(12) United States Patent
Yamada et al.

(10) Patent No.: US 6,335,479 B1
(45) Date of Patent: Jan. 1, 2002

(54) PROTECTIVE SHEET FOR SOLAR BATTERY MODULE, METHOD OF FABRICATING THE SAME AND SOLAR BATTERY MODULE

(75) Inventors: Hiroshi Yamada; Koujiro Ookawa; Yasuki Suzuura; Takakazu Goto; Hideki Arao; Atsuo Tsuzuki; Kazuyuki Takasawa; Hiroshi Yamamoto; Katsutoshi Konno, all of Tokyo-To (JP)

(73) Assignee: Dai Nippon Printing Co., Ltd. (JP)

( * ) Notice: Subject to any disclaimer, the term of this patent is extended or adjusted under 35 U.S.C. 154(b) by 0 days.

(21) Appl. No.: 09/418,193

(22) Filed: Oct. 13, 1999

(30) Foreign Application Priority Data

| Oct. 13, 1998 | (JP) | 10-290540 |
|---|---|---|
| May 17, 1999 | (JP) | 11-135613 |
| May 17, 1999 | (JP) | 11-135688 |
| May 17, 1999 | (JP) | 11-135888 |
| May 17, 1999 | (JP) | 11-136110 |
| Jun. 25, 1999 | (JP) | 11-179533 |
| Aug. 17, 1999 | (JP) | 11-230611 |

(51) Int. Cl.⁷ ................. H01L 31/048; H01L 31/0216
(52) U.S. Cl. ............ 136/251; 136/244; 136/256; 428/332; 428/336; 428/339; 428/421; 428/426; 428/428; 428/429; 428/441; 428/446; 428/447; 428/689; 428/699; 428/702
(58) Field of Search ................... 136/224, 251, 136/256; 428/332, 336, 339, 421, 426, 428, 429, 441, 446, 447, 689, 699, 702

(56) References Cited

U.S. PATENT DOCUMENTS 6,046,403 A * 4/2000 Yoshikawa et al. ........ 136/256

FOREIGN PATENT DOCUMENTS

| EP | 0680096 A2 | | 4/1995 |
|---|---|---|---|
| EP | 0680097 A2 | | 4/1995 |
| JP | 4-206760 | * | 7/1992 |
| JP | 9-180253 | * | 7/1997 |
| JP | 9-199740 | * | 7/1997 |
| JP | 10-25357 | * | 1/1998 |
| JP | 10-308521 | * | 11/1998 |

OTHER PUBLICATIONS

Patent Abstracts of Japan, abstract for JP 09–199740, Jul. 1997.
Patent Abstracts of Japan, abstract for JP 10–51,013, Feb. 1998.
Patent Abstracts of Japan, abstract for JP 10–308,521, Nov. 1998.
Patent Abstracts of Japan, abstract for JP 08–242010, Sep. 1996.
Patent Abstracts of Japan, abstract for JP 04–349672, Dec. 1992.
Patent Abstracts of Japan, abstract for JP 07–283427, Oct. 1995.
Patent Abstracts of Japan, abstract for JP 10–51014, Feb. 1998.

* cited by examiner

Primary Examiner—Alan Diamond
(74) Attorney, Agent, or Firm—Parkhurst & Wendel, L.L.P.

(57) ABSTRACT

A protective sheet for a solar battery module comprises a weather-resistant sheet (1) of, for example, a fluorocarbon resin, and a deposited inorganic oxide thin film (2) formed on one of the surfaces of the weather-resistant sheet (1). A surface-treated layer (3) is formed in the weather-resistant sheet (1) to enhance adhesion between the weather-resistant sheet (1) and the deposited inorganic oxide thin film (2).

60 Claims, 19 Drawing Sheets

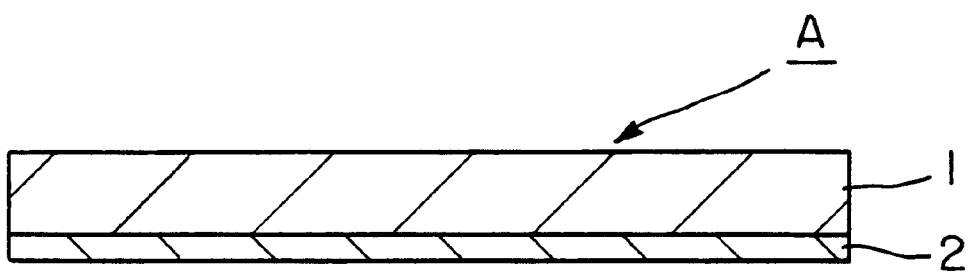
F I G. 1
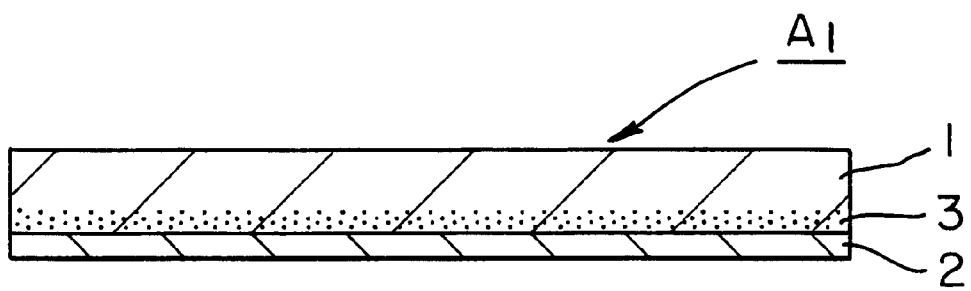
F I G. 2
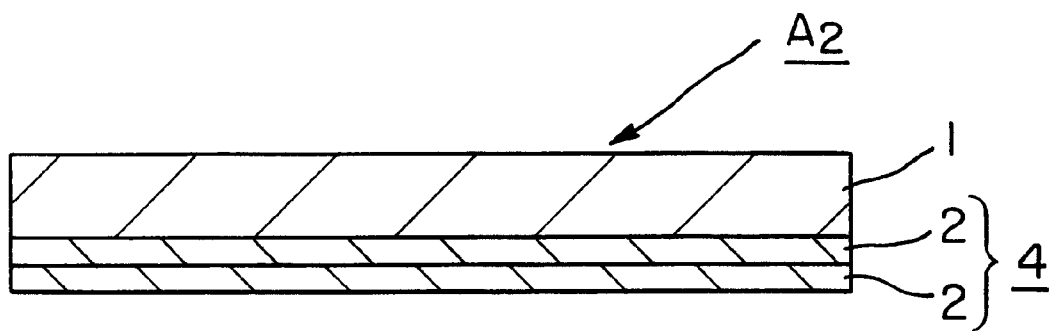
F I G. 3

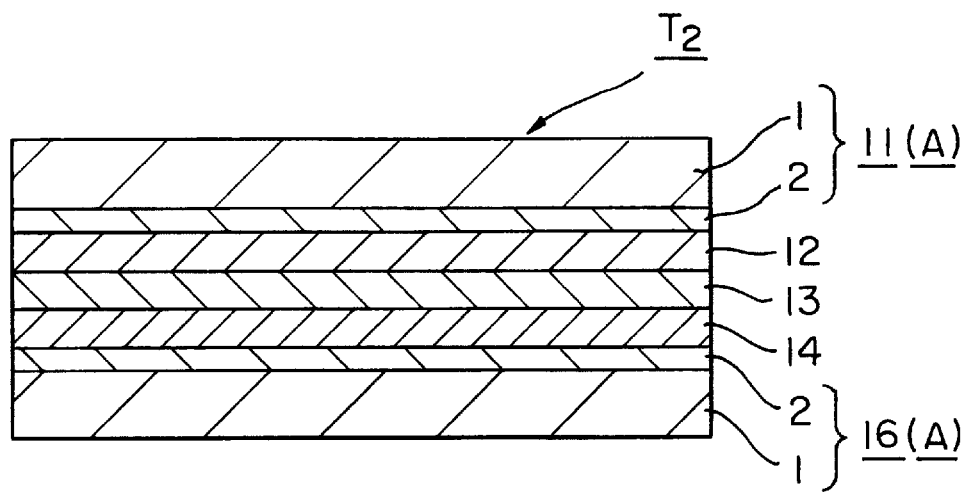
F I G. 7
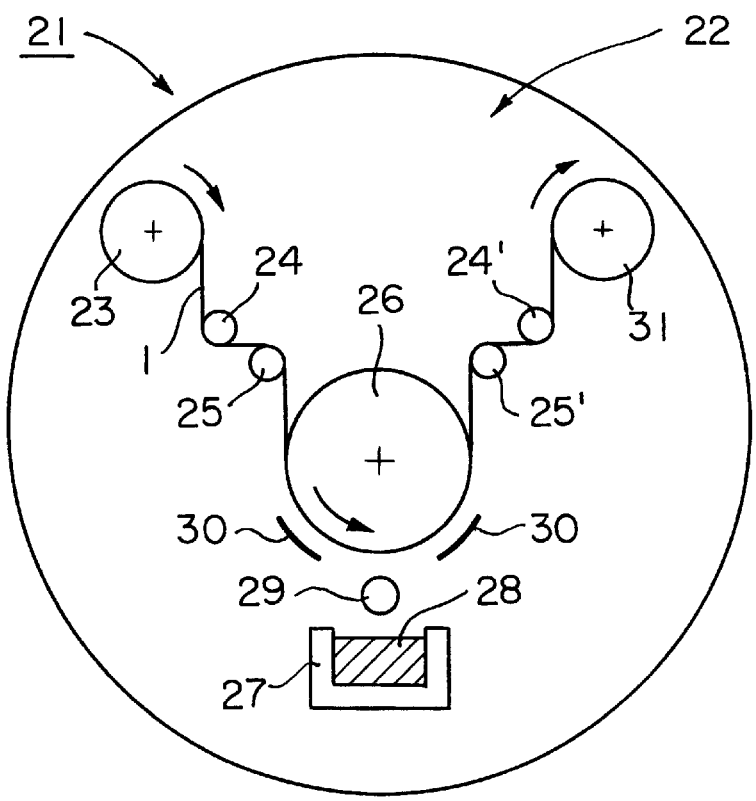
F I G. 8

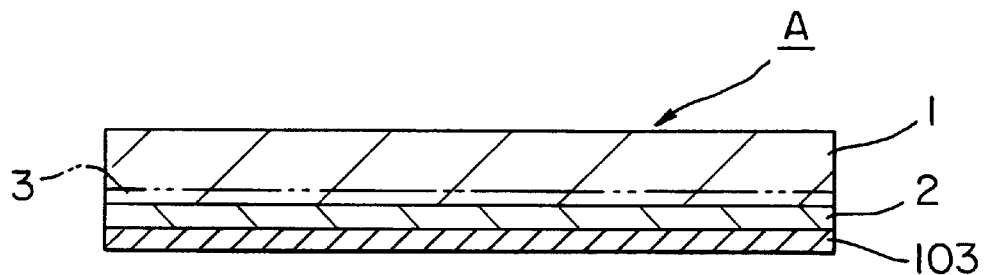
F I G. 10
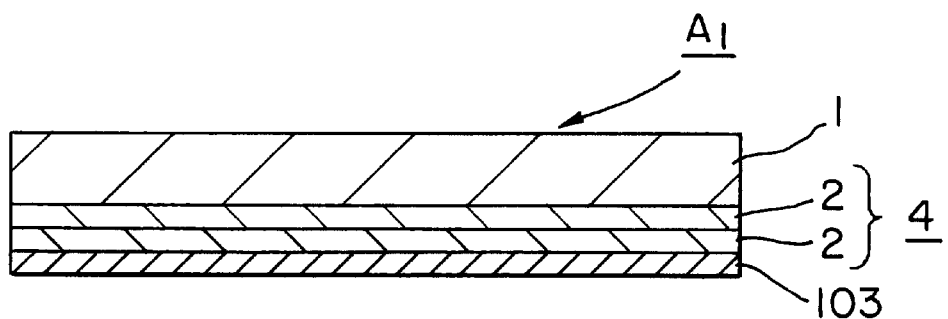
F I G. 11
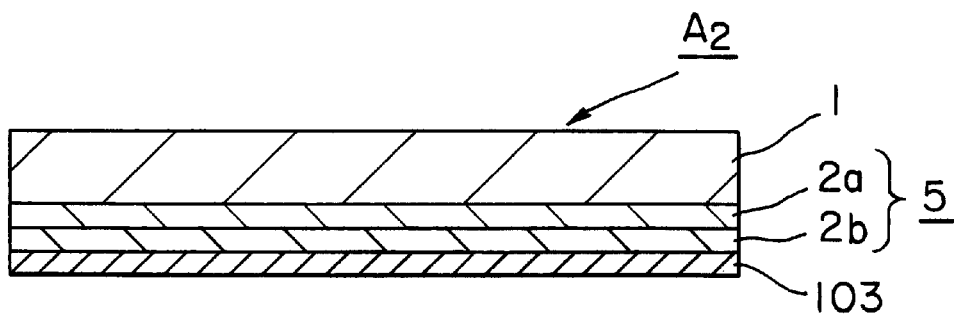
F I G. 12

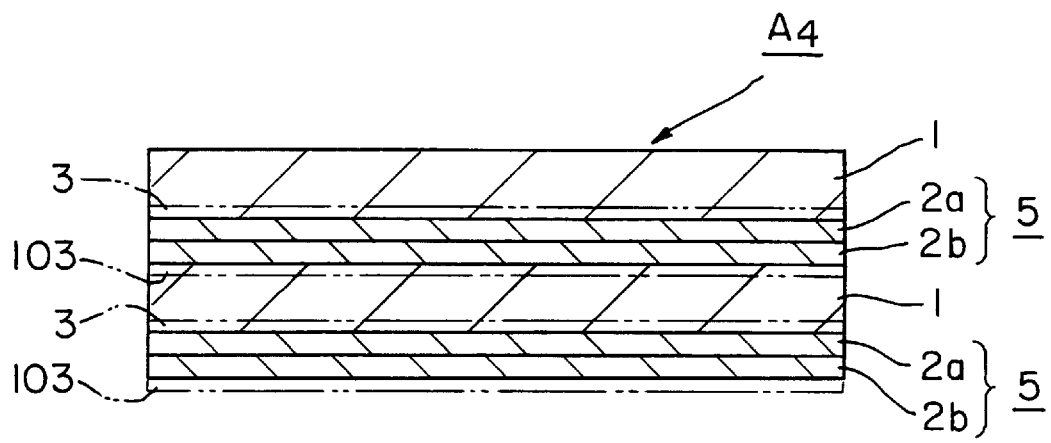
F I G. 20
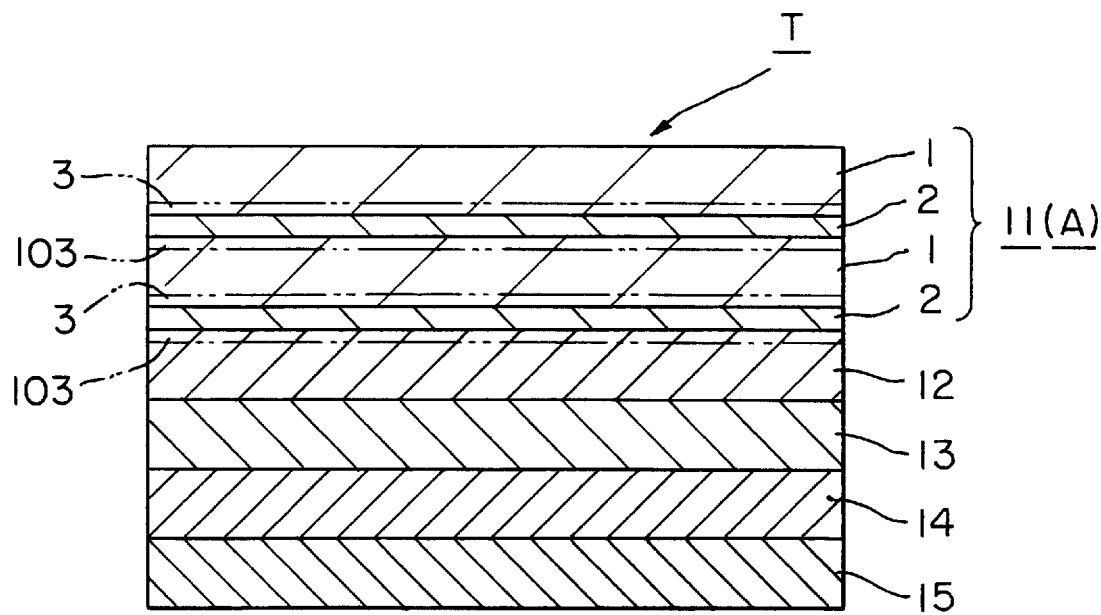
F I G. 21

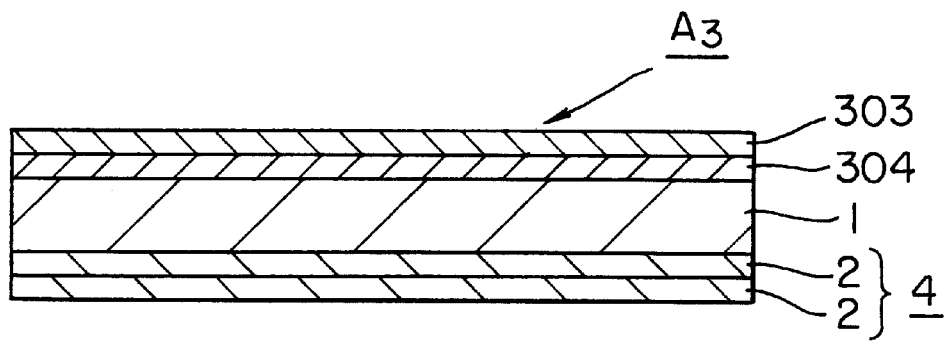
F I G. 27
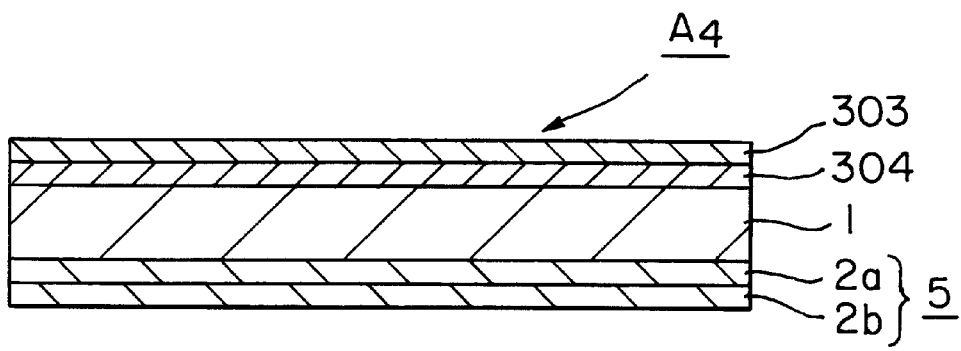
F I G. 28
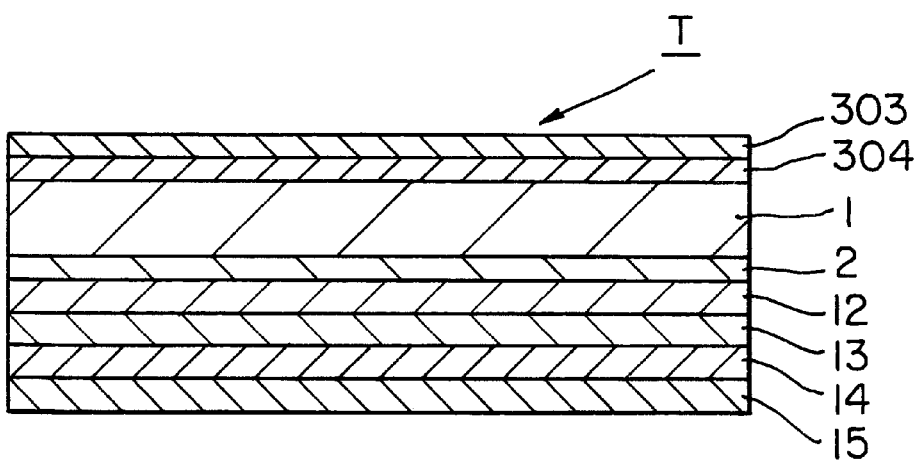
F I G. 29

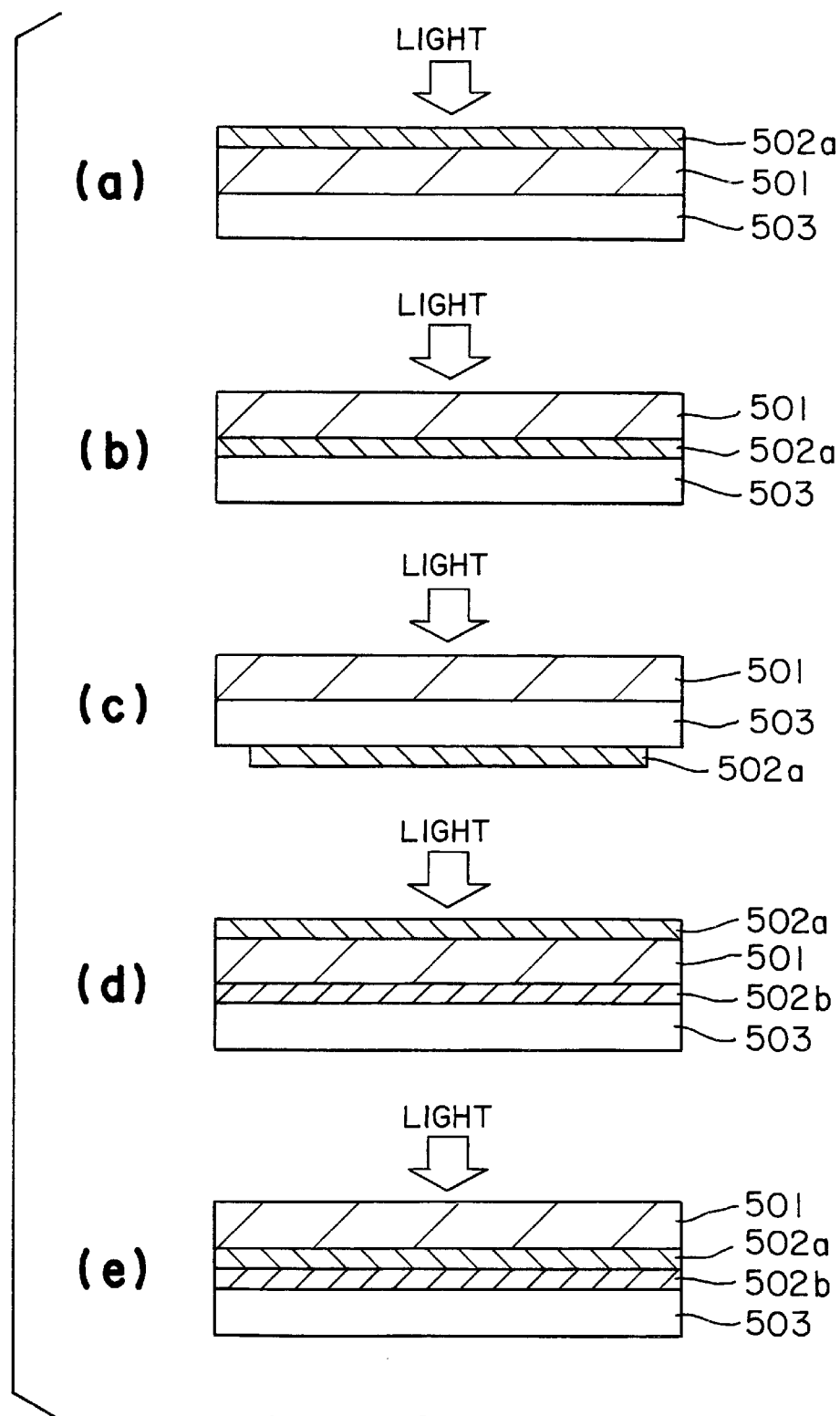
F I G. 36

ND BATTERY MODULE

TECHNICAL FIELD

The present invention relates to a protective sheet for a solar battery module, a method of fabricating the protective sheet and a solar battery module provided with the protective sheet. More specifically, the present invention relates to a protective sheet for protecting the front surface or the back surface of a solar battery module, excellent in properties including strength, weather resistance, heat resistance, light resistance, wind endurance, hailstorm resistance, chemical resistance, moisture resistance and soil resistance, and having very high durability and protective ability; and solar battery module employing the protective sheet.

BACKGROUND ART

With an increasing rise in awareness of environmental problems, solar batteries as clean energy sources have attracted a great deal of attention. Various types of solar battery modules have been developed and proposed in recent years.

Generally, a solar battery module is fabricated, for example, by fabricating silicon solar cells or amorphous silicon solar cells, superposing a protective sheet, a filler layer, a layer provided with solar cells, i.e., photovoltaic cells, a filler layer and a back protective sheet in that order in a laminated structure, bringing those component layers into close contact by vacuum, and laminating those component layers by a lamination process.

The solar battery modules were applied to pocket calculators in the early stage of solar battery application and, subsequently, began to be applied to various kinds of electronic apparatuses. The field of civil application of solar battery modules have rapidly been spreading in recent years. The most important object of the solar battery module application will be the realization of large-scale, concentrated solar battery power generation.

The presently most common front surface protective sheet for the solar battery module is a glass sheet. Resin sheets, such as fluorocarbon resin sheets, have become no table in recent years and the development of resin sheets is in rapid progress.

Resin sheets excellent in strength are the most commonly used as the back protective sheet for the solar battery module. Metal sheets also are used as back protective sheets.

Generally, a protective sheet included in a solar battery module, for example, a front surface protective sheet, must be highly transparent to sunlight because the solar battery absorbs sunlight for photovoltaic power generation, and excellent in properties including strength, weather resistance, heat resistance, water resistance, light resistance, wind endurance, hail storm resistance and chemical resistance. Particularly, the protective sheet must be excellent in moisture-proof property to prevent the permeation of moisture and oxygen, have a high surface hardness, excellent in soil resistance to prevent dust accumulation, have very high durability and protective ability. The back protective sheet must meet substantially the same conditions as those for the front surface protective sheet.

The glass sheet, which is the most commonly used at present as the front surface protective sheet of the solar battery module, has a high sunlight transmittance, is excellent in properties relating to durability, such as weather resistance, heat resistance, water resistance, light resistance and chemical resistance, is excellent in moistureproof property, has a high surface hardness, is excellent in soil resistance to prevent dust accumulation and has high protective ability. However, the glass sheet is inferior in strength, plasticity, impact resistance, workability, handling facility and cost.

Although the fluorocarbon resin sheet serving as the front surface protective sheet of the solar battery module, as compared with the glass sheet, is satisfactory in strength, plasticity, impact resistance and weight, the same is inferior in properties relating to durability including weather resistance, heat resistance, water resistance light resistance and chemical resistance, and is particularly unsatisfactory in moistureproof property and soil resistance.

Although a resin sheet having a high strength, as employed as the back protective sheet of the solar battery module, is satisfactory in strength, plasticity, impact resistance, weight and cost, the same is inferior in properties relating to durability including weather resistance, heat resistance, water resistance, light resistance and chemical resistance and, particularly, lacks moistureproof property and soil resistance.

There have been a proposal to use sheets of a material having an excellent gas-barrier property and impermeable to moisture, oxygen gas and the like as the front or the back surface protective sheet of the solar battery module. The most commonly used sheets having an excellent gas-barrier property are aluminum foils.

Although very excellent in gas-barrier property, aluminum foils cause problems in the disposal thereof and, basically, aluminum foils are opaque and obstruct the view of things behind them. A resin film excellent in gas-barrier property, such as a film of a polyvinylidene chloride resin, or a polyvinyl alcohol resin or an ethylene-vinyl alcohol copolymer is a previously proposed resin film excellent in gas-barrier property. The resin film of a polyvinylidene chloride resin produces chlorinated gases when incinerated. Therefore, it is undesirable to use such a film in view of preventing environmental pollution. Basically, the gas-barrier property of that resin film is not necessarily satisfactory and that resin film is unsuitable for uses requiring a high gas-barrier property. The resin film of the polyvinyl alcohol resin or the ethylene-vinyl alcohol copolymer has a relatively excellent gas-barrier property in an absolute dry condition and is not satisfactory in impermeability to moisture. The impermeability of this resin film to oxygen gas deteriorates under a moist condition. Accordingly, this film is unsuitable, from the practical point of view, for use as a gas-barrier film.

A recently proposed gas-barrier film excellent in gas-barrier property is, for example, an inorganic oxide film, such as a silicon oxide film or an aluminum oxide film, deposited by a physical vapor deposition process, such as a vacuum evaporation process, or a chemical vapor deposition process, such as a low-temperature plasma chemical vapor deposition process.

The gas-barrier film formed by depositing such an inorganic oxide is an aggregate of inorganic oxide grains and inevitably has defects in its structure, which limits reliability in gas-barrier property. Since such a gas-barrier film has a glassy structure, the gas-barrier film is inferior in flexibility and is subject to cracking when mechanical stress is induced therein. When cracked, the gas-barrier property of the gas-barrier film deteriorates greatly.

A previously proposed composite gas-barrier film is a multilayer gas-barrier film comprising a plurality of component films formed by a multistage vapor deposition process. Another previously proposed composite gas-barrier film comprises a resin film having an excellent gas-barrier property and a deposited inorganic oxide film deposited on the surface of the resin film. These composite gas-barrier films are not necessarily satisfactory.

DISCLOSURE OF THE INVENTION

The present invention provides a safe protective sheet for a solar battery module, having a high strength, excellent in properties including weather resistance, heat resistance, water resistance, light resistance, wind endurance, hailstorm resistance, chemical resistance, moisture resistance and soil resistance, greatly improved in moistureproof property to prevent the permeation of moisture and oxygen, capable of limiting long-term deterioration to the least extent, having very high durability and protective ability, and capable of being manufactured at a low cost; a method of fabricating the protective sheet; and a solar battery module.

The present invention provides a protective sheet for a solar battery module, comprising a weather-resistant sheet and an inorganic oxide thin film deposited on one surface of the weather-resistant sheet by vapor deposition.

The present invention provides a protective sheet for a solar battery module, formed by superposing a pair of laminated sheet each comprising a weather-resistant sheet and an inorganic oxide thin film deposited by vapor deposition.

The present invention provides a protective sheet for a solar battery module, comprising a weather-resistant sheet and an ultraviolet ray intercepting layer, an infrared ray intercepting layer or a highly reflecting layer.

The present invention provides a method of fabricating a protective sheet of a laminated construction comprising at least a weather-resistant sheet and an ultraviolet ray intercepting layer formed on the weather-resistant sheet for a solar battery module, comprising the steps of: preparing the weather-resistant sheet; and forming the ultraviolet ray intercepting layer by applying a coating resin liquid containing $TiO_2$ or $CeO_2$ having a mean grain size in the range of 1 to 100 nm dispersed therein to the weather-resistant sheet and drying the same.

The present invention provides a method of fabricating a protective sheet of a laminated construction comprising at least a weather-resistant sheet and an infrared ray intercepting layer formed on the weather-resistant sheet for a solar battery module, comprising the steps of: preparing the weather-resistant sheet; and forming the infrared ray intercepting layer y depositing a metal on the weather-resistant sheet by vapor deposition or by applying a coating resin liquid containing a metal oxide particles dispersed therein to the weather-resistant sheet and drying the same.

The present invention provides a solar battery module comprising: solar cells; a pair of filler layers sandwiching the solar cells therebetween; and a pair of protective sheet disposed on the filler layers, respectively; wherein at least one of the protective sheet comprises a weather-resistant sheet and an inorganic oxide thin film formed by vapor deposition.

The present invention provides a solar battery module comprising: solar cells; a pair of filler layers sandwiching the solar cells therebetween; and a pair of protective sheet disposed on the filler layers, respectively; wherein at least one of the protective sheet is formed by superposing a pair of laminated structures each comprising a weather-resistant sheet and an inorganic oxide thin film formed by vapor deposition.

The present invention provides a solar battery module comprising: solar cells; a pair of filler layers sandwiching the solar cells therebetween; and a pair of protective sheet disposed on the filler layers, respectively; wherein at least one of the protective sheet comprises a weather-resistant sheet, and an ultraviolet ray intercepting layer, an infrared ray intercepting layer or a highly reflective layer formed on one of the surfaces of the weather-resistant sheet.

The present invention provides a solar battery module comprising: solar cells; a pair of filler layers sandwiching the solar cells therebetween; and a pair of protective sheet disposed on the filler layers, respectively; wherein at least one of the protective sheet comprises a weather-resistant sheet and a light confining layer formed on one of the surfaces of the weather-resistant sheet.

BRIEF DESCRIPTION OF THE DRAWINGS

FIG. 1 is a typical sectional view of a protective sheet in a first embodiment according to the present invention for a solar battery module;

FIG. 2 is a typical sectional view of a protective sheet for a solar battery module, FIG. 3 is a typical sectional view of a protective sheet for a solar battery module;

FIG. 7 is a typical sectional view of a solar battery module provided with the protective sheet shown in FIG. 1;

FIG. 8 is a diagrammatic view of a continuous vapor deposition system for forming an inorganic oxide thin film by a physical vapor deposition process for vapor deposition

FIG. 10 is a typical sectional view of a protective sheet in a third embodiment according to the present invention for a solar battery module;

FIG. 11 is a typical sectional view of a protective sheet for a solar battery module;

FIG. 12 is a typical sectional view of a protective sheet for a solar battery module;

FIG. 20 is a typical sectional view of a protective sheet for a solar battery module;

FIG. 21 is a typical sectional view of a solar battery module provided with the protective sheet shown in FIG. 16;

FIG. 27 is a typical sectional view of a protective sheet for a solar battery module;

FIG. 28 is a typical sectional view of a protective sheet for a solar battery module;

FIG. 29 is a typical sectional view of a solar battery module provided with the protective sheet shown in FIG. 24;

FIGS. 36(a) to 36(e) are typical sectional views of assistance in explaining a process of fabricating a protective sheet in a modification of the protective sheet shown in FIG. 35;

BEST MODE FOR CARRYING OUT THE INVENTION

First Embodiment

The present invention will be described hereinafter with reference to the accompanying drawings.

In this description, the term "sheet" is used in its broad sense to denote both sheets and films, and the term "film" is used in its broad sense to denote both sheets and films.

Figure 4:
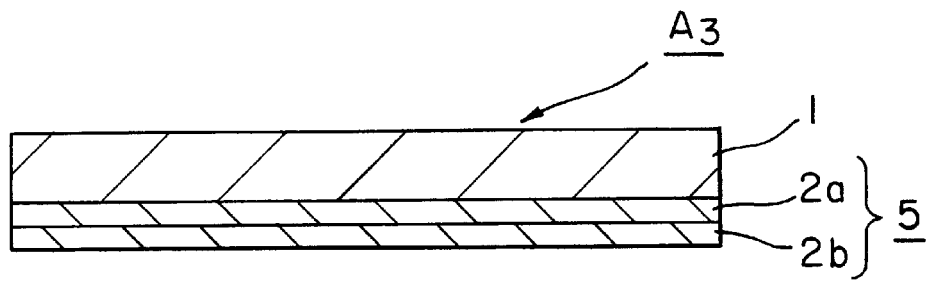
FIG. 4 is a typical sectional view of a protective sheet for a solar battery module.
Figure 5:
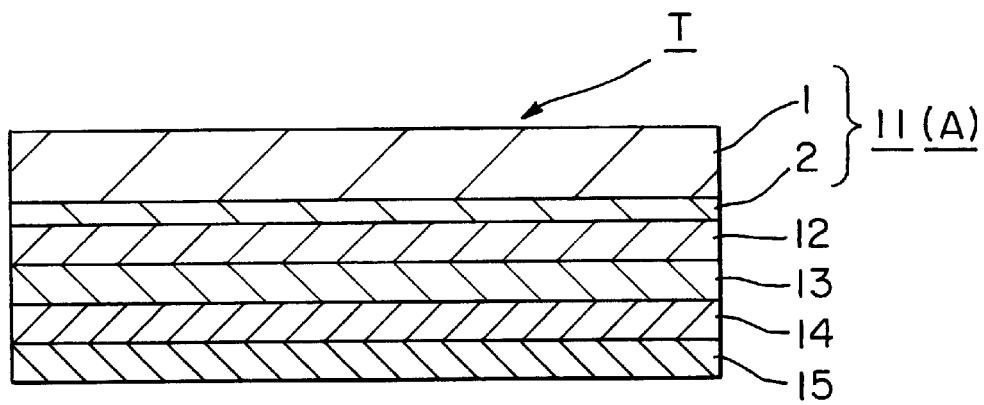
FIG. 5 is a typical sectional view of a solar battery module provided with the protective sheet shown in FIG. 1.
Figure 6:
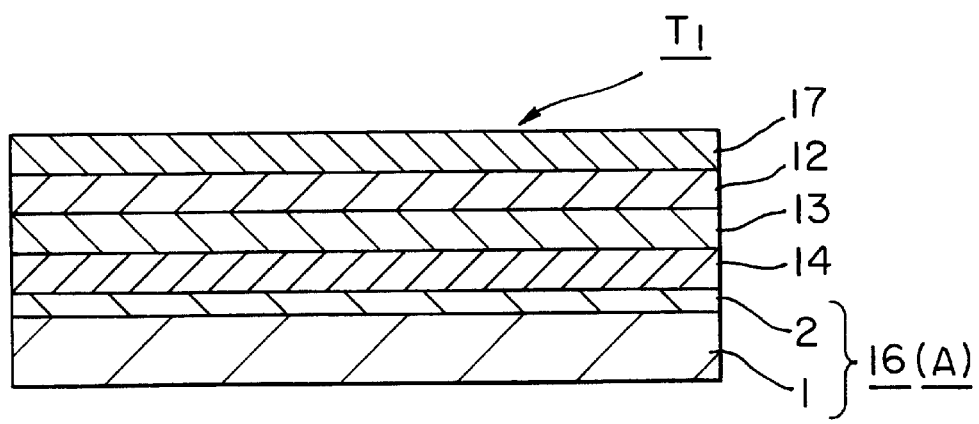
FIG. 6 is a typical sectional view of a solar battery module provided with the protective sheet shown in FIG. 1.

FIGS. 1 to 4 are typical sectional views of protective sheets in examples in a first embodiment according to the present invention for a solar battery module, and FIGS. 5 to 6 are typical sectional views of solar battery modules employing the protective sheet shown in FIG. 1.

Referring to FIG. 1, a protective sheet A embodying the present invention for a solar battery module comprises a fluorocarbon resin sheet (weather-resistant sheet) 1, and a deposited inorganic oxide thin film 2 formed on one of the surfaces of the fluorocarbon resin sheet 1.

As shown in FIG. 2, a protective sheet $A_1$ in an example of the first embodiment for a solar battery module is formed by surface-treating one of the surfaces of a fluorocarbon resin sheet 1 to form a surface-treated layer 3, and forming a deposited inorganic oxide thin film 2 on the surface-treated layer 3 of the fluorocarbon resin sheet 1.

As shown in FIG. 3, a protective sheet $A_2$ in another example of the first embodiment for a solar battery module is formed by forming a multilayer film 4 consisting of at least two deposited inorganic oxide thin films 2 on one of the surfaces of a fluorocarbon resin sheet 1.

As shown in FIG. 4 a protective sheet $A_3$ in a third example of the first embodiment for a solar battery module comprises a fluorocarbon resin sheet 1 and a composite film 5 formed on one of the surfaces of the fluorocarbon resin film 1. The composite film 5 consists of a first deposited inorganic oxide thin film 2a formed on one of the surfaces of the fluorocarbon resin sheet 1 by a chemical vapor deposition process, and a second deposited inorganic oxide thin film 2b of an inorganic oxide different from that of the first deposited inorganic oxide film 2a, formed on the first deposited inorganic oxide thin film 2a by a physical vapor deposition process.

Those protective sheets are only examples of the protective sheet in the first embodiment and the present invention is not limited thereto.

For example, in each of the protective sheets shown in FIGS. 3 and 4, the surface of the fluorocarbon resin sheet 1 may be finished in a surface-treated surface similar to the surface-treated surface 3 shown in FIG. 2. In the protective sheet $A_3$ shown in FIG. 4, a deposited inorganic oxide thin film may be formed first on the surface of the fluorocarbon resin sheet 1 by a physical vapor deposition process, and then another deposited inorganic oxide thin film may be formed by a chemical vapor deposition process.

A solar battery module employing this protective sheet A embodying the present invention and shown in FIG. 1 will be described by way of example. Referring to FIG. 5, a solar battery module T employs the protective sheet A shown in FIG. 1 as its front surface protective sheet 11. The solar battery module T is fabricated by superposing the protective sheet 11 (A), a filler layer 12, a photovoltaic layer 13 of solar cells, a filler layer 14 and a generally known back surface protective sheet 15 in that order in a superposed structure, and subjecting the superposed structure to a generally known forming process, such as a lamination process, in which those component layers of the superposed structure are brought into close contact by vacuum and are bonded together by hot pressing. The deposited inorganic oxide thin film 2 of the protective sheet 11 faces inside.

Another solar battery module T, shown in FIG. 6 employs the protective sheet A shown in FIG. 1 as its back surface protective sheet 16. The solar battery module $T_1$ is fabricated by superposing a generally known front surface protective sheet 17, a filler layer 12, a photovoltaic layer 13 of solar cells, a filler layer 14 and the protective sheet 16 (A) in that order in a superposed structure, and subjecting the superposed structure to a generally known forming process, such as a lamination process, in which those component layers of the superposed structure are brought into close contact by vacuum and are bonded together by hot pressing. The deposited inorganic oxide thin film 2 of the protective sheet 16 faces inside.

A third solar battery module $T_2$ shown in FIG. 7 employs the protective sheet A shown in FIG. 1 as its front surface protective sheet 11 and its back surface protective sheet 16. The solar battery module $T_2$ is fabricated by superposing the front surface protective sheet 11 (A), a filler layer 12, a photovoltaic layer 13 of solar cells, a filler layer 14 and the protective sheet 16 (A) in that order in a superposed structure, and subjecting the superposed structure to a generally known forming process, such as a lamination process, in which those component layers of the superposed structure are brought into close contact by vacuum and are bonded together by hot pressing. The deposited inorganic oxide thin film 2 of each of the protective sheets 11 and 16 faces inside.

The foregoing protective sheets in accordance with the present invention and the foregoing solar battery modules employing those protective sheets are examples intended to illustrate the invention and not to be construed to limit the scope of the invention.

For example, the protective sheets shown in FIGS. 2, 3 and 4 can be applied to solar battery modules of various types. The foregoing solar battery modules may comprise additional layers for sunlight absorption, reinforcement or the like.

Materials for and methods of fabricating the protective sheets in accordance with the present invention and the solar battery modules employing those protective sheets will be described. The fluorocarbon resin sheet 1 for the protective sheets embodying the present invention and the solar battery modules employing those protective sheets is a transparent film or a transparent sheet of any one of polytetrafluoroethylene (PTFE), perfluoroalcoxy resins (PFA), i.e., copolymers of tetrafluoroethylene and perfluoroalkyl vinyl ether, tetafluoroethylene-hexafluoropropylene copolymers (FEP), tetrafluoroethylene-perfluoroalkyl vinyl ether-hexafluoropropylene copolymers (EPE), tetrafluoroethylene-ethylene or propylenecopolymers (ETFE), polychlorotrifluoroethylene resins (PCTFE), ethylene-chlorotrifluoroethylene copolymers (ECTFE), vinylidene fluoride resins (PVDF), and polyvinyl fluorides (PVF).

Sheets of polyvinyl fluorides (PVF) and tetrafluoroethylene-ethylene or -propylene copolymers (ETFE) among the foregoing fluorocarbon resin sheets 1 are most preferable from the viewpoint of transparency and transmittance to sunlight.

The protective sheets of the solar battery modules using the fluorocarbon resin sheet 1 utilize the excellent properties of the fluorocarbon resin sheet 1 including mechanical properties, heat resistance, optical properties, weather resistance including light resistance, heat resistance, water resistance and the like, soil resistance and chemical resistance. The protective sheet is equal in optical properties and durability to a glass sheet generally used as a protective sheet, has satisfactory mechanical properties, and is more flexible and lighter than a glass sheet, excellent in workability and easy to handle.

The fluorocarbon resin sheet 1 may be, for example, any one of films or sheets of the foregoing fluorocarbon resins formed by a film forming process, such as an extrusion process, a casting process, a T-die extrusion process, a cutting process, an inflation process or the like, any one of multilayer films or multilayer sheets of two or more kinds of the foregoing fluorocarbon resins formed by a coextrusion process, or any one of films or sheets formed by subjecting a mixture of a plurality of kinds of the foregoing fluorocarbon resins to a film forming process. When necessary, the fluorocarbon resin sheet 1 may be a uniaxially or biaxially oriented film or sheet formed by subjecting a fluorocarbon resin film or sheet to a uniaxial or biaxial orientation process of a tenter system or a tubular film system.

The thickness of the fluorocarbon resin sheet is in the range of about 12 to about 200 μm, desirably, in the range of about 25 to about 150 μm.

It is desirable that the fluorocarbon resin sheet 11 of the present invention has a visible light transmittance of 90% or above, preferably, 95% or above and a property to transmit all incident sunlight and to absorb the same.

When forming the fluorocarbon resin sheet, various compounding ingredients and additives may be added to the fluorocarbon resin to improve the workability, heat resistance, weather resistance, mechanical properties, dimensional stability, oxidation resistance, slipperiness, releasability, flame retardancy, antifungal property, electric properties and the like. The amount of each of the compounding ingredients and the additives is in the range of a very small percent to several tens percent and may optionally be determined according to the purpose.

The fluorocarbon resin may contain commonly known additives, such as a lubricant, a crosslinking agent, an oxidation inhibitor, an ultraviolet absorber, a light stabilizer, a filler, a reinforcing material, a stiffener, an antistatic agent, a flame retarder, a flame-resistant agent, a foaming agent, an antifungus agent, a pigment and the like. The fluorocarbon resin may further contain modifiers.

In the present invention, it is preferable to use a fluorocarbon resin sheet of a fluorocarbon resin produced by preparing a mixture of a fluorocarbon resin, and an oxidation inhibitor or an ultraviolet absorber, and kneading the mixture.

In the present invention, it is preferable to use a fluorocarbon resin sheet of a fluorocarbon resin produced by preparing a mixture of a fluorocarbon resin, an oxidation inhibitor and/or an ultraviolet absorber, and kneading the mixture.

The ultraviolet absorber absorbs detrimental ultraviolet rays contained in sunlight, converts the energy of ultraviolet rays into harmless thermal energy in its molecules to prevent active species that starts the photodeterioration of polymers from being excited. One or some of ultraviolet absorbers, such as those of a benzophenone group, a benzotriazole group, a salicylate group, an acrylonitrile group, metallic complex salts, a hindered amine group and an inorganic ultraviolet absorber, such as ultrafine titanium oxide powder (particle size: 0.01 to 0.06 μm) or ultrafine zinc oxide powder (particle size: 0.01 to 0.04 μm), may be used.

The oxidation inhibitor prevents the light deterioration or thermal deterioration of polymers. Suitable oxidation inhibitors are, for example, those of a phenol group, an amine group, a sulfur group, a phosphoric acid group and the like.

The ultraviolet absorber or the oxidation inhibitor may be an ultraviolet absorbing polymer or an oxidation inhibiting polymer produced by chemically bonding an ultraviolet absorber of the benzophenone group or an oxidation inhibitor of the phenol group to the principal chains or the side chains of a polymer.

The ultraviolet absorber and/or the oxidation inhibitor content is dependent on the shape and density of particles and a preferable ultraviolet absorber and/or the oxidation inhibitor content is in the range of about 0.1 to about 10% by weight.

When necessary, a surface-treated layer 3 may be formed in a surface of the fluorocarbon resin sheet 1 by a surface pretreatment process to improve the adhesion between the surface of the fluorocarbon resin sheet 11 and the deposited inorganic oxide thin film 2.

The surface-treated layer 3 may be formed by, for example, a corona discharge treatment, an ozone treatment, a low-temperature plasma treatment using oxygen gas or nitrogen gas, a glow discharge treatment, an oxidation treatment using a chemical or the like. The surface-treated layer 3 may be a corona-treated layer, an ozone-treated layer, a plasma-treated layer, an oxidized layer or the like.

The surface pretreatment of the fluorocarbon resin sheet may be carried out before forming the deposited inorganic oxide thin film. When the surface of the fluorocarbon resin sheet is to be treated by a low-temperature plasma process or a glow discharge process, the surface pretreatment may be carried out in an in-line processing mode as a pretreatment process in a process for forming the deposited inorganic oxide thin film, which is effective in reducing the manufacturing cost.

The surface of the fluorocarbon resin sheet 1 is finished by the surface pretreatment to improve the adhesion between the fluorocarbon resin sheet 1 and the deposited inorganic oxide thin film 2. The improvement of adhesion can be achieved by forming, instead of forming the surface-treated layer, a layer of a primer, an undercoater, an anchoring agent, an adhesive or a deposited undercoating material.

Suitable materials for forming the coating layer are, for example, composite resins containing a polyester resin, a polyamide resin, a polyurethane resin, an epoxy resin, a phenolic resin, a (meta)acrylic resin, a polyvinyl acetate resin, a polyolefin resin such as a polyethylene, a polypropylene or a copolymer or a resin obtained by modifying one of those resins, a cellulose resin or the like as a principal component of a vehicle.

In the present invention, the composite resin may contain an ultraviolet absorber and/or an oxidation inhibitor for light resistance improvement.

The ultraviolet absorber absorbs detrimental ultraviolet rays in sunlight, converts the energy of ultraviolet rays into harmless thermal energy in its molecules to prevent active species that starts the photodeterioration of polymers from being excited. One or some of ultraviolet absorbers, such as those of a benzophenone group, a benzotriazole group, a salicylate group, an acrylonitrile group, metallic complex salts, a hindered amine group and an inorganic ultraviolet absorber, such as ultrafine titanium oxide powder (particle size: 0.01 to 0.06 $\mu$m) or ultrafine zinc oxide powder (particle size: 0.01 to 0.04 $\mu$m), may be used.

The oxidation inhibitor prevents the light deterioration or thermal deterioration of polymers. Suitable oxidation inhibitors are, for example, those of a phenol group, an amine group, a sulfur group, a phosphoric acid group and the like.

The ultraviolet absorber or the oxidation inhibitor may be an ultraviolet absorbing polymer or an oxidation inhibiting polymer produced by chemically bonding an ultraviolet absorber of the benzophenone group or an oxidation inhibitor of the phenol group to the principal chains or the side chains of a polymer.

The ultraviolet absorber and/or the oxidation inhibitor content is dependent on the shape and density of particles and a preferable ultraviolet absorber and/or the oxidation inhibitor content is in the range of about 0.1 to about 10% by weight.

The coating layer may be formed of a coating material of, for example, a solvent type, an aqueous type or an emulsion type by a roller coating process, a gravure coating process, a kiss-roll coating process or the like. The coating layer may be formed by a coating process subsequent to a fluorocarbon resin sheet forming process or a biaxial orientation process, or by an in-line coating process included in the film forming process or the biaxial orientation process.

The surface-treated layer 3 may be formed on one surface of the fluorocarbon resin sheet to protect the fluorocarbon resin sheet from vapor deposition conditions for forming the deposited inorganic oxide thin film, to suppress yellowing, deterioration, shrinkage or cohesive failure in a surface layer or an inner layer of the fluorocarbon resin sheet, and to improve the adhesion between the fluorocarbon resin sheet and the deposited inorganic oxide thin film. The surface-treated layer 3, i.e., a deposition-resistant protective film, such as a deposited inorganic oxide thin film, may be formed by, for example, a chemical vapor deposition process (CVD process), such as a plasma chemical vapor deposition process, a thermal chemical vapor deposition process or a photochemical vapor deposition process, or a physical vapor deposition process (PVD process), such as a vacuum evaporation process, a sputtering process or an ion plating process.

The thickness of the deposition-resist-ant protective film of silicon oxide or the like may be less than 150 Å. The deposition-resistant protective film may be a nonbarrier film not having any barrier effect to inhibit the permeation of source gases and oxygen gas. Concretely, the thickness of the deposition-resistant protective film is in the range of about 10 to about 100 Å, preferably, in the range of about 20 to 80 Å, more preferably, in the range of about 30 to about 60 Å.

If the thickness is greater than 150 Å, more concretely 100 Å, 80 Å or 60 Å, the fluorocarbon resin sheet is exposed to severe deposition conditions. Consequently, the fluorocarbon resin sheet turns yellow, cohesive failure occurs, the formation of a satisfactory deposition-resistant protective film becomes difficult, and cracks develop in the film. If the thickness is less than 10 Å, 20 Å or 30 Å, the film is incapable of functioning as an effective deposition-resistant protective film.

The protective sheet of the present invention for a solar battery module, and the deposited inorganic oxide thin film 2 included in the solar battery module will be described. The deposited inorganic oxide thin film may be a single-layer deposited inorganic oxide thin film, a multilayer film consisting of a plurality of deposited thin films of an inorganic oxide, or a composite film consisting of a plurality of deposited thin films respectively formed of different inorganic oxides by a physical vapor deposition process, a chemical vapor deposition process, or both a physical vapor deposition process and a chemical vapor deposition process.

The deposited inorganic oxide thin film formed by a physical vapor deposition process will be described. The physical vapor deposition process (PVD process) for forming the deposited inorganic oxide thin film may be, for example, a vacuum evaporation process, a sputtering process or anion plating process.

A deposited film can be deposited on a fluorocarbon resin sheet by a vacuum evaporation process using a metal oxide as a source material, an oxidation vapor deposition process using a metal or a metal oxide, performing oxidation and depositing a metal oxide on the fluorocarbon resin sheet or a plasma-assisted oxidation vapor deposition process carrying out a plasma-assisted oxidation.

In the foregoing process, the evaporation material may be heated by, for example, a resistance heating method, a radio frequency heating method or an electron beam (EB) heating method.

FIG. 8 is a diagrammatic view of a continuous vacuum evaporation system for forming the deposited inorganic oxide thin film by a physical vapor deposition process.

Referring to FIG. 8, in a continuous vacuum evaporation system 21, a fluorocarbon resin sheet 1 unwound from a feed roll 23 disposed in a vacuum chamber 22 is guided to a cooling coating drum 26 by guide rollers 24 and 25.

A source material 28, such as aluminum or aluminum oxide, contained in a crucible 27 is heated and vaporized, and the vaporized source material 28 is deposited on the fluorocarbon resin sheet 1 wound around the cooling coating drum 26. When necessary, oxygen gas is blown through an oxygen gas supply opening 29 into the vacuum chamber 22. The evaporated source material 28 is deposited through masks 30 on the fluorocarbon resin sheet 1 in a deposited inorganic oxide thin film, such as an aluminum oxide deposited thin film. The fluorocarbon resin sheet 1 coated with the deposited inorganic oxide thin film, such as an aluminum oxide deposited thin film, is guided through guide rollers 25' and 24' and is taken up in a take-up roll 31. A multilayer deposited inorganic oxide thin film consisting of a plurality of inorganic oxide films can be formed on a fluorocarbon resin sheet by forming a first deposited inorganic oxide thin film on a fluorocarbon resin sheet by a first processing cycle by the continuous vacuum evaporation system, and forming a second deposited inorganic oxide thin film on the first deposited inorganic oxide thin film by a second processing cycle by the same continuous vacuum evaporation system. It is also possible to form the multilayer deposited inorganic oxide thin film consisting of a plurality of deposited inorganic oxide thin films by successively processing the fluorocarbon resin sheet by a plurality of continuous vacuum evaporation systems similar to the foregoing continuous vacuum evaporation system.

Basically, the deposited inorganic oxide thin film may be a deposited thin film of a metal oxide, such as the oxide of silicon (Si), aluminum (Al), magnesium (Mg), Calcium (Ca), potassium (K), tin (Sn), sodium (Na), boron (B), titanium (Ti), lead (Pb), zirconium (Zr), yttrium (Y) or the like.

Preferable metal oxide deposited thin films are those of oxides of silicon (Si) and aluminum (Al).

The metal oxide deposited thin film can referred to as metal oxide, such as silicon oxide, aluminum oxide and magnesium oxide. Those metal oxides are represented by $MO_x$ ($SiO_x$, $AlO_x$, $MgO_x$), where "x" is dependent on the valence of the metal.

The values of "xx" re 0 to 2 for silicon (Si), 0 to 1.5 for aluminum (Al), 0 to 1 for magnesium (Mg), 0 to 1 for calcium (Ca), 0 to 0.5 for potassium (K), 0 to 2 for tin (Sn), 0 to 0.5 for sodium (Na), 0 to 1.5 for boron (B), 0 to 2 for titanium (Ti), 0 to 2 for lead (Pb), 0 to 2 for zirconium (Xr) and 0 to 1.5 for yttrium (Y).

When x=0, the material is a metal, the film of the material is not transparent and hence cannot be used. When the value of "x" is a maximum, the material is a complete oxide of the metal.

Although dependent on the kind of the metal or the metal oxide, the thickness of the inorganic oxide thin film is, for example, in the range of about 50 to about 2000 Å, preferably, about 100 to about 1000 Å. A mixture of different metals or a mixture of different metal oxides may be used for forming the deposited inorganic oxide thin film. The deposited inorganic oxide thin film may be a film of a mixture of different inorganic oxides.

Further description will be given of the formation of the deposited inorganic oxide thin film by a chemical vapor deposition process. The deposited inorganic oxide thin film can be formed by a chemical vapor deposition process, such as a plasma chemical vapor deposition process, a thermal chemical vapor deposition process or a photochemical vapor deposition process.

More concretely, a deposited thin film of an inorganic oxide, such as silicon oxide can be formed by a low-temperature plasma chemical vapor deposition process using an evaporation monomer gas, such as an organic silicon compound gas, as a source gas, an inert gas, such as argon gas or helium gas, as a carrier gas and oxygen gas as an oxygen supply gas. The low-temperature plasma chemical vapor deposition process is carried out by a low-temperature plasma chemical vapor deposition system. The low-temperature plasma chemical vapor deposition system may use, for example, a radio frequency plasma producing system, a pulse-wave plasma producing system or a microwave plasma producing system. It is desirable to use a radio frequency plasma producing system to produce a highly active, stable plasma.

Figure 9:
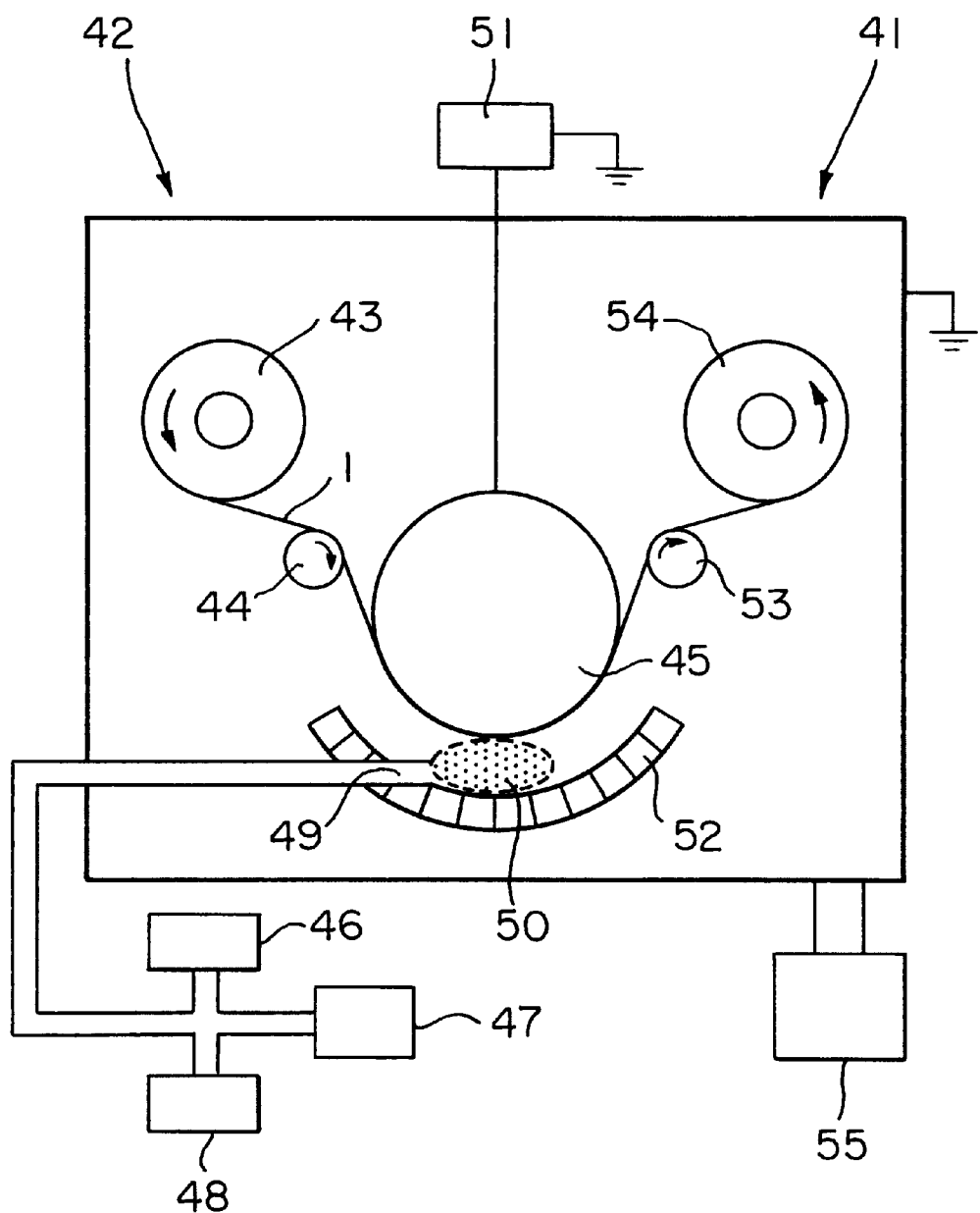
FIG. 9 is a diagrammatic view of a low-temperature plasma chemical vapor deposition system for forming an inorganic oxide thin film by a physical vapor deposition process for vapor deposition.

A low-temperature plasma chemical vapor deposition process for forming the deposited inorganic oxide thin film will concretely be described by way of example. FIG. 9 is a diagrammatic view of a low-temperature plasma chemical vapor deposition system for carrying out the low-temperature plasma chemical vapor deposition process for forming the deposited inorganic oxide thin film.

Referring to FIG. 9, in a low-temperature plasma chemical vapor deposition system 41, a fluorocarbon resin sheet 1 unwound from a feed roll 43 disposed in a vacuum chamber 42 is guided to the circumference of a cooling electrode drum 45 by guide roller 44 at a predetermined moving speed.

Oxygen gas, an inert gas, a deposition monomer gas, such as an organic silicon compound gas, and such are supplied from gas supply units 46 and 47 and a source material volatilizing unit 48. The composition of a mixed gas consisting of oxygen gas, the inert gas, the deposition monomer gas and such is adjusted. The mixed gas of a predetermined composition is supplied through a gas supply nozzle 49 into the vacuum chamber 42. A plasma 50 is produced on the fluorocarbon resin sheet 1 wound round the cooling electrode drum 45 by glow discharge to deposit a deposited thin film of an organic oxide, such as silicon oxide, on the fluorocarbon resin sheet 1.

Predetermined power is supplied to the cooling electrode drum 45 by a power supply 51 disposed outside the vacuum chamber 42. A magnet 52 is disposed near the cooling electrode drum 45 to promote the production of the plasma. The fluorocarbon resin sheet 1 provided with the deposited thin film of the inorganic oxide, such as silicon oxide, is guided to a take-up roll 54 by a guide roller 53 and is taken up on the take-up roll 54. Thus, the deposited inorganic oxide thin film can be formed by the plasma chemical vapor deposition process. In FIG. 9, indicated at 55 is a vacuum pump.

The foregoing protective sheet and the foregoing method of fabricating the same are only examples and are not to be construed to limit the scope of the present invention.

The deposited inorganic oxide thin film is not limited to a single-layer deposited inorganic oxide thin film but may be a multilayer film consisting of a plurality of deposited thin films of an inorganic oxide, or a composite film consisting of a plurality of deposited thin films respectively formed of different inorganic oxides.

According to the present invention, a multilayer deposited inorganic oxide thin film consisting of a plurality of inorganic oxide films can be formed on a fluorocarbon resin sheet by forming a first deposited inorganic oxide thin film on a fluorocarbon resin sheet by a first processing cycle by the low-temperature plasma chemical vapor deposition system, and forming a second deposited inorganic oxide thin film on the first deposited inorganic oxide thin film by a second processing cycle by the same low-temperature plasma chemical vapor deposition system. It is also possible to form the multilayer deposited inorganic oxide thin film consisting of a plurality of deposited inorganic oxide thin films by successively processing the fluorocarbon resin sheet by a plurality of low-temperature plasma chemical vapor deposition systems similar to the foregoing low-temperature plasma chemical vapor deposition system.

Monomer gases suitable for depositing the deposited thin film of an inorganic oxide, such as silicon oxide are those of 1,1,3,3-tetramethyldisiloxane, hexamethyldisiloxane, vinyl trimethylsilane, methyl trimethylsilane, hexamethyldisilane, methylsilane, dimethylsilane, trimethylsilane, diethylsilane, propylsilane, phenylsilane, vinyl triethoxysilane, vinyl trimethoxysilane, tetramethoxysilane, tetraethoxysilane, phenyltrimethoxysilane, methyltriethoxysilane, octamethylcyclotetrasiloxane and the like.

Among the foregoing organic silicon compounds, 1,1,3,3-tetramethyldisiloxane or hexamethyldisiloxane is particularly preferable in view of facility in handling and the characteristics of a deposited thin film formed by using the same as a source gas.

The inert gas is, for example, argon gas, helium gas or the like.

A silicon oxide deposited thin film formed by the foregoing process according to the present invention is a reaction product produced through the interaction of the monomer gas of an inorganic silicon compound or the like and oxygen gas and firmly adhering to the fluorocarbon resin sheet and is dense and highly flexible. The silicon oxide deposited thin film is a continuous deposited thin film containing silicon oxide indicated by $SiO_x$ (x=0 to 2) as a principal component.

Preferably, the deposited thin film of silicon oxide contains a deposited thin film of silicon oxide indicted by a chemical formula $SiO_x$ (x=1.3 5o 1.9) as a principal component, in view of transparency and barrier effect.

The value of x of $SiO_x$ is dependent on the mole ratio between the monomer gas and oxygen gas, the energy of the plasma and the like. Generally, the gas permeability is lower, the deposited thin film becomes yellowish and the transparency of the deposited thin film is lower when the value of x is smaller The silicon oxide deposited thin film contains silicon (Si) and oxygen (O) as its essential constituent elements, and contains a very small amount of carbon (C),hydrogen (H) or both carbon (C) and hydrogen (H). The thickness of the silicon oxide deposited thin film is in the range of 50 to 500 Å. The content ratio between the essential constituent elements and the minor elements varies continuously in a direction along the thickness.

The foregoing physical properties of the silicon oxide deposited thin film can be determined through the elementary analysis of the silicon oxide deposited thin film, in which the silicon oxide deposited thin film is analyzed through ion etching in the direction of the depth, by surface analyzer, such as an x-ray photoelectron spectroscope for x-ray photoelectron spectroscopy (XPS) or a secondary ion mass spectroscope for secondary ion mass spectroscopy (SIMS).

Desirably, the thickness of the silicon oxide deposited thin film is in the range of about 50 to about 2000 Å. More concretely, it is desirable that the thickness is in the range of about 100 to 1000 Å. A thickness greater than 1000 Å, more specifically, greater than 2000 Å is undesirable, because a silicon oxide deposited thin film of such a great thickness is liable to crack. A thickness less than 100 Å, more specifically, less than 50 Å is undesirable, because a silicon oxide deposited thin film of such a small thickness is incapable of functioning as a barrier film.

The thickness can be measured by a fundamental parameter method using, for example, a fluorescent x-ray spectrometer (RIX2000, available from K. K. Rigaku).

The thickness of the silicon oxide deposited thin film can be changed by increasing the silicon oxide deposition rate by increasing the respective flow rates of the monomer gas and oxygen gas or by reducing the deposition rate.

Each of the component deposited inorganic oxide thin films of the protective sheet in accordance with the present invention for a solar battery module, and the solar battery module in accordance with the present invention may be a composite film consisting of a plurality of deposited thin films of different inorganic oxides formed by using, for example, both the physical vapor deposition process and the chemical vapor deposition process in combination.

It is desirable to form such a composite film consisting of a plurality of deposited thin films of different inorganic oxides by first depositing a dense, highly flexible, relatively hard-to-crack inorganic oxide thin film on a fluorocarbon resin sheet by a chemical vapor deposition process, and then depositing a deposited inorganic oxide thin film on the previously formed deposited inorganic oxide thin film by a physical vapor deposition process.

Naturally, such a composite film consisting of a plurality of deposited thin films may be formed by first depositing an inorganic oxide thin film on a fluorocarbon resin sheet by a physical vapor deposition process, and then depositing a dense, highly flexible, relatively hard-to-crack inorganic oxide thin film on the previously deposited inorganic oxide thin film by a chemical vapor deposition process.

An ordinary front surface protective sheet included in a solar battery module will be described. The front surface protective sheet must be highly transparent to sunlight and insulating, must be satisfactory in properties including weather-resistant properties including heat resistance, light resistance and water resistance, wind endurance, hailstorm resistance, chemical resistance, moisture-proof property and soil resistance, must be excellent in physical or chemical strength and toughness, must be highly durable, and must be excellent in scratch resistance and impact absorbing property for the protection of solar cells as photovoltaic cells.

Glass sheets, and films or sheets of various resins including fluorocarbon resins, polyamide resins (nylons), polyester resins, polyethylene resins, polypropylene resins, cyclic polyolefin resins, polystyrene resins, polymethyl methacrylate resins, polycarbonate resins acetal resins and cellulose resins are possible materials for the protective sheet.

The films or sheets of those resins may be uniaxially or biaxially oriented films or sheets.

The thickness of the films or sheets is in the range of about 12 to about 200 μm, preferably, in the range of about 25 to about 150 μm.

Description will be given of the filler layer 12 underlying the front surface protective sheet in accordance with the present invention included in the solar battery module. The filler layer 12 must be transparent to transmit and absorb incident sunlight and must be adhesive to the front surface protective sheet. The filler layer 12 must be thermoplastic to keep the surfaces of the solar cells, i.e., photovoltaic cells, flat and smooth and must be excellent in scratch resistance and impact absorbing property to protect the solar cells, i.e., photovoltaic cells.

Materials suitable for forming the filler layer 12 are, for example, fluorocarbon resins, ethylene-vinyl acetate copolymers, ionomers, ethylene-acrylic acid or -methacrylic acid copolymers, polyethylene resins, polypropylene resins, acid-modified polyolefin resins produced by modifying polyolefin resins, such as polyethylene resins or polypropylene resins, by unsaturated carboxylic acid, such as acrylic acid, itaconic acid, maleic acid or fumaric acid, polyvinyl butyral resins, silicone resins, epoxy resins, (meta) acrylic resins, and mixtures of some of those resins.

The resin forming the filler layer 12 may contain additives including a crosslinking agent, a thermal oxidation inhibitor, a light stabilizer, an ultraviolet absorber and a photooxidation inhibitor by an amount that will not affect adversely to the transparency of the resin to improve the weather-resistant properties including heat resistance, light resistance and water resistance.

From the viewpoint of ensuring weather-resistant properties including light resistance, heat resistance and water resistance, desirable materials for forming the filler layer on the sunlight receiving side are fluorocarbon resins and ethylene-vinyl acetate resins.

The thickness of the filler layer is in the range of about 200 to about 1000 μm, preferably, in the range of about 350 to about 600 μm.

The solar cells 13, i.e., photovoltaic cells, of the solar battery module will be described. The solar cells 13 may be known solar cells, such as crystalline silicon solar cells, polycrystalline silicon solar cells, amorphous silicon solar cells, copper-indium-selenide solar cells, compound semiconductor solar cells and the like.

The present invention may employ polycrystalline silicon thin-film solar cells, microcrystalline silicon thin-film solar cells, hybrid solar cells formed by combining crystalline silicon thin-film solar cells and amorphous silicon solar cells.

The filler layer 14 underlying the solar cells of the solar battery module will be described. The filler layer 14, similarly to the filler layer 12 underlying the front surface protective sheet, must be adhesive to the back surface protective sheet. The filler layer 14 must be thermoplastic to keep the surfaces of the solar cells, i.e., photovoltaic cells, flat and smooth and must be excellent in scratch resistance and impact absorbing property to protect the solar cells, i.e., photovoltaic cells.

Differing from the filler layer 12 underlying the front surface protective sheet, the filler layer 14 underlying the solar cells of the solar battery module need not necessarily be transparent.

The filler layer 14, similarly to the filler layer 12 underlying the front surface protective sheet, may be formed of one of materials including fluorocarbon resins, ethylene-vinyl acetate copolymers, ionomers, ethylene-acrylic acid or -methacrylic acid copolymers, polyethylene resins, polypropylene resins, acid-modified polyolefin resins produced by modifying polyolefin resins, such as polyethylene resins or polypropylene resins, by unsaturated carboxylic acid, such as acrylic acid, itaconic acid, maleic acid or fumaric acid, polyvinyl butyral resins, silicone resins, epoxy resins, (meta) acrylic resins, and mixtures of some of those resins.

The resin forming the filler layer 14 may contain additives including a crosslinking agent, a thermal oxidation inhibitor, a light stabilizer, an ultraviolet absorber and a photooxidation inhibitor by an amount that will not affect adversely to the transparency of the resin to improve the weather-resistant properties including heat resistance, light resistance and water resistance.

The thickness of the filler layer is in the range of about 200 to about 1000 μm, preferably, in the range of about 350 to about 600 μm.

An ordinary back surface protective sheet included in a solar battery module will be described. The back surface protective sheet must be an insulating resin film or sheet. The back surface protective sheet must be satisfactory in weather-resistant properties including heat resistance, light resistance and water resistance, must be excellent in chemical or physical strength and toughness, and must be excellent in scratch resistance and impact absorbing property for the protection of solar cells as photovoltaic cells.

Films or sheets of various resins including polyamide resins (nylons), polyester resins, polyethylene resins, polypropylene resins, cyclic polyolefin resins, polystyrene resins, polycarbonate resins, acetal resins, cellulose resins (meta)acrylic resins and fluorocarbon resins are possible materials for the protective sheet.

The films or sheets of those resins may be uniaxially or biaxially oriented films or sheets.

The thickness of the films or sheets is in the range of about 12 to about 200 μm, preferably, in the range of about 25 to about 150 μm.

The solar battery module of the present invention may be provided with an additional weather-resistant sheet for the improvement of the strength, weather resistance, scratch resistance and the durability of the solar battery module. Possible materials for forming the additional weather-resistant sheet are, for example, low-density polyethylenes, medium-density polyethylenes, high-density polyethylenes, linear low-density polyethylenes, polypropylenes, ethylene-propylene copolymers, ethylene-vinyl acetate copolymers, ionomers, ethylene-ethyl acrylate copolymers, ethylene-acrylate or -methacrylate copolymers, methyl pentene polymers, polybutene resins, polyvinyl chloride resins, polyvinyl acetate resins, polyvinylindene chloride resins, vinyl chloride-vinylidene chloride copolymers, poly(meta)acrylic resins, polyacrylonitrile resins, polystyrene resins, acrylonitrile-styrene copolymers (AS resins), acrylonitrile-butadiene-styrene copolymers (ABS resins), polyester resins, polyamide resins, polycarbonate resins, polyvinyl alcohol resins, saponified ethylene-vinyl acetate copolymers, fluorocarbon resins, diene resins, polyacetal resins, polyurethane resins, nitrocellulose, polymers obtained by the polymerization of cyclopentadiene, cyclopentadiene derivatives, dicyclopentadiene, dicyclopentadiene derivatives, cyclohexadiene, cyclohexadiene derivatives, norbornadiene, norbornadiene derivatives and cyclic dienes, transparent cyclic polyolefin resins produced by the copolymerization of the cyclic diene, and one or some of olefin monomers including ethylene, propylene, 4-methyl-1-pentene, styrene, butadiene, isoprene and the like, and other known resins. The additional weather-resistant sheet may be disposed on the deposited inorganic oxide thin film.

The films or sheets of those resins may be nonoriented, uniaxially oriented or biaxially oriented.

There is no restriction on the thickness of those films or sheets; the thickness of the films or sheets may be in the range of several micrometers to about 300 µm.

The films or sheets may be extruded films, blown films or coating films.

A method of fabricating the solar battery module in accordance with the present invention using the foregoing materials will be described hereinafter. The method of fabricating the solar battery module uses the protective sheet in accordance with the present invention for a solar battery module as the front surface protective sheet or the back surface protective sheet of the solar battery module. The solar battery module is fabricated by superposing the protective sheet, the filler layer, a photovoltaic layer of the solar cells, i.e., photovoltaic cells, the filler layer and a generally known back surface protective sheet in that order in a superposed structure, and subjecting the superposed structure to a generally known forming process, such as a lamination process, in which those component layers of the superposed structure are brought into close contact by vacuum and are bonded together by hot pressing. The deposited inorganic oxide thin film of the front surface protective sheet faces inside. When necessary, other layers are interposed between those component layers.

When necessary, layers of a hot-melt adhesive, a solvent adhesive, a photocurable adhesive or the like containing a (meta)acrylic resin, an olefin resin, a vinyl resin or the like as a principal component of its vehicle may be formed between the component layers to enhance the adhesion between the adjacent component layers.

When necessary, the contact surfaces of the adjacent component layers may be pretreated by a pretreatment process, such as a corona discharge process, ozonizing process, a low-temperature plasma process using oxygen gas or nitrogen gas, an atmospheric pressure plasma process, glow discharge process, an oxidation process using a chemical or the like to enhance the adhesion between the contact surfaces.

A pretreatment layer of a primer, an undercoating material, an adhesive or an anchoring agent or the like may be formed on the contact surfaces of the adjacent component layers for a surface pretreatment process.

The pretreatment layer may be formed of a resin compound containing as a principal component of its vehicle one of resins including, for example, polyester resins, polyamide resins, polyurethane resins, epoxy resins, phenolic resins, (meta)acrylic resins, polyvinyl acetate resins, polyolefin resins, such as polyethylene resins or polypropylene resins, copolymers or modifications of polyolefin resins and cellulose resins.

The coating layer may be formed of a coating material of a solvent type, an aqueous type or an emulsion type by a roll coating process, a gravure coating process, a kiss-roll coating process or the like.

The surface pretreatment process may form a deposited inorganic oxide thin film of a thickness in the range of about 20 to about 100 Å, preferably, in the range of about 30 to 60 Å not having barrier effect to improve the adhesion between the adjacent component layers by a process similar to the foregoing process for forming the deposited inorganic oxide thin film.

EXAMPLES

Examples of the first embodiment will be described hereinafter.

Example 1

(1) A roll of a 50 µm thick polyvinyl fluoride sheet (PVF sheet), i.e., base sheet, was mounted on a feed roll of a continuous vacuum evaporation system. The polyvinyl fluoride sheet was unwound and wound around a coating drum and a 500 Å thick deposited aluminum oxide thin film was deposited on a treated surface of the polyvinyl fluoride sheet treated for adhesion improvement by a reactive vacuum evaporation process of an electron beam (EB) heating system. Aluminum was used as an evaporation source and oxygen gas was supplied to the continuous vacuum evaporation system.

Deposition conditions:

Evaporation source: Aluminum

Vacuum in vacuum chamber: $7.5 \times 10^{-6}$ mbar

Vacuum in deposition chamber: $2.1 \times 10^{-6}$ mbar

EB power: 40 kW

Sheet moving speed: 600 m/min (2) A protective sheet in accordance with the present invention for a solar battery module was completed by subjecting the 500 Å thick deposited aluminum oxide thin film formed on the surface of the polyvinyl fluoride sheet to a glow-discharge plasma process to form a plasma-processed surface. The glow-discharge plasma process was carried out by a glow-discharge plasma producing apparatus of 1500 W in plasma output immediately after the deposition of the 500 Å thick deposited aluminum oxide thin film. In the glow-discharge plasma process, an oxygen/argon mixed gas of 19/1 in $O_2/Ar$ ratio was supplied so that the pressure of the oxygen/argon mixed gas is maintained at $6 \times 10^{-5}$ torr and the processing speed was 420 m/min.

(3) A solar battery module was fabricated by using the protective sheet thus fabricated. The protective sheet, a 400 µm thick ethylene-vinyl acetate copolymer sheet, a 38 µm thick biaxially oriented polyethylene terephthalate film provided with an array of amorphous silicon solar cells, a 400 µm thick ethylene-vinyl acetate copolymer sheet and a 50 µm a thick biaxially oriented polyethylene terephthalate film were superposed in that order with the plasma-processed deposited aluminum oxide thin film facing inside and the surface of the 38 µm thick biaxially oriented polyethylene terephthalate film provided with the array of amorphous silicon solar cells facing the front surface protective sheet. Those component layers were laminated by using adhesive layers of an acrylic resin to complete a solar battery module.

(4) Another protective sheet in accordance with the present invention and another solar battery module of the same components were fabricated by the same processes, except that a 50 µm thick fluorocarbon resin sheet of an ethylene-tetrafluoroethylene copolymer (ETFE) was used instead of the 50 µm thick polyvinyl fluoride sheet (PVF sheet) e Example 2

(1) A roll of a 50 µm thick polyvinyl fluoride film (PVF film), i.e., base sheet, was mounted on a feed roll of a plasma chemical vapor deposition system. A 500 Å thick deposited silicon oxide thin film was deposited on a treated surface of the polyvinyl fluoride film treated for adhesion improvement under the following conditions.

Deposition conditions:

Reaction gas mixing ratio: Hexamethyldisiloxane/ oxygen/helium=1/10/10 (Unit: slm)

Vacuum in vacuum chamber: $5.0 \times 10^{-6}$ mbar

Vacuum in deposition chamber: $6.0 \times 10^{-2}$ mbar

Power supplied to cooling electrode drum: 20 kW

Film moving speed: 80 m/min

Surface for vapor deposition: Corona-processed surface (2) A protective sheet in accordance with the present invention for a solar battery module was completed by subjecting the 500 Å thick deposited silicon oxide thin film formed on the surface of the polyvinyl fluoride film to a corona discharge process to form a corona-processed surface and to increase the surface tension of the deposited silicon oxide thin film from 35 dyne to 60 dyne. Corona discharge power was 10 kW and the sheet was moved at a moving speed of 100 m/min.

(3) A solar battery module was fabricated by using the protective sheet thus fabricated as a front surface protective sheet. The front surface protective sheet, a 400 μm thick ethylene-vinyl acetate copolymer sheet, a 38 μm thick biaxially oriented polyethylene terephthalate film provided with an array of amorphous silicon solar cells, a 400 μm thick ethylene-vinyl acetate copolymer sheet and a 50 μm thick biaxially oriented polyethylene terephthalate film were superposed in that order with the corona-processed deposited silicon oxide thin film facing inside and the surface of the 38 μm thick biaxially oriented polyethylene terephthalate film provided with the array of amorphous silicon solar cells facing the front surface protective sheet. Those component layers were laminated by using adhesive layers of an acrylic resin to complete a solar battery module.

(4) Another protective sheet in accordance with the present invention and another solar battery module of the same components were fabricated by the same processes, except that a 50 μm thick fluorocarbon resin sheet of an ethylene-tetrafluoroethylene copolymer (ETFE) was used instead of the 50 μm thick polyvinyl fluoride sheet (PVF sheet).

Example 3

(1) A roll of a 50 μm thick polyvinyl fluoride film (PVF film) containing an ultraviolet absorber was mounted on a feed roll of a plasma chemical vapor deposition system. A 500 Å thick deposited silicon oxide thin film was deposited on a treated surface of the polyvinyl fluoride film treated for adhesion improvement under the following conditions.

Deposition conditions:

Reaction gas mixing ratio: Hexamethyldisiloxane/ oxygen/helium=1/10/10 (unit: slm)

Vacuum in vacuum chamber: $5.0 \times 10^{-5}$ mbar

Vacuum in deposition chamber: $6.0 \times 10^{-2}$ mbar

Power supplied to cooling electrode drum: 20 kW

Film moving speed: 80 m/min

Surface for deposition: Corona-processed surface

The surface of the 500 Å thick deposited silicon oxide thin film formed on the polyvinyl fluoride film was subjected to a corona discharge process to form a corona-processed surface to increase the surface tension of the deposited silicon oxide thin film from 35 dyne to 60 dyne. Corona discharge power was 10 kw and the sheet was moved at a moving speed of 100 m/min.

(2) A roll of the polyvinyl fluoride film provided with the corona-processed deposited silicon oxide thin film was mounted on a feed roll of a continuous vacuum evaporation system. The polyvinyl fluoride film was unwound and wound around a coating drum and a 500 Å thick deposited aluminum oxide thin film was deposited on the corona-processed surface of the deposited silicon oxide thin film formed on the polyvinyl fluoride film by a reactive vacuum evaporation process of an electron beam (EB) heating system. Aluminum was used as an evaporation source and oxygen gas was supplied to the continuous vacuum evaporation system.

Deposition conditions:

Evaporation source: Aluminum

Vacuum in vacuum chamber: $7.5 \times 10^{-6}$ mbar

Vacuum in deposition chamber: $2.1 \times 10^{-6}$ mbar

EB power: 40 kW

Film moving speed: 600 m/min

A protective sheet in accordance with the present invention for a solar battery module was completed by subjecting the 500 Å thick deposited aluminum oxide thin film formed on the surface of the polyvinyl fluoride sheet to a glow-discharge plasma process to form a plasma-processed surface. The glow-discharge plasma process was carried out by a glow-discharge plasma producing apparatus of 1500 W in plasma output immediately after the deposition of the 500 Å thick deposited aluminum oxide thin film. In the glow-discharge plasma process, an oxygen/argon mixed gas of 19/1 in $O_2$/Ar ratio was supplied so that the pressure of the oxygen/argon mixed gas is maintained at $6 \times 10^{-5}$ torr and the processing speed was 420 m/min.

(3) A solar battery module was fabricated by using the protective sheet thus fabricated as a front surface protective sheet. The protective sheet, a 400 μm thick ethylene-vinyl acetate copolymer sheet, a 38 μm thick biaxially oriented polyethylene terephthalate film provided with an array of amorphous silicon solar cells, a 400 μm thick ethylene-vinyl acetate copolymer sheet and a 50 μm thick biaxially oriented polyethylene terephthalate film were superposed in that order with the plasma-processed deposited aluminum oxide thin film facing inside and the surface of the 38 μm thick polyethylene terephthalate film provided with the array of amorphous silicon solar cells facing the front surface protective sheet. Those component layers were laminated by using adhesive layers of an acrylic resin to complete a solar battery module.

(4) Another protective sheet in accordance with the present invention and another solar battery module of the same components were fabricated by the same processes, except that a 50 μm thick fluorocarbon resin sheet of an ethylene-tetrafluoroethylene copolymer (ETFE) was used instead of the 50 μm thick polyvinyl fluoride film (PVF film).

Example 4

(1) Protective sheets that are the same as the protective sheet in Example 1 were used as the front surface protective sheet and the back surface protective sheet of a solar battery module. The solar battery module was fabricated by superposing the front surface protective sheet, a 400 μm thick ethylene-vinyl acetate copolymer sheet, a 38 μm thick biaxially oriented polyethylene terephthalate film provided with an array of amorphous silicon solar cells, a 400 μm thick ethylene-vinyl acetate copolymer sheet and the back surface protective sheet in that order with the plasma-processed deposited aluminum oxide thin films of the front surface and the back surface protective sheet facing inside and with the surface of the 38 μm thick polyethylene terephthalate film provided with the solar cells facing the front surface protective sheet, and laminating those component layers by using adhesive layers of an acrylic resin.

(2) Protective sheets in accordance with the present invention and another solar battery module of the same components were fabricated by the same processes, except that 50 μm thick fluorocarbon resin sheets of an ethylene-tetrafluoroethylene copolymer (ETFE) were used instead of the 50 μm thick polyvinyl fluoride sheets (PVF sheet).

Example 5

(1) Protective sheets that are the same as the protective sheet in Example 2 were used as the front surface protective sheet and the back surface protective sheet of a solar battery module. The solar battery module was fabricated by superposing the front surface protective sheet, a 400 μm thick ethylene-vinyl acetate copolymer sheet, a 38 μm a thick biaxially oriented polyethylene terephthalate film provided with an array of amorphous silicon solar cells, a 400 μm thick ethylene-vinyl acetate copolymer sheet and the back surface protective sheet in that order with the plasma-processed deposited silicon oxide thin films of the front surface and the back surface protective sheet facing inside and with the surface of the 38 μm thick polyethylene terephthalate film provided with the array of amorphous silicon solar cells facing the front surface protective sheet, and laminating those component layers by using adhesive layers of an acrylic resin.

(2) Protective sheets in accordance with the present invention and another solar battery module of the same components were fabricated by the same processes, except that 50 μm thick fluorocarbon resin sheets of an ethylene-tetrafluoroethylene copolymer (ETFE) were used instead of the 50 μm thick polyvinyl fluoride sheets (PVF sheet).

Example 6

(1) Protective sheets that are the same as the protective sheet in Example 3 were used as the front surface protective sheet and the back surface protective sheet of a solar battery module. The solar battery module was fabricated by superposing the front surface protective sheet, a 400 μm thick ethylene-vinyl acetate copolymer sheet, a 38 μm thick biaxially oriented polyethylene terephthalate film provided with an array of amorphous silicon solar cells, a 400 μm thick ethylene-vinyl acetate copolymer sheet and the back surface protective sheet in that order with the plasma-processed deposited aluminum oxide thin films of the front surface and the back surface protective sheet facing inside and with the surface of the 38 μm thick polyethylene terephthalate film provided with the array of amorphous silicon solar cells facing the front surface protective sheet, and laminating those component layers by using adhesive layers of an acrylic resin.

(2) Protective sheets in accordance with the present invention and another solar battery module of the same components were fabricated by the same processes, except that 50 μm thick fluorocarbon resin sheets of an ethylene-tetrafluoroethylene copolymer (ETFE) containing an ultraviolet absorber were used instead of the 50 μm thick polyvinyl fluoride sheets (PVF sheet) containing the ultraviolet absorber.

Example 7

(1) A protective sheet that is the same as the protective sheet in Example 1 was used as the back surface protective sheet of a solar battery module. The solar battery module was fabricated by superposing a 3 mm thick glass sheet, a 400 μm thick ethylene-vinyl acetate copolymer sheet, a 38 μm thick biaxially oriented polyethylene terephthalate film provided with an array of amorphous silicon solar cells, a 400 μm thick ethylene-vinyl acetate copolymer sheet and the back surface protective sheet in that order with the plasma-processed deposited aluminum oxide thin film of the back surface protective sheet facing inside and with the surface of the 38 μm thick polyethylene terephthalate film provided with the array of amorphous silicon solar cells facing the 3 mm thick glass sheet, and laminating those component layers by using adhesive layers of an acrylic resin.

(2) A protective sheet in accordance with the present invention and another solar battery module of the same components were fabricated by the same processes, except that a 50 μm thick fluorocarbon resin sheet of an ethylene-tetrafluoroethylene copolymer (ETFE) was used instead of the 50 μm thick polyvinyl fluoride sheet (PVF sheet).

Example 8

(1) A protective sheet that is the same as the protective sheet in Example 2 was used as the back surface protective sheet of a solar battery module. The solar battery module was fabricated by superposing a 50 μm thick polyvinyl fluoride sheet (PVF sheet), a 400 μm thick ethylene-vinyl acetate copolymer sheet, a 38 μm thick biaxially oriented polyethylene terephthalate film provided with an array of amorphous silicon solar cells, a 400 μm thick ethylene-vinyl acetate copolymer sheet and the back surface protective sheet in that order with the corona-processed deposited silicon oxide thin film of the back surface protective sheet facing inside and with the surface of the 38 μm thick polyethylene terephthalate film provided with the array of amorphous silicon solar cells facing the 50 μm thick polyvinyl fluoride sheet, and laminating those component layers by using adhesive layers of an acrylic resin.

(2) A protective sheet in accordance with the present invention and another solar battery module of the same components were fabricated by the same processes, except that a 50 μm thick fluorocarbon resin sheet of an ethylene-tetrafluoroethylene copolymer (ETFE) was used instead of the 50 μm thick polyvinyl fluoride sheet (PVF sheet).

Example 9

(1) A protective sheet that is the same as the protective sheet in Example 3 was used as the back surface protective sheet of a solar battery module. The solar battery module was fabricated by superposing a 50 μm thick polyvinyl fluoride sheet (PVF sheet), a 400 μm thick ethylene-vinyl acetate copolymer sheet, a 38 μm thick biaxially oriented polyethylene terephthalate film provided with an array of amorphous silicon solar cells, a 400 μm thick ethylene-vinyl acetate copolymer sheet and the back surface protective sheet in that order with the plasma-processed deposited aluminum oxide thin film of the back surface protective sheet facing inside and with the surface of the 38 μm thick polyethylene terephthalate film provided with the array of amorphous silicon solar cells facing the 50 μm thick polyvinyl fluoride sheet, and laminating those component layers by using adhesive layers of an acrylic resin.

(2) A protective sheet in accordance with the present invention and another solar battery module of the same components were fabricated by the same processes, except that a 50 μm thick fluorocarbon resin sheet of an ethylene-tetrafluoroethylene copolymer (ETFE) was used instead of the 50 μm thick polyvinyl fluoride sheet (PVF sheet).

Example 10

(1) A roll of a 50 μm thick fluorocarbon resin sheet of a ethylene-tetrafluoroethylene copolymer (ETFE) was mounted on a feed roll of a plasma chemical vapor deposition system. A 50 Å thick deposited silicon oxide thin film as a surface layer was deposited on a treated surface of the fluorocarbon resin sheet treated for adhesion improvement under the same conditions as those in Example 2.

Subsequently, a 800 Å thick deposited silicon oxide thin film was formed on the surface layer by the same process as that in Example 2. The surface of the 800 Å thick deposited silicon oxide thin film was subjected to the same corona discharge process as in Example 2 to increase the surface tension of the same from 35 dyne to 60 dyne and to form a protective sheet having a corona-processed surface in accordance with the present invention for a solar battery module.

(2) A solar battery module was fabricated by using the protective sheet thus fabricated as a front surface protective sheet. The front surface protective sheet, a 400 μm thick ethylene-vinyl acetate copolymer sheet, a 38 μm thick biaxially oriented polyethylene terephthalate film provided with an array of amorphous silicon solar cells, a 400 μm thick ethylene-vinyl acetate copolymer sheet and a 50 μm thick biaxially oriented polyethylene terephthalate film were superposed in that order with the corona-processed deposited silicon oxide thin film facing inside and the surface of the 38 μm thick biaxially oriented polyethylene terephthalate film provided with the solar cells facing the front surface protective sheet. Those component layers were laminated by using adhesive layers of an acrylic resin to complete a solar battery module.

(3) Another protective sheet in accordance with the present invention and another solar battery module of the same components were fabricated by the same processes, except that a 50 μm thick polyvinyl fluoride sheet (PVF sheet) was used instead of the 50 μm a thick fluorocarbon resin sheet of an ethylene-tetrafluoroethylene copolymer (ETFE).

Example 11

(1) Protective sheets that are the same as the protective sheet in Example 10 were used as the front surface protective sheet and the back surface protective sheet of a solar battery module. The solar battery module was fabricated by superposing the front surface protective sheet, a 400 μm thick ethylene-vinyl acetate copolymer sheet, a 38 μm thick biaxially oriented polyethylene terephthalate film provided with an array of amorphous silicon solar cells, a 400 μm thick ethylene-vinyl acetate copolymer sheet and the back surface protective sheet in that order with the corona-processed deposited silicon oxide thin films of the front surface and the back surface protective sheet facing inside and with the surface of the 38 μm thick polyethylene terephthalate film provided with the array of amorphous silicon solar cells facing the front surface protective sheet, and laminating those component layers by using adhesive layers of an acrylic resin.

(2) Protective sheets in accordance with the present invention and another solar battery module of the same components were fabricated by the same processes, except that 50 μm thick polyvinyl fluoride sheets (PVF sheets) were used instead of the 50 μm thick fluorocarbon resin sheets of an ethylene-tetrafluoroethylene copolymer (ETFE).

Comparative Example 1

A solar battery module was fabricated by superposing a 3 mm thick glass sheet, i.e., base sheet, as a back surface protective sheet, a 400 μm thick ethylene-vinyl acetate copolymer sheet, a 38 μm thick biaxially oriented polyethylene terephthalate film provided with an array of amorphous silicon solar cells, a 400 μm thick ethylene-vinyl acetate copolymer sheet and a 50 μm thick biaxially oriented polyethylene terephthalate film in that order with the surface of the 38 μm thick polyethylene terephthalate film provided with the array of amorphous silicon solar cells facing the 50 μm thick biaxially oriented polyethylene terephthalate film, and laminating those component layers by using adhesive layers of an acrylic resin.

Comparative Example 2

A solar battery module was fabricated by superposing a 50 μm thick polyvinyl fluoride sheet (PVF sheet), i.e., base sheet, as a front surface protective sheet, a 400 μm thick ethylene-vinyl acetate copolymer sheet, a 38 μm thick biaxially oriented polyethylene terephthalate film provided with an array of amorphous silicon solar cells, a 400 μm thick ethylene-vinyl acetate copolymer sheet and a 50 μm thick biaxially oriented polyethylene terephthalate film in that order with the surface of the 38 μm thick polyethylene terephthalate film provided with the array of amorphous silicon solar cells facing the 50 μm thick polyvinyl fluoride sheet, and laminating those component layers by using adhesive layers of an acrylic resin.

Comparative Example 3

A solar battery module was fabricated by superposing a 50 μm thick polyvinyl fluoride sheet (PVF sheet), i.e., base sheet, as a front surface protective sheet, a 400 μm in thick ethylene-vinyl acetate copolymer sheet, a 38 μm thick biaxially oriented polyethylene terephthalate film provided with an array of amorphous silicon solar cells, a 400 μm a thick ethylene-vinyl acetate copolymer sheet and a 50 μm thick polyvinyl fluoride sheet (PVF sheet) as a back surface protective sheet in that order with the surface of the 38 μm thick polyethylene terephthalate film provided with the array of amorphous silicon solar cells facing the front surface protective sheet, and laminating those component layers by using adhesive layers of an acrylic resin. and laminating those component layers by using adhesive layers of an acrylic resin.

Experiments

The protective sheets in Examples 1 to 11 of the present invention and those in Comparative examples 1 to 3 were subjected to total transmittance measurement. The solar battery modules in Examples 1 to 11 and Comparative examples 1 to 3 were subjected to solar battery module evaluation tests.

(1) Total Transmittance Measurement Total transmittance (%) of each of the protective sheets in Examples 1 to 11 and Comparative examples 1 to 3 against the total transmittance of the base sheet as a reference total transmittance was measured by a color computer.

(2) Solar Battery Module Evaluation Tests

The solar battery modules were subjected to environmental tests in conformity to conditions specified in JIS C8917-1989. Photovoltaic output of the solar battery modules was measured before and after environmental tests.

(3) Moisture Permeability and Oxygen Permeability

The moisture permeabilities of the protective sheets in Examples 1 to 11 and comparative examples 1 to 3 were measured in an atmosphere of 40° C. and 90% RH by a moisture permeability measuring apparatus (PERMATRAN, MOCON, USA). The oxygen permeabilities of the protective sheets in Examples 1 to 11 and Comparative examples 1 to 3 were measured in an atmosphere of 23° C. and 90%

RH by an oxygen permeability measuring apparatus (OXTRAN, MOCON, USA). Measured data is tabulated in Table 1-1.

TABLE 1-1

|  | Total transmittance (%) | Moisture permeability (g/m²/24 hr) | Oxygen permeability (cc/m²/24 hr/atm) | Output reduction Ratio (%) |
|---|---|---|---|---|
| Example 1 | 93 | 0.9 | 1.1 | 3 |
| Example 2 | 92 | 0.6 | 0.5 | 2 |
| Example 3 | 93 | 0.6 | 0.7 | 2 |
| Example 4 | 93 | 0.9 | 1.1 | 1 |
| Example 5 | 92 | 0.6 | 0.4 | 1 |
| Example 6 | 93 | 0.6 | 0.7 | 1 |
| Example 7 | 93 | 0.9 | 1.1 | 2 |
| Example 8 | 92 | 0.6 | 0.5 | 5 |
| Example 9 | 93 | 0.6 | 0.7 | 5 |
| Example 10 | 91 | 0.1 | 0.4 | 1 |
| Example 11 | 91 | 0.1 | 0.3 | 1 |
| Comparative Example 1 | 89 | 25.0 | 80.0 | 18 |
| Comparative Example 2 | 93 | 27.0 | 28.0 | 15 |
| Comparative Example 3 | 93 | 27.0 | 28.0 | 12 |

In table 1-1, moisture permeability is expressed in a unit of g/m²/day·40° C. ·100% RH (relative humidity), and oxygen permeability is expressed in a unit of cc/m²/day·23° C.·90% RH.

As obvious from Table 1-1, the protective sheets in Examples 1 to 11 have high total transmittances, respectively, and are excellent in moisture impermeability and oxygen impermeability.

The output reduction ratios of the solar battery modules employing the protective sheets in Examples 1 to 11 were low.

The protective sheets in Comparative examples 1 to 3 had high total transmittances, respectively. However, the moisture impermeabilities and the oxygen impermeabilities of the protective sheets in Comparative examples 1 to 3 were low. Consequently, the output reduction ratios of the solar battery modules employing the protective sheets in Comparative examples 1 to 3 were high.

As apparent from the foregoing description, the present invention takes notice of the properties of glass sheets that are used as the front surface protective sheets of solar battery modules, uses a fluorocarbon resin sheet as a base sheet, fabricates a protective sheet for a solar battery module by forming a transparent, vitreous deposited inorganic oxide thin film, such as a silicon oxide thin film or an aluminum oxide thin film, on one of the surfaces of the fluorocarbon resin sheet; the protective sheet thus fabricated is used as the front surface protective sheet or the back surface protective sheet of a solar battery module; the solar battery module is fabricated by, for example, superposing the protective sheet as a front surface protective sheet, a filler layer, a film provided with solar cells, i.e., photovoltaic cells, a filler layer and an ordinary back surface protective sheet for a solar battery module in that order in a superposed structure with the deposited inorganic oxide thin film facing inside, bringing the component layers of the superposed structure into close contact by vacuum and bonding together those component layers by a lamination process using hot pressing; and the protective sheet transmits sunlight at a high transmittance, is excellent in strength, weather resistance, heat resistance, water resistance, light resistance, wind endurance, hailstorm resistance, chemical resistance, moisture resistance and soil resistance, has a high impermeability to moisture and oxygen, limits performance degradation due to aging to the least extent, very durable, has excellent protective ability, and can be used for the stable fabrication of a low-cost, safe solar battery module.

Other examples of the present invention and comparative examples will be described hereinafter.

Example 12

Front Surface Protective Sheet

A transparent 25 µm thick ETFE film was used as a weather-resistant film. A 500 Å thick silicon oxide (SiO$_x$) thin film (gas-barrier layer) was deposited on one surface of the ETFE film by a PE-CVD process. A front surface protective sheet in Example 1 was fabricated by forming a 250 µm thick adhesive layer of a composite material prepared by homogeneously mixing 100 parts by weight of an ethylene-vinyl acetate copolymer having a vinyl acetate content of 35% by weight, 2 parts by weight of a crosslinking agent (DCP: dicumylperoxide) and 3 parts by weight of ultraviolet absorber (2,4-dihydroxybenzophenone) at 110° C. on the ETFE film by a calender coating process.

Back Surface Protective Sheet

Two white 38 µm thick PVF films and a 20 µm thick aluminum foil (gas barrier layer) were laminated by a dry lamination process to form a laminated structure of (38 µm thick white PVF film)/(20 µm thick aluminum foil)/(38 µm thick white PVF film). A back surface protective sheet in Example 1 was fabricated by forming a 250 µm thick composite resin layer of a composite material prepared by homogeneously mixing 100 parts by weight of an ethylene-vinyl acetate copolymer having a vinyl acetate content of 35% by weight, 1 part by weight of a crosslinking agent (DCP: dicumilperoxyd), 2 parts by weight of ultraviolet absorber (2,4-dihydroxybenzophenone) and 25 parts by weight of titanium oxide (white pigment) at 120° C. on the ETFE film by a calender coating process.

Example 13

Front Surface Protective Sheet

A transparent 25 µm thick PVF film was used as a weather-resistant film. A 400 Å thick aluminum oxide thin film (gas-barrier layer) was deposited on one surface of the PVF film by a PVD process. A coating liquid of an inorganic-organic hybrid material prepared by mixing 5 parts by weight of tetraethoxysilane and 95 parts by weight of an ethylene-vinyl alcohol copolymer was applied in a coating layer of 3 g/m² to the aluminum oxide thin film by a gravure coating process, and the coating layer was hot-dried to complete a composite gas-barrier layer. A 200 µm thick adhesive layer was formed on the composite gas-barrier layer by extruding a composite resin prepared by homogeneously mixing 100 parts by weight of an ethylene-vinyl acetate having a vinyl acetate content of 30% by weight, 1.5 parts by weight of a TBPH (2,5-dimethyl-2,5-di(t-butylperoxy)hexane), i.e., a crosslinking agent, 2 parts by weight of TAC (triallylcyanurate), i.e., a crosslinking auxiliary r and three parts by weight of silane coupling agent at 110° C. on the composite gas-barrier layer by an extrusion coating process to complete a front surface protective sheet in Example 2 for a solar battery module.

Back Surface Protective Sheet

Two white 25 µm thick weather-resistant polyethylene terephthalate films (hereinafter referred to as "white weather-resistant PET films") and a 20 µm thick aluminum foil (gas barrier layer) were laminated by a dry lamination process to form a laminated structure of (25 μm thick white weather-resistant PET film)/(20 μm thick aluminum foil)/(25 μm thick white weather-resistant PET film). A 200 μm thick adhesive layer of a composite material prepared by homogeneously mixing 100 parts by weight of an ethylene-vinyl acetate copolymer having a vinyl acetate content of 30% by weight, 1.5 part by weight of a TBPH (2,5-dimethyl-2,5-di (t-butylperoxy)hexane), i.e., a crosslinking agent, 1.5 parts by weight of TAC (triarylcyanurate), i.e., a crosslinking auxiliary, and 2 parts by weight of silane coupling agent at 110° C. was formed on one surface of the laminated structure by an extrusion coating process to complete a back surface protective sheet in Example 13 for a solar battery module.

Comparative Example 4

Front Surface Protective Sheet

A front surface protective sheet in Comparative example 4 is the same as the front surface protective sheet in Example 12, except that the deposited silicon oxide ($SiO_x$) thin film, i.e., a gas-barrier layer, is omitted.

Back Surface Protective Sheet

A back surface protective sheet in Comparative example 4 is the same as the back surface protective sheet in Example 12, except that the aluminum foil sandwiched between the two white PVF films is omitted.

Tests and Test Results

The front surface protective sheets and the back surface protective sheets in Examples 12 and 13 and Comparative example 4 for solar battery modules were subjected to the following tests. Test results are tabulated in Tables 1-2 and 1-3.

(1) Moisture permeabilities in an atmosphere of 40° C. and 90% RH and oxygen permeabilities in an atmosphere of 25° C. and 100% RH of the protective sheets were measured by a moisture permeability measuring apparatus (MOCON PERMATAN, Modern Control) and an oxygen permeability measuring apparatus (MOCON OXTRAN, Modern Control). Measured data is shown in Table 1-2.

TABLE 1-2

| Test Sample | Moisture permeability (g/m²/24 hr) | Oxygen permeability (cc/m²/24 hr/atm) |
|---|---|---|
| Example 12 Front surface protective film | 0.9 | 1.1 |
| Back surface protective film | ≦0.1 | ≦0.1 |
| Example 13 Front surface protective film | 0.2 | 0.4 |
| Back surface protective film | ≦0.1 | ≦0.1 |
| Comparative Example 4 Front surface protective film | 18 | 43 |
| Back surface protective film | 4.9 | 5.2 |

In table 1-2, moisture permeability is expressed in a unit of g/m²·atm day, and oxygen permeability is expressed in a unit of cc/m² ·atm -day.

(2) Solar battery modules in Examples 12 and 13 and Comparative example 4 were fabricated by combining the front surface protective sheets and the back surface protective sheets in Examples 12 and 13 and Comparative example 4 with solar batteries employing a microcrystalline silicon thin film formed by a PE-CVD process by a vacuum lamination process. The solar battery modules were subjected to tests to evaluate their performance and long-term stability, in which photoelectric conversion efficiency η (%) and fill factor (FF) were measured in an initial state and in a state after irradiation with 1 sun, at 50° C. for 2000 hr. Measured data is tabulated in Table 1-3.

TABLE 1-3

| | Characteristic of solar battery | | | |
|---|---|---|---|---|
| | Initial state | | State after exposure to 1 sun, 50° C., 2000 hr | |
| | Conversion efficiency η (%) | FF | Conversion efficiency η (%) | FF |
| Example 12 | 10.5 | 0.75 | 10.3 | 0.73 |
| Example 13 | 10.4 | 0.75 | 10.4 | 0.75 |
| Comparative Example 4 | 10.5 | 0.75 | 9.0 | 0.65 |

As obvious from the measured data shown in Tables 1-2 and 1-3, the protective sheets in Examples 12 and 13, which comprise the gas-barrier layer in addition to the weather-resistant film and the adhesive layers, are excellent in strength, weather resistance and heat resistance, have very small moisture permeabilities and oxygen permeabilities, respectively, and are highly gas-impermeable.

The solar battery modules in Examples 12 and 13 fabricated by sandwiching the microcrystalline silicon thin film, which deteriorates easily in an atmosphere containing moisture or oxygen, between the protective sheets in Example 12 or 13 maintains satisfactory photoelectric conversion efficiency and FF after being irradiated by 1 sun at 50° C. for 2000 hr. Thus, the solar battery modules in Examples 12 and 13 are excellent in long-term stability.

Second Embodiment

Protective sheets for solar battery modules, and solar battery modules in a second embodiment according to the present invention will be described with reference to FIGS. 1 to 9 which have been used for describing the first embodiment.

Referring to FIG. 1, a protective sheet A in accordance with the present invention for a solar battery module has a basic structure constructed by forming a deposited inorganic oxide thin film 2 on one of the surfaces of a weather-resistant sheet 1 of a cyclic polyolefin resin.

As shown in FIG. 3, a protective sheet $A_1$ in an example of the present invention for a solar battery module is formed by forming a multilayer film 4 consisting of at least two deposited inorganic oxide thin films 2 on one of the surfaces of a cyclic polyolefin resin sheet 1.

As shown in FIG. 4 a protective sheet $A_3$ in another example of the present invention for a solar battery module comprises a cyclic polyolefin resin sheet 1 and a composite film 5 formed on one of the surfaces of the cyclic polyolefin resin sheet 1. The composite film 5 consists of a first deposited inorganic oxide thin film 2a formed on one of the surfaces of the cyclic polyolefin resin sheet 1 by a chemical vapor deposition process, and a second deposited inorganic oxide thin film 2b of an inorganic oxide different from that of the first deposited inorganic oxide film 2a, formed on the first deposited inorganic oxide thin film 2a by a physical vapor deposition process.

Those protective sheets are only examples of the protective sheet in accordance with the present invention and the present invention is not limited thereto.

For example, in the protective sheet $A_3$ shown in FIG. 4, a deposited inorganic thin film may be formed first on the surface of the cyclic polyolefin resin sheet 1 a physical vapor deposition process, and then another deposited inorganic oxide thin film may be formed by a chemical vapor deposition process.

A solar battery module employing this protective sheet A embodying the present invention and shown in FIG. 1 will be described by way of example. Referring to FIG. 5, a solar battery module T employs the protective sheet A shown in FIG. 1 as its front surface protective sheet 11 (A). The solar battery module T is fabricated by superposing the protective sheet 11 (A), a filler layer 12, a photovoltaic layer 13 of solar cells, a filler layer 14 and a generally known back surface protective sheet 15 in that order in a superposed structure, and subjecting the superposed structure to a generally known forming process, such as a lamination process, in which those component layers of the superposed structure are brought into close contact by vacuum and are bonded together by hot pressing. The deposited inorganic oxide thin film 2 of the protective sheet 11 faces inside.

Another solar battery module $T_1$ shown in FIG. 6 employs the protective sheet A shown in FIG. 1 as its back surface protective sheet 16. The solar battery module $T_1$ is fabricated by superposing a generally known front surface protective sheet 17, a filler layer 12, a photovoltaic layer 13 of solar cells, a filler layer 14 and the protective sheet 16 (A) in that order in a superposed structure, and subjecting the superposed structure to a generally known forming process, such as a laminating process, in which those component layers of the superposed structure are brought into close contact by vacuum and are bonded together by hot pressing. The deposited inorganic oxide thin film 2 of the protective sheet 16 faces inside.

A third solar battery module $T_2$ shown in FIG. 7 employs the protective sheet A shown in FIG. 1 as its front surface protective sheet 11 and its back surface protective sheet 16. The solar battery module $T_2$ is fabricated by superposing the front surface protective sheet 11 (A), a filler layer 12, a photovoltaic layer 13 of solar cells, a filler layer 14 and the protective sheet 16 (A) in that order in a superposed structure, and subjecting the superposed structure to a generally known forming process, such as a lamination process, in which those component layers of the superposed structure are brought into close contact by vacuum and are bonded together by hot pressing. The deposited inorganic oxide thin film 2 of each of the protective sheets 11 and 16 faces inside.

The foregoing protective sheets in accordance with the present invention and the foregoing solar battery modules employing those protective sheets are examples intended to illustrate the invention and not to be construed to limit the scope of the invention.

For example, the protective sheets shown in FIGS. 3 and 4 can be applied to solar battery modules of various types. The foregoing solar battery modules may comprise additional layers for sunlight absorption, reinforcement or the like.

Materials for and methods of fabricating the protective sheets in accordance with the present invention and the solar battery modules employing those protective sheets will be described. It is desirable that the cyclic polyolefin resin film or sheet for the protective sheets embodying the present invention and the solar battery modules employing those protective sheets has a high sunlight transmittance because the solar battery absorbs sunlight and generates power by its photovoltaic effect.

It is desirable that the cyclic polyolefin resin film or sheet is excellent in mechanical or chemical strength, excellent in weather resistance, heat resistance, water resistance, light resistance, wind endurance, hailstorm resistance, chemical resistance and piercing strength. It is particularly desirable that the cyclic polyolefin resin film or sheet is excellent in weather resistance and moisture impermeability that prevents the permeation of oxygen and the like, has a high surface hardness, is excellent in soil resistance that prevents the accumulation of soil and dust thereon, is very durable and has a high protective ability.

It is desirable that the cyclic polyolefin resin film or sheet is capable of withstanding conditions for forming a deposited inorganic oxide thin film thereon, does not spoil the characteristics thereof and the deposited inorganic oxide thin film deposited thereon, is capable of firmly adhering to the deposited inorganic oxide thin film and of satisfactorily holding the same thereon.

The present invention may employ transparent cyclic polyolefin films or sheets of, for example, cyclopentadiene, cyclopentadiene derivatives, dicyclopentadiene, dicyclopentadiene derivatives, cyclohexadiene, cyclohexadiene derivative s, norbornadiene, norbornadiene derivatives, polymers produced through the polymerization of cyclic dienes, copolymers of cyclic dienes and one or some of ethylene, propylene, 4-methyl-1-pentene, styrene, butadiene, isoprene and the like.

Among those transparent cyclic polyolefin resin films or sheets, film or sheets of polycyclopentadienes of cyclic dienes including cyclopentadiene, cyclopentadiene derivatives, dicyclopentadiene, dicyclopentadiene derivatives, norbornadiene and norbornadiene derivatives are excellent in properties including weather resistance, water resistance and transparency, and are particularly preferable from the view point of sunlight transmission.

The protective sheets of the solar battery modules using the cyclic polyolefin resin film or sheet utilizes the excellent properties of the cyclic polyolefin resin sheet including mechanical properties, optical properties and properties including weather resistance, heat resistance and water resistance, moisture impermeability, soil resistance, chemical resistance and piercing strength. The protective sheet is equal to the glass sheet used as the conventional protective sheet in optical properties and durability, has satisfactory mechanical properties, and is more flexible and lighter than the glass sheet, excellent in workability and easy to handle.

There is no possibility that the cyclic polyolefin film or sheet in accordance with the present invention causes environmental destruction of pollution when disposed of after use.

The cyclic polyolefin resin film or sheet in accordance with the present invention may be, for example, any one of films or sheets of the foregoing cyclic polyolefin resins formed by a film forming process, such as an extrusion process, a casting process, a T-die extrusion process, a cutting process, an inflation process or the like, any one of multilayer films or multilayer sheets of two or more kinds of the foregoing cyclic polyolefin resins formed by a coextrusion process, or any one of films or sheets formed by subjecting a mixture of a plurality of kinds of the foregoing cyclic polyolefin resins to a film forming process. When necessary, the cyclic polyolefin resin film or sheet may be a uniaxially or biaxially oriented film or sheet formed by subjecting acyclic polyolefin resin film or sheet to a uniaxial or biaxial orientation process of a tenter system or a tubular film system.

The thickness of the cyclic polyolefin resin film or sheet is in the range of about 12 to about 300 μm, desirably, in the range of about 25 to about 200 μm.

It is desirable that the cyclic polyolefin resin film or sheet of the present invention has a visible light transmittance of 90% or above, preferably, 95% or above and a property to transmit all incident sunlight and to absorb the same.

When forming the cyclic polyolefin resin film or sheet, various compounding ingredients and additives may be added to the cyclic polyolefin resin to improve the workability, heat resistance, weather resistance, strength, mechanical properties, dimensional stability, oxidation resistance, slipperiness, releasability, flame retardancy, antifungal property, electric properties, piercing strength and the like. The amount of each of the compounding ingredients and the additives is in the range of a very small percent to several tens percent and may optionally be determined according to the purpose.

The cyclic olefin resin may contain commonly known additives, such as a lubricant, a crosslinking agent, an oxidation inhibitor, an ultraviolet absorber, a light stabilizer, a filler, a reinforcing material, reinforcing fibers, an antistatic agent, a flame retarder, a flame-resistant agent, a foaming agent, an antifungus agent, a pigment and the like. The cyclic polyolefin resin may further contain modifiers.

In the present invention, it is preferable to use a cyclic polyolefin resin film or sheet of a composite cyclic polyolefin resin produced by preparing a mixture of a cyclic polyolefin resin, an oxidation inhibitor, an ultraviolet absorber or one or a plurality of kinds of reinforcing fibers, and kneading the mixture to improve the weather resistance, strength, piercing strength and the like.

When necessary, a surface-treated layer 3 may be formed in a surface of the fluorocarbon resin sheet by a surface pretreatment process to improve the adhesion between the surface of the cyclic polyolefin film or sheet and the deposited inorganic oxide thin film.

The surface-treated layer 3 may be formed by, for example, a corona discharge treatment, an ozone treatment, a low-temperature plasma treatment using oxygen gas or nitrogen gas, a glow discharge treatment, an oxidation treatment using a chemical or the like. The surface-treated layer 3 may be a corona-treated layer, an ozone-treated layer, a plasma-treated layer, an oxidized layer or the like.

The surface pretreatment of the cyclic polyolefin resin film or sheet is a method of improving adhesion between the cyclic polyolefin resin film or sheet and the deposited inorganic oxide thin film. The surface of the cyclic polyolefin resin film or sheet is finished by the surface pretreatment to improve the adhesion between the cyclic polyolefin resin film or sheet and the deposited inorganic oxide thin film. The improvement of adhesion can be achieved by forming, instead of forming the surface-treated layer, a layer of a primer, an undercoater, an anchoring agent, an adhesive or a deposited undercoating material.

Suitable materials for forming the coating layer are, for example, composite resins containing a polyester resin, a polyamide resin, a polyurethane resin, an epoxy resin, a phenolic resin, a (meta)acrylic resin, a polyvinyl acetate resin, a polyolefin resin such as a polyethylene, a polypropylene or a copolymer or a resin obtained by modifying one of those resins, a cellulose resin or the like as a principal component of a vehicle.

In the present invention, the composite resin may contain an ultraviolet absorber and/or an oxidation inhibitor for weather resistance improvement.

The composite resin may contain one or a plurality of the foregoing ultraviolet absorbers.

The composite resin may contain one or a plurality of the foregoing oxidation inhibitors.

The ultraviolet absorber and/or the oxidation inhibitor content is dependent on the shape and density of particles and a preferable ultraviolet absorber and/or the oxidation inhibitor content is in the range of about 0.1 to about 10% by weight.

The coating layer may be formed of a coating material of, for example, a solvent type, an aqueous type or an emulsion type by a roller coating process, a gravure coating process, a kiss-roll coating process or the like. The coating layer may be formed by a coating process subsequent to a resin film or sheet forming process or a biaxial orientation process, or by an in-line coating process included in the film forming process or the biaxial orientation process.

The surface-treated layer may be formed on one surface of the cyclic polyolefin resin film or sheet to protect the cyclic polyolefin resin film or sheet from vapor deposition conditions for forming the deposited inorganic oxide thin film, to suppress yellowing, deterioration, shrinkage or cohesive failure in a surface layer or an inner layer of the cyclic polyolefin resin film or sheet, and to improve the adhesion between the cyclic polyolefin resin film or sheet and the deposited inorganic oxide thin film. The surface-treated layer, i.e., a deposition-resistant protective film, such as a deposited inorganic oxide thin film, may be formed by, for example, a chemical vapor deposition process (CVD process), such as a plasma chemical vapor deposition process, a thermal chemical vapor deposition process or a photochemical vapor deposition process, or a physical vapor deposition process (PVD process), such as a vacuum evaporation process, a sputtering process or an ion plating process.

The thickness of the deposition-resistant protective film of silicon oxide or the like may be less than 150 Å. The deposition-resistant protective film may be a nonbarrier film not having any barrier effect to inhibit the permeation of moisture and oxygen gas. Concretely, the thickness of the deposition-resistant protective film is in the range of about 10 to about 100 Å, more preferably, in the range of about 20 to 80 Å, more preferably, in the range of about 30 to about 60 Å.

If the thickness is greater than 150 Å, more concretely 100 Å, 80 Å or 60 Å, the cyclic polyolefin resin film or sheet is exposed to severe deposition conditions. Consequently, the cyclic polyolefin resin film or sheet turns yellow, cohesive failure occurs, the formation of a satisfactory deposition-resistant protective film becomes difficult, and cracks develop in the film. If the thickness is less than 10 Å, 20 Å or 30 Å, the film is incapable of functioning as an effective deposition-resistant protective film.

When the cyclic polyolefin resin film or sheet forms the outermost layer of a solar battery, the cyclic polyolefin resin film or sheet may be an embossed film or sheet having an embossed surface or embossed surfaces finished by an embossing process to provide the cyclic polyolefin resin film or sheet with a sunlight diffusing effect or an antireflection effect.

The embossed surface may be such as having irregularities of sizes in the range of a submicron size to several hundreds micrometer. The irregularities may be of any suitable shape, such as a pyramidal shape, a V-shape or a plaid-shape.

The deposited inorganic oxide thin film may be formed by the continuous vacuum evaporation system shown in FIG. 8.

The low-temperature plasma chemical vapor deposition process for forming the deposited inorganic oxide thin film may be carried out by the low-temperature plasma chemical vapor deposition system shown in FIG. 9.

When fabricating a solar battery module, the reinforcing fibers may be, for example, glass fibers or filaments, carbon fibers or filaments, aramid fibers or filaments, polyamide fibers or filaments, polyester fibers or filaments, natural fibers or the like. The reinforcing fibers or filaments, or a nonwoven fabric of the reinforcing fibers or filaments may be used for forming a fiber-reinforcing layer.

It is also possible to form the fiber-reinforced layer by preparing a mixture of the reinforcing fibers or filaments, such as the foregoing glass fibers or filaments, carbon fibers or filaments, aramid fibers or filaments, polyamide fibers or filaments, polyester fibers or filaments, natural fibers or the like, or a nonwoven fabric or a sheet resembling a nonwoven fabric of the reinforcing fibers or filaments, and a resin for forming the filler layer, such as one of fluorocarbon resins, ethylene-vinyl acetate resins, methacrylate copolymers, polyethylene resins, polypropylene resins, modified polyolefin resins produced by modifying polyolefin resins, such as polyethylene resins or polypropylene resins, by an unsaturated carboxylic acid, such as acrylic acid, itaconic acid, maleic acid or fumaric acid, cyclic polyolefin resins, polyvinyl butyral resins, silicone resins, epoxy resins, (meta) acrylic resins and the like, kneading the mixture, and forming a film of the kneaded mixture.

EXAMPLES

Examples of the second embodiment will concretely be described hereinafter.

Example 1

(1) A roll of a 100 $\mu$m thick polydicyclopentadiene resin sheet, i.e., base sheet, was mounted on a feed roll of a continuous vacuum evaporation system. The polydicyclopentadiene resin sheet was unwound and wound around a coating drum and a 500 Å thick deposited aluminum oxide thin film was deposited on a treated surface of the polydicyclopentadiene resin sheet treated for adhesion improvement by a reactive vacuum evaporation process of an electron beam (EB) heating system. Aluminum was used as an evaporation source and oxygen gas was supplied to the continuous vacuum evaporation system.

Deposition conditions:
Evaporation source: Aluminum
Vacuum in vacuum chamber: $7.5 \times 10^{-6}$ mbar
Vacuum in deposition chamber: $2.1 \times 10^{-6}$ mbar
EB power: 40 kW
Sheet moving speed: 600 m/min (2) A protective sheet in accordance with the present invention for a solar battery module was completed by subjecting the 500 Å thick deposited aluminum oxide thin film formed on the surface of the polydicyclopentadiene resin sheet to a glow-discharge plasma process to form a plasma-processed surface. The glow-discharge plasma process was carried out by a glow-discharge plasma producing apparatus of 1500 W in plasma output immediately after the deposition of the 500 Å thick deposited aluminum oxide thin film. In the glow-discharge plasma process, an oxygen/argon mixed gas of 19/1 in $O_2$/Ar ratio was supplied so that the pressure of the oxygen/argon mixed gas is maintained at $6 \times 10^{-5}$ torr and the processing speed was 420 m/min.

(3) A solar battery module was fabricated by using the protective sheet thus fabricated. The protective sheet, a 400 $\mu$m thick ethylene-vinyl acetate copolymer sheet, a 38 $\mu$m thick biaxially oriented polyethylene terephthalate film provided with an array of amorphous silicon solar cells, a 400 $\mu$m thick ethylene-vinyl acetate copolymer sheet and a 50 $\mu$m thick biaxially oriented polyethylene terephthalate film were superposed in that order with the plasma-processed deposited aluminum oxide thin film facing inside and the surface of the 38 $\mu$m thick biaxially oriented polyethylene terephthalate film provided with the array of amorphous silicon solar cells facing the front surface protective sheet. Those component layers were laminated by using adhesive layers of an acrylic resin to complete a solar battery module.

(4) Another protective sheet in accordance with the present invention and another solar battery module of the same components were fabricated by the same processes, except that a 100 $\mu$m thick polycyclopentadiene resin sheet was used instead of the 100 $\mu$m thick polydicyclopentadiene resin sheet as the base sheet.

Example 2

(1) A roll of a 100 $\mu$m thick polydicyclopentadiene resin sheet, i.e., base sheet, was mounted on a feed roll of a plasma chemical vapor deposition system. A 500 Å thick deposited silicon oxide thin film was deposited on a treated surface of the polydicyclopentadiene resin sheet treated for adhesion improvement under the following conditions.

Deposition conditions:
Reaction gas mixing ratio: Hexamethyldisiloxane/oxygen/helium=1/10/10 (Unit: slm)
Vacuum in vacuum chamber: $5.0 \times 10^{-6}$ mbar
Vacuum in deposition chamber: $6.0 \times 10^{-2}$ mbar
Power supplied to cooling electrode drum: 20 kW
Film moving speed: 80 m/min
Surface for vapor deposition: Corona-processed surface (2) A protective sheet in accordance with the present invention for a solar battery module was completed by subjecting the 500 Å thick deposited silicon oxide thin film formed on the surface of the polydicyclopentadiene resin sheet to a corona discharge process to form a corona-processed surface and to increase the surface tension of the deposited silicon oxide thin film from 35 dyne to 60 dyne. Corona discharge power was 10 kW and the sheet was moved at a moving speed of 100 m/min.

(3) A solar battery module was fabricated by using the protective sheet thus fabricated as a front surface protective sheet. The front surface protective sheet, a 400 $\mu$m thick ethylene-vinyl acetate copolymer sheet, a 38 $\mu$m thick biaxially oriented polyethylene terephthalate film provided with an array of amorphous silicon solar cells, a 400 $\mu$m thick ethylene-vinyl acetate copolymer sheet and a 50 $\mu$m thick biaxially oriented polyethylene terephthalate film were superposed in that order with the corona-processed deposited silicon oxide thin film facing inside and the surface of the 38 $\mu$m thick biaxially oriented polyethylene terephthalate film provided with the array of amorphous silicon solar cells facing the front surface protective sheet. Those component layers were laminated by using adhesive layers of an acrylic resin to complete a solar battery module.

(4) Another protective sheet in accordance with the present invention and another solar battery module of the same components were fabricated by the same processes, except that a 100 $\mu$m thick polycyclopentadiene resin sheet was used instead of the 100 $\mu$m thick polydicyclopentadiene resin sheet.

Example 3

(1) A roll of a 300 $\mu$m thick polydicyclopentadiene resin sheet containing an ultraviolet absorber was mounted on a feed roll of a plasma chemical vapor deposition system. A 500 Å thick deposited silicon oxide thin film was deposited on a treated surface of the polydicyclopentadiene resin sheet treated for adhesion improvement under the following conditions.

Deposition conditions:
Reaction gas mixing ratio: Hexamethyldisiloxane/oxygen/helium=1/10/10 (Unit: slm)
Vacuum in vacuum chamber: $5.0 \times 10^{-5}$ mbar
Vacuum in deposition chamber: $6.0 \times 10^{-2}$ mbar
Power supplied to cooling electrode drum: 20 kW
Film moving speed: 80 m/min
Surface for deposition: Corona-processed surface The surface of the 500 Å thick deposited silicon oxide thin film formed on the polydicyclopentadiene resin sheet was subjected to a corona discharge process to form a corona-processed surface and to increase the surface tension of the deposited silicon oxide thin film from 35 dyne to 60 dyne. Corona discharge power was 10 kW and the sheet was moved at a moving speed of 100 m/min.

(2) A roll of the polydicyclopentadiene resin sheet provided with the corona-processed deposited silicon oxide thin film was mounted on a feed roll of a continuous vacuum evaporation system. The polydicyclopentadiene resin sheet was unwound and wound around a coating drum and a 500 Å thick deposited aluminum oxide thin film was deposited on the corona-processed surface of the deposited silicon oxide thin film formed on the polydicyclopentadiene resin sheet by a reactive vacuum evaporation process of an electron beam (EB) heating system. Aluminum was used as an evaporation source and oxygen gas was supplied to the continuous vacuum evaporation system.

Deposition conditions:
Evaporation source: Aluminum
Vacuum in vacuum chamber: $7.5 \times 10^{-6}$ mbar
Vacuum in deposition chamber: $2.1 \times 10^{-6}$ mbar
EB power: 40 kW
Film moving speed: 600 m/min A protective sheet in accordance with the present invention for a solar battery module was completed by subjecting the 500 Å thick deposited aluminum oxide thin film formed on the surface of the polydicyclopentadiene resin sheet to a glow-discharge plasma process to form a plasma-processed surface. The glow-discharge plasma process was carried out by a glow-discharge plasma producing apparatus of 1500 W in plasma output immediately after the deposition of the 500 Å thick deposited aluminum oxide thin film. In the glow-discharge plasma process, an oxygen/argon mixed gas of 19/1 in $O_2/Ar$ ratio was supplied so that the pressure of the oxygen/argon mixed gas is maintained at $6 \times 10^{-5}$ torr and the processing speed was 420 m/min.

(3) A solar battery module was fabricated by using the protective sheet thus fabricated as a front surface protective sheet. The protective sheet, a 400 μm thick ethylene-vinyl acetate copolymer sheet, a 38 μm thick biaxially oriented polyethylene terephthalate film provided with an array of amorphous silicon solar cells, a 400 μm thick ethylene-vinyl acetate copolymer sheet and a 50 μm thick biaxially oriented polyethylene terephthalate film were superposed in that order with the plasma-processed deposited aluminum oxide thin film facing inside and the surface of the 38 μm thick polyethylene terephthalate film provided with the array of amorphous silicon solar cells facing the front surface protective sheet. Those component layers were laminated by using adhesive layers of an acrylic resin to complete a solar battery module.

(4) Another protective sheet in accordance with the present invention and another solar battery module of the same components were fabricated by the same processes, except that a 300 μm thick polycyclopentadiene resin sheet containing an ultraviolet absorber was used instead of the 300 μm thick polydicyclopentadiene resin sheet containing an ultraviolet absorber and used as the base sheet.

Example 4

(1) Protective sheets that are the same as the protective sheet in Example 1 were used as the front surface protective sheet and the back surface protective sheet of a solar battery module. The solar battery module was fabricated by superposing the front surface protective sheet, a 400 μm thick ethylene-vinyl acetate copolymer sheet, a 38 μm thick biaxially oriented polyethylene terephthalate film provided with an array of amorphous silicon solar cells, a 400 μm thick ethylene-vinyl acetate copolymer sheet and the back surface protective sheet in that order with the plasma-processed deposited aluminum oxide thin films of the front surface and the back surface protective sheet facing inside and with the surface of the 38 μm thick polyethylene terephthalate film provided with the solar cells facing the front surface protective sheet, and laminating those component layers by using adhesive layers of an acrylic resin.

(2) Protective sheets in accordance with the present invention and another solar battery module of the same components were fabricated by the same processes, except that 100 μm thick polycyclopentadiene resin sheets were used instead of the 100 μm thick polydicyclopentadiene resin sheets.

Example 5

(1) Protective sheets that are the same as the protective sheet in Example 2 were used as the front surface protective sheet and the back surface protective sheet of a solar battery module. The solar battery module was fabricated by superposing the front surface protective sheet, a 400 μm thick ethylene-vinyl acetate copolymer sheet, a 38 μm thick biaxially oriented polyethylene terephthalate film provided with an array of amorphous silicon solar cells, a 400, μm thick ethylene-vinyl acetate copolymer sheet and the back surface protective sheet in that order with the plasma-processed deposited silicon oxide thin films of the front surface and the back surface protective sheet facing inside and with the surface of the 38 μm a thick polyethylene terephthalate film provided with the array of amorphous silicon solar cells facing the front surface protective sheet, and laminating those component layers by using adhesive layers of an acrylic resin.

(2) Protective sheets in accordance with the present invention and another solar battery module of the same components were fabricated by the same processes, except that 100 μm thick polycyclopentadiene resin sheets were used instead of the 100 μm thick polydicyclopentadiene resin sheets.

Example 6

(1) Protective sheets that are the same as the protective sheet in Example 3 were used as the front surface protective sheet and the back surface protective sheet of a solar battery module. The solar battery module was fabricated by superposing the front surface protective sheet, a 400 μm thick ethylene-vinyl acetate copolymer sheet, a 38 μm thick biaxially oriented polyethylene terephthalate film provided with an array of amorphous silicon solar cells, a 400 μm thick ethylene-vinyl acetate copolymer sheet and the back surface protective sheet in that order with the plasma-processed deposited aluminum oxide thin films of the front surface and the back surface protective sheet facing inside and with the surface of the 38 μm thick polyethylene terephthalate film provided with the array of amorphous silicon solar cells facing the front surface protective sheet, and laminating those component layers by using adhesive layers of an acrylic resin.

(2) Protective sheets in accordance with the present invention and another solar battery module of the same components were fabricated by the same processes, except that 300 μm thick polycyclopentadiene resin sheets containing an ultraviolet absorber were used instead of the 300 μm thick polydicyclopentadiene resin sheet containing the ultraviolet absorber.

Example 7

(1) A protective sheet that is the same as the protective sheet in Example 1 was used as the back surface protective sheet of a solar battery module. The solar battery module was fabricated by superposing a 3 mm thick glass sheet, a 400 μm thick ethylene-vinyl acetate copolymer sheet, a 38 μm thick biaxially oriented polyethylene terephthalate film provided with an array of amorphous silicon solar cells, a 400 μm thick ethylene-vinyl acetate copolymer sheet and the back surface protective sheet in that order with the plasma-processed deposited aluminum oxide thin film of the back surface protective sheet facing inside and with the surface of the 38 μm thick polyethylene terephthalate film provided with the array of amorphous silicon solar cells facing the 3 mm thick glass sheet, and laminating those component layers by using adhesive layers of an acrylic resin.

(2) A protective sheet in accordance with the present invention and another solar battery module of the same components were fabricated by the same processes, except that a 100 μm thick polycyclopentadiene resin sheet was used instead of the 100 μm thick polydicyclopentadiene resin sheet.

Example 8

(1) A protective sheet that is the same as the protective sheet in Example 2 was used as the back surface protective sheet of a solar battery module. The solar battery module was fabricated by superposing a 50 μm thick polyvinyl fluoride sheet (PVF sheet), a 400 μm thick ethylene-vinyl acetate copolymer sheet, a 38 μm thick biaxially oriented polyethylene terephthalate film provided with an array of amorphous silicon solar cells, a 400 μm thick ethylene-vinyl acetate copolymer sheet and the back surface protective sheet in that order with the corona-processed deposited silicon oxide thin film of the back surface protective sheet facing inside and with the surface of the 38 μm thick polyethylene terephthalate film provided with the array of amorphous silicon solar cells facing the 50 μm thick polyvinyl fluoride sheet, and laminating those component layers by using adhesive layers of an acrylic resin.

(2) A protective sheet in accordance with the present invention and another solar battery module of the same components were fabricated by the same processes, except that a 100 μm thick polycyclopentadiene resin sheet was used instead of the 100 μm thick polydicyclopentadiene resin sheet.

Example 9

(1) A protective sheet that is the same as the protective sheet in Example 3 was used as the back surface protective sheet of a solar battery module. The solar battery module was fabricated by superposing a 50 μm thick polyvinyl fluoride sheet (PVF sheet), a 400 μm thick ethylene-vinyl acetate copolymer sheet, a 38 μm thick biaxially oriented polyethylene terephthalate film provided with an array of amorphous silicon solar cells, a 400 μm thick ethylene-vinyl acetate copolymer sheet and the back surface protective sheet in that order with the plasma-processed deposited aluminum oxide thin film of the back surface protective sheet facing inside and with the surface of the 38 μm thick polyethylene terephthalate film provided with the array of amorphous silicon solar cells facing the 50 μm thick polyvinyl fluoride sheet, and laminating those component layers by using adhesive layers of an acrylic resin.

(2) A protective sheet in accordance with the present invention and another solar battery module of the same components were fabricated by the same processes, except that a 100 μm thick polycyclopentadiene resin sheet was used instead of the 100 μm thick polydicyclopentadiene resin sheet.

Example 10

(1) A roll of a 100 μm thick polydicyclopentadiene resin sheet containing an ultraviolet absorber comprising ultrafine titanium oxide powder, and glass fibers was mounted on a feed roll of a plasma chemical vapor deposition system. A 50 Å thick deposited silicon oxide thin film as a deposition-resistant protective film was deposited on a surface of the polydicyclopentadiene resin sheet under the following conditions.

Deposition conditions:

Reaction gas mixing ratio: Hexamethyldisiloxane/oxygen/helium=5/5/5 (Unit: slm)

Vacuum in vacuum chamber: $7.0 \times 10^{-6}$ mbar

Vacuum in deposition chamber: $3.8 \times 10^{-2}$ mbar

Power supplied to cooling electrode drum: 15 kW

Sheet moving speed: 100 m/min (2) A roll of the polydicyclopentadiene resin sheet provided with the deposition-resistant protective film was mounted on a feed roll of a plasma chemical vapor deposition system. A 800 Å thick deposited silicon oxide thin film was deposited on the deposition-resistant protective film formed on the polydicyclopentadiene resin sheet.

Deposition conditions:

Evaporation source: Aluminum

Vacuum in vacuum chamber: $5.0 \times 10^{-6}$ mbar

Vacuum in deposition chamber: $6.0 \times 10-2$ mbar

Power supplied to cooling electrode drum: 20 kW

Film moving speed: 80 m/min

A protective sheet in accordance with the present invention for a solar battery module was completed by subjecting the 800 Å thick deposited silicon oxide thin film to a corona discharge process to form a corona-processed surface and to increase the surface tension of the deposited silicon oxide thin film from 35 dyne to 60 dyne. Corona discharge power was 10 kW and the sheet was moved at a moving speed of 100 m/min.

(3) A solar battery module was fabricated by using the protective sheet thus fabricated as a front surface protective sheet. The protective sheet, a 400 μm thick ethylene-vinyl acetate copolymer sheet, a 38 μm thick biaxially oriented polyethylene terephthalate film provided with an array of amorphous silicon solar cells, a 400 μm thick ethylene-vinyl acetate copolymer sheet and a 50 μm thick biaxially oriented polyethylene terephthalate film were superposed in that order with the corona-processed deposited silicon oxide thin film facing inside and the surface of the 38 μm thick polyethylene terephthalate film provided with the array of amorphous silicon solar cells facing the front surface protective sheet. Those component layers were laminated by using adhesive layers of an acrylic resin to complete a solar battery module.

(4) Another protective sheet in accordance with the present invention and another solar battery module of the same components were fabricated by the same processes, except that a 100 μm thick polycyclopentadiene resin sheet containing an ultraviolet absorber comprising ultrafine titanium oxide powder, and glass fibers was used instead of the 100 μm thick polydicyclopentadiene resin sheet containing an ultraviolet absorber comprising ultrafine titanium oxide powder, and glass fiber.

Example 11

(1) A roll of the polydicyclopentadiene resin sheet in Example 10 provided with the deposition-resistant protective film was mounted on a feed roll of a continuous vacuum evaporation system. The polydicyclopentadiene resin sheet was unwound and wound around a coating drum and a 800 Å thick deposited aluminum oxide thin film was deposited on the deposition-resistant protective film by a reactive vacuum evaporation process of an electron beam (EB) heating system. Aluminum was used as an evaporation source and oxygen gas was supplied to the continuous vacuum evaporation system.

Deposition conditions:

Evaporation source: Aluminum

Vacuum in vacuum chamber: $7.5 \times 10^{-6}$ mbar

Vacuum in deposition chamber: $2.1 \times 10^{-6}$ mbar

EB power: 40 kW

Film moving speed: 600 m/min

A protective sheet in accordance with the present invention for a solar battery module was completed by subjecting the 800 Å thick deposited aluminum oxide thin film to a glow-discharge plasma process to form a plasma-processed surface. The glow-discharge plasma process was carried out by a glow-discharge plasma producing apparatus of 1500 W in plasma output immediately after the deposition of the 800 Å thick deposited aluminum oxide thin film. In the glow-discharge plasma process, an oxygen/argon mixed gas of 19/1 in $O_2/Ar$ ratio was supplied so that the pressure of the oxygen/argon mixed gas is maintained at $6 \times 10^{-5}$ torr and the processing speed was 420 m/min.

(2) The protective sheet thus fabricated was used as a front surface protective sheet. A 400 μm thick ethylene-vinyl acetate copolymer sheet was laminated to the plasma-processed surface of the deposited aluminum oxide thin film with an adhesive layer of an acrylic resin.

A 38 μm thick biaxially oriented polyethylene terephthalate film provided with an array of amorphous silicon solar cells, a 400 μm thick ethylene-vinyl acetate copolymer sheet and a 50 μm thick biaxially oriented polyethylene terephthalate film were superposed in that order on the ethylene-vinyl acetate copolymer sheet laminated to the protective sheet with the he surface of the 38 μm thick biaxially oriented polyethylene terephthalate film provided with the array of amorphous silicon solar cells facing the front surface protective sheet. Those component layers were laminated by using adhesive layers of an acrylic resin to complete a solar battery module.

(3) Another protective sheet in accordance with the present invention and another solar battery module of the same components were fabricated by the same processes, except that a 100 μm thick polycyclopentadiene resin sheet containing an ultraviolet absorber comprising ultrafine titanium oxide powder, and glass fibers was used instead of the 100 μm thick polydicyclopentadiene resin sheet containing an ultraviolet absorber comprising ultrafine titanium oxide powder, and glass fibers.

Example 12

(1) A 100 μm thick polydicyclopentadiene resin sheet containing an ultraviolet absorber comprising ultrafine titanium oxide powder, and glass fibers was used. One of the surfaces of the polydicyclopentadiene resin sheet was processed by an embossing process using an embossing roller to form an embossed surface provided with pyramidal projections of 1 μm in size.

A roll of the polydicyclopentadiene resin sheet having the embossed surface was mounted on a feed roll of a continuous vacuum evaporation system. The polydicyclopentadiene resin sheet was unwound and wound around a coating drum and a 50 Å thick deposited aluminum oxide thin film as a deposition-resistant protective film was deposited on the other surface not embossed of the polydicyclopentadiene resin sheet by a reactive vacuum evaporation process of an electron beam (EB) heating system. Aluminum was used as an evaporation source and oxygen gas was supplied to the continuous vacuum evaporation system.

Deposition conditions:

Evaporation source: Aluminum

Vacuum in vacuum chamber: $7.5 \times 10^{-6}$ mbar

Vacuum in deposition chamber: $2.1 \times 10^{-6}$ mbar

EB power: 20 kW

Film moving speed: 500 m/min (2) A protective sheet in accordance with the present invention for a solar battery module was completed by forming a 800 Å thick deposited aluminum oxide thin film on the deposition-resistant protective film formed on the unembossed surface of the polydicyclopentadiene resin sheet by a reactive vacuum evaporation process of an electron beam (EB) heating system similar to that in Example 1, and subjecting the 800 Å thick deposited aluminum oxide thin film to a plasma process to form a plasma-processed surface.

(3) A solar battery module was fabricated by using the protective sheet thus fabricated as a front surface protective sheet. The protective sheet, a 400 μm thick ethylene-vinyl acetate copolymer sheet, a 38 μm thick biaxially oriented polyethylene terephthalate film provided with an array of amorphous silicon solar cells, a 400 μm thick ethylene-vinyl acetate copolymer sheet and a 50 μm at thick biaxially oriented polyethylene terephthalate film were superposed in that order with the plasma-processed surface of the deposited aluminum oxide thin film facing inside and the surface of the 38 μm thick biaxially oriented polyethylene terephthalate film provided with the array of amorphous silicon solar cells facing the front surface protective sheet. Those component layers were laminated by using adhesive layers of an acrylic resin to complete a solar battery module.

(4) Another protective sheet in accordance with the present invention and another solar battery module of the same components were fabricated by the same processes, except that a 100 μm thick polycyclopentadiene resin sheet containing an ultraviolet absorber comprising ultrafine titanium oxide powder, and glass fibers and having an embossed surface was used instead of the 100 μm thick polydicyclopentadiene resin sheet containing an ultraviolet absorber comprising ultrafine titanium oxide powder, and glass fibers and having the embossed surface.

Example 13

(1) Protective sheets that are the same as the protective sheet in Example 10 were used as the front surface protective sheet and the back surface protective sheet of a solar battery module. The solar battery module was fabricated by superposing the front surface protective sheet, a 400 $\mu$m thick ethylene-vinyl acetate copolymer sheet, a 38 $\mu$m thick biaxially oriented polyethylene terephthalate film provided with an array of amorphous silicon solar cells, a 400 $\mu$m thick ethylene-vinyl acetate copolymer sheet and the back surface protective sheet in that order with the corona-processed deposited silicon oxide thin films of the front surface and the back surface protective sheet facing inside and with the surface of the 38 $\mu$m thick polyethylene terephthalate film provided with the solar cells facing the front surface protective sheet, and laminating those component layers by using adhesive layers of an acrylic resin.

(2) Protective sheets in accordance with the present invention and another solar battery module of the same components were fabricated by the same processes, except that a 100 $\mu$m thick polycyclopentadiene resin sheets containing an ultraviolet absorber comprising ultrafine titanium oxide powder, and glass fibers were used instead of the 100 $\mu$m thick polydicyclopentadiene resin sheets containing an ultraviolet absorber comprising ultrafine titanium oxide powder, and glass fibers face.

Example 14

(1) Protective sheets that are the same as the protective sheet in Example 11 were used as the front surface protective sheet and the back surface protective sheet of a solar battery module. A 400 $\mu$m thick ethylene-vinyl acetate copolymer sheet was laminated to the plasma-processed surface of the deposited aluminum oxide thin film of the front surface protective sheet with an adhesive layer of an acrylic resin to form a first laminated structure.

A 400 $\mu$m thick ethylene-vinyl acetate copolymer sheet was laminated to the plasma-processed surface of the deposited aluminum oxide thin film of the back surface protective sheet with an adhesive layer of an acrylic resin to form a second laminated structure.

A 38 $\mu$m thick biaxially oriented polyethylene terephthalate film provided with an array of amorphous silicon solar cells was sandwiched between the first and the second laminated structure with the 400 $\mu$m thick ethylene-vinyl acetate copolymer sheets contiguous with the 38 $\mu$m thick biaxially oriented polyethylene terephthalate film and with the surface of the 38 $\mu$m thick biaxially oriented polyethylene terephthalate film facing the front surface protective sheet.

(2) Protective sheets in accordance with the present invention and another solar battery module of the same components were fabricated by the same processes, except that a 100 $\mu$m thick polycyclopentadiene resin sheets containing an ultraviolet absorber comprising ultrafine titanium oxide powder, and glass fibers were used instead of the 100 $\mu$m thick polydicyclopentadiene resin sheets containing an ultraviolet absorber comprising ultrafine titanium oxide powder, and glass fibers face.

Example 15

(1) Protective sheets that are the same as the protective sheet in Example 12 were used as the front surface protective sheet and the back surface protective sheet of a solar battery module. The solar battery module was fabricated by superposing the front surface protective sheet, a 400 $\mu$m thick ethylene-vinyl acetate copolymer sheet, a 38 $\mu$m thick biaxially oriented polyethylene terephthalate film provided with an array of amorphous silicon solar cells, a 400 $\mu$m thick ethylene-vinyl acetate copolymer sheet and the back surface protective sheet in that order with the plasma-processed deposited aluminum oxide thin films of the front surface and the back surface protective sheet facing inside and with the surface of the 38 $\mu$m thick polyethylene terephthalate film provided with the array of amorphous silicon solar cells facing the front surface protective sheet, and laminating those component layers by using adhesive layers of an acrylic resin.

(2) Protective sheets in accordance with the present invention and another solar battery module of the same components were fabricated by the same processes, except that 100 $\mu$m thick embossed polycyclopentadiene resin sheets containing an ultraviolet absorber comprising ultrafine titanium oxide powder, and glass fibers were used instead of the 100 $\mu$m thick embossed polydicyclopentadiene resin sheets containing the ultraviolet absorber comprising ultrafine titanium oxide powder, and glass fibers.

Example 16

(1) A protective sheet that is the same as the protective sheet in Example 10 was used as the back surface protective sheet of a solar battery module. The solar battery module was fabricated by superposing a 3 mm thick glass sheet, a 400 $\mu$m thick ethylene-vinyl acetate copolymer sheet, a 38 $\mu$m thick biaxially oriented polyethylene terephthalate film provided with an array of amorphous silicon solar cells, a 400 $\mu$m thick ethylene-vinyl acetate copolymer sheet and the back surface protective sheet in that order with the corona-processed deposited silicon oxide thin film of the back surface protective sheet facing inside and with the surface of the 38 $\mu$m thick polyethylene terephthalate film provided with the array of amorphous silicon solar cells facing the 3 mm thick glass sheet, and laminating those component layers by using adhesive layers of an acrylic resin.

(2) A protective sheet in accordance with the present invention and another solar battery module of the same components were fabricated by the same processes, except that a 100 $\mu$m thick polycyclopentadiene resin sheet containing an ultraviolet absorber comprising ultrafine titanium oxide powder, and glass fibers was used instead of the 100 $\mu$m thick polydicyclopentadiene resin sheet containing an ultraviolet absorber comprising ultrafine titanium oxide powder, and glass fibers.

Example 17

(1) A protective sheet that is the same as the protective sheet in Example 11 was used as the back surface protective sheet of a solar battery module. The solar battery module was fabricated by superposing a 50 $\mu$m thick polyvinyl fluoride sheet (PVF sheet), a 400 $\mu$m thick ethylene-vinyl acetate copolymer sheet, a 38 $\mu$m thick biaxially oriented polyethylene terephthalate film provided with an array of amorphous silicon solar cells, a 400 $\mu$m thick ethylene-vinyl acetate copolymer sheet and the back surface protective sheet in that order with the plasma-processed deposited aluminum oxide thin film of the back surface protective sheet facing inside and with the surface of the 38 $\mu$m thick polyethylene terephthalate film provided with the array of amorphous silicon solar cells facing the 50 $\mu$m thick polyvinyl fluoride sheet, and laminating those component layers by using adhesive layers of an acrylic resin.

(2) A protective sheet in accordance with the present invention and another solar battery module of the same components were fabricated by the same processes, except that a 100 μm thick polycyclopentadiene resin sheet containing an ultraviolet absorber comprising ultrafine titanium oxide powder, and glass fibers was used instead of the 100 μm thick polydicyclopentadiene resin sheet containing an ultraviolet absorber comprising ultrafine titanium oxide powder, and glass fibers.

Example 18

(1) A protective sheet that is the same as the protective sheet in Example 11 was used as the back surface protective sheet of a solar battery module. The solar battery module was fabricated by superposing a 50 μm thick polyvinyl fluoride sheet (PVF sheet), a 400 μm thick ethylene-vinyl acetate copolymer sheet, a 38 μm thick biaxially oriented polyethylene terephthalate film provided with an array of amorphous silicon solar cells, a 400 μm thick ethylene-vinyl acetate copolymer sheet and the back surface protective sheet in that order with the plasma-processed deposited aluminum oxide thin film of the back surface protective sheet facing inside and with the surface of the 38 μm thick polyethylene terephthalate film provided with the array of amorphous silicon solar cells facing the 50 μm thick polyvinyl fluoride sheet, and laminating those component layers by using adhesive layers of an acrylic resin. (2) A protective sheet in accordance with the present invention and another solar battery module of the same components were fabricated by the same processes, except that a 100 μm thick embossed polycyclopentadiene resin sheet containing an ultraviolet absorber comprising ultrafine titanium oxide powder, and glass fibers was used instead of the 100 μm thick embossed polydicyclopentadiene resin sheet containing an ultraviolet absorber comprising ultrafine titanium oxide powder, and glass fibers.

Comparative Example 1

A 3 mm thick glass sheet was used as a base sheet for a front surface protective sheet for a solar battery module. The solar battery module was fabricated by superposing the 3 mm thick glass sheet, a 400 μm thick ethylene-vinyl acetate copolymer sheet, a 38 μm thick biaxially oriented polyethylene terephthalate film provided with an array of amorphous silicon solar cells, a 400 μm thick ethylene-vinyl acetate copolymer sheet and a 50 μm thick biaxially oriented polyethylene terephthalate film in that order with the surface of the 38 μm thick polyethylene terephthalate film provided with the array of amorphous silicon solar cells facing the glass sheet, and laminating those component layers by using adhesive layers of an acrylic resin.

Comparative Example 2

A 50 μm thick polyvinyl fluoride sheet (PVF sheet) was used as a base sheet for a front surface protective sheet for a solar battery module. The solar battery module was fabricated by superposing the 50 μm thick polyvinyl fluoride sheet, a 400 μm thick ethylene-vinyl acetate copolymer sheet, a 38 μm thick biaxially oriented polyethylene terephthalate film provided with an array of amorphous silicon solar cells, a 400 μm thick ethylene-vinyl acetate copolymer sheet and a 50 μm thick biaxially oriented polyethylene terephthalate film in that order with the surface of the 38 μm thick polyethylene terephthalate film provided with the array of amorphous silicon solar cells facing the 50 μm thick polyvinyl fluoride sheet, and laminating those component layers by using adhesive layers of an acrylic resin.

Comparative Example 3

Two 50 μm thick polyvinyl fluoride sheets (PVF sheets) were used as base sheets for a front surface protective sheet and a back surface protective sheet for a solar battery module. The solar battery module was fabricated by superposing one of the two 50 μm thick polyvinyl fluoride sheets (PVF sheets), a 400 μm thick ethylene-vinyl acetate copolymer sheet, a 38 μm thick biaxially oriented polyethylene terephthalate film provided with an array of amorphous silicon solar cells, a 400 μm thick ethylene-vinyl acetate copolymer sheet and the other 50 μm thick polyvinyl fluoride sheet (PVF sheet) in that order with the surface of the 38 μm thick polyethylene terephthalate film provided with the array of amorphous silicon solar cells facing the 50 μm thick polyvinyl fluoride sheet serving as the front surface protective sheet, and laminating those component layers by using adhesive layers of an acrylic resin.

Experiments

The protective sheets in Examples 1 to 18 and in Comparative examples 1 to 3 were subjected to total transmittance measurement. The solar battery modules in Examples 1 to 18 and Comparative examples 1 to 3 were subjected to solar battery module evaluation tests.

(1) Total Transmittance Measurement

Total transmittance (%) of each of the protective sheets in Examples 1 to 18 and Comparative examples 1 to 3 against the total transmittance of the base sheet as a reference total transmittance was measured by a color computer.

(2) Solar Battery Module Evaluation Tests

The solar battery modules were subjected to environmental tests in conformity to conditions specified in JIS C8917-1989. Photovoltaic output of the solar battery modules was measured before and after environmental tests.

(3) Moisture Permeability and Oxygen Permeability

The moisture permeabilities of the protective sheets in Examples 1 to 18 and Comparative examples 1 to 3 were measured in an atmosphere of 40° C. and 90% RH by a moisture permeability measuring apparatus (PERMATRAN, MOCON, USA). The oxygen permeabilities of the protective sheets in Examples 1 to 18 and Comparative examples 1 to 3 were measured in an atmosphere of 23° C. and 90% RH by an oxygen permeability measuring apparatus (OXTRAN, MOCON, USA). Measured data is tabulated in Table 2-1.

TABLE 2-1

|  | Total transmittance (%) | Moisture permeability (g/m$^2$/24 hr) | Oxygen permeability (cc/m$^2$/24 hr/atm) | Output reduction ratio (%) |
| --- | --- | --- | --- | --- |
| Example 1 | 92 | 0.5 | 5.3 | 4 |
| Example 2 | 91 | 0.2 | 2.0 | 3 |
| Example 3 | 91 | 0.1 | 1.1 | 2 |
| Example 4 | 92 | 0.5 | 4.9 | 2 |
| Example 5 | 91 | 0.2 | 1.8 | 2 |
| Example 6 | 91 | 0.1 | 1.0 | 1 |
| Example 7 | 92 | 0.5 | 5.1 | 3 |
| Example 8 | 91 | 0.2 | 2.1 | 4 |
| Example 9 | 91 | 0.1 | 1.1 | 4 |
| Example 10 | 90 | 0.3 | 4.5 | 3 |
| Example 11 | 90 | 0.2 | 2.0 | 3 |
| Example 12 | 90 | 0.1 | 0.9 | 2 |
| Example 13 | 90 | 0.3 | 3.9 | 2 |

TABLE 2-1-continued

|  | Total transmittance (%) | Moisture permeability (g/m$^2$/24 hr) | Oxygen permeability (cc/m$^2$/24 hr/atm) | Output reduction ratio (%) |
| --- | --- | --- | --- | --- |
| Example 14 | 89 | 0.2 | 1.5 | 2 |
| Example 15 | 91 | 0.3 | 0.8 | 1 |
| Example 16 | 90 | 0.2 | 0.7 | 1 |
| Example 17 | 90 | 0.1 | 0.6 | 1 |
| Example 18 | 89 | 0.1 | 0.9 | 1 |
| Comparative Example 1 | 89 | 15.5 | 40.3 | 14 |
| Comparative Example 2 | 93 | 26.3 | 27.7 | 15 |
| Comparative Example 3 | 93 | 26.3 | 27.7 | 12 |

In table 2-1, total transmittance is expressed in a unit of %, moisture permeability is expressed in a unit of g/m$^2$/day·40° C.·100% RH, oxygen permeability is expressed in a unit of cc/m$^2$/day·23° C.·90% RH, and output reduction ratio is expressed in a unit of %.

As obvious from Table 2-1, the protective sheets in Examples 1 to 18 have high total transmittances, respectively, and are excellent in moisture impermeability and oxygen impermeability.

The output reduction ratios of the solar battery modules employing the protective sheets in Examples 1 to 18 were low.

The protective sheets in Comparative examples 1 to 3 had high total transmittances, respectively. However, the moisture impermeabilities and the oxygen impermeabilities of the protective sheets in Comparative examples 1 to 3 were low. Consequently, the output reduction ratios of the solar battery modules employing the protective sheets in Comparative examples 1 to 3 were high.

As apparent from the foregoing description, the present invention uses a cyclic polyolefin resin film or sheet as a base sheet, fabricates a protective sheet for a solar battery module by forming a transparent, vitreous deposited inorganic oxide thin film, such as a silicon oxide thin film or an aluminum oxide thin film, on one of the surfaces of the cyclic polyolefin resin film or sheet; the protective sheet thus fabricated is used as the front surface protective sheet or the back surface protective sheet of a solar battery module; the solar battery module is fabricated by, for example, superposing the protective sheet as a front surface protective sheet, a filler layer, a film provided with solar cells, i.e., photovoltaic cells, a filler layer and a back surface protective sheet for a solar battery module in that order in a superposed structure with the deposited inorganic oxide thin film facing inside, bringing the component layers of the superposed structure into close contact by vacuum and bonding together those component layers by a lamination process using hot pressing; and the protective sheet is excellent in sunlight transmittance, strength, weather resistance, heat resistance, water resistance, light resistance, wind endurance, hailstorm resistance, chemical resistance, moisture resistance, soil resistance and piercing strength, has a high impermeability to moisture and oxygen, limits performance degradation due to aging to the least extent, very durable, has excellent protective ability, and can be used for the stable fabrication of a low-cost, safe solar battery module.

The materials mentioned in the description of the first embodiment are applicable to the second embodiment.

Third Embodiment

The present invention will be described hereinafter with reference to the accompanying drawings.

In this description, the term "sheet" is used in its broad sense to denote both sheets and films, and the term "film" is used in its broad sense to denote both sheets and films.

Figure 13:
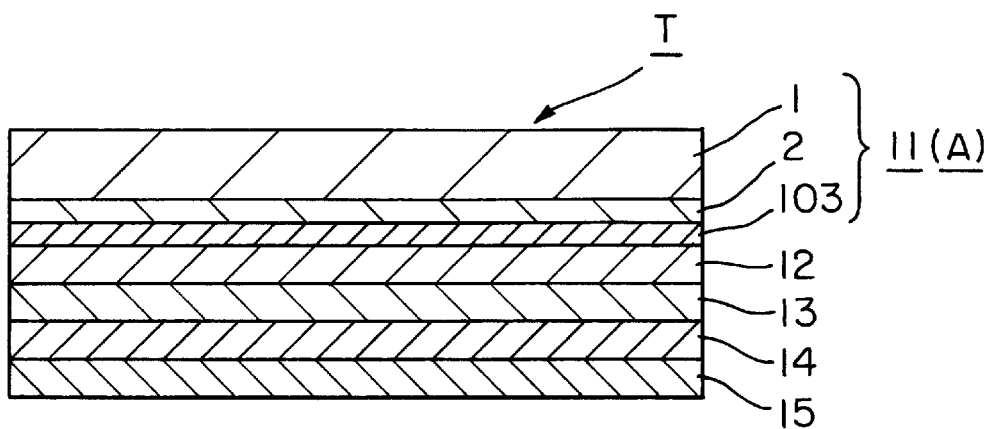
FIG. 13 is a typical sectional view of a solar battery module provided with the protective sheet shown in FIG. 10.
Figure 14:
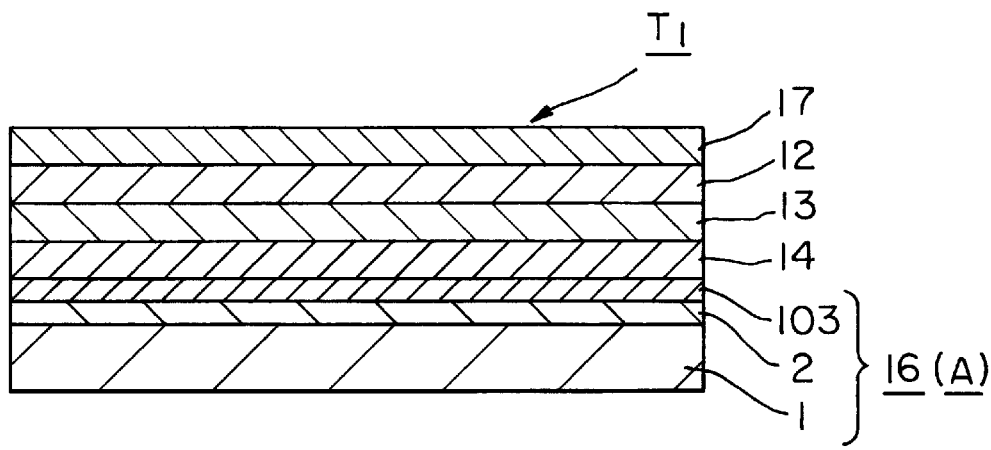
FIG. 14 is a typical sectional view of a solar battery module provided with the protective sheet shown in FIG. 10.
Figure 15:
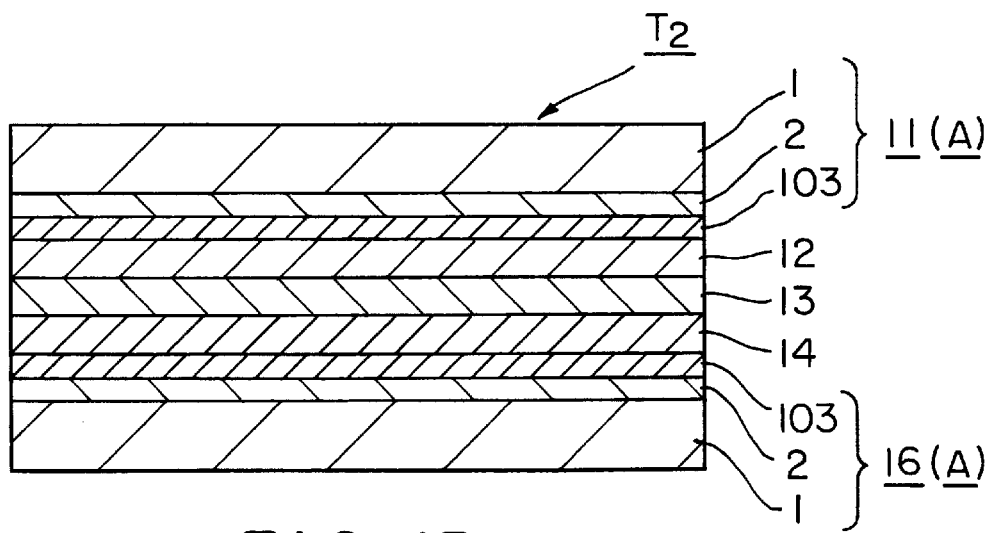
FIG. 15 is a typical sectional view of a solar battery module provided with the protective sheet shown in FIG. 10.

Protective sheets in accordance with the present invention for solar battery modules and solar battery modules employing the protective sheets will be described with reference to the accompanying drawings. FIGS. 10, 11 and 12 are typical sectional views of protective sheets in examples in a third embodiment according to the present invention for a solar battery module, and FIGS. 13, 14 and 15 are typical sectional views of solar battery modules employing the protective sheet shown in FIG. 10.

Referring to FIG. 10, a protective sheet A embodying the present invention for a solar battery module has a basic structure comprising a plastic sheet (weather-resistant sheet) 1, a deposited inorganic oxide film 2 formed on one of the surfaces of the plastic sheet 1, and a coating film 103 of a condensation polymer produced through the hydrolysis of a silicon compound and formed on the deposited inorganic oxide film 2.

As shown in FIG. 11, a protective sheet A$_1$ in an example of the third embodiment for a solar battery module comprises a plastic sheet 1, a multilayer film 4 consisting of at least two deposited inorganic oxide films 2 and formed on one of the surfaces of the plastic sheet 1, and a coating film 103 of a condensation polymer produced through the hydrolysis of a silicon compound and formed on the deposited inorganic oxide film 2 of the multilayer film 4.

As shown in FIG. 12 a protective sheet A$_3$ in a third example of the third embodiment for a solar battery module comprises a plastic sheet 1, a composite film 5 consisting of a first deposited inorganic oxide film 2a formed on one of the surfaces of the plastic sheet 1 by a chemical vapor deposition process and a deposited inorganic oxide film 2b formed on the deposited inorganic oxide film 2a by a physical vapor deposition process, and formed on one of the surfaces of the plastic film 1, and a coating film 13 of a condensation polymer produced through the hydrolysis of a silicon compound and formed on the deposited inorganic oxide film.

Those protective sheets are only examples of the protective sheet in the first embodiment and the present invention is not limited thereto.

For example, in the protective sheet A$_2$ shown in FIG. 12, a deposited inorganic oxide film may be formed first on the surface of the plastic sheet 1 by a physical vapor deposition process, and then another deposited inorganic oxide film may be formed by a chemical vapor deposition process.

A solar battery module employing this protective sheet A embodying the present invention and shown in FIG. 10 will be described by way of example. Referring to FIG. 13, a solar battery module T employs the protective sheet A shown in FIG. 10 as its front surface protective sheet 11. The solar battery module T is fabricated by superposing the front surface protective sheet 11 (A), a filler layer 12, a photovoltaic layer 13 of solar cells, a filler layer 14 and a generally known back surface protective sheet 15 in that order in a superposed structure, and subjecting the superposed structure to a generally known forming process, such as a lamination process, in which those component layers of the superposed structure are brought into close contact by vacuum and are bonded together by hot pressing. The coating film 103 of the front surface protective sheet 11 faces inside.

Another solar battery module $T_1$ shown in FIG. 14 employs the protective sheet A shown in FIG. 1 as its back surface protective sheet 16. The solar battery module $T_1$ is fabricated by superposing a generally known front surface protective sheet 17, a filler layer 12, a photovoltaic layer 13 of solar cells, a filler layer 14 and the back surface protective sheet 16 (A) in that order in a superposed structure, and subjecting the superposed structure to a generally known forming process, such as a lamination process, in which those component layers of the superposed structure are brought into close contact by vacuum and are bonded together by hot pressing. The coating film 103 of the protective sheet 16 faces inside.

A third solar battery module $T_2$ shown in FIG. 15 employs the protective sheet A shown in FIG. 10 as its front surface protective sheet 11 and its back surface protective sheet 16. The solar battery module $T_2$ is fabricated by superposing the front surface protective sheet 11 (A), a filler layer 12, a photovoltaic layer 13 of solar cells, a filler layer 14 and the protective sheet 16 (A) in that order in a superposed structure, and subjecting the superposed structure to a generally known forming process, such as a lamination process, in which those component layers of the superposed structure are brought into close contact by vacuum and are bonded together by hot pressing. The coating film 103 of each of the protective sheets 11 and 16 faces inside.

The foregoing protective sheets in accordance with the present invention and the foregoing solar battery modules employing those protective sheets are examples intended to illustrate the invention and not to be construed to limit the scope of the invention.

For example, the protective sheets shown in FIGS. 11 and 12 can be applied to solar battery modules of various types. The foregoing solar battery modules may comprise additional layers for sunlight absorption, reinforcement or the like. Basically, the plastic sheet (weather-resistant sheet) 1 for forming the protective sheet in accordance with the present invention and the solar battery module may be a film or sheet capable of withstanding deposition conditions for forming the deposited inorganic oxide film or coating conditions for forming the coating film, excellent in adhesion to the deposited inorganic oxide film or the coating film, capable of satisfactorily holding the film without adversely affecting the characteristics of those films, excellent in sunlight transmittance that affect the absorption of sunlight by a solar battery and the photovoltaic power generation of a solar battery, excellent in strength, weather resistance, heat resistance, water resistance, light resistance, wind endurance, hailstorm resistance and chemical resistance, having a high impermeability to moisture and oxygen, limiting performance degradation to the least extent, very durable, and having excellent protective ability. Those resin films or sheets may be those of, for example, polyethylene resins, polypropylene resins, cyclic polyolefin resins, polystyrene resins, acrylonitrile-styrene copolymers (AS resins), acrylonitrile-butadiene-styrene copolymers (ABS resins), polyvinyl chloride resins, fluorocarbon resins poly(meta) acrylic resins, polycarbonate resins, polyester resins, such as polyethylene terephthalate and polyethylene naphthalate, polyamide resins, such as nylons, polyimide resins, polyamidimide resins, polyaryl phthalate resins, silicone resins, polysulfone resins, polyphenylene sulfide resins, polyester sulfone resins, polyurethane resins, acetal resins, cellulose resins and the like.

Sheets of fluorocarbon resins, cyclic polyolefin resins, polycarbonate resins, poly(meta)acrylic resins and polyester resins are particularly preferable.

According to the present invention, it is particularly preferable to use transparent films or sheets of, for example, polytetrafluoroethylene (PTFE), perfluoroalcoxy resins (PFA), i.e., copolymers of tetrafluoroethylene and perfluoroalkylvinyl ether, copolymers of tetrafluoroethylene and hexafluoropropylene (FEP), copolymers of tetrafluoroethylene, perfluoroalkylvinyl ether and hexafluoropropylene (EPE), copolymers of tetrafluoroethylene and ethylene or propylene (ETFE), polychlorotrifluoroethylene resins (PCTFE) copolymers of ethylene and chlorotrifluoroethylene (ECTFE), vinylidene fluoride resins (PVDF), and one or some of fluorocarbon resins, such as vinyl fluoride resins (PVF).

Among those fluorocarbon resin sheets, sheets of polyvinyl fluoride resins (PVF) or copolymers of tetrafluoroethylene and ethylene or propylene (ETFE) are particularly preferable from the view point of transparency and sunlight transmittance.

According to the present invention, it is particularly preferable to use cyclic polyolefin resin sheets of, for example, cyclopentadiene and its derivatives, dicyclopentadiene and its derivatives, cyclohexadiene and its derivatives, norbornadiene and its derivatives, polymers of cyclic diene monomers, and copolymers of cyclic diene monomers and one or some of propylene, 4-methyl-1-pentene, styrene, butadiene, isoprene and olefin monomers.

According to the present invention, it is particularly preferable to use, among the foregoing transparent cyclic polyolefin resin sheets, transparent cyclic polyolefin sheets of cyclopentadiene and its derivatives, dicyclopentadiene and its derivatives or polymers or copolymers of cyclic diene monomers, such as norbornadiene and its derivatives, because those sheets are excellent in weather resistance and water resistance, are highly transparent and have high sunlight transmittance.

The protective sheets of the solar battery modules using the fluorocarbon resin sheet or the cyclic polyolefin resin sheet utilize the excellent properties of the fluorocarbon resin sheet or the cyclic polyolefin resin sheet including mechanical properties, chemical properties and optical properties, more concretely, weather resistance, heat resistance, water resistance, light resistance, moisture resistance, soil resistance, chemical resistance and the like. The protective sheet is equal in optical properties, durability and protective ability to a glass sheet commonly used as a protective sheet, has satisfactory mechanical properties including flexibility, and chemical properties, and is lighter than the glass sheet, excellent in workability and easy to handle.

According to the present invention, the resin films or sheets may be formed of, for example, one or some of the foregoing resins by a film forming process, such as an extrusion process, a casting process, a T-die extrusion process, a cutting process, an inflation process or the like, may be multilayer films or sheets of two or more kinds of the foregoing resins formed by a coextrusion process, or may be films or sheets formed by subjecting a mixture of a plurality of kinds of the foregoing resins to a film forming process. When necessary, the resin films or sheets may be uniaxially or biaxially oriented films or sheets formed by subjecting resin films or sheets to a uniaxial or biaxial orientation process of a tenter system or a tubular film system.

The thickness of the resin films or sheets is in the range of about 12 to about 300 μm, preferably, in the range of about 20 to about 200 μm.

It is desirable that the resin films or sheets of the present invention have a visible light transmittance of 90% or above, preferably, 95% or above and a property to transmit all incident sunlight and to absorb the same.

When forming the resin films each of one or a plurality of the resins, various compounding ingredients and additives may be added to the resin or resins to improve the workability, heat resistance, weather resistance, mechanical properties, dimensional stability, oxidation resistance, slipperiness, releasability, flame retardancy, antifungal property, electric properties and the like. The amount of each of the compounding ingredients and the additives is in the range of a very small percent to several tens percent and may optionally be determined according to the purpose.

The resins may contain commonly known additives, such as a lubricant, a crosslinking agent, an oxidation inhibitor, an ultraviolet absorber, a light stabilizer, a filler, a reinforcing material, a stiffener, an antistatic agent, a flame retarder, a flame-resistant agent, a foaming agent, an antifungus agent, a pigment and the like. The resins may further contain modifiers.

When necessary, a surface-treated layer 3 (FIG. 10) may be formed in a surface of each of the resin films or sheets before forming a deposited inorganic oxide film on the surface to improve adhesion between the resin films or sheets and a deposited inorganic oxide film.

According to the present invention, the composite resins may contain, for example, an ultraviolet absorber and/or an oxidation inhibitor to improve the light resistance and the like. may contain, for example, an ultraviolet absorber and/or an oxidation inhibitor to improve the light resistance and the like.

Description will be given of the coating film of a condensation polymer produced through the hydrolysis of a silicon compound, employed in the protective sheet in accordance with the present invention for a solar battery module and a solar battery module. When forming the coating film, a material containing a silicon compound as a principal component or a solution of the material prepared by dissolving the material in an appropriate solvent, such as ethanol or isopropanol, is brought into contact with a stoichiometrically necessary amount of water or an amount of water greater by one or several parts than the stoichiometrically necessary amount for hydrolysis to prepare a condensation polymer.

Preferably, the hydrolysis is carried out at a temperature in the range of −20 to 130° C., more preferably, in the range of 0 to 30° C. or at a temperature corresponding to the boiling point of the selectively used solvent.

The most proper method of bringing the material into contact with water is dependent particularly on the reactivity of the material.

The solution of the material may be dropped at long intervals into a surplus amount of water or the necessary amount of water may be added at a time or in a series of times to the solution prepared by selectively dissolving the material.

It is advantageous to introduce water into the reactive mixture by means of an organic or an inorganic solvent containing water instead of adding water to the reactive mixture.

It is known that the introduction of water into the reactive mixture by using a molecular sieve, and an organic solvent containing water, such as 30% ethanol, is particularly proper for most cases.

Water can be added to the reactive mixture by using a reaction that produces water, such as a reaction for producing an ester from an acid and an alcohol.

Suitable materials as the solvent, in addition to the effective lower aliphatic alcohols, are ketones, preferably, lower dialkyl ketones, such as acetone, and methyl isobutyl ketone, esters, preferably, lower dialkyl ethers, such as diethyl ether, tetrahydrofuran (THF), amides, esters including ethyl acetate, dimethyl formamide and mixtures of the same. Condensation polymerization by hydrolysis may selectively using a catalyst, such as a compound that discharges protons or hydroxyl ions, or an amine.

Suitable materials as the catalyst are organic or inorganic acids, such as hydrochloric acid and acetic acid, ammonia, alkaline metal and alkaline earth hydroxides, such as organic or inorganic salts including sodium hydroxide, potassium hydroxide and calcium hydroxide, and amines soluble in a reactive medium, such as lower alkylamines and alkanol amines.

Volatile acids and bases, such as ammonia and triethylamine, are particularly preferable.

The concentration of the catalyst may be 3 mol per liter at the greatest.

A mixture of all the source compounds need not necessarily be prepared before starting hydrolysis (condensation polymerization). Actually, in a specific case, it is advantageous to bring some of the source compounds into contact with water in an initial stage of hydrolysis, and then to bring the rest later into contact with water.

To reduce precipitation to the least possible extent, it is preferable to add water in several steps, for example, in three steps.

In the first step, $\frac{1}{10}$ to $\frac{1}{20}$ of the amount of water stoichiometrically necessary for hydrolysis is added to the source material.

After stirring a mixture of the source materials and water for a short time, $\frac{1}{5}$ to $\frac{1}{10}$ of the amount of water stoichiometrically necessary for hydrolysis is added to the mixture, the mixture is stirred for a sort time, and an amount of water is added to the mixture so that the total amount of water added to the source material is a little greater than the stoichiometric amount.

Time necessary for condensation polymerization by hydrolysis is dependent on the source materials, the concentrations of the source materials, the catalyst, reaction temperature and the like.

Generally, the reaction process for condensation polymerization by hydrolysis is conducted at atmospheric pressure. The reaction process may be conducted at a higher-than-atmospheric pressure or at a reduced pressure.

After all the predetermined amount of water has been added to the source materials, it is preferable to prepare a composite material comprising a condensation polymer produced through the hydrolysis of a silicon compound, by stirring the mixture for a long time in the range of two to three hours at room temperature or at a temperature slightly higher than room temperature.

According to the present invention, the composite material thus prepared is applied to or printed on the surface of the deposited inorganic oxide film in a composite material film, the composite material film is dried and aged to form the coating film. The composite material film may be formed by any one of coating processes including a floating-knife coating process, a knife-over-roll coating process, an inverted knife coating process, a squeeze roll coating process, a reverse roll coating process, a roll coating process, a gravure roll coating process, a kiss-roll coating process, an air blade coating process, a dip coating process, a flow coating process, a spin coating process, a spray coating process, a bar coating process, a curtain-flow coating process and the like, or any one of printing processes including a gravure printing process, an offset printing process, a silk-screen printing process, a transfer printing process and the like.

The desirable thickness of the coating film as dried is in the range of 0.2 to 50 g/m², more preferably, in the range of 1.0 to 25 g/m².

When curing the coating film of the composite material comprising the condensation polymer produced through the hydrolysis of silicon oxide, by a heating means or by irradiation with ionizing radiation, it is preferable that the composite material comprising the condensation polymer produced through the hydrolysis of silicon oxide contain an initiator.

The initiator may be a commercially available photopolymerization initiator.

Possible initiators are photoreaction initiators commercially available from ciba-Geigy, Switzerland including IRUGACURE 185 (1-hydroxycyclohexyl phenyl ketone), IRUGACURE 500 (1-hydroxycyclohexyl phenyl ketone+ benzophenone) and the like, GLOCURE 1173, 1116, 1396, 1274 and 1020 commercially available from Merk, Switzerland, benzophenone, 2-chlorothioxanethene, 2-methylthioxanthone, 2-isopropylthioxanthone, benzoin, 4,4-dimethoxybenzoin, benzoin ethyl ether, benzoin isopropyl ether, benzoin dimethyl ether, 1,1,1-trichloroacetophenone, diethoxyacetophenone and dibenzosuberon.

Particularly suitable thermal reaction initiators are diacyl peroxide, peroxydicarbonate, alkylperoxy ester, dialkyl peroxide, peroxy ketal, ketone peroxide and alkylperoxide organic peroxides.

Particularly preferable thermal reaction initiators are dibenzoil peroxide, perbenzoic tert-butyl and azobisisobutylonitrile.

Naturally, an ionic polymerization initiator may be used.

Particularly, a UV initiator that initiates cationic polymerization reaction is effective with compound including R' groups having epoxy groups, such as glycidyl oxypropyl trimethoxysilane, and expressed by general formula (1).

In most cases, the result of curing by cations is more satisfactory than that of curing by a free radical initiator under the same conditions.

The composite material may contain an ordinary amount of initiator. For example, a composite substance containing 30 to 50% by weight of solid content may contain 0.5 to 2% by weight (to the total weight) of initiator.

According to the present invention, the coating film formed by application or printing is cured after drying.

The coating film may be cured by a know process depending on the type of the initiator contained therein, such as a heating process or an irradiation process using a UV lamp, a laser or the like.

It is known that a thermal curing process is particularly advantageous to curing a coating film including R' groups having epoxy groups and an irradiation curing process, in most cases, is advantageous to curing a coating film containing R' groups having unsaturated C—C bonds.

According to the present invention, a silicon compound or silicon compounds expressed by R'SiR$_3$, where R' denotes a group stable to hydrolysis and capable of being polymerized by heat and/or ionizing radiation, and R denotes an OH group and/or a group subject to hydrolysis.

It is desirable that R' of the general formula R'SiR$_3$ is an epoxy atomic group or a group including an atomic group having a C—C double bond.

A glycidyl oxyalkyl group, particularly, a glycidyl oxyalkyl group having an alkyl part having one to four carbon atomic groups is an example of the group including an epoxy atomic group. Particularly preferable group is a γ-glycidyl oxypropyl group.

Preferably, the group R' of the general formula R'SiR$_3$, having an atomic group having a C—C double bond is selectively substituted alkenyl and alkynyl groups, such as a straight chain, a side chain or a cyclic group having 2 to 20, preferably, 2 to 10 carbon atoms and at least one C—C double bond. Particularly preferable groups as the group R' are lower alkenyl groups, such as vinyl, 1- and 2-propenyl, butenyl, isobutenyl, phenyl vinyl and propargyl, or groups including atomic groups including an alkynyl group, a methacryl group or an acrylic group.

In the general formula R'SiR$_3$, R is, for example, hydrogen, a halogen, an alkoxy group, a hydroxyl group, or an alkynylcarbonyl group.

According to the present invention, particularly preferable groups are, for example, a methoxy group, an ethoxy group, an n-propoxy group, an i-propoxy group, a sec-butoxy group, a tert-butoxy group, an isobutoxy group, a β-methoxyethoxy group, an acetyloxy group, a propionyloxy group, a monomethylamino group, a monoethylamino group, a dimethylamino group, a diethylamino group, an N-ethylanilino group, a methylcarbonyl group, an ethylcarbonyl group, a methoxycarbonyl group, an ethoxycarbonyl group and the like.

The group R of the general formula R'SiR$_3$ does not remain in the final product, is decomposed by hydrolysis, and the product of hydrolysis must be removed immediately or later by an appropriate method. Therefore, a group not having any substituent and capable of being hydrolyzed into a lower alcohol of a low molecular weight, such as methanol, ethanol propanol or butanol, is particularly preferable as the group R. The silicon compound expressed by the general formula R'SiR$_3$ may be used in an entirely or partly condensed form, i.e., in a compound produced by the partial hydrolysis of the silicon compound, individually or in combination with another hydrolyzable compound, such as an organometallic compound.

Preferably, such an oligomer is a partially condensed substance soluble in a reaction medium, having the shape of a straight or cyclic chain, a low molecular weight and a condensation degree in the range of, for example, about 2 to 100, more preferably, in the range of about 2 to 6, such as polyorganosiloxane.

Specific examples of substances capable of being effectively used as the silicon compound expressed by the general formula R'SiR$_3$ are γ-(meta)acryloxypropyl trimethoxysilane, vinyl trichlorosilane, vinyl trimethoxysilane, vinyl triethoxysilane, vinyl tris(β-methoxyethoxy)silane and γ-glycidyl oxypropyl trimethoxysilane.

Preferably, the silicon compound expressed by the general formula R'SiR$_3$ is not used individually. Preferably, the silicon compound is mixed with one or some of organometallic compounds expressed by general formula MR$_n$, where M denotes an element, such as silicon, aluminum, titanium, zirconium, vanadium, boron and tin, R denotes an OH group and/or a easily hydrolyzable group and n denotes the valence of the metallic element, that is generally used for producing glass and ceramic materials, and the compounds are converted into hydrates of corresponding oxides by hydrolysis preferably, complete hydrolysis.

A metallic element contained in the organometallic compound expressed by the general formula MR$_n$ is, for example, silicon, aluminum titanium, zirconium, vanadium, boron or tin. It goes without saying that the present invention may use an organometallic compound containing a metallic element other than those mentioned above.

In the organometallic compound expressed by the general formula $MR_n$, R may be either the same or different and may be defined similarly to the R of the general formula $R'SiR_3$ expressing the silicon compound.

Preferably, the organometallic compound expressed by the general formula $MR_n$ and the silicon compound expressed by the general formula $R'SiR_3$ are used in a mixture having the molar ratio of the organometallic compound to the silicon compound in the range of 1:99 to 99:1.

The material forming the coating film of the present invention may contain, in addition to the silicon compound expressed by the general formula $R'SiR_3$ and the organometallic compound expressed by the general formula $MR_n$, one or some kinds of resins having hydrogen bond forming groups as a binder or binders.

Possible resins having hydrogen bond forming groups are, for example, polymers having hydroxyl groups and their derivatives, such as polyvinyl alcohol, polyvinyl acetal, ethylene-vinyl alcohol copolymers, phenolic resins, methylol melamine resins and their derivatives, polymers having carboxyl groups and their derivatives, such as polymers or copolymers of polymerizing unsaturated acids including poly(meta)acrylic acid, maleic anhydride and itaconic acid, and their esters, such as polymers or copolymers of vinyl esters including vinyl acetate, (meta)acrylic acid esters including methyl methacrylate, polymers having ether bonds, such as polyalkylene oxide, polyoxyalkylene glycol and polyvinyl ether, silicone resins, polymers having amide bonds, such as a>N(COR) bond (R is hydrogen atom, an alkyl group which may have a substituent or an aryl group which may have a substituent), polyvinyl pyrrolidone having a >N(O) bond and its derivatives, polyurethane resins having urethane bonds, polymers having urea bonds and polymers having amide bonds.

According to the present invention, the resin having hydrogen bond forming groups may be used with a mixture of the silicon compound expressed by the general formula $R'SiR_3$ and the organometallic compound expressed by the general formula $MR_n$ and the amount of the resin having hydrogen bond forming groups to be used is such that the weight ratio of the resin having hydrogen bond forming groups to the mixture of the silicon compound and the organometallic compound is in the range of 1:99 to 99:1, preferably, 5:30.

EXAMPLES

Examples of the third embodiment will be described hereinafter.

Example 1

(1) A roll of a 50 µm thick polyvinyl fluoride sheet (PVF sheet) was mounted on a feed roll of a plasma chemical vapor deposition system. A 50 Å thick deposited silicon oxide thin film as a deposition-resistant protective film was deposited on a treated surface of the polyvinyl fluoride sheet treated for adhesion improvement under the following deposition condition.

Deposition conditions:
Reaction gas mixing ratio: Hexamethyldicyloxane: Oxygen: Helium=5:5:5 (Unit: slm)
Vacuum in vacuum chamber: $7.5 \times 10^{-6}$ mbar
Vacuum in deposition chamber: $3.8 \times 10^{-2}$ mbar
Power supplied to cooling electrode drum: 15 kW
Sheet moving speed: 100 m/min (2) A roll of the 50 µm thick polyvinyl fluoride sheet (PVF sheet) provided with the deposition-resistant protective film was mounted on the feed roll of a plasma chemical vapor deposition system, and a 800 Å thick deposited silicon oxide thin film was deposited on the deposition-resistant protective film of the polyvinyl fluoride sheet under the following deposition conditions.

Deposition conditions
Reaction gas mixing ratio: Hexamethyldicyloxane: Oxygen:Helium=5:10:10 (Unit: slm)
Vacuum in vacuum chamber: $5.0 \times 10^{-6}$ mbar
Vacuum in deposition chamber: $6.0 \times 10^{-2}$ mbar
Power supplied to cooling electrode drum: 20 kW
Sheet moving speed: 80 m/min The 800 Å thick deposited silicon oxide film formed on the surface of the polyvinyl fluoride sheet was subjected to a corona discharge process to form a corona-processed surface and to increase the surface tension of the deposited silicon oxide film from 35 dyne to 60 dyne. Corona discharge power was 10 kW and the sheet was moved at a moving speed of 100 m/min.

(3) Then, 25% by mole aluminum sec-butyrate was dropped at long intervals into a mixture of 45% by mole methacryl oxypropyl trimethoxysilane and 30% by mole methyl trimethoxysilane heated at room temperature while the mixture was stirred moderately. After all aluminum sec-butyrate had been dropped, the mixture was stirred for five minutes and was cooled to 15° C.

An amount of water equal to 1/15 of an amount was water necessary for complete hydrolysis was dropped into the mixture while the mixture was stirred.

The mixture was stirred for additional five minutes, and then was cooled to 8° C.

Hydrolysis was completed and a coating composite material was prepared.

The coating composite material thus prepared was applied by a gravure roll coating process to the corona-processed surface of the deposited silicon oxide film formed in (2) in a coating film, the coating film was dried at 120° C. for 1 hr to form a coating film of 1.0 g/m² (dry state) in coating rate. Thus a protective sheet in accordance with the present invention for a solar battery module was fabricated.

(4) A solar battery module was fabricated by using the protective sheet thus fabricated as a front surface protective sheet. The front surface protective sheet, a 400 µm thick ethylene-vinyl acetate copolymer sheet, a 38 µm thick biaxially oriented polyethylene terephthalate film provided with an array of amorphous silicon solar cells, a 400 µm thick ethylene-vinyl acetate copolymer sheet and a 50 µm thick biaxially oriented polyethylene terephthalate film were superposed in that order with the coating film of the protective sheet facing inside and the surface of the 38 µm thick biaxially oriented polyethylene terephthalate film provided with the array of amorphous silicon solar cells facing the front surface protective sheet. Those component layers were laminated by using adhesive layers of an acrylic resin to complete a solar battery module.

(5) Another protective sheet in accordance with the present invention and another solar battery module of the same components were fabricated by the same processes, except that a 50 µm thick fluorocarbon resin sheet of an ethylene-tetrafluoroethylene copolymer was used instead of the 50 µm thick polyvinyl fluoride sheet (PVF sheet).

Example 2

(1) A roll of a 50 µm thick polyvinyl fluoride film was mounted on a feed roll of a continuous vacuum evaporation system. The 50 µm thick polyvinyl fluoride film was unwound and wound around a coating drum. A 800 Å thick deposited aluminum oxide film was deposited on the deposition-resistant protective film of the polyvinyl fluoride sheet under the following conditions by a reactive evaporation process of an electron beam (EB) heating system, in which aluminum was used as an evaporation source and oxygen gas was supplied to the continuous vacuum evaporation system.

Deposition conditions:
Evaporation source: Aluminum
Vacuum in vacuum chamber: $7.5 \times 10^{-6}$ mbar
Vacuum in deposition chamber: $2.1 \times 10^{-6}$ mbar
EB power: 40 kW
Film moving speed: 600 m/min Subsequently, the 800 Å thick deposited aluminum oxide film formed on the surface of the polyvinyl fluoride sheet was processed by a glow-discharge plasma process to form a plasma-processed surface. The glow-discharge plasma process was carried out by a glow-discharge plasma producing apparatus of 1500 W in plasma output immediately after the deposition of the 800 Å thick deposited aluminum oxide film. In the glow-discharge plasma process, an oxygen/argon mixed gas of 19/1 in $O_2$/Ar ratio was supplied so that the pressure of the oxygen/argon mixed gas is maintained at $6 \times 10^{-5}$ torr and the processing speed was 420 m/min.

(2) A mixture of 25 g of ethyl silicate, 25 g of ethanol, 86 g of 2N hydrochloric acid and 1.51 g of water was heated at 80° C. and was stirred for 1 to 2 hr.

The molar ratio of ethyl silicate to water of the mixture was 1:1:51.

Then, 2.5 g of epoxy silane (SH 6040, Commercially available from Toray-Dou Corning) was added to the mixture and the mixture was stirred.

Then, 1.7 g of a 10% polyvinyl alcohol aqueous solution (polyvinyl alcohol having a polymerization degree of 2000 available from Kuraray) was added to the mixture and the mixture was stirred for 1 to 2 hr. When the mixture turned transparent, 0.1 g of 32% by weight N,N-dimethylbenzylamine ethanol solution was added to prepare a composite coating material.

The coating composite material thus prepared was applied to the plasma-processed surface of the deposited aluminum oxide film formed in (1) by a gravure roll coating process in a film of 1.0 $g/m^2$ in coating rate to complete a protective sheet for a solar battery module.

(3) A solar battery module was fabricated by using the protective sheet thus fabricated as a front surface protective sheet. The front surface protective sheet, a 400 µthick ethylene-vinyl acetate copolymer sheet, a 38 µm thick biaxially oriented polyethylene terephthalate film provided with an array of amorphous silicon solar cells, a 400 µm thick ethylene-vinyl acetate copolymer sheet and a 50 µm thick biaxially oriented polyethylene terephthalate film were superposed in that order with the coating film of the front surface protective sheet facing inside and the surface of the 38 µm thick biaxially oriented polyethylene terephthalate film provided with the array of amorphous silicon solar cells facing the front surface protective sheet. Those component layers were laminated by using adhesive layers of an acrylic resin to complete a solar battery module.

(4) Another protective sheet in accordance with the present invention and another solar battery module of the same components were fabricated by the same processes, except that a 50 µm thick fluorocarbon resin sheet of an ethylene-tetrafluoroethylene copolymer (ETFE) was used instead of the 50 µm thick polyvinyl fluoride sheet (PVF sheet).

Example 3

(1) A roll of a 50 µm thick polyvinyl fluoride film (PVF film) was mounted on a feed roll of a plasma chemical vapor deposition system. A 500 Å A thick deposited silicon oxide thin film was deposited on one of the surfaces of the polyvinyl fluoride film under the following conditions.

Deposition conditions:
Reaction gas mixing ratio: Hexamethyldisiloxane/oxygen/helium=1/10/10 (Unit: slm)
Vacuum in vacuum chamber: $5.0 \times 10^{-6}$ mbar
Vacuum in deposition chamber: $6.0 \times 10^{-2}$ mbar
Power supplied to cooling electrode drum: 20 kW
Film moving speed: 80 m/min
Surface for deposition: Corona-processed surface The surface of the 500 Å thick deposited silicon oxide thin film formed on the polyvinyl fluoride film was subjected to a corona discharge process to form a corona-processed surface and to increase the surface tension of the deposited silicon oxide thin film from 35 dyne to 60 dyne. Corona discharge power was 10 kW and the sheet was moved at a moving speed of 100 m/min.

(2) A roll of the polyvinyl fluoride film provided with the corona-processed deposited silicon oxide thin film was mounted on a feed roll of a continuous vacuum evaporation system. The polyvinyl fluoride film was unwound and wound around a coating drum and a 500 Å thick deposited aluminum oxide thin film was deposited on the corona-processed surface of the deposited silicon oxide thin film formed on the polyvinyl fluoride film by a reactive vacuum evaporation process of an electron beam (EB) heating system. Aluminum was used as an evaporation source and oxygen gas was supplied to the continuous vacuum evaporation system.

Deposition conditions:
Evaporation source: Aluminum
Vacuum in vacuum chamber: $7.5 \times 10^{-6}$ mbar
Vacuum in deposition chamber: $2.1 \times 10^{-6}$ mbar
EB power: 40 kW
Film moving speed: 600 m/min A protective sheet in accordance with the present invention for a solar battery module was completed by subjecting the 500 Å thick deposited aluminum oxide thin film formed on the surface of the polyvinyl fluoride sheet to a glow-discharge plasma process to form a plasma-processed surface. The glow-discharge plasma process was carried out by a glow-discharge plasma producing apparatus of 1500 W in plasma output immediately after the deposition of the 500 Å thick deposited aluminum oxide thin film. In the glow-discharge plasma process, an oxygen/argon mixed gas of 19/1 in $O_2$/Ar ratio was supplied so that the pressure of the oxygen/argon mixed gas is maintained at $6 \times 10^{-5}$ torr and the processing speed was 420 m/min.

(3) The plasma-processed surface of the deposited aluminum oxide film formed in (2) was coated with a film of the composite coating material prepared in Example 1. The film of the composite coating material was dried at 120° C. for 1 hr to form a coating film of 1.0 $g/m^2$ (dry state) in coating rate to complete a protective sheet in accordance with the present invention for a solar battery module.

(4) A solar battery module was fabricated by using the protective sheet thus fabricated as a front surface protective sheet. The front surface protective sheet, a 400 μm thick ethylene-vinyl acetate copolymer sheet, a 38 μm thick biaxially oriented polyethylene terephthalate film provided with an array of amorphous silicon solar cells, a 400 μm thick ethylene-vinyl acetate copolymer sheet and a 50 μm thick biaxially oriented polyethylene terephthalate film were superposed in that order with the coating film facing inside and the surface of the 38 μm thick polyethylene terephthalate film provided with the array of amorphous silicon solar cells facing the front surface protective sheet. Those component layers were laminated by using adhesive layers of an acrylic resin to complete a solar battery module.

(5) Another protective sheet in accordance with the present invention and another solar battery module of the same components were fabricated by the same processes, except that a 50 μm thick fluorocarbon resin sheet of an ethylene-tetrafluoroethylene copolymer (ETFE) containing an ultraviolet absorber was used instead of the 50 μm thick polyvinyl fluoride film (PVF film) containing an ultraviolet absorber.

Example 4

(1) A roll of a 50 μm thick polyvinyl fluoride sheet (PVF sheet) was mounted on a feed roll of a continuous vacuum evaporation system. The polyvinyl fluoride sheet was unwound and wound around a coating drum. A 50 Å thick deposited aluminum oxide thin film as a deposition-resistant protective film was deposited on a treated surface of the polyvinyl fluoride film treated for adhesion improvement by a reactive vacuum evaporation process of an electron beam (EB) heating system under the following conditions.

Deposition conditions:

Evaporation source: Aluminum

Vacuum in vacuum chamber: $7.5 \times 10^{-6}$ mbar

Vacuum in deposition chamber: $2.1 \times 10^{-6}$ mbar

EB power: 20 kW

Film moving speed: 500 m/min (2) A 800 Å thick deposited aluminum oxide film was formed by a method similar to that of (2) of Example 2 on the deposition-resistant protective film, i.e., the deposited aluminum oxide film, of the 50 μm thick polyvinyl fluoride sheet by a reactive vacuum evaporation process of an electron beam (EB) heating system. The surface of the deposited aluminum oxide film was subjected to a plasma process to form a plasma-processed surface.

(3) The plasma-processed surface of the deposited aluminum oxide film formed in (2) was coated with a film of the composite coating material prepared in Example 2 by a gravure roll coating process. The film of the composite coating material was dried at 120° C. for 1 hr to form a coating film of 2.0 g/m² (dry state) in coating rate to complete a protective sheet in accordance with the present invention for a solar battery module.

(4) A solar battery module was fabricated by using the protective sheet thus fabricated as a front surface protective sheet. The front surface protective sheet, a 400 μm thick ethylene-vinyl acetate copolymer sheet, a 38 μm thick biaxially oriented polyethylene terephthalate film provided with an array of amorphous silicon solar cells, a 400 μm thick ethylene-vinyl acetate copolymer sheet and a 50 μm thick biaxially oriented polyethylene terephthalate film were superposed in that order with the coating film facing inside and the surface of the 38 μm thick polyethylene terephthalate film provided with the array of amorphous silicon solar cells facing the front surface protective sheet. Those component layers were laminated by using adhesive layers of an acrylic resin to complete a solar battery module.

(5) Another protective sheet in accordance with the present invention and another solar battery module of the same components were fabricated by the same processes, except that a 50 μm thick fluorocarbon resin sheet of an ethylene-tetrafluoroethylene copolymer (ETFE) was used instead of the 50 μm thick polyvinyl fluoride sheet (PVF sheet).

Example 5

(1) Protective sheets that are the same as the protective sheet in Example 1 were used as the front surface protective sheet and the back surface protective sheet of a solar battery module. The solar battery module was fabricated by superposing the front surface protective sheet, a 400 μm thick ethylene-vinyl acetate copolymer sheet, a 38 μm thick biaxially oriented polyethylene terephthalate film provided with an array of amorphous silicon solar cells, a 400 μm thick ethylene-vinyl acetate copolymer sheet and the back surface protective sheet in that order with the coating films of the front surface and the back surface protective sheet facing inside and with the surface of the 38 μm thick polyethylene terephthalate film provided with the solar cells facing the front surface protective sheet, and laminating those component layers by using adhesive layers of an acrylic resin.

(2) Protective sheets in accordance with the present invention and another solar battery module of the same components were fabricated by the same processes, except that 50 μm thick fluorocarbon resin sheets of an ethylene-tetrafluoroethylene copolymer (ETFE) were used instead of the 50 μm thick polyvinyl fluoride sheets (PVF sheet).

Example 6

(1) Protective sheets that are the same as the protective sheet in Example 2 were used as the front surface protective sheet and the back surface protective sheet of a solar battery module. The solar battery module was fabricated by superposing the front surface protective sheet, a 400 μm thick ethylene-vinyl acetate copolymer sheet, a 38 μm thick biaxially oriented polyethylene terephthalate film provided with an array of amorphous silicon solar cells, a 400 μm thick ethylene-vinyl acetate copolymer sheet and the back surface protective sheet in that order with the coating films of the front surface and the back surface protective sheet facing inside and with the surface of the 38 μm thick polyethylene terephthalate film provided with the array of amorphous silicon solar cells facing the front surface protective sheet, and laminating those component layers by using adhesive layers of an acrylic resin.

(2) Protective sheets in accordance with the present invention and another solar battery module of the same components were fabricated by the same processes, except that 50 μm thick fluorocarbon resin sheets of an ethylene-tetrafluoroethylene copolymer (ETFE) were used instead of the 50 μm thick polyvinyl fluoride sheets (PVF sheet).

Example 7

(1) Protective sheets that are the same as the protective sheet in Example 3 were used as the front surface protective sheet and the back surface protective sheet of a solar battery module. The solar battery module was fabricated by superposing the front surface protective sheet, a 400 μm thick ethylene-vinyl acetate copolymer sheet, a 38 μm thick biaxially oriented polyethylene terephthalate film provided with an array of amorphous silicon solar cells, a 400 μm thick ethylene-vinyl acetate copolymer sheet and the back surface protective sheet in that order with the coating films of the front surface and the back surface protective sheet facing inside and with the surface of the 38 μm thick polyethylene terephthalate film provided with the array of amorphous silicon solar cells facing the front surface protective sheet, and laminating those component layers by using adhesive layers of an acrylic resin.

(2) Protective sheets in accordance with the present invention and another solar battery module of the same components were fabricated by the same processes, except that 50 μm thick fluorocarbon resin sheets of an ethylene-tetrafluoroethylene copolymer (ETFE) containing an ultraviolet absorber were used instead of the 50 μm thick polyvinyl fluoride sheets (PVF sheets) containing the ultraviolet absorber.

Example 8

(1) Protective sheets that are the same as the protective sheet in Example 4 were used as the front surface protective sheet and the back surface protective sheet of a solar battery module. The solar battery module was fabricated by superposing the front surface protective sheet, a 400 μm thick ethylene-vinyl acetate copolymer sheet, a 38 μm thick biaxially oriented polyethylene terephthalate film provided with an array of amorphous silicon solar cells, a 400 μm thick ethylene-vinyl acetate copolymer sheet and the back surface protective sheet in that order with the coating films of the front surface and the back surface protective sheet facing inside and with the surface of the 38 μm thick polyethylene terephthalate film provided with the array of amorphous silicon solar cells facing the front surface protective sheet, and laminating those component layers by using adhesive layers of an acrylic resin.

(2) Protective sheets in accordance with the present invention and another solar battery module of the same components were fabricated by the same processes, except that 50 μm thick fluorocarbon resin sheets of an ethylene-tetrafluoroethylene copolymer (ETFE) were used instead of the 50 μm thick polyvinyl fluoride sheets (PVF sheets).

Example 9

(1) A protective sheet that is the same as the protective sheet in Example 1 was used as the back surface protective sheet of a solar battery module. The solar battery module was fabricated by superposing a 3 mm thick glass sheet, a 400 μm thick ethylene-vinyl acetate copolymer sheet, a 38 μm thick biaxially oriented polyethylene terephthalate film provided with an array of amorphous silicon solar cells, a 400 μm thick ethylene-vinyl acetate copolymer sheet and the back surface protective sheet in that order with the coating film of the back surface protective sheet facing inside and with the surface of the 38 μm thick polyethylene terephthalate film provided with the array of amorphous silicon solar cells facing the 3 mm thick glass sheet, and laminating those component layers by using adhesive layers of an acrylic resin.

(2) A protective sheet in accordance with the present invention and another solar battery module of the same components were fabricated by the same processes, except that a 50 μm thick fluorocarbon resin sheet of an ethylene-tetrafluoroethylene copolymer (ETFE) was used instead of the 50 μm thick polyvinyl fluoride sheet (PVF sheet).

Example 10

(1) A protective sheet that is the same as the protective sheet in Example 2 was used as the back surface protective sheet of a solar battery module. The solar battery module was fabricated by superposing a 50 μm thick polyvinyl fluoride sheet (PVF sheet), a 400 μm thick ethylene-vinyl acetate copolymer sheet, a 38 μm thick biaxially oriented polyethylene terephthalate film provided with an array of amorphous silicon solar cells, a 400 μm thick ethylene-vinyl acetate copolymer sheet and the back surface protective sheet in that order with the coating film of the back surface protective sheet facing inside and with the surface of the 38 μm thick polyethylene terephthalate film provided with the array of amorphous silicon solar cells facing the 50 μm thick polyvinyl fluoride sheet, and laminating those component layers by using adhesive layers of an acrylic resin.

(2) A protective sheet in accordance with the present invention and another solar battery module of the same components were fabricated by the same processes, except that a 50 μm thick fluorocarbon resin sheet of an ethylene-tetrafluoroethylene copolymer (ETFE) was used instead of the 50 μm thick polyvinyl fluoride sheet (PVF sheet).

Example 11

(1) A protective sheet that is the same as the protective sheet in Example 3 was used as the back surface protective sheet of a solar battery module. The solar battery module was fabricated by superposing a 50 μm thick polyvinyl fluoride sheet (PVF sheet), a 400 μm thick ethylene-vinyl acetate copolymer sheet, a 38 μm thick biaxially oriented polyethylene terephthalate film provided with an array of amorphous silicon solar cells, a 400 μm a thick ethylene-vinyl acetate copolymer sheet and the back surface protective sheet in that order with the coating film of the back surface protective sheet facing inside and with the surface of the 38 μm thick polyethylene terephthalate film provided with the array of amorphous silicon solar cells facing the 50 μm thick polyvinyl fluoride sheet, and laminating those component layers by using adhesive layers of an acrylic resin.

(2) A protective sheet in accordance with the present invention and another solar battery module of the same components were fabricated by the same processes, except that a 50 μm thick fluorocarbon resin sheet of an ethylene-tetrafluoroethylene copolymer (ETFE) was used instead of the 50 μm thick polyvinyl fluoride sheet (PVF sheet).

Examples 12 to 15

Front surface protective sheets in accordance with the present invention and solar battery modules of the same components as those of Example 1 were fabricated by the same processes by using plastic sheets in Examples 12 to 15 instead of the 50 μm thick polyvinyl fluoride sheet (PVF sheet).

Example 12: 100 μm thick polydicyclopentadiene resin sheet

Example 13: 100 μm thick polycarbonate resin sheet

Example 14: 100 μm thick polyacrylic resin sheet

Example 15: 100 μm thick polyethylene terephthalate resin sheet

Examples 16 to 19

Front surface protective sheets in accordance with the present invention and solar battery modules of the same components as those of Example 2 were fabricated by the same processes by using plastic sheets in Examples 16 to 19 instead of the 50 μm thick polyvinyl fluoride sheet (PVF sheet).

Example 16: 100 μm thick polydicyclopentadiene resin sheet

Example 17: 100 μm thick polycarbonate resin sheet

Example 18: 100 μm thick polyacrylic resin sheet

Example 19: 100 μm thick polyethylene terephthalate resin sheet

Example 20

(1) A 500 Å thick deposited silicon oxide film was formed on a surface of a 50 μm thick polyvinyl fluoride sheet (PVF sheet) by a radio-frequency induction heating process, in which 99.9% pure silicon monoxide (SiO) was evaporated in a vacuum of $1 \times 10^{-4}$ torr.

Subsequently, the surface of the 500 Å thick deposited silicon oxide film formed on the polyvinyl fluoride sheet was subjected to a corona discharge process to increase the surface tension of the same from 35 dyne to 60 dyne. Corona discharge power was 10 kW and the sheet was moved at a moving speed of 100 m/min.

(2) The coating composite material prepared in Example d1 was applied to the corona-processed surface of the deposited silicon oxide film by a gravure roll coating process in a coating film, the coating film was dried at 120° C. for 1 hr to form a coating film of 1.0 g/m² (dry state) in coating rate. Thus a protective sheet in accordance with the present invention for a solar battery module was fabricated.

(3) A solar battery module was fabricated by using the protective sheet thus fabricated as a front surface protective sheet. The front surface protective sheet, a 400 μm thick ethylene-vinyl acetate copolymer sheet, a 38 μm thick biaxially oriented polyethylene terephthalate film provided with an array of amorphous silicon solar cells, a 400 μm thick ethylene-vinyl acetate copolymer sheet and a 50 μm thick biaxially oriented polyethylene terephthalate film were superposed in that order with the coating film facing inside and the surface of the 38 μm thick biaxially oriented polyethylene terephthalate film provided with the solar cells facing the front surface protective sheet. Those component layers were laminated by using adhesive layers of an acrylic resin to complete a solar battery module.

(4) Another protective sheet in accordance with the present invention and another solar battery module of the same components were fabricated by the same processes, except that a 50 μm thick fluorocarbon resin sheet of an ethylene-vinyl acetate copolymer containing an ultraviolet absorber was instead of the 50 μm thick polyvinyl fluoride sheet (PVF sheet) containing an ultraviolet absorber.

Example 21

(1) A roll of the 50 μm thick polyvinyl fluoride sheet (PVF sheet) was mounted on the feed roll of a plasma chemical vapor deposition system, and a 800 Å thick deposited silicon oxide thin film was deposited on one of the surfaces of the polyvinyl fluoride sheet under the following deposition conditions.

Deposition conditions

Reaction gas mixing ratio: Hexamethyldicyloxane:Oxygen:Helium=1:10:10 (Unit: slm)

Vacuum in vacuum chamber: $5.0 \times 10^{-6}$ mbar

Vacuum in deposition chamber: $6.0 \times 10^{-2}$ mbar

Power supplied to cooling electrode drum: 20 kW

Sheet moving speed: 80 m/min

The 800 Å thick deposited silicon oxide film formed on the surface of the polyvinyl fluoride sheet was subjected to a corona discharge process to form a corona-processed surface and to increase the surface tension of the deposited silicon oxide film from 35 dyne to 60 dyne. Corona discharge power was 10 kW and the sheet was moved at a moving speed of 100 m/min.

(2) The coating composite material prepared in Example 1 was applied by a gravure roll coating process to the corona-processed surface of the deposited silicon oxide film in a film. The film was dried at 120° C. for 1 hr to form a coating film of 1.0 g/m² (dry state) in coating rate. Thus a protective sheet in accordance with the present invention for a solar battery module was fabricated.

(3) A solar battery module was fabricated by using the protective sheet thus fabricated as a front surface protective sheet. The front surface protective sheet, a 400 μm thick ethylene-vinyl acetate copolymer sheet, a 38 μm thick biaxially oriented polyethylene terephthalate film provided with an array of amorphous silicon solar cells, a 400 μm thick ethylene-vinyl acetate copolymer sheet and a 50 μm thick biaxially oriented polyethylene terephthalate film were superposed in that order with the coating film of the front surface protective sheet facing inside and the surface of the 38 μm thick biaxially oriented polyethylene terephthalate film provided with the array of amorphous silicon solar cells facing the front surface protective sheet. Those component layers were laminated by using adhesive layers of an acrylic resin to complete a solar battery module.

(4) Another protective sheet in accordance with the present invention and another solar battery module of the same components were fabricated by the same processes, except that a 50 μm thick fluorocarbon resin sheet of an ethylene-tetrafluoroethylene copolymer was used instead of the 50 μm thick polyvinyl fluoride sheet (PVF sheet).

Example 22

(1) A roll of a 50 μm thick polyvinyl fluoride film was mounted on a feed roll of a continuous vacuum evaporation system. The 50 μm thick polyvinyl fluoride film was unwound and wound around a coating drum. A 800 Å thick deposited aluminum oxide film was deposited on one of the surfaces of the of the polyvinyl fluoride sheet under the following conditions by a reactive evaporation process of an electron beam (EB) heating system, in which aluminum was used as an evaporation source and oxygen gas was supplied to the continuous vacuum evaporation system.

Deposition conditions:

Evaporation source: Aluminum

Vacuum in vacuum chamber: $7.5 \times 10^{-6}$ mbar

Vacuum in deposition chamber: $2.1 \times 10^{-6}$ mbar

EB power: 40 kW

Film moving speed: 600 m/min

Subsequently, the 800 Å thick deposited aluminum oxide film formed on the surface of the polyvinyl fluoride sheet was processed by a glow-discharge plasma process to form a plasma-processed surface. The glow-discharge plasma process was carried out by a glow-discharge plasma producing apparatus of 1500 W in plasma output immediately after the deposition of the 800 Å thick deposited aluminum oxide film. In the glow-discharge plasma process, an oxygen/argon mixed gas of 19/1 in $O_2/Ar$ ratio was supplied so that the pressure of the oxygen/argon mixed gas is maintained at $6 \times 10^{-5}$ torr and the processing speed was 420 m/min.

(2) The composite coating material prepared in Example 2 was applied to the plasma-processed surface of the deposited aluminum oxide film by a gravure roll coating process in a film. The film was dried at 120° C. for 1 hr to form a coating film of 1.0 g/m² in coating rate (dry state). Thus, a protective sheet in accordance with the present invention for a solar battery module was fabricated.

(3) A solar battery module was fabricated by using the protective sheet thus fabricated as a front surface protective sheet. The front surface protective sheet, a 400 μm thick ethylene-vinyl acetate copolymer sheet, a 38 μm thick biaxially oriented polyethylene terephthalate film provided with an array of amorphous silicon solar cells, a 400 μm thick ethylene-vinyl acetate copolymer sheet and a 50 μm thick biaxially oriented polyethylene terephthalate film were superposed in that order with the coating film of the front surface protective sheet facing inside and the surface of the 38 μm thick biaxially oriented polyethylene terephthalate film provided with the array of amorphous silicon solar cells facing the front surface protective sheet. Those component layers were laminated by using adhesive layers of an acrylic resin to complete a solar battery module.

(4) Another protective sheet in accordance with the present invention and another solar battery module of the same components were fabricated by the same processes, except that a 50 μm thick fluorocarbon resin sheet of an ethylene-tetrafluoroethylene copolymer (ETFE) was used instead of the 50 μm thick polyvinyl fluoride sheet (PVF sheet).

Comparative Example 1

A solar battery module was fabricated by superposing a 3 mm thick glass sheet as a back surface protective sheet, a 400 μm thick ethylene-vinyl acetate copolymer sheet, a 38 μm thick biaxially oriented polyethylene terephthalate film provided with an array of amorphous silicon solar cells, a 400 μm a thick ethylene-vinyl acetate copolymer sheet and a 50 μm thick biaxially oriented polyethylene terephthalate film in that order with the surface of the 38 μm thick polyethylene terephthalate film provided with the array of amorphous silicon solar cells facing the 50 μm thick biaxially oriented polyethylene terephthalate film, and laminating those component layers by using adhesive layers of an acrylic resin.

Comparative Example 2

A solar battery module was fabricated by superposing a 50 μm thick polyvinyl fluoride sheet (PVF sheet) as a front surface protective sheet, a 400 μm a thick ethylene-vinyl acetate copolymer sheet, a 38 μm thick biaxially oriented polyethylene terephthalate film provided with an array of amorphous silicon solar cells, a 400 μm thick ethylene-vinyl acetate copolymer sheet and a 50 μm thick biaxially oriented polyethylene terephthalate film in that order with the surface of the 38 μm thick polyethylene terephthalate film provided with the array of amorphous silicon solar cells facing the 50 μm thick polyvinyl fluoride sheet, and laminating those component layers by using adhesive layers of an acrylic resin.

Comparative Example 3

A solar battery module was fabricated by superposing a 100 μm thick polydicyclopentadiene sheet as a front surface protective sheet, a 400 μm a thick ethylene-vinyl acetate copolymer sheet, a 38 μm thick biaxially oriented polyethylene terephthalate film provided with an array of amorphous silicon solar cells, a 400 μm thick ethylene-vinyl acetate copolymer sheet and a 50 μm thick biaxially oriented polyethylene terephthalate sheet in that order with the surface of the 38 μthick polyethylene terephthalate film provided with the array of amorphous silicon solar cells facing the front surface protective sheet, and laminating those component layers by using adhesive layers of an acrylic resin.

Comparative Example 4

A solar battery module was fabricated by using 50 μm thick polyvinyl fluoride sheets (PVF sheets) as a front surface protective sheet and a back surface protective sheet. The solar battery module was fabricated by superposing one of the 50 μm thick polyvinyl fluoride sheets (PVF sheets) as a front surface protective sheet, a 400 μm thick ethylene-vinyl acetate copolymer sheet, a 38 μm thick biaxially oriented polyethylene terephthalate film provided with an array of amorphous silicon solar cells, a 400 μm thick ethylene-vinyl acetate copolymer sheet and the other 50 μm thick polyvinyl fluoride sheet (PVF sheet) as a back surface protective sheet in that order with the surface of the 38 μm thick polyethylene terephthalate film provided with the array of amorphous silicon solar cells facing the front surface protective sheet, and laminating those component layers by using adhesive layers of an acrylic resin.

Comparative Example 5

A solar battery module was fabricated by using 100 μm thick polydicyclopentadiene sheets as a front surface protective sheet and a back surface protective sheet. The solar battery module was fabricated by superposing one of the 100 μm thick polydicyclopentadiene sheets as a front surface protective sheet, a 400 μm thick ethylene-vinyl acetate copolymer sheet, a 38 μm thick biaxially oriented polyethylene terephthalate film provided with an array of amorphous silicon solar cells, a 400 μm thick ethylene-vinyl acetate copolymer sheet and the other 100 μm thick polydicyclopentadiene sheet in that order with the surface of the 38 μm an thick polyethylene terephthalate film provided with the array of amorphous silicon solar cells facing the front surface protective sheet, and laminating those component layers by using adhesive layers of an acrylic resin.

Experiments

The protective sheets in Examples 1 to 22 of the present invention and those in comparative examples 1 to 5 were subjected to total transmittance measurement. The solar battery modules in Examples 1 to 22 and Comparative examples 1 to 5 were subjected to solar battery module evaluation tests.

(1) Total Transmittance Measurement

Total transmittance (%) of each of the protective sheets in Examples 1 to 22 and Comparative examples 1 to 5 against the total transmittance of the base sheet as a reference total transmittance was measured by a color computer.

(2) Solar Battery Module Evaluation Tests

The solar battery modules were subjected to environmental tests in conformity to conditions specified in JIS C 8917-1989. Photovoltaic output of the solar battery modules was measured before and after environmental tests.

(3) Moisture Permeability and Oxygen Permeability The moisture permeabilities of the protective sheets in Examples 1 to 22 and Comparative examples 1 to 5 were measured in an atmosphere of 40° C. and 90% RH by a moisture permeability measuring apparatus (PERMATRAN, MOCON, USA). The oxygen permeabilities of the protective sheets in Examples 1 to 22 and Comparative examples 1 to 5 were measured in an atmosphere of 23° C. and 90% RH by an oxygen permeability measuring apparatus (OXTRAN, MOCON, USA).

Measured data is tabulated in Table 3-1.

TABLE 3-1

|  | Total transmittance (%) | Moisture permeability (g/m³/24 hr) | Oxygen permeability (cc/m²/24 hr/atm) | Output reductiOn ratio (%) |
|---|---|---|---|---|
| Example 1 | 93 | 0.3 | 0.4 | 3 |
| Example 2 | 92 | 0.4 | 0.5 | 2 |
| Example 3 | 93 | 0.3 | 0.3 | 2 |
| Example 4 | 90 | 0.4 | 0.6 | 2 |
| Example 5 | 92 | 0.4 | 0.4 | 1 |
| Example 6 | 93 | 0.3 | 0.3 | 1 |
| Example 7 | 90 | 0.4 | 0.5 | 1 |
| Example 8 | 91 | 0.3 | 0.4 | 1 |
| Example 9 | 93 | 0.4 | 0.3 | 3 |
| Example 10 | 91 | 0.1 | 0.4 | 1 |
| Example 11 | 91 | 0.1 | 0.3 | 1 |
| Example 12 | 92 | 0.2 | 0.3 | 2 |
| Example 13 | 92 | 0.4 | 0.5 | 3 |
| Example 14 | 90 | 0.3 | 0.2 | 2 |
| Example 15 | 90 | 0.3 | 0.4 | 3 |
| Example 16 | 92 | 0.1 | 0.2 | 1 |
| Example 17 | 91 | 0.4 | 0.4 | 3 |
| Example 18 | 91 | 0.3 | 0.5 | 3 |
| Example 19 | 90 | 0.3 | 0.4 | 2 |
| Example 20 | 93 | 0.4 | 0.5 | 3 |
| Example 21 | 93 | 0.3 | 0.5 | 3 |
| Example 22 | 93 | 0.4 | 0.5 | 2 |
| Comparative Example 1 | 89 | 25.0 | 80.0 | 18 |
| Comparative Example 2 | 93 | 27.0 | 28.0 | 15 |
| Comparative Example 3 | 92 | 1.1 | 200.0 | 10 |
| Comparative Example 4 | 93 | 27.0 | 28.0 | 12 |
| Comparative Example 5 | 93 | 1.0 | 200.0 | 9 |

In table 3-1, moisture permeability is expressed in a unit of g/m²/day·40° C.·100% RH, and oxygen permeability is expressed in a unit of cc/m²/day·23° C.·90% RH.

As obvious from Table 3-1, the protective sheets in Examples 1 to 22 have high total transmittances, respectively, and are excellent in moisture impermeability and oxygen impermeability.

Incidentally, the protective sheets in Examples 1 to 22 had oxygen permeabilities in an atmosphere of 25° C. and 90% RH not greater than 2.0 cm³/m²·day·atm and moisture permeabilities in an atmosphere of 40° C. and 100% RH mpy htrsyrt yjsm 3/0 g/m²·day·atm.

The output reduction ratios of the solar battery modules employing the protective sheets in Examples 1 to 22 were low.

The protective sheets in Comparative examples 1 to 5 had high total transmittances, respectively. However, the moisture impermeabilities and the oxygen impermeabilities of the protective sheets in Comparative examples 1 to 5 were low. Consequently, the output reduction ratios of the solar battery modules employing the protective sheets in Comparative examples 1 to 5 were high.

As apparent from the foregoing description, the present invention uses a plastic sheet as a base sheet, forms a transparent, vitreous deposited inorganic oxide thin film, such as a silicon oxide thin film or an aluminum oxide thin film, on one of the surfaces of the plastic sheet, and fabricates a protective sheet for a solar battery module by forming a coating film of a composite material comprising a condensation polymer produced through the hydrolysis of a silicon compound; the protective sheet thus fabricated is used as the front surface protective sheet or the back surface protective sheet of a solar battery module; the solar battery module is fabricated by, for example, superposing the protective sheet as a front surface protective sheet, a filler layer, a film provided with solar cells, i.e., photovoltaic cells, a filler layer and the protective sheet as a back surface protective sheet in that order in a superposed structure with the deposited inorganic oxide thin films facing inside, bringing the component layers of the superposed structure into close contact by vacuum and bonding together those component layers by a lamination process using hot pressing; and the protective sheet transmits sunlight at a high transmittance, is excellent in strength, weather resistance, heat resistance, water resistance, light resistance, wind endurance, hailstorm resistance, chemical resistance, moisture resistance and soil resistance, has a high impermeability to moisture and oxygen, limits performance degradation due to aging to the least extent, very durable, has excellent protective ability, and can be used for the stable fabrication of a low-cost, safe solar battery module.

The materials mentioned in the description of the first and the second embodiment are applicable to the third embodiment.

Fourth Embodiment

The present invention will be described hereinafter with reference to the accompanying drawings.

In this description, the term "sheet" is used in its broad sense to denote both sheets and films, and the term "film" is used in its broad sense to denote both sheets and films.

Figure 22:
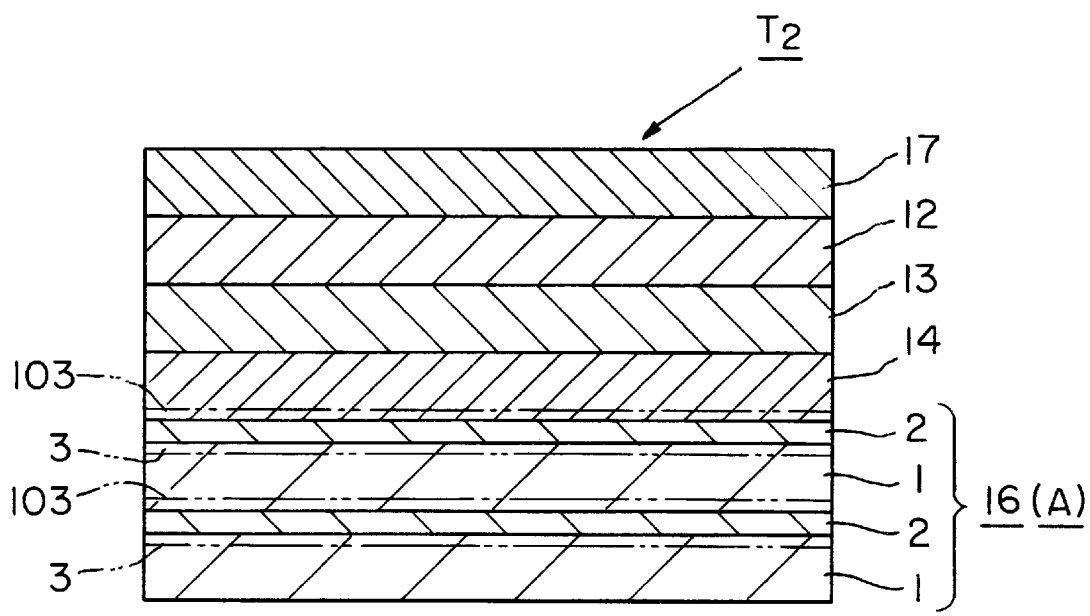
FIG. 22 is a typical sectional view of a solar battery module provided with the protective sheet shown in FIG. 16.
Figure 23:
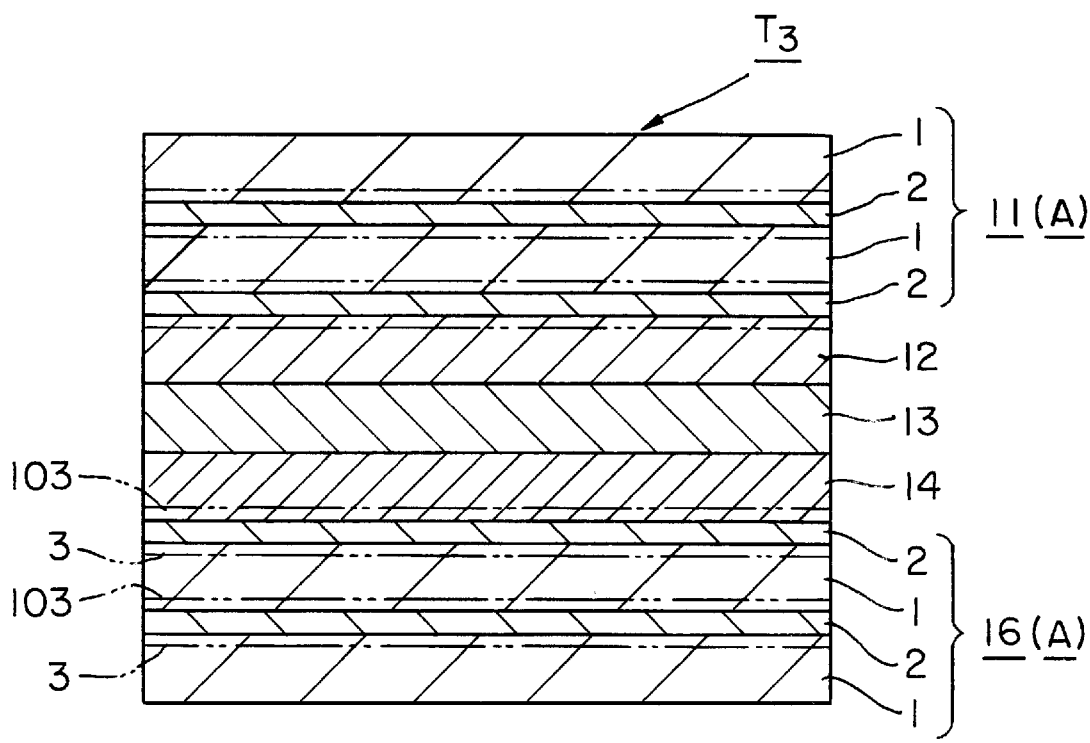
FIG. 23 is a typical sectional view of a solar battery module provided with the protective sheet shown in FIG. 16.

Protective sheets in accordance with the present invention for solar battery modules and solar battery modules employing the protective sheets will be described with reference to the accompanying drawings. FIGS. 16, 17, 18, 19 and 20 are typical sectional views of protective sheets in examples in a fourth embodiment according to the present invention for a solar battery module, and FIGS. 21, 22 and 23 are typical sectional views of solar battery modules employing the protective sheet shown in FIG. 16.

Figure 16:
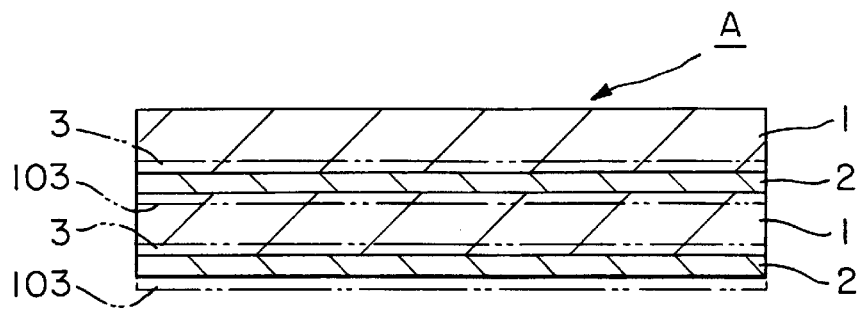
FIG. 16 is a typical sectional view of a protective sheet in a fourth embodiment according to the present invention for a solar battery module.

Referring to FIG. 16, a protective sheet A in a first example of the fourth embodiment of the present invention for a solar battery module is a laminated structure constructed by laminating at least two basic structures each comprising a fluorocarbon resin sheet (weather-resistant sheet) 1 and a deposited inorganic oxide film 2 formed on one of the surfaces of the fluorocarbon resin sheet 1.

A surface-treated layer 3 may be formed in the fluorocarbon resin sheet 1, and a coating film 103 of a polymer produced through the hydrolysis of a silicon compound may be formed on the deposited inorganic oxide film 2.

Figure 17:
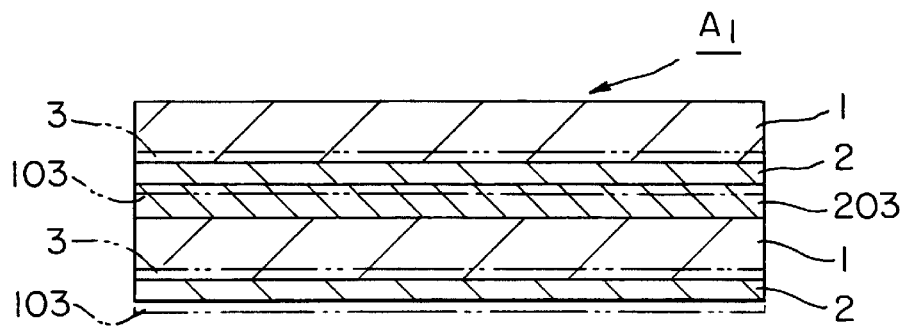
FIG. 17 is a typical sectional view of a protective sheet for a solar battery module.

As shown in FIG. 17, a protective sheet $A_1$ in a second example of the fourth embodiment for a solar battery module is a laminated sheet formed by laminating at least two basic structures each comprising a fluorocarbon resin sheet 1 and a deposited inorganic oxide thin film 2 formed on one of the surfaces of the fluorocarbon resin sheet 1 by using an adhesive layer 203.

Figure 18:
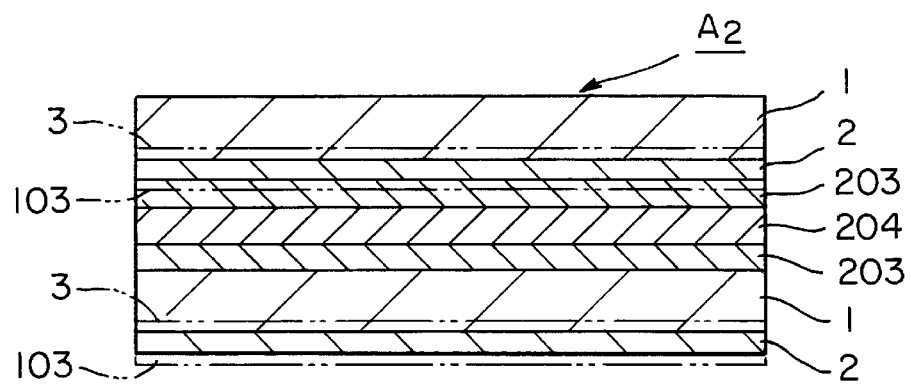
FIG. 18 is a typical sectional view of a protective sheet for a solar battery module.

As shown in FIG. 18 a protective sheet $A_3$ in a third example of the fourth embodiment for a solar battery module is a laminated sheet formed by laminating at least two basic structures each comprising a fluorocarbon resin sheet 1 and a deposited inorganic oxide thin film 2 formed on one of the surfaces of the fluorocarbon resin sheet 1, and a resin sheet 204 having a high strength by using adhesive layers 203 so that the resin sheet 204 is sandwiched between the basic structures.

Figure 19:
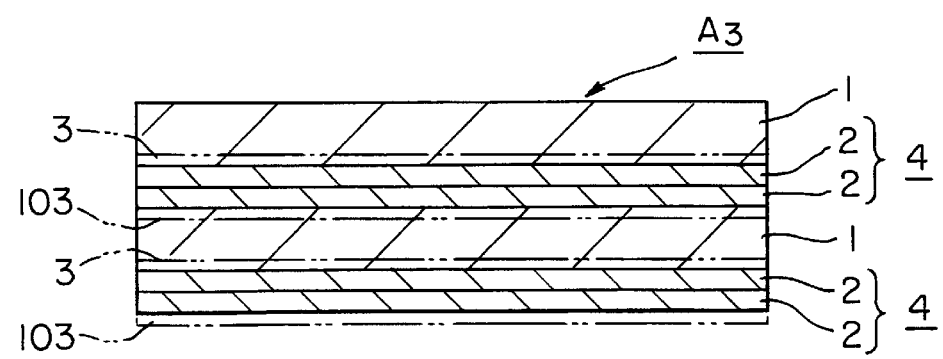
FIG. 19 is a typical sectional view of a protective sheet for a solar battery module.

As shown in FIG. 19, a protective sheet $A_3$ in a fourth example of the fourth embodiment for a solar battery module is a laminated sheet formed by laminating at least two basic structures each comprising a fluorocarbon resin sheet 1 and a multilayer film 4 comprising at least two deposited inorganic oxide thin films 2 and formed on one of the surfaces of the fluorocarbon resin sheet 1.

As shown in FIG. 20, a protective sheet $A_4$ in a fifth example of the fourth embodiment for a solar battery module is a laminated sheet formed by laminating at least two basic structures each comprising a fluorocarbon resin sheet 1, and a composite film 5 consisting of a first deposited inorganic oxide thin film 2a formed by a chemical vapor deposition process on one of the surfaces of the fluorocarbon resins sheet 1 and a second deposited inorganic oxide thin film 2b formed of a material different from that of the first deposited inorganic oxide thin film 2a by a physical vapor deposition process on the first deposited inorganic oxide thin film 2a.

Those protective sheets are only examples of the protective sheet in the fourth embodiment and the present invention is not limited thereto.

For example, when laminating at least the two basic structures each consisting of the fluorocarbon resin sheet and the deposited inorganic oxide thin film, the basic structures may be superposed with the respective deposited inorganic oxide thin films thereof facing each other or with the fluorocarbon resin sheet of one of the basic structures and the deposited inorganic oxide thin film of the other basic structure facing each other.

A solar battery module employing this protective sheet A embodying the present invention and shown in FIG. 16 will be described by way of example. Referring to FIG. 21, a solar battery module T employs the protective sheet A shown in FIG. 16 as its front surface protective sheet 11. The solar battery module T is fabricated by superposing the front surface protective sheet 11 (A), a filler layer 12, a photovoltaic layer 13 of solar cells, a filler layer 14 and a generally known back surface protective sheet 15 in that order in a superposed structure, and subjecting the superposed structure to a generally known forming process, such as a lamination process, in which those component layers of the superposed structure are brought into close contact by vacuum and are bonded together by hot pressing. Either of the surfaces of the front surface protective sheet 11 may face inside.

Another solar battery module $T_2$ shown in FIG. 22 employs the protective sheet A shown in FIG. 16 as its back surface protective sheet 16. The solar battery module $T_2$ is fabricated by superposing a generally known front surface protective sheet 17, a filler layer 12, a photovoltaic layer 13 of solar cells, a filler layer 14 and the back surface protective sheet 16(A) in that order in a superposed structure, and subjecting the superposed structure to a generally known forming process, such as a lamination process, in which those component layers of the superposed structure are brought into close contact by vacuum and are bonded together by hot pressing.

A third solar battery module $T_3$ shown in FIG. 23 employs the protective sheet A shown in FIG. 16 as its front surface protective sheet 11 and its back surface protective sheet 16. The solar battery module $T_3$ is fabricated by superposing the front surface protective sheet 11(A), a filler layer 12, a photovoltaic layer 13 of solar cells, a filler layer 14 and the protective sheet 16(A) in that order in a superposed structure, and subjecting the superposed structure to a generally known forming process, such as a lamination process, in which those component layers of the superposed structure are brought into close contact by vacuum and are bonded together by hot pressing. Either of the surfaces of each of the protective sheets 11 and 16 may face inside.

The foregoing protective sheets in accordance with the present invention and the foregoing solar battery modules employing those protective sheets are examples intended to illustrate the invention and not to be construed to limit the scope of the invention.

For example, the foregoing solar battery modules may comprise additional layers for sunlight absorption, reinforcement or the like.

Description will be given of methods of forming the protective sheet by laminating at least the two basic structures each comprising the fluorocarbon resin sheet and the deposited inorganic oxide thin film, and forming the solar battery module employing the protective sheets. There are various possible methods.

A first method in accordance with the present invention uses at least the two basic structures each comprising the fluorocarbon resin sheet 1 and the deposited inorganic oxide thin film 2, and laminates the two basic structures by using the adhesive layer 203.

A second method in accordance with the present invention uses at least the two basic structures each comprising the fluorocarbon resin sheet 1 and the deposited inorganic oxide thin film 2, and laminates the two basic structures by using the adhesive layer 203 extruded individually between the two basic structures or in a coextrusion mode.

A third method in accordance with the present invention uses at least the two basic structures each comprising the fluorocarbon resin sheet 1 and the deposited inorganic oxide thin film 2, sandwiches the high-strength resin sheet 204 between the two basic structures, and laminates the component layers by using adhesive layers.

The foregoing methods of laminating at least the two basic structures each comprising the fluorocarbon resin sheet and the deposited inorganic oxide thin film are only examples and the present invention is not limited thereto.

When necessary, the surface of the deposited inorganic oxide thin film 2 formed on the fluorocarbon resin sheet 1 or the surface of the fluorocarbon resin sheet 1 to be bonded to another surface may be processed for adhesion improvement by a surface pretreatment process, such as a corona discharge process, an ozone process, a low-temperature or atmospheric pressure plasma process, a glow-discharge process, an oxidation process using a chemical or the like.

The surface pretreatment process may be an independent process to be carried out after forming the deposited inorganic oxide thin film. When the surface treatment process is a low-temperature plasma process or a glow discharge process, the surface pretreatment process may be carried out in an in-line processing mode in a process for forming the deposited inorganic oxide thin film, which is effective in reducing the manufacturing cost.

The surface of the fluorocarbon resin sheet provided with the deposited inorganic oxide thin film is finished by the surface pretreatment process for the adhesion improvement of the same. The improvement of adhesion can be achieved also by forming a layer of a primer, an undercoater, an anchoring agent or the like.

Suitable materials for forming the coating layer are, for example, composite resins containing a polyester resin, a polyurethane resin, an acrylic resin or the like as a principal component of a vehicle.

The coating layer may be formed of a coating material of, for example, a solvent type, an aqueous solution type or an emulsion type by a roll coating process, a gravure roll coating process, a kiss-roll coating process or the like.

Suitable materials for forming the adhesive layer for bonding together the superposed layers are polyvinyl acetate adhesives, polyacrylate adhesives including homopolymers of ethyl acrylate, butyl acrylate and 2-ethylhexylester acrylate, and copolymers of those homopolymers and methyl methacrylate, acrylonitrile or styrene, cyanoacrylate adhesives, ethylene copolymer adhesives including copolymers of ethylene and monomers including vinyl acetate, ethyl acrylate, acrylic acid, methacrylic acid and the like, cellulose adhesives, polyester adhesives, polyamide adhesives, polyimide adhesives, amino resin adhesives including urea resins and melamine resins, phenolic resin adhesives, epoxy adhesives, polyurethane adhesives, reactive (meta)acrylic adhesives, rubber adhesives including styrene-butadiene rubbers, chloroprene rubbers and nitrile rubbers, silicone adhesives, inorganic adhesive including alkaline metal silicate and low-melting glass and the like.

Those adhesives may be of any one of an aqueous type, a solution type, an emulsion type and dispersion type, may be of any one of forms including a film, a sheet, powder or a solid, and may be of any one of bonding types including a chemical reaction type, a solvent volatilization type, a hot melt type, a hot pressing type and the like.

The adhesive may be applied to the sheet by, for example, a roll coating process, a gravure roll coating process, a kiss-roll coating process and the like or may be printed on the sheet by a printing process.

The fusible, extrudable adhesive resin for forming an extruded adhesive resin layer in the laminating process may be any one or a mixture of some of fusible resins including low-density polyethylenes, medium-density polyethylenes, high-density polyethylenes, linear low-density polyethylenes, polypropylenes, ethylene-vinyl acetate copolymers, ionomers, ethylene-ethyl acrylate copolymers, ethylene-acrylate copolymers, ethylene-methacrylic acid copolymers, ethylene-propylene copolymers, methyl pentene polymers, acid-modified polyolefin resins produced by modifying polyolefin resins, such as polyethylenes or polypropylenes, by an unsaturated carboxylic acid, such as acrylic acid, methacrylic acid, maleic acid, maleic anhydride, fumaric acid, itaconic acid or the like, polyvinyl acetate resins, polyester resins, polystyrene resins, cyclic polyolefin resins, ethylene-$\alpha$-olefin copolymers produced by polymerization using a metallocene catalyst, and the like.

The extruded adhesive resin layer is formed of one or some of the foregoing resins by an extrusion or a coextrusion process.

When laminating layers by using the extruded adhesive layer, an anchoring layer of a bonding assistant, such as an anchoring agent, may be used to bond the layers firmly together.

Possible anchoring agents are, for example, organic titanium compounds, such as alkyltitanate, isocyanates, polyethylene imines, polybutadienes and the like. The anchoring agent may be either oil-soluble or water-soluble.

Desirably, the anchoring agent is applied by a coating process, such as a roll coating process, a gravure roll coating process, a kiss-roll coating process or the like, to the layer in a coating film of 0.1 to 5 g/m$^2$ (dry state) in coating rate.

The third may use a laminating adhesive for laminating the layers.

The high-strength resin sheets to be laminated may be resin films or resin sheets excellent in physical and chemical strength, dimensional stability, weather resistance, heat resistance, water resistance, light resistance, chemical resistance, insulating property, flexibility, bending property, workability and the like. Possible films or sheets are tough films or sheets of polyester resins including ethylene-vinyl acetate copolymers, polyethylene terephthalates, polybutylene terephthalates, polyethylene naphthalates and polytetramethylene terephthalates, polyolefin resins including polyethylenes, polypropylenes, and ethylene-propylene copolymers, polyamide resins including nylon 12 and nylon 66, polyimide resins including polyimides, polyamidimides and polyetherimides, fluorocarbon resins including polytetrafluoroethylenes, polytrifluoroethylenes, polyvinilidene fluorides and polyvinyl fluorides, polyether sulphones, polyether ketones, polyphenylene sulfides, polyarylates, polyesterethers, aromatic polyamides, polycarbonates, cyclic polyolefins and the like.

The resin films or sheets may be extruded or coextruded films or sheets, and may be nonoriented, uniaxially oriented or biaxially oriented. Desirably, the thickness of the resin films or sheets is in the range of about 6 to 300 $\mu$m, preferably, in the range of 10 to 100 $\mu$m.

When laminating sheets with a high-strength sheet sandwiched between the sheets, a laminating adhesive may be used in addition to one of the foregoing adhesives.

The laminating adhesive may be any one of laminating adhesives of a solvent type, an aqueous type or an emulsion type including single- or two-component, hardening or nonhardening vinyl resins, (meta)acrylic resins, polyamide resins, polyester resins, polyurethane resins, epoxy resins, phenolic resins and rubbers.

The laminating adhesive may contain an adhesion promoting agent, such as a silane coupling agent, and/or one or some of additives including an ultraviolet absorber, an oxidation inhibitor, a stabilizer and the like.

Desirably, the laminating adhesive is applied by a coating process, such as a roll coating process, a gravure roll coating process, a kiss-roll coating process or the like, to the sheet in a coating film of 0.1 to 10 g/m$^2$ (dry state) in coating rate.

Particularly desirable resin sheets among the foregoing high-strength resin sheets are extruded or coextruded films or sheets of one or some of ethylene-vinyl acetate copolymers, polyethylene resins and cyclic polyolefin resins. Possible cyclic polyolefin resin films or sheets are those of, for example, cyclic diene polymers including cyclopentadiene and its derivatives, dicyclopentadiene and its derivatives, cyclohexadiene and its derivatives, norbornadiene and its derivatives, or one or some transparent cyclic polyolefin resin consisting of one or some of copolymers of those cyclic dienes, and olefin monomers including ethylene, propylene, 4-methyl-1-pentene, styrene, butadiene and isoprene.

Transparent cyclic polyolefin resins including cyclic diene polymers, such as cyclopentadiene and its derivatives+and dicyclopentadiene and its derivatives are particularly preferable because those transparent cyclic polyolefin resins are excellent in weather resistance and water resistance, is transparent and is preferable from the viewpoint of sunlight transmission.

The front surface protective sheets in accordance with the present invention for solar battery modules using the cyclic polyolefin resin films or sheets utilize the excellent properties of the cyclic polyolefin resin films or sheets including mechanical properties, optical properties, weather resistance, heat resistance, water resistance, light resistance, moisture resistance, soil resistance, chemical resistance and the like. The front surface protective sheet is equal in optical properties and durability to a glass sheet generally used as a protective sheet, has satisfactory mechanical properties, and is more flexible and lighter than a glass sheet, excellent in workability and easy to handle.

It is desirable that the cyclic polyolefin resin of the present invention has a visible light transmittance of 90% or above, preferably, 95% or above and a property to transmit all incident sunlight.

The cyclic polyolefin resin film or sheet in accordance with the present invention is excellent in adhesion to a deposited inorganic oxide thin film or a fluorocarbon resin sheet, a two-layer laminated sheet formed by laminating the cyclic polyolefin resin film or sheet, and the deposited inorganic oxide thin film or the fluorocarbon resin sheet has a very high bonding strength, and the layers of the two-layer laminated sheet does not delaminate. A two-layer barrier film consisting of a deposited inorganic oxide thin film and a cyclic polyolefin resin film or sheet has a high impermeability to oxygen gas and moisture, particularly to moisture. Thus, the present invention provides a very satisfactory front surface protective sheet having excellent properties including transparency, heat resistance, hot water resistance and aptitude for lamination.

Various compounding ingredients and additives may be added to the adhesive layer, the extruded adhesive resin layer or the high-strength resin sheet to improve the workability, heat resistance, weather resistance, mechanical properties, dimensional stability, oxidation resistance, slipperiness, releasability, flame retardancy, antifungal property, electric properties and the like. The amount of each of the compounding ingredients and the additives is in the range of a very small percent to several tens percent and may optionally be determined according to the purpose.

Commonly known additives, such as a lubricant, a crosslinking agent, an oxidation inhibitor, an ultraviolet absorber, a light stabilizer, a filler, a reinforcing material, a stiffener, an antistatic agent, a flame retarder, a flame-resistant agent, a foaming agent, an antifungus agent, a pigment and the like may be used. A modifying resin may be used.

According to the present invention, it is particularly preferable to use an ultraviolet absorber and/or an oxidation inhibitor among those additives.

The ultraviolet absorber absorbs detrimental ultraviolet rays contained in sunlight, converts the energy of ultraviolet rays into harmless thermal energy in its molecules to prevent active species that starts the photodeterioration of polymers from being excited. One or some of ultraviolet absorbers, such as those of a benzophenone group, a benzotriazole group, a salicylate group, an acrylonitrile group, metallic complex salts, a hindered amine group and an inorganic ultraviolet absorber, such as ultrafine titanium oxide powder (particle size: 0.01 to 0.06 $\mu$m) or ultrafine zinc oxide powder (particle size: 0.01 to 0.04 $\mu$m), may be used.

The oxidation inhibitor prevents the light deterioration or thermal deterioration of polymers. Suitable oxidation inhibitors are, for example, those of a phenol group, an amine group, a sulfur group, a phosphoric acid group and the like.

The ultraviolet absorber or the oxidation inhibitor may be an ultraviolet absorbing polymer or an oxidation inhibiting polymer produced by chemically bonding an ultraviolet absorber of the benzophenone group or an oxidation inhibitor of the phenol group to the principal chains or the side chains of a polymer.

The ultraviolet absorber and/or the oxidation inhibitor content is dependent on the shape and density of particles and a preferable ultraviolet absorber and/or the oxidation inhibitor content is in the range of about 0.1 to about 10% by weight.

When necessary, a surface-treated layer may be formed in a surface for bonding by a surface pretreatment process for adhesion improvement. The surface-treated layer may be formed by, for example, a corona discharge treatment, an ozone treatment, an atmospheric or low-temperature plasma treatment using oxygen gas or nitrogen gas, a glow discharge treatment, an oxidation treatment using a chemical or the like.

The surface pretreatment for adhesion improvement may form a layer of a primer, an undercoater, an anchoring agent or the like.

The coating layer may be formed of, for example, a composite resin containing a polyester resin, a polyurethane resin, an acrylic resin or the like as a principal component of its vehicle.

The coating layer may be formed of a coating material of, for example, a solvent type, an aqueous solution type or an emulsion type by a roll coating process, a gravure roll coating process, a kiss-roll coating process or the like.

The surface pretreatment for adhesion improvement may form, as the surface-treated layer, a nonbarrier deposited inorganic oxide thin film of a thickness in the range of 20 to 100 Å, preferably, in the range of 30 to 60 Å by a process similar to that for forming the deposited inorganic oxide thin film. an emulsion type by a roll coating process, a gravure roll coating process a kiss-roll coating process or the like.

The surface pretreatment for adhesion improvement may form, as the surface-treated layer, a nonbarrier deposited inorganic oxide thin film of a thickness in the range of 20 to 100 Å, preferably, in the range of 30 to 60 Å by a process similar to that for forming the deposited inorganic oxide thin film.

EXAMPLES

Examples of the fourth embodiment will be described hereinafter.

Example 1

(1) A roll of a 50 $\mu$m thick polyvinyl fluoride sheet (PVF sheet), i.e., base sheet, was mounted on a feed roll of a continuous vacuum evaporation system. The polyvinyl fluoride sheet was unwound and wound around a coating drum and a 500 Å thick deposited aluminum oxide thin film was deposited on a treated surface of the polyvinyl fluoride sheet treated for adhesion improvement by a reactive vacuum evaporation process of an electron beam (EB) heating system to form a coated polyvinyl fluoride sheet. Aluminum was used as an evaporation source and oxygen gas was supplied to the continuous vacuum evaporation system.

Deposition conditions:

Evaporation source: Aluminum

Vacuum in vacuum chamber: $7.5\times10^{-6}$ mbar

Vacuum in deposition chamber: $2.1\times10^{-6}$ mbar

EB power: 40 kW

Sheet moving speed: 600 m/min (2) The 500 Å thick deposited aluminum oxide thin film of the coated polyvinyl fluoride sheet was subjected to a glow-discharge plasma process to form a plasma-processed surface. The glow-discharge plasma process was carried out by a glow-discharge plasma producing apparatus of 1500 W in plasma output immediately after the deposition of the 500 Å thick deposited aluminum oxide thin film. In the glow-discharge plasma process, an oxygen/argon mixed gas of 19/1 in $O_2/Ar$ ratio was supplied so that the pressure of the oxygen/argon mixed gas is maintained at $6 \times 10^{-5}$ torr and the processing speed was 420 m/min.

(3) A laminating adhesive layer of a two-component polyurethane laminating adhesive was formed in 1.0 g/m$^2$ (dry state) in coating rate by a gravure roll coating process on the plasma-processed surface of the deposited aluminum oxide film of each of two coated polyvinyl fluoride sheets similar to that formed by (1) and (2), the two coated polyvinyl fluoride sheets were disposed with the laminating adhesive layers thereof facing each other, a 20 μm thick polydicyclopentadiene film was sandwiched between the coated polyvinyl fluoride sheets, and those component layers were laminated by a dry lamination process to complete a protective sheet in accordance with the present invention for a solar battery module.

(4) A solar battery module was fabricated by using the protective sheet thus fabricated as a front surface protective sheet. The front surface protective sheet, a 400 μm thick ethylene-vinyl acetate copolymer sheet, a 38 μm thick biaxially oriented polyethylene terephthalate film provided with an array of amorphous silicon solar cells, a 400 μm thick ethylene-vinyl acetate copolymer sheet and a 50 μm thick biaxially oriented polyethylene terephthalate film were superposed in that order with the surface of the 38 μm thick biaxially oriented polyethylene terephthalate film provided with the array of amorphous silicon solar cells facing the front surface protective sheet. Those component layers were laminated by using adhesive layers of an acrylic resin to complete a solar battery module.

(5) Another protective sheet in accordance with the present invention and another solar battery module of the same components were fabricated by the same processes, except that a 50 μm thick fluorocarbon resin sheet of an ethylene-tetrafluorethylene copolymer (ETFE) was used instead of the 50 μm thick polyvinyl fluoride sheet (PVF sheet).

A third protective sheet in accordance with the present invention and a third solar battery module of the same components were fabricated by the same processes, except that a 20 μm thick polycyclopentadiene film was used instead of the 20 μm thick polydicyclopentadiene sheet.

A fourth protective sheet in accordance with the present invention and a fourth solar battery module of the same components were fabricated by the same processes, except that the two coated polyvinyl fluoride sheets were superposed and bonded together with the deposited aluminum oxide thin film of one of the coated polyvinyl fluoride sheets bonded to the polyvinyl fluoride sheet of the other coated polyvinyl fluoride sheet.

Example 2

(1) A roll of a 50 μm thick polyvinyl fluoride film (PVF film), i.e., base sheet, was mounted on a feed roll of a plasma chemical vapor deposition system. A 500 Å thick deposited silicon oxide thin film was deposited on a treated surface of the polyvinyl fluoride film treated for adhesion improvement under the following conditions to form a coated polyvinyl fluoride sheet.

Deposition conditions:
  Reaction gas mixing ratio: Hexamethyldisiloxane/oxygen/helium=1/10/10 (Unit: slm)
  Vacuum in vacuum chamber: $5.9 \times 10^{-6}$ mbar
  Vacuum in deposition chamber: $6.0 \times 10^{-2}$ mbar
  Power supplied to cooling electrode drum: 20 kW
  Film moving speed: 80 m/min
  Surface for vapor deposition: Corona-processed surface (2) The 500 Å thick deposited silicon oxide thin film of the coated polyvinyl fluoride film was subjected to a corona discharge process to form a corona-processed surface and to increase the surface tension of the deposited silicon oxide thin film from 35 dyne to 60 dyne. Corona discharge power was 10 kW and the sheet was moved at a moving speed of 100 m/min.

(3) A laminating adhesive layer of 1.0 g/m$^2$ (dry state) in coating rate was formed on the corona-processed surface of the deposited silicon oxide film of each of two coated polyvinyl fluoride sheets similar to that formed by (1) and (2), the two coated polyvinyl fluoride sheets were disposed with the laminating adhesive layers thereof facing each other, a 20 μm thick polydicyclopentadiene film was sandwiched between the coated polyvinyl fluoride sheets, and those component layers were laminated by a dry lamination process to complete a protective sheet in accordance with the present invention for a solar battery module.

(4) A solar battery module was fabricated by using the protective sheet thus fabricated as a front surface protective sheet. The front surface protective sheet, a 400 μm thick ethylene-vinyl acetate copolymer sheet, a 38 μm thick biaxially oriented polyethylene terephthalate film provided with an array of amorphous silicon solar cells, a 400 μm thick ethylene-vinyl acetate copolymer sheet and a 50 μm thick biaxially oriented polyethylene terephthalate film were superposed in that order with the surface of the 38 μm thick biaxially oriented polyethylene terephthalate film provided with the array of amorphous silicon solar cells facing the front surface protective sheet. Those component layers were laminated by using adhesive layers of an acrylic resin to complete a solar battery module.

(5) Another protective sheet in accordance with the present invention and another solar battery module of the same components were fabricated by the same processes, except that a 50 μm thick fluorocarbon resin sheet of an ethylene-tetrafluoroethylene copolymer (ETFE) was used instead of the 50 μm thick polyvinyl fluoride sheet (PVF sheet).

A third protective sheet in accordance with the present invention and a third solar battery module of the same components were fabricated by the same processes, except that a 20 μm thick polycyclopentadiene film was used instead of the 20 μm thick polydicyclopentadiene sheet.

A fourth protective sheet in accordance with the present invention and a fourth solar battery module of the same components were fabricated by the same processes, except that the two coated polyvinyl fluoride sheets were superposed and bonded together with the deposited silicon oxide thin film of one of the coated polyvinyl fluoride sheets bonded to the polyvinyl fluoride sheet of the other coated polyvinyl fluoride sheet.

Example 3

(1) A 50 μm thick polyvinyl fluoride film (PVF film) containing an ultraviolet absorber was used as a base sheet. A 500 Å thick deposited silicon oxide thin film was deposited on a surface of the polyvinyl fluoride film under the same conditions as those in Example 2. The surface of the deposited silicon oxide thin film was subjected to a corona discharge process to form a corona-processed surface.

(2) A 500 Å thick deposited aluminum oxide thin film was deposited on the corona-processed surface of the deposited silicon oxide thin film formed on the polyvinyl fluoride film under the same conditions as those in Example 1. A coated polyvinyl fluoride film was completed by subjecting the surface of the deposited aluminum oxide thin film to a plasma process to form a plasma-processed surface therein.

(3) A laminating adhesive layer of a two-component polyurethane adhesive containing a small amount of an ultraviolet absorber containing ultrafine titanium oxide powder (particle size: 0.01 to 0.06 $\mu$m was formed in a coating rate of 5.0 g/m$^2$ (dry state) on the plasma-processed surface of the deposited aluminum oxide film of each of two coated polyvinyl fluoride films similar to that formed by (1) and (2). The two coated polyvinyl fluoride films were bonded together with the laminating adhesive layers thereof in contact with each other to complete a protective sheet in accordance with the present invention for a solar battery module.

(4) A solar battery module was fabricated by using the protective sheet thus fabricated as a front surface protective sheet. The front surface protective sheet, a 400 $\mu$m thick ethylene-vinyl acetate copolymer sheet, a 38 $\mu$m thick biaxially oriented polyethylene terephthalate film provided with an array of amorphous silicon solar cells, a 400 $\mu$m thick ethylene-vinyl acetate copolymer sheet and a 50 $\mu$m thick biaxially oriented polyethylene terephthalate film were superposed in that order with the surface of the 38 $\mu$m thick polyethylene terephthalate film provided with the array of amorphous silicon solar cells facing the front surface protective sheet. Those component layers were laminated by using adhesive layers of an acrylic resin to complete a solar battery module.

(5) Another protective sheet in accordance with the present invention and another solar battery module of the same components were fabricated by the same processes, except that a 50 $\mu$m thick fluorocarbon resin film of an ethylene-tetrafluoroethylene copolymer (ETFE) was used instead of the 50 $\mu$m thick polyvinyl fluoride film (PVF film).

A third protective sheet in accordance with the present invention and a third solar battery module of the same components were fabricated by the same processes, except that the two coated polyvinyl fluoride films were superposed and bonded together with the deposited aluminum oxide thin film of one of the coated polyvinyl fluoride films bonded to the polyvinyl fluoride film of the other coated polyvinyl fluoride film.

Example 4

An anchoring layer of a polyurethane anchoring agent was formed in a coating rate of 0.5 g/m$^2$ (dry state) by a gravure roll coating process on the plasma-processed surface of the deposited aluminum oxide film of each of two coated polyvinyl fluoride sheets similar to that in Example 1. A 100 $\mu$m thick polydicyclopentadiene film was formed on the anchoring layer of each of the two coated polyvinyl fluoride sheets by an extrusion coating process. Thus a protective sheet in accordance with the present invention for a solar battery module was completed.

A solar battery module employing the protective sheet as its front surface protective sheet was fabricated by the same processes as those in Example 1.

Another protective sheet in accordance with the present invention and another solar battery module of the same components were fabricated by the same processes, except that a polycyclopentadiene film was used instead of the polydicyclopentadiene film.

A third protective sheet in accordance with the present invention and a third solar battery module of the same components were fabricated by the same processes, except that the two coated polyvinyl fluoride sheets were superposed and bonded together with the deposited aluminum oxide thin film of one of the coated polyvinyl fluoride sheets bonded to the polyvinyl fluoride sheet of the other coated polyvinyl fluoride sheet.

Example 5

An anchoring layer of a polyurethane anchoring agent was formed in a coating rate of 0.5 g/m$^2$ (dry state) by a gravure roll coating process on the corona-processed surface of the deposited silicon oxide film of each of two coated polyvinyl fluoride sheets similar to that in Example 2. A 30 $\mu$m thick polydicyclopentadiene film was formed on the anchoring layer of each of the two coated polyvinyl fluoride sheets by an extrusion coating process. Thus a protective sheet in accordance with the present invention for a solar battery module was fabricated.

A solar battery module employing the protective sheet as its front surface protective sheet was fabricated by the same processes as those in Example 2.

Another protective sheet in accordance with the present invention and another solar battery module of the same components were fabricated by the same processes, except that a polynorbornadiene resin was used instead of the polydicyclopentadiene resin.

A third protective sheet in accordance with the present invention and a third solar battery module of the same components were fabricated by the same processes, except that the two coated polyvinyl fluoride sheets were superposed and bonded together with the deposited silicon oxide thin film of one of the coated polyvinyl fluoride sheets bonded to the polyvinyl fluoride sheet of the other coated polyvinyl fluoride sheet.

Example 6

A laminating adhesive layer of a two-component polyurethane laminating adhesive containing an ultraviolet absorber containing ultrafine titanium oxide powder (particle size: 0.01 to 0.06 $\mu$m was formed in a coating rate of 1.0 g/m$^2$ (dry state) by a gravure roll coating process on the plasma-processed surface of the deposited aluminum oxide film of each of two coated polyvinyl fluoride sheets (PVF sheets) similar to that in Example 1. A 20 $\mu$m thick polydicyclopentadiene film was sandwiched between the coated polyvinyl fluoride sheets, and those component layers were laminated by a dry lamination process to complete a protective sheet in accordance with the present invention for a solar battery module.

A solar battery module employing the protective sheet as its front surface protective sheet was fabricated by the same processes as those in Example 1.

Another protective sheet in accordance with the present invention and another solar battery module of the same components were fabricated by the same processes, except that a polycyclopentadiene film was used instead of the polydicyclopentadiene film.

A third protective sheet in accordance with the present invention and a third solar battery module of the same components were fabricated by the same processes, except that the two coated polyvinyl fluoride sheets were superposed and bonded together with the deposited aluminum oxide thin film of one of the coated polyvinyl fluoride sheet s bonded to the polyvinyl fluoride sheet of the other coated polyvinyl fluoride sheet.

Example 7

(1) Protective sheets that are the same as the protective sheet in Example 1 were used as the front surface protective sheet and the back surface protective sheet of a solar battery module. The solar battery module was fabricated by superposing the front surface protective sheet, a 400 µm thick ethylene-vinyl acetate copolymer sheet, a 38 µm thick biaxially oriented polyethylene terephthalate film provided with an array of amorphous silicon solar cells, a 400 µm thick ethylene-vinyl acetate copolymer sheet and the back surface protective sheet in that order with the surface of the 38 µm thick polyethylene terephthalate film provided with the array of amorphous silicon solar cells facing the front surface protective sheet, and laminating those component layers by using adhesive layers of an acrylic resin.

(2) Protective sheets in accordance with the present invention and another solar battery module of the same components were fabricated by the same processes, except that 50 µm thick fluorocarbon resin sheets of an ethylene-tetrafluoroethylene copolymer (ETFE) were used instead of the 50 µm thick polyvinyl fluoride sheets (PVF sheet).

A third protective sheet in accordance with the present invention and a third solar battery module of the same components were fabricated by the same processes, except that a 20 µm thick polycyclopentadiene film was used instead of the 20 µm thick polydicyclopentadiene film.

A fourth protective sheet in accordance with the present invention and a fourth solar battery module of the same components were fabricated by the same processes, except that the two coated polyvinyl fluoride sheets were superposed and bonded together with the deposited aluminum oxide thin film of one of the coated polyvinyl fluoride sheets bonded to the polyvinyl fluoride sheet of the other coated polyvinyl fluoride sheet.

Example 8

(1) Protective sheets that are the same as the protective sheet in Example 3 were used as the front surface protective sheet and the back surface protective sheet of a solar battery module. The solar battery module was fabricated by superposing the front surface protective sheet, a 400 µm thick ethylene-vinyl acetate copolymer sheet, a 38 µm thick biaxially oriented polyethylene terephthalate film provided with an array of amorphous silicon solar cells, a 400 µm thick ethylene-vinyl acetate copolymer sheet and the back surface protective sheet in that order with the surface of the 38 µm thick polyethylene terephthalate film provided with the array of amorphous silicon solar cells facing the front surface protective sheet, and laminating those component layers by using adhesive layers of an acrylic resin.

(2) Protective sheets in accordance with the present invention and another solar battery module of the same components were fabricated by the same processes, except that 50 µm thick fluorocarbon resin sheets of an ethylene-tetrafluoroethylene copolymer (ETFE) were used as the base sheet instead of the 50 µm thick polyvinyl fluoride sheets (PVF sheet).

Third protective sheets in accordance with the present invention and a third solar battery module of the same components were fabricated by the same processes, except that a 20 µm thick polycyclopentadiene film was used instead of the 20 µm thick polydicyclopentadiene film.

A fourth protective sheet in accordance with the present invention and a fourth solar battery module of the same components were fabricated by the same processes, except that the two coated polyvinyl fluoride sheets were superposed and bonded together with the deposited silicon oxide thin film of one of the coated polyvinyl fluoride sheets bonded to the polyvinyl fluoride sheet of the other coated polyvinyl fluoride sheet.

Example 9

(1) Protective sheets that are the same as the protective sheet in Example 3 were used as the front surface protective sheet and the back surface protective sheet of a solar battery module. The solar battery module was fabricated by superposing the front surface protective sheet, a 400 µm thick ethylene-vinyl acetate copolymer sheet, a 38 µm thick biaxially oriented polyethylene terephthalate film provided with an array of amorphous silicon solar cells, a 400 µm thick ethylene-vinyl acetate copolymer sheet and the back surface protective sheet in that order with the surface of the 38 µm thick polyethylene terephthalate film provided with the array of amorphous silicon solar cells facing the front surface protective sheet, and laminating those component layers by using adhesive layers of an acrylic resin.

(2) Protective sheets in accordance with the present invention and another solar battery module of the same components were fabricated by the same processes, except that a 50 µm thick fluorocarbon resin sheet of an ethylene-tetrafluoroethylene copolymer (ETFE) containing an ultraviolet absorber was used instead of the 50 µm thick polyvinyl fluoride sheet (PVF sheet) containing an ultraviolet absorber.

A third protective sheet in accordance with the present invention and a third solar battery module of the same components were fabricated by the same processes, except that the two coated polyvinyl fluoride sheets were superposed and bonded together with the deposited aluminum oxide thin film of one of the coated polyvinyl fluoride sheets bonded to the polyvinyl fluoride sheet of the other coated polyvinyl fluoride sheet.

Example 10

(1) Protective sheets that are the same as the protective sheet in Example 4 were used as the front surface protective sheet and the back surface protective sheet of a solar battery module. The solar battery module was fabricated by superposing the front surface protective sheet, a 400 µm thick ethylene-vinyl acetate copolymer sheet, a 38 µm thick biaxially oriented polyethylene terephthalate film provided with an array of amorphous silicon solar cells, a 400 µm thick ethylene-vinyl acetate copolymer sheet and the back surface protective sheet in that order with the surface of the 38 µm thick polyethylene terephthalate film provided with the array of amorphous silicon solar cells facing the front surface protective sheet, and laminating those component layers by using adhesive layers of an acrylic resin.

A protective sheet in accordance with the present invention and another solar battery module of the same components were fabricated by the same processes, except that a polycyclopentadiene resin was used instead of the polydicyclopentadiene resin.

A third protective sheet in accordance with the present invention and a third solar battery module of the same components were fabricated by the same processes, except that the two coated polyvinyl fluoride sheets were superposed and bonded together with the deposited aluminum oxide thin film of one of the coated polyvinyl fluoride sheets bonded to the polyvinyl fluoride sheet of the other coated polyvinyl fluoride sheet.

Example 11

Protective sheets that are the same as the protective sheet in Example 5 were used as the front surface protective sheet and the back surface protective sheet of a solar battery module. The solar battery module was fabricated by superposing the front surface protective sheet, a 400 µm thick ethylene-vinyl acetate copolymer sheet, a 38 µm thick biaxially oriented polyethylene terephthalate film provided with an array of amorphous silicon solar cells, a 400 µm thick ethylene-vinyl acetate copolymer sheet and the back surface protective sheet in that order with the surface of the 38 µm thick polyethylene terephthalate film provided with the array of amorphous silicon solar cells facing the front surface protective sheet, and laminating those component layers by using adhesive layers of an acrylic resin.

Protective sheets in accordance with the present invention and another solar battery module of the same components were fabricated by the same processes, except that a polynorbornadiene resin was used instead of the polydicyclopentadiene resin.

A third protective sheet in accordance with the present invention and a third solar battery module of the same components were fabricated by the same processes, except that the two coated polyvinyl fluoride sheets were superposed and bonded together with the deposited silicon oxide thin film of one of the coated polyvinyl fluoride sheets bonded to the polyvinyl fluoride sheet of the other coated polyvinyl fluoride sheet.

Example 12

Protective sheets that are the same as the protective sheet in Example 6 were used as the front surface protective sheet and the back surface protective sheet of a solar battery module. The solar battery module was fabricated by superposing the front surface protective sheet, a 400 µm thick ethylene-vinyl acetate copolymer sheet, a 38 µm thick biaxially oriented polyethylene terephthalate film provided with an array of amorphous silicon solar cells, a 400 µm thick ethylene-vinyl acetate copolymer sheet and the back surface protective sheet in that order with the surface of the 38 µm thick polyethylene terephthalate film provided with the array of amorphous silicon solar cells facing the front surface protective sheet, and laminating those component layers by using adhesive layers of an acrylic resin.

Protective sheets in accordance with the present invention and another solar battery module of the same components were fabricated by the same processes, except that a polycyclopentadiene film was used instead of the polydicyclopentadiene film.

A third protective sheet in accordance with the present invention and a third solar battery module of the same components were fabricated by the same processes, except that the two coated polyvinyl fluoride sheets were superposed and bonded together with the deposited aluminum oxide thin film of one of the coated polyvinyl fluoride sheets bonded to the polyvinyl fluoride sheet of the other coated polyvinyl fluoride sheet.

Example 13

(1) A protective sheet that is the same as the protective sheet in Example 1 was used as the back surface protective sheet of a solar battery module. The solar battery module was fabricated by superposing a 3 mm thick glass sheet, a 400 µm thick ethylene-vinyl acetate copolymer sheet, a 38 µm thick biaxially oriented polyethylene terephthalate film provided with an array of amorphous silicon solar cells, a 400 µm thick ethylene-vinyl acetate copolymer sheet and the back surface protective sheet in that order with the surface of the 38 µm thick polyethylene terephthalate film provided with the array of amorphous silicon solar cells facing the 3 mm thick glass sheet, and laminating those component layers by using adhesive layers of an acrylic resin.

(2) A protective sheet in accordance with the present invention and another solar battery module of the same components were fabricated by the same processes, except that a 50 µm thick fluorocarbon resin sheet of an ethylene-tetrafluoroethylene copolymer (ETFE) was used instead of the 50 µm thick polyvinyl fluoride sheet (PVF sheet).

A third protective sheet in accordance with the present invention and a third solar battery module of the same components were fabricated by the same processes, except that a 20 µm thick polycyclopentadiene film was used instead of the 20 µm thick polydicyclopentadiene film.

A fourth protective sheet in accordance with the present invention and a fourth solar battery module of the same components were fabricated by the same processes, except that the two coated polyvinyl fluoride sheets were superposed and bonded together with the deposited aluminum oxide thin film of one of the coated polyvinyl fluoride sheets bonded to the polyvinyl fluoride sheet of the other coated polyvinyl fluoride sheet.

Example 14

(1) A protective sheet that is the same as the protective sheet in Example 2 was used as the back surface protective sheet of a solar battery module. The solar battery module was fabricated by superposing a 50 µm thick polyvinyl fluoride sheet (PVF sheet), a 400 µm thick ethylene-vinyl acetate copolymer sheet, a 38 µm thick biaxially oriented polyethylene terephthalate film provided with an array of amorphous silicon solar cells, a 400 µm thick ethylene-vinyl acetate copolymer sheet and the back surface protective sheet in that order with the surface of the 38 µm thick polyethylene terephthalate film provided with the array of amorphous silicon solar cells facing the 50 µm thick polyvinyl fluoride sheet, and laminating those component layers by using adhesive layers of an acrylic resin.

(2) Another protective sheet in accordance with the present invention and another solar battery module of the same components were fabricated by the same processes, except that a 50 µm thick fluorocarbon resin sheet of an ethylene-tetrafluoroethylene copolymer (ETFE) was used as a base sheet instead of the 50 µm thick polyvinyl fluoride sheet (PVF sheet).

A third protective sheet in accordance with the present invention and a third solar battery module of the same components were fabricated by the same processes, except that a 20 µm thick polycyclopentadiene film was used instead of the 20 µm thick polydicyclopentadiene film.

A fourth protective sheet in accordance with the present invention and a fourth solar battery module of the same components were fabricated by the same processes, except that the two coated polyvinyl fluoride sheets were superposed and bonded together with the deposited silicon oxide thin film of one of the coated polyvinyl fluoride sheets bonded to the polyvinyl fluoride sheet of the other coated polyvinyl fluoride sheet.

Example 15

(1) A protective sheet that is the same as the protective sheet in Example 3 was used as the back surface protective sheet of a solar battery module. The solar battery module was fabricated by superposing a 100 $\mu$m thick polydicyclopentadiene sheet, a 400 $\mu$m thick ethylene-vinyl acetate copolymer sheet, a 38 $\mu$m thick biaxially oriented polyethylene terephthalate film provided with an array of amorphous silicon solar cells, a 400 $\mu$m thick ethylene-vinyl acetate copolymer sheet and the back surface protective sheet in that order with the surface of the 38 $\mu$m thick polyethylene terephthalate film provided with the array of amorphous silicon solar cells facing the 100 $\mu$m thick polydicyclopentadiene sheet, and laminating those component layers by using adhesive layers of an acrylic resin.

(2) Another protective sheet in accordance with the present invention and another solar battery module of the same components were fabricated by the same processes, except that a 50 $\mu$m thick fluorocarbon resin sheet of an ethylene-tetrafluoroethylene copolymer containing an ultraviolet absorber(ETFE sheet) was used as a base sheet instead of the 50 $\mu$m thick polyvinyl fluoride sheet (PVF sheet) containing an ultraviolet absorber.

A third protective sheet in accordance with the present invention and a third solar battery module of the same components were fabricated by the same processes, except that the two coated polyvinyl fluoride sheets each provided with the deposited silicon oxide thin film and the deposited aluminum oxide thin film were superposed and bonded together with the deposited aluminum oxide thin film of one of the coated polyvinyl fluoride sheets bonded to the polyvinyl fluoride sheet of the other coated polyvinyl fluoride sheet.

Comparative Example 1

A solar battery module was fabricated by superposing a 100 $\mu$m thick polydicyclopentadiene sheet, i.e., base sheet, as a front surface protective sheet, a 400 $\mu$m thick ethylene-vinyl acetate copolymer sheet, a 38 $\mu$m thick biaxially oriented polyethylene terephthalate film provided with an array of amorphous silicon solar cells, a 400 $\mu$m thick ethylene-vinyl acetate copolymer sheet and a 50 $\mu$m thick biaxially oriented polyethylene terephthalate film in that order with the surface of the 38 $\mu$m thick polyethylene terephthalate film provided with the array of amorphous silicon solar cells facing the front surface protective sheet, and laminating those component layers by using adhesive layers of an acrylic resin.

Comparative Example 2

A solar battery module was fabricated by superposing a 50 $\mu$m thick polyvinyl fluoride sheet (PVF sheet), i.e., base sheet, as a front surface protective sheet, a 400 $\mu$m thick ethylene-vinyl acetate copolymer sheet, a 38 $\mu$m thick biaxially oriented polyethylene terephthalate film provided with an array of amorphous silicon solar cells, a 400 $\mu$m thick ethylene-vinyl acetate copolymer sheet and a 50 $\mu$m thick biaxially oriented polyethylene terephthalate film in that order with the surface of the 38 $\mu$m thick polyethylene terephthalate film provided with the array of amorphous silicon solar cells facing the front surface protective sheet, and laminating those component layers by using adhesive layers of an acrylic resin.

Comparative Example 3

A solar battery module was fabricated by superposing a 100 $\mu$m thick polydicyclopentadiene sheet, i.e., base sheet, as a front surface protective sheet, a 400 $\mu$m thick ethylene-vinyl acetate copolymer sheet, a 38 $\mu$m thick biaxially oriented polyethylene terephthalate film provided with an array of amorphous silicon solar cells, a 400 $\mu$m thick ethylene-vinyl acetate copolymer sheet and a 100 $\mu$m thick polydicyclopentadiene sheet, i.e., base sheet, as a back surface protective sheet in that order with the surface of the 38 $\mu$m thick polyethylene terephthalate film provided with the array of amorphous silicon solar cells facing the front surface protective sheet, and laminating those component layers by using adhesive layers of an acrylic resin.

Comparative Example 4

A solar battery module was fabricated by superposing a 50 $\mu$m thick polyvinyl fluoride film (PVF film), i.e., base sheet, as a front surface protective sheet, a 400 $\mu$m thick ethylene-vinyl acetate copolymer sheet, a 38 $\mu$m thick biaxially oriented polyethylene terephthalate film provided with an array of amorphous silicon solar cells, a 400 $\mu$m thick ethylene-vinyl acetate copolymer sheet and a 50 $\mu$m thick polyvinyl fluoride film (PVF film), i.e., base sheet, as a back surface protective sheet in that order with the surface of the 38 $\mu$m thick polyethylene terephthalate film provided with the array of amorphous silicon solar cells facing the front surface protective sheet, and laminating those component layers by using adhesive layers of an acrylic resin.

Experiments

The protective sheets in Examples 1 to 15 of the present invention and those in Comparative examples 1 to 4 were subjected to total transmittance measurement. The solar battery modules in Examples 1 to 15 and Comparative examples 1 to 4 were subjected to solar battery module evaluation tests.

(1) Total Transmittance Measurement

Total transmittance (%) of each of the protective sheets in Examples 1 to 15 and Comparative examples 1 to 4 against the total transmittance of the base sheet as a reference total transmittance was measured by a color computer.

(2) Solar Battery Module Evaluation Tests

The solar battery modules were subjected to environmental tests in conformity to conditions specified in JIS C8917-1989. Photovoltaic output of the solar battery modules was measured before and after environmental tests.

(3) Moisture Permeability and Oxygen Permeability The moisture permeabilities of the protective sheets in Examples 1 to 15 and Comparative examples 1 to 4 were measured in an atmosphere of 40° C. and 90% RH by a moisture permeability measuring apparatus (PERMATRAN, MOCON, USA). The oxygen permeabilities of the protective sheets in Examples 1 to 15 and Comparative examples 1 to 5 were measured in an atmosphere of 23° C. and 90% RH by an oxygen permeability measuring apparatus (OXTRAN, MOCON, USA).

Measured data is tabulated in Table 4-1.

TABLE 4-1

|  | Total transmittance (%) | Moisture permeability (g/m$^2$/24 hr) | Oxygen permeability (cc/m$^2$/24 hr/atm) | Output reduction ratio (%) |
| --- | --- | --- | --- | --- |
| Example 1 | 91 | 0.2 | 0.4 | 2 |
| Example 2 | 90 | 0.3 | 0.4 | 3 |

TABLE 4-1-continued

|  | Total transmittance (%) | Moisture permeability (g/m²/24 hr) | Oxygen permeability (cc/m²/24 hr/atm) | Output reduction ratio (%) |
|---|---|---|---|---|
| Example 3 | 92 | 0.1 | 0.2 | 1 |
| Example 4 | 93 | 0.3 | 0.6 | 3 |
| Example 5 | 92 | 0.4 | 0.5 | 1 |
| Example 6 | 90 | 0.2 | 0.4 | 3 |
| Example 7 | 91 | 0.2 | 0.3 | 2 |
| Example 8 | 91 | 0.3 | 0.4 | 2 |
| Example 9 | 92 | 0.1 | 0.1 | 1 |
| Example 10 | 92 | 0.3 | 0.5 | 2 |
| Example 11 | 91 | 0.2 | 0.3 | 2 |
| Example 12 | 90 | 0.1 | 0.1 | 1 |
| Example 13 | 93 | 0.3 | 0.2 | 2 |
| Example 14 | 92 | 0.4 | 0.2 | 3 |
| Example 15 | 91 | 0.2 | 0.3 | 3 |
| Comparative Example 1 | 93 | 1.2 | 200.0 | 10 |
| Comparative Example 2 | 93 | 26.7 | 27.5 | 15 |
| Comparative Example 3 | 93 | 1.2 | 200.0 | 8 |
| Comparative Example 4 | 93 | 26.0 | 28.0 | 11 |

In table 4-1, moisture permeability is expressed in a unit of g/m²/day·40° C.·100% RH, and oxygen permeability is expressed in a unit of cc/m²/day·23° C.·90% RH.

As obvious from Table 4-1, the protective sheets in Examples 1 to 15 have high total transmittances, respectively, and are excellent in moisture impermeability and oxygen impermeability.

The output reduction ratios of the solar battery modules employing the protective sheets in Examples 1 to 15 were low.

The protective sheets in Comparative examples 1 to 4 had high total transmittances, respectively. However, the moisture impermeabilities and the oxygen impermeabilities of the protective sheets in Comparative examples 1 to 4 were low. Consequently, the output reduction ratios of the solar battery modules employing the protective sheets in Comparative examples 1 to 4 were high.

As apparent from the foregoing description, the present invention uses a fluorocarbon resin sheet as a base sheet, fabricates a coated fluorocarbon resin sheet by forming a transparent, vitreous deposited inorganic oxide thin film, such as a silicon oxide thin film or an aluminum oxide thin film, on one of the surfaces of the fluorocarbon resin sheet, and fabricates a protective sheet for a solar battery module by laminating at least two coated fluorocarbon resin sheets similar to the foregoing coated fluorocarbon resin sheet by an adhesive layer or the like, uses the protective sheet as the front surface protective sheet or the back surface protective sheet of a solar battery module; fabricates a solar battery module by, for example, superposing the protective sheet as a front surface protective sheet, a filler layer, a film provided with solar cells, i.e., photovoltaic cells, a filler layer and an ordinary back surface protective sheet in that order in a superposed structure, bringing the component layers of the superposed structure into close contact by vacuum and bonding together those component layers by a lamination process using hot pressing; and the protective sheet transmits sunlight at a high transmittance, is excellent in strength, weather resistance, heat resistance, water resistance, light resistance, wind endurance, hailstorm resistance, chemical resistance, moisture resistance and soil resistance, has a high impermeability to moisture and oxygen, limits performance degradation due to aging to the least extent, very durable, has excellent protective ability, and can be used for the stable fabrication of a low-cost, safe solar battery module.

The materials mentioned in the description of the first, the second and the third embodiment are applicable to the fourth embodiment.

Fifth Embodiment

The present invention will be described hereinafter with reference to FIGS. 16 to 23 previously used in the description of the fourth embodiment.

In this description, the term "sheet" is used in its broad sense to denote both sheets and films, and the term "film" is used in its broad sense to denote both sheets and films.

Referring to FIG. 16, a protective sheet A in a first example of the fifth embodiment of the present invention for a solar battery module is a laminated structure constructed by laminating at least two basic structures each comprising a cyclic polyolefin sheet (weather-resistant sheet) 1 and a deposited inorganic oxide film 2 formed on one of the surfaces of the cyclic polyolefin sheet 1.

A surface-treated layer 3 may be formed in the cyclic polyolefin sheet 1, and a coating film 103 of a polymer produced through the hydrolysis of a silicon compound may be formed on the deposited inorganic oxide film 2.

As shown in FIG. 17, a protective sheet A1 in a second example of the fifth embodiment for a solar battery module is a laminated sheet formed by laminating at least two basic structures each comprising a cyclic polyolefin sheet 1 and a deposited inorganic oxide thin film 2 formed on one of the surfaces of the cyclic polyolefin sheet 1 by using an adhesive layer 203.

As shown in FIG. 18 a protective sheet $A_3$ in a third example of the fourth embodiment for a solar battery module is a laminated sheet formed by laminating at least two basic structures each comprising a cyclic polyolefin sheet 1 and a deposited inorganic oxide thin film 2 formed on one of the surfaces of the fluorocarbon resin sheet 1, and a resin sheet 204 having a high strength by using adhesive layers 203 so that the resin sheet 204 is sandwiched between the basic structures.

As shown in FIG. 19, a protective sheet $A_3$ in a fourth example of the fifth embodiment for a solar battery module is a laminated sheet formed by laminating at least two basic structures each comprising a cyclic polyolefin 1 and a multilayer film 4 comprising at least two deposited inorganic oxide thin films 2 and formed on one of the surfaces of the fluorocarbon resin sheet 1.

As shown in FIG. 20, a protective sheet $A_4$ in a fifth example of the fourth embodiment for a solar battery module is a laminated sheet formed by laminating at least two basic structures each comprising a cyclic polyolefin sheet 1, and a composite film 5 consisting of a first deposited inorganic oxide thin film 2a formed by a chemical vapor deposition process on one of the surfaces of the cyclic polyolefin sheet 1 and a second deposited inorganic oxide thin film 2b formed of a material different from that of the first deposited inorganic oxide thin film 2a by a physical vapor deposition process on the first deposited inorganic oxide thin film 2a.

Those protective sheets are only examples of the protective sheet in the fourth embodiment and the present invention is not limited thereto.

For example, when laminating at least the two basic structures each consisting of the cyclic polyolefin sheet and the deposited inorganic oxide thin film, the basic structures may be superposed with the respective deposited inorganic oxide thin films thereof facing each other or with the cyclic polyolefin sheet of one of the basic structures and the deposited inorganic oxide thin film of the other basic structure facing each other.

A solar battery module employing this protective sheet A embodying the present invention and shown in FIG. 16 will be described by way of example. Referring to FIG. 21, a solar battery module T employs the protective sheet A shown in FIG. 16 as its front surface protective sheet 11. The solar battery module T is fabricated by superposing the front surface protective sheet 11 (A), a filler layer 12, a photovoltaic layer 13 of solar cells, a filler layer 14 and a generally known back surface protective sheet 15 in that order in a superposed structure, and subjecting the superposed structure to a generally known forming process, such as a lamination process, in which those component layers of the superposed structure are brought into close contact by vacuum and are bonded together by hot pressing. Either of the surfaces of the front surface protective sheet 11 may face inside.

Another solar battery module $T_2$ shown in FIG. 22 employs the protective sheet A shown in FIG. 16 as its back surface protective sheet 16. The solar battery module $T_2$ is fabricated by superposing a generally known front surface protective sheet 17, a filler layer 12, a photovoltaic layer 13 of solar cells, a filler layer 14 and the back surface protective sheet 16 (A) in that order in a superposed structure, and subjecting the superposed structure to a generally known forming process, such as a lamination process, in which those component layers of the superposed structure are brought into close contact by vacuum and are bonded together by hot pressing.

A third solar battery module $T_3$ shown in FIG. 23 employs the protective sheet A shown in FIG. 16 as its front surface protective sheet 11 and its back surface protective sheet 16. The solar battery module $T_3$ is fabricated by superposing the front surface protective sheet 11 (A), a filler layer 12, a photovoltaic layer 13 of solar cells, a filler layer 14 and the protective sheet 16 (A) in that order in a superposed structure, and subjecting the superposed structure to a generally known forming process, such as a lamination process, in which those component layers of the superposed structure are brought into close contact by vacuum and are bonded together by hot pressing. Either of the surfaces of each of the protective sheets 11 and 16 may face inside.

The foregoing protective sheets in accordance with the present invention and the foregoing solar battery modules employing those protective sheets are examples intended to illustrate the invention and not to be construed to limit the scope of the invention.

For example, solar battery modules of different forms can be fabricated by using the protective sheets shown in FIGS. 17 to 20, and the foregoing solar battery modules may comprise additional layers for sunlight absorption, reinforcement or the like.

Description will be given of methods of forming the protective sheet by laminating at least the two basic structures each comprising the cyclic polyolefin sheet and the deposited inorganic oxide thin film, and forming the solar battery module employing the protective sheets. There are various possible methods.

A first method in accordance with the present invention uses at least the two basic structures each comprising the cyclic polyolefin sheet 1 and the deposited inorganic oxide thin film 2, and laminates the two basic structures by using the adhesive layer 203.

A second method in accordance with the present invention uses at least the two basic structures each comprising the cyclic polyolefin sheet 1 and the deposited inorganic oxide thin film 2, and laminates the two basic structures by using the adhesive layer 203 extruded individually between the two basic structures or in a coextrusion mode.

A third method in accordance with the present invention uses at least the two basic structures each comprising the cyclic polyolefin sheet 1 and the deposited inorganic oxide thin film 2, sandwiches the high-strength resin sheet 204 between the two basic structures, and laminates the component layers by using adhesive layers 203.

The foregoing methods of laminating at least the two basic structures each comprising the cyclic polyolefin sheet and the deposited inorganic oxide thin film are only examples and the present invention is not limited thereto.

When necessary, the surface of the deposited inorganic oxide thin film 2 formed on the cyclic polyolefin sheet 1 or the surface of the cyclic polyolefin sheet 1 to be bonded to another surface may be processed for adhesion improvement by a surface pretreatment process, such as a corona discharge process, an ozone process, a low-temperature or atmospheric pressure plasma process, a glow-discharge process, an oxidation process using a chemical or the like.

The surface pretreatment process may be an independent process to be carried out after forming the deposited inorganic oxide thin film. When the surface treatment process is a low-temperature plasma process or a glow discharge process, the surface pretreatment process may be carried out in an in-line processing mode in a process for forming the deposited inorganic oxide thin film, which is effective in reducing the manufacturing cost.

The surface of the cyclic polyolefin sheet provided with the deposited inorganic oxide thin film is finished by the surface pretreatment process for the adhesion improvement of the same. The improvement of adhesion can be achieved also by forming a layer of a primer, an undercoater, an anchoring agent or the like, for example, on the surface of the deposited inorganic oxide thin film or the surface of the cyclic polyolefin sheet.

Suitable materials for forming the coating layer are, for example, composite resins containing a polyester resin, a polyurethane resin, an acrylic resin or the like as a principal component of a vehicle.

The coating layer may be formed of a coating material of, for example, a solvent type, an aqueous solution type or an emulsion type by a roll coating process, a gravure roll coating process, a kiss-roll coating process or the like.

Methods of fabricating solar battery modules from those materials will be described. A known method uses the protective sheet in accordance with the present invention for a solar battery module as the front surface protective sheet or the back surface protective sheet of the solar battery module. The method fabricates a solar battery module by superposing the protective sheet as a front surface protective sheet, a filler layer, a photovoltaic layer of solar cells, a filler layer, and an ordinary protective sheet or the protective sheet in accordance with the present invention as a back surface protective sheet in that order in a superposed structure, when necessary, interposes layers of other materials between the component layers of the superposed structure, bringing the component layers of the superposed structure into close contact by vacuum and bonding together those component layers by a lamination process using hot pressing.

When necessary, and adhesive, such as a fusible adhesive, a solvent adhesive or a photocurable adhesive, containing, as a principal component of its vehicle, a (meta)acrylic resin, an olefin resin, a vinyl resin or the like may be used to enhance adhesion between the layers.

When necessary, the surface to which the filler layer is to be bonded, such as the surface of the deposited inorganic oxide thin film of the front or the back surface protective sheet of the solar battery module or the surface of the cyclic polyolefin sheet, may be treated by a pretreatment process, such as a corona discharge process, ozone process, a low-temperature or atmospheric plasma process, a glow-discharge process, an oxidation process using a chemical or the like, before laminating the filler layer or the like to one of the surfaces of the front or the back surface protective sheet of the solar battery module to enhance adhesion between the contiguous layers.

The surface pretreatment for adhesion improvement can be achieved also by forming a coating layer of coating material, such as a primer, an undercoater, an anchoring agent or the like, on the surface of the deposited inorganic oxide thin film or the surface of the fluorocarbon resin sheet.

The coating material may be a composite resin containing a polyester resin, a polyurethane resin, an acrylic resin or the like as a principal component of a vehicle.

The coating layer may be formed of a solvent coating material, an aqueous coating material or an emulsion coating material by a coating process, such as a roll coating process, a gravure roll coating process or a kiss-roll coating process.

The surface pretreatment for adhesion improvement can be achieved by forming a nonbarrier deposited inorganic oxide thin film of a thickness in the range of about 20 to 100 Å, preferably, in the range of 30 to 60 Å as a surface-pretreated layer by the foregoing method of forming the deposited inorganic oxide film on the surface contiguous with the filler layer, i.e., the surface of the cyclic polyolefin sheet or the deposited inorganic oxide thin film.

EXAMPLES

Examples of the fifth embodiment will be described hereinafter.

Example 1

(1) A roll of a 100 $\mu$m thick polydicyclopentadiene sheet, i.e., base sheet, was mounted on a feed roll of a continuous vacuum evaporation system. The polydicyclopentadiene sheet was unwound and wound around a coating drum and a 500 Å thick deposited aluminum oxide thin film was deposited on a treated surface of the polydicyclopentadiene sheet treated for adhesion improvement by a reactive vacuum evaporation process of an electron beam (EB) heating system to form a coated polydicyclopentadiene sheet. Aluminum was used as an evaporation source and oxygen gas was supplied to the continuous vacuum evaporation system.

Deposition conditions:

Evaporation source: Aluminum

Vacuum in vacuum chamber: $7.5 \times 10^{-6}$ mbar

Vacuum in deposition chamber: $2.1 \times 10^{-6}$ mbar

EB power: 40 kW

Sheet moving speed: 600 m/min (2) The 500 Å thick deposited aluminum oxide thin film of the coated polydicyclopentadiene sheet was subjected to a glow-discharge plasma process to form a plasma-processed surface. The glow-discharge plasma process was carried out by a glow-discharge plasma producing apparatus of 1500 W in plasma output immediately after the deposition of the 500 Å thick deposited aluminum oxide thin film. In the glow-discharge plasma process, an oxygen/argon mixed gas of 19/1 in $O_2/Ar$ ratio was supplied so that the pressure of the oxygen/argon mixed gas is maintained at $6 \times 10^{-5}$ torr and the processing speed was 420 m/min.

(3) A laminating adhesive layer of a polyurethane laminating adhesive consisting of a polyesterpolyol resin containing 5% by weight of benzotriazole ultraviolet absorber, and a diisocyanate compound was formed in 1.0 g/m$^2$ (dry state) in coating rate by a gravure roll coating process on the plasma-processed surface of the deposited aluminum oxide film of one of two coated polydicyclopentadiene sheets similar to that formed by (1) and (2). The two coated polydicyclopentadiene sheets were disposed with the laminating adhesive layer of one of the coated polydicyclopentadiene sheet and the plasma-processed surface of the deposited aluminum oxide thin film of the other coated polydicyclopentadiene sheet, and the two coated polydicyclopentadiene sheets were laminated by a dry lamination process to form a protective sheet for a solar battery module.

(4) A solar battery module was fabricated by using the protective sheet thus fabricated as a front surface protective sheet. The front surface protective sheet, a 400 $\mu$m thick ethylene-vinyl acetate copolymer sheet, a 38 $\mu$m thick biaxially oriented polyethylene terephthalate film provided with an array of amorphous silicon solar cells, a 400 $\mu$m thick ethylene-vinyl acetate copolymer sheet and a 50 $\mu$m thick biaxially oriented polyethylene terephthalate film were superposed in that order with the surface of the 38 $\mu$m thick biaxially oriented polyethylene terephthalate film provided with the array of amorphous silicon solar cells facing the front surface protective sheet. Those component layers were laminated by using adhesive layers of an acrylic resin to complete a solar battery module.

(5) Another protective sheet in accordance with the present invention and another solar battery module of the same components were fabricated by the same processes, except that a 100 $\mu$m thick polycyclopentadiene sheet was used instead of the 100 $\mu$m thick polydicyclopentadiene sheet.

A third protective sheet in accordance with the present invention and a third solar battery module of the same components were fabricated by the same processes, except that the two coated polydicyclopentadiene sheets were superposed and bonded together with the deposited aluminum oxide thin film of one of the coated polydicyclopentadiene sheets bonded to the polydicyclopentadiene sheet of the other coated polydicyclopentadiene sheet.

Example 2

(1) A roll of a 100 $\mu$m thick polydicyclopentadiene sheet, i.e., base sheet, was mounted on a feed roll of a plasma chemical vapor deposition system. A 500 Å thick deposited silicon oxide thin film was deposited on a treated surface of the polydicyclopentadiene sheet treated for adhesion improvement under the following conditions to form a coated polydicyclopentadiene sheet.

Deposition conditions:

Reaction gas mixing ratio: Hexamethyldisiloxane/oxygen/helium=1/10/10 (Unit: slm)

Vacuum in vacuum chamber: $5.0 \times 10^{-6}$ mbar

Vacuum in deposition chamber: $6.0 \times 10^{-2}$ mbar

Power supplied to cooling electrode drum: 20 kW

Film moving speed: 80 m/min

Surface for vapor deposition: Corona-processed surface (2) The 500 Å thick deposited silicon oxide thin film of the coated polydicyclopentadiene sheet was subjected to a corona discharge process to form a corona-processed surface and to increase the surface tension of the deposited silicon oxide thin film from 35 dyne to 60 dyne. Corona discharge power was 10 kW and the sheet was moved at a moving speed of 100 m/min.

(3) A laminating adhesive layer of 1.0 g/m² (dry state) in coating rate of a polyurethane laminating adhesive consisting of a polyesterpolyol resin containing 1.5% by weight of a benzotriazole ultraviolet absorber and 1.t % by weight of a hindered amine photostabilizer, and a diisocyanate compound was formed on the corona-processed surface of the deposited silicon oxide film of one of two coated polydicyclopentadiene sheets similar to that formed by (1) and (2), the two coated polydicyclopentadiene sheets were disposed with the laminating adhesive layer of one of the two coated polydicyclopentadiene sheets facing the corona-processed surface of the other coated polydicyclopentadiene sheet, and the two coated polydicyclopentadiene sheets were laminated by a dry lamination process to form a protective sheet in accordance with the present invention for a solar battery module.

(4) A solar battery module was fabricated by using the protective sheet thus fabricated as a front surface protective sheet. The front surface protective sheet, a 400 μm thick ethylene-vinyl acetate copolymer sheet, a 38 μm thick biaxially oriented polyethylene terephthalate film provided with an array of amorphous silicon solar cells, a 400 μm thick ethylene-vinyl acetate copolymer sheet and a 50 μm thick biaxially oriented polyethylene terephthalate film were superposed in that order with the surface of the 38 μm thick biaxially oriented polyethylene terephthalate film provided with the array of amorphous silicon solar cells facing the front surface protective sheet. Those component layers were laminated by using adhesive layers of an acrylic resin to complete a solar battery module.

(5) Another protective sheet in accordance with the present invention and another solar battery module of the same components were fabricated by the same processes, except that a 100 μm thick polycyclopentadiene was used instead of the 100 μm thick polydicyclopentadiene sheet.

A third protective sheet in accordance with the present invention and a third solar battery module of the same components were fabricated by the same processes, except that the two coated polyvinyl fluoride sheets were superposed and bonded together with the deposited silicon oxide thin film of one of the coated polydicyclopentadiene sheets bonded to the polydicyclopentadiene sheet of the other coated polydicyclopentadiene sheet.

Example 3

(1) A 100 μm thick polydicyclopentadiene sheet containing an ultraviolet absorber was used as a base sheet. A 500 Å thick deposited silicon oxide thin film was deposited on a surface of the polydicyclopentadiene sheet under the same conditions as those in Example 2. The surface of the deposited silicon oxide thin film was subjected to a corona discharge process to form a corona-processed surface.

(2) A 500 Å thick deposited aluminum oxide thin film was deposited on the corona-processed surface of the deposited silicon oxide thin film formed on the polydicyclopentadiene sheet under the same conditions as those in Example 1. A coated polyvinyl fluoride film was completed by subjecting the surface of the deposited aluminum oxide thin film to a plasma process to form a plasma-processed surface therein.

(3) A laminating adhesive layer of a polyurethane laminating adhesive consisting of a polyesterpolyol resin containing a small amount of an ultraviolet absorber containing ultrafine titanium oxide powder (particle size: 0.01 to 0.06 μm), and a diisocyanate compound was formed in a coating rate of 5.0 g/m² (dry state) on the plasma-processed surface of the deposited aluminum oxide film of each of two coated polydicyclopentadiene sheets similar to that formed by (1) and (2) by a gravure roll coating process. The two coated polydicyclopentadiene sheets were bonded together with the laminating adhesive layers thereof in contact with each other to complete a protective sheet in accordance with the present invention for a solar battery module.

(4) A solar battery module was fabricated by using the protective sheet thus fabricated as a front surface protective sheet. The front surface protective sheet, a 400 μm thick ethylene-vinyl acetate copolymer sheet, a 38 μm thick biaxially oriented polyethylene terephthalate film provided with an array of amorphous silicon solar cells, a 400 μm thick ethylene-vinyl acetate copolymer sheet and a 50 μm thick biaxially oriented polyethylene terephthalate film were superposed in that order with the surface of the 38 μm thick polyethylene terephthalate film provided with the array of amorphous silicon solar cells facing the front surface protective sheet. Those component layers were laminated by using adhesive layers of an acrylic resin to complete a solar battery module.

(5) Another protective sheet in accordance with the present invention and another solar battery module of the same components were fabricated by the same processes, except that a 100 μm thick polycyclopentadiene sheet was used instead of the 100 μm thick polydicyclopentadiene sheet.

A third protective sheet in accordance with the present invention and a third solar battery module of the same components were fabricated by the same processes, except that the two coated polydicyclopentadiene sheets were superposed and bonded together with the deposited aluminum oxide thin film of one of the coated polydicyclopentadiene sheets bonded to the polydicyclopentadiene sheet of the other coated polydicyclopentadiene sheet.

Example 4

An anchoring layer of a polyurethane anchoring agent was formed in a coating rate of 0.5 g/m² (dry state) by a gravure roll coating process on the plasma-processed surface of the deposited aluminum oxide film of each of two coated polydicyclopentadiene sheets similar to that in Example 1. A 30 μm thick polydicyclopentadiene film was formed on the anchoring layer of each of the two coated polydicyclopentadiene sheets by an extrusion coating process. Thus a protective sheet in accordance with the present invention for a solar battery module was completed.

A solar battery module employing the protective sheet as its front surface protective sheet was fabricated by the same processes as those in Example 1.

Another protective sheet in accordance with the present invention and another solar battery module of the same components were fabricated by the same processes, except that a polycyclopentadiene film was used instead of the polydicyclopentadiene film.

A third protective sheet in accordance with the present invention and a third solar battery module of the same components were fabricated by the same processes, except that the two coated polydicyclopentadiene sheets were superposed and bonded together with the deposited aluminum oxide thin film of one of the coated polydicyclopentadiene sheets bonded to the polydicyclopentadiene sheet of the other coated polydicyclopentadiene sheet.

Example 5

An anchoring layer of a polyurethane anchoring agent was formed in a coating rate of 0.5 g/m² (dry state) by a gravure roll coating process on the corona-processed surface of the deposited silicon oxide film of each of two coated polydicyclopentadiene sheets similar to that in Example 2. A 30 μm thick polydicyclopentadiene film was formed on the anchoring layer of each of the two coated polydicyclopentadiene sheets by an extrusion coating process. Thus a protective sheet in accordance with the present invention for a solar battery module was fabricated.

A solar battery module employing the protective sheet as its front surface protective sheet was fabricated by the same processes as those in Example 2.

Another protective sheet in accordance with the present invention and another solar battery module of the same components were fabricated by the same processes, except that a polynorbornadiene resin was used instead of the polydicyclopentadiene resin.

A third protective sheet in accordance with the present invention and a third solar battery module of the same components were fabricated by the same processes, except that the two coated polydicyclopentadiene sheets were superposed and bonded together with the deposited silicon oxide thin film of one of the coated polydicyclopentadiene sheets bonded to the polydicyclopentadiene sheet of the other coated polydicyclopentadiene sheet.

Example 6

A laminating adhesive layer of a two-component polyurethane laminating adhesive containing a small amount of an ultraviolet absorber containing ultrafine titanium oxide powder (particle size: 0.01 to 0.06 μm) was formed in a coating rate of 1.0 g/m² (dry state) by a gravure roll coating process on the plasma-processed surface of the deposited aluminum oxide film of each of two coated polydicyclopentadiene sheets similar to that in Example 1. A 20 μm thick polydicyclopentadiene film was sandwiched between the laminating adhesive layers of the coated polydicyclopentadiene sheets, and those component layers were laminated by a dry lamination process to complete a protective sheet in accordance with the present invention for a solar battery module.

A solar battery module employing the protective sheet was fabricated by the same processes as those in Example 1.

Another protective sheet in accordance with the present invention and another solar battery module of the same components were fabricated by the same processes, except that a polycyclopentadiene film was used instead of the polydicyclopentadiene film.

A third protective sheet in accordance with the present invention and a third solar battery module of the same components were fabricated by the same processes, except that the two coated polydicyclopentadiene sheets were superposed and bonded together with the deposited aluminum oxide thin film of one of the coated polydicyclopentadiene sheets bonded to the polydicyclopentadiene sheet of the other coated polydicyclopentadiene sheet.

Example 7

(1) Protective sheets that are the same as the protective sheet in Example 1 were used as the front surface protective sheet and the back surface protective sheet of a solar battery module. The solar battery module was fabricated by superposing the front surface protective sheet, a 400 μm thick ethylene-vinyl acetate copolymer sheet, a 38 μm thick biaxially oriented polyethylene terephthalate film provided with an array of amorphous silicon solar cells, a 400 μm thick ethylene-vinyl acetate copolymer sheet and the back surface protective sheet in that order with the surface of the 38 μm thick polyethylene terephthalate film provided with the array of amorphous silicon solar cells facing the front surface protective sheet, and laminating those component layers by using adhesive layers of an acrylic resin.

(2) Protective sheets in accordance with the present invention and another solar battery module of the same components were fabricated by the same processes, except that 100 μm thick polycyclopentadiene sheets were used instead of the 100 μm thick polydicyclopentadiene sheets.

A third protective sheet in accordance with the present invention and a third solar battery module of the same components were fabricated by the same processes, except that the two coated polydicyclopentadiene sheets were superposed and bonded together with the deposited aluminum oxide thin film of one of the coated polydicyclopentadiene sheets bonded to the polydicyclopentadiene sheet of the other coated polydicyclopentadiene sheet.

Example 8

(1) Protective sheets that are the same as the protective sheet in Example 2 were used as the front surface protective sheet and the back surface protective sheet of a solar battery module. The solar battery module was fabricated by superposing the front surface protective sheet, a 400 μm thick ethylene-vinyl acetate copolymer sheet, a 38 μm thick biaxially oriented polyethylene terephthalate film provided with an array of amorphous silicon solar cells, a 400 μm thick ethylene-vinyl acetate copolymer sheet and the back surface protective sheet in that order with the surface of the 38 μm thick polyethylene terephthalate film provided with the array of amorphous silicon solar cells facing the front surface protective sheet, and laminating those component layers by using adhesive layers of an acrylic resin.

(2) Protective sheets in accordance with the present invention and another solar battery module of the same components were fabricated by the same processes, except that 100 μm thick polycyclopentadiene sheets were used as the base sheets instead of the 100 μm thick polydicyclopentadiene sheets.

Third protective sheets in accordance with the present invention and a third solar battery module of the same components were fabricated by the same processes, except that the two coated polydicyclopentadiene sheets were superposed and bonded together with the deposited silicon oxide thin film of one of the coated polydicyclopentadiene sheets bonded to the polydicyclopentadiene sheet of the other coated polydicyclopentadiene sheet.

Example 9

(1) Protective sheets that are the same as the protective sheet in Example 3 were used as the front surface protective sheet and the back surface protective sheet of a solar battery module. The solar battery module was fabricated by superposing the front surface protective sheet, a 400 μm thick ethylene-vinyl acetate copolymer sheet, a 38 μm thick biaxially oriented polyethylene terephthalate film provided with an array of amorphous silicon solar cells, a 400 μm thick ethylene-vinyl acetate copolymer sheet and the back surface protective sheet in that order with the surface of the 38 μm thick polyethylene terephthalate film provided with the array of amorphous silicon solar cells facing the front surface protective sheet, and laminating those component layers by using adhesive layers of an acrylic resin.

(2) Protective sheets in accordance with the present invention and another solar battery module of the same components ere fabricated by the same processes, except that a 100 μm thick polycyclopentadiene sheet) containing an ultraviolet absorber was used instead of the 100 μm thick polydicyclopentadiene sheet containing an ultraviolet absorber.

A third protective sheet in accordance with the present invention and a third solar battery module of the same components were fabricated by the same processes, except that the two coated polyvinyl fluoride sheets were superposed and bonded together with the deposited aluminum oxide thin film of one of the coated polydicyclopentadiene sheets bonded to the polydicyclopentadiene sheet of the other coated polydicyclopentadiene sheet.

Example 10

Protective sheets that are the same as the protective sheet in Example 4 were used as the front surface protective sheet and the back surface protective sheet of a solar battery module. The solar battery module was fabricated by superposing the front surface protective sheet, a 400 μm thick ethylene-vinyl acetate copolymer sheet, a 38 μm thick biaxially oriented polyethylene terephthalate film provided with an array of amorphous silicon solar cells, a 400 μm thick ethylene-vinyl acetate copolymer sheet and the back surface protective sheet in that order with the surface of the 38 μm thick polyethylene terephthalate film provided with the array of amorphous silicon solar cells facing the front surface protective sheet, and laminating those component layers by using adhesive layers of an acrylic resin.

A protective sheet in accordance with the present invention and another solar battery module of the same components were fabricated by the same processes, except that a polycyclopentadiene resin was used instead of the polydicyclopentadiene resin.

A third protective sheet in accordance with the present invention and a third solar battery module of the same components were fabricated by the same processes, except that the two coated polydicyclopentadiene sheets were superposed and bonded together with the deposited aluminum oxide thin film of one of the coated polydicyclopentadiene sheets bonded to the polydicyclopentadiene sheet of the other coated polydicyclopentadiene sheet.

Example 11

Protective sheets that are the same as the protective sheet in Example 5 were used as the front surface protective sheet and the back surface protective sheet of a solar battery module. The solar battery module was fabricated by superposing the front surface protective sheet, a 400 μm thick ethylene-vinyl acetate copolymer sheet, a 38 μm thick biaxially oriented polyethylene terephthalate film provided with an array of amorphous silicon solar cells, a 400 μm thick ethylene-vinyl acetate copolymer sheet and the back surface protective sheet in that order with the surface of the 38 μm thick polyethylene terephthalate film provided with the array of amorphous silicon solar cells facing the front surface protective sheet, and laminating those component layers by using adhesive layers of an acrylic resin.

Protective sheets in accordance with the present invention and another solar battery module of the same components were fabricated by the same processes, except that a polycyclopentadiene resin was used instead of the polydicyclopentadiene resin.

A third protective sheet in accordance with the present invention and a third solar battery module of the same components were fabricated by the same processes, except that the two coated polydicyclopentadiene sheets were superposed and bonded together with the deposited silicon oxide thin film of one of the coated polydicyclopentadiene sheets bonded to the polydicyclopentadiene sheet of the other coated polydicyclopentadiene sheet.

Example 12

Protective sheets that are the same as the protective sheet in Example 6 were used as the front surface protective sheet and the back surface protective sheet of a solar battery module. The solar battery module was fabricated by superposing the front surface protective sheet, a 400 μm a thick ethylene-vinyl acetate copolymer sheet, a 38 μm thick biaxially oriented polyethylene terephthalate film provided with an array of amorphous silicon solar cells, a 400 μm thick ethylene-vinyl acetate copolymer sheet and the back surface protective sheet in that order with the surface of the 38 μm thick polyethylene terephthalate film provided with the array of amorphous silicon solar cells facing the front surface protective sheet, and laminating those component layers by using adhesive layers of an acrylic resin.

Protective sheets in accordance with the present invention and another solar battery module of the same components were fabricated by the same processes, except that a polycyclopentadiene film was used instead of the polydicyclopentadiene film.

A third protective sheet in accordance with the present invention and a third solar battery module of the same components were fabricated by the same processes, except that the two coated polydicyclopentadiene sheets were superposed and bonded together with the deposited aluminum oxide thin film of one of the coated polydicyclopentadiene sheets bonded to the polydicyclopentadiene sheet of the other coated polydicyclopentadiene sheet.

Example 13

(1) A protective sheet that is the same as the protective sheet in Example 1 was used as the back surface protective sheet of a solar battery module. The solar battery module was fabricated by superposing a 3 mm thick glass sheet, a 400 μm thick ethylene-vinyl acetate copolymer sheet, a 38 μm thick biaxially oriented polyethylene terephthalate film provided with an array of amorphous silicon solar cells, a 400 μm thick ethylene-vinyl acetate copolymer sheet and the back surface protective sheet in that order with the surface of the 38 μm thick polyethylene terephthalate film provided with the array of amorphous silicon solar cells facing the 3 mm thick glass sheet, and laminating those component layers by using adhesive layers of an acrylic resin.

(2) A protective sheet in accordance with the present invention and another solar battery module of the same components were fabricated by the same processes, except that a 100 μm thick polycyclopentadiene was used instead of the 100 μm thick polydicyclopentadiene sheet.

A third protective sheet in accordance with the present invention and a third solar battery module of the same components were fabricated by the same processes, except that the two coated polydicyclopentadiene sheets were superposed and bonded together with the deposited aluminum oxide thin film of one of the coated polydicyclopentadiene sheets bonded to the polydicyclopentadiene sheet of the other coated polydicyclopentadiene sheet.

Example 14

(1) A protective sheet that is the same as the protective sheet in Example 2 was used as the back surface protective sheet of a solar battery module. The solar battery module was fabricated by superposing a 50 μm thick fluorocarbon resin sheet, a 400 μm thick ethylene-vinyl acetate copolymer sheet, a 38 μm thick biaxially oriented polyethylene terephthalate film provided with an array of amorphous silicon solar cells, a 400 μm thick ethylene-vinyl acetate copolymer sheet and the back surface protective sheet in that order with the surface of the 38 μm thick polyethylene terephthalate film provided with the array of amorphous silicon solar cells facing the 50 μm thick fluorocarbon resin sheet, and laminating those component layers by using adhesive layers of an acrylic resin.

(2) Another protective sheet in accordance with the present invention and another solar battery module of the same components were fabricated by the same processes, except that a 100 μm thick polycyclopentadiene sheet was used as a base sheet instead of the 100 μm thick polydicyclopentadiene sheet.

A third protective sheet in accordance with the present invention and a third solar battery module of the same components were fabricated by the same processes, except that the two coated polydicyclopentadiene sheets were superposed and bonded together with the deposited silicon oxide thin film of one of the coated polydicyclopentadiene sheets bonded to the polydicyclopentadiene sheet of the other coated polydicyclopentadiene sheet.

Example 15

(1) A protective sheet that is the same as the protective sheet in Example 3 was used as the back surface protective sheet of a solar battery module. The solar battery module was fabricated by superposing a 100 μm thick polydicyclopentadiene sheet, a 400 μm thick ethylene-vinyl acetate copolymer sheet, a 38 μm thick biaxially oriented polyethylene terephthalate film provided with an array of amorphous silicon solar cells, a 400 μm thick ethylene-vinyl acetate copolymer sheet and the back surface protective sheet in that order with the surface of the 38 μm thick polyethylene terephthalate film provided with the array of amorphous silicon solar cells facing the 100 μm thick polydicyclopentadiene sheet, and laminating those component layers by using adhesive layers of an acrylic resin.

(2) Another protective sheet in accordance with the present invention and another solar battery module of the same components were fabricated by the same processes, except that a 100 μm thick polycyclopentadiene sheet containing an ultraviolet absorber( ) was used as a base sheet instead of the 100 μm thick polydicyclopentadiene sheet containing an ultraviolet absorber.

A third protective sheet in accordance with the present invention and a third solar battery module of the same components were fabricated by the same processes, except that the two coated polydicyclopentadiene sheets each provided with the deposited silicon oxide thin film and the deposited aluminum oxide thin film were superposed and bonded together with the deposited aluminum oxide thin film of one of the coated polydicyclopentadiene sheets bonded to the polydicyclopentadiene sheet of the other coated polydicyclopentadiene sheet.

Comparative Example 1

A solar battery module was fabricated by superposing a 100 μm thick polydicyclopentadiene sheet, i.e., base sheet, as a front surface protective sheet, a 400 μm thick ethylene-vinyl acetate copolymer sheet, a 38 μm thick biaxially oriented polyethylene terephthalate film provided with an array of amorphous silicon solar cells, a 400 μm thick ethylene-vinyl acetate copolymer sheet and a 50 μm thick biaxially oriented polyethylene terephthalate film in that order with the surface of the 38 μm thick polyethylene terephthalate film provided with the array of amorphous silicon solar cells facing the front surface protective sheet, and laminating those component layers by using adhesive layers of an acrylic resin.

Comparative Example 2

A solar battery module was fabricated by superposing a 50 μm thick polyvinyl fluoride sheet (PVF sheet), i.e., base sheet, as a front surface protective sheet, a 400 μm thick ethylene-vinyl acetate copolymer sheet, a 38 μm thick biaxially oriented polyethylene terephthalate film provided with an array of amorphous silicon solar cells, a 400 μm thick ethylene-vinyl acetate copolymer sheet and a 50 μm thick biaxially oriented polyethylene terephthalate film in that order with the surface of the 38 μm thick polyethylene terephthalate film provided with the array of amorphous silicon solar cells facing the front surface protective sheet, and laminating those component layers by using adhesive layers of an acrylic resin.

Comparative Example 3

A solar battery module was fabricated by superposing a 100 μm thick polydicyclopentadiene sheet, i.e., base sheet, as a front surface protective sheet, a 400 μm thick ethylene-vinyl acetate copolymer sheet, a 38 μm thick biaxially oriented polyethylene terephthalate film provided with an array of amorphous silicon solar cells, a 400 μm thick ethylene-vinyl acetate copolymer sheet and a 100 μm thick polydicyclopentadiene sheet, i.e., base sheet, as a back surface protective sheet in that order with the surface of the 38 μm thick polyethylene terephthalate film provided with the array of amorphous silicon solar cells facing the front surface protective sheet, and laminating those component layers by using adhesive layers of an acrylic resin.

Comparative Example 4

A solar battery module was fabricated by superposing a 50 μm thick polyvinyl fluoride film (PVF film), i.e., base sheet, as a front surface protective sheet, a 400 μm thick ethylene-vinyl acetate copolymer sheet, a 38 μm thick biaxially oriented polyethylene terephthalate film provided with an array of amorphous silicon solar cells, a 400 μm thick ethylene-vinyl acetate copolymer sheet and a 50 μm thick polyvinyl fluoride film (PVF film), i.e., base sheet, as a back surface protective sheet in that order with the surface of the 38 μthick polyethylene terephthalate film provided with the array of amorphous silicon solar cells facing the front surface protective sheet, and laminating those component layers by using adhesive layers of an acrylic resin.

Experiments

The protective sheets in Examples 1 to 15 of the present invention and those in Comparative examples 1 to 4 were subjected to total transmittance measurement. The solar battery modules in Examples 1 to 15 and Comparative examples 1 to 4 were subjected to solar battery module evaluation tests.

(1) Total Transmittance Measurement

Total transmittance (%) of each of the protective sheets in Examples 1 to 15 and Comparative examples 1 to 4 against the total transmittance of the base sheet as a reference total transmittance was measured by a color computer.

(2) Solar Battery Module Evaluation Tests

The solar battery modules were subjected to environmental tests in conformity to conditions specified in JIS C8917-1989. Photovoltaic output of the solar battery modules was measured before and after environmental tests.

(3) Moisture Permeability and Oxygen Permeability The moisture permeabilities of the protective sheets in Examples 1 to 15 and Comparative examples 1 to 4 were measured in an atmosphere of 40° C. and 90%RH by a moisture permeability measuring apparatus (PERMATRAN, MOCON, USA). The oxygen permeabilities of the protective sheets in Examples 1 to 22 and Comparative examples 1 to 5 were measured in an atmosphere of 23° C. and 90% RH by an oxygen permeability measuring apparatus (OXTRAN, MOCON, USA).

Measured data is tabulated in Table 5-1.

TABLE 5-1

| | Total transmittance (%) | Moisture permeability (g/m$^2$/24 hr) | Oxygen permeability (cc/m$^2$/24 hr/atm) | Output reduction ratio (%) |
|---|---|---|---|---|
| Example 1 | 92 | 0.2 | 0.4 | 2 |
| Example 2 | 91 | 0.3 | 0.4 | 3 |
| Example 3 | 90 | 0.1 | 0.2 | 1 |
| Example 4 | 93 | 0.3 | 0.6 | 3 |
| Example 5 | 91 | 0.4 | 0.5 | 1 |
| Example 6 | 92 | 0.2 | 0.4 | 3 |
| Example 7 | 92 | 0.2 | 0.4 | 1 |
| Example 8 | 91 | 0.3 | 0.4 | 2 |
| Example 9 | 90 | 0.1 | 0.2 | 1 |
| Example 10 | 93 | 0.3 | 0.6 | 2 |
| Example 11 | 92 | 0.4 | 0.5 | 1 |
| Example 12 | 92 | 0.2 | 0.4 | 1 |
| Example 13 | 92 | 0.2 | 0.4 | 5 |
| Example 14 | 91 | 0.3 | 0.4 | 4 |
| Example 15 | 90 | 0.1 | 0.2 | 3 |
| Comparative Example 1 | 92 | 1.2 | 200.0 | 10 |
| Comparative Example 2 | 93 | 26.3 | 27.2 | 15 |
| Comparative Example 3 | 92 | 1.2 | 200.0 | 8 |
| Comparative Example 4 | 93 | 26.3 | 27.2 | 11 |

In table 5-1, moisture permeability is expressed in a unit of g/m$^2$/day·40° C.·100% RH, and oxygen permeability is expressed in a unit of cc/m$^2$/day·23° C.·90% RH.

As obvious from Table 5-1, the protective sheets in Examples 1 to 15 have high total transmittances, respectively, and are excellent in moisture impermeability and oxygen impermeability.

The output reduction ratios of the solar battery modules employing the protective sheets in Examples 1 to 15 were low.

The protective sheets in Comparative examples 1 to 4 had high total transmittances, respectively. However, the moisture impermeabilities and the oxygen impermeabilities of the protective sheets in Comparative examples 1 to 4 were low. Consequently, the output reduction ratios of the solar battery modules employing the protective sheets in Comparative examples 1 to 4 were high.

As apparent from the foregoing description, the present invention uses a cyclic polyolefin sheet as a base sheet, fabricates a coated fluorocarbon resin sheet by forming a transparent, vitreous deposited inorganic oxide thin film, such as a silicon oxide thin film or an aluminum oxide thin film, on one of the surfaces of the cyclic polyolefin sheet, and fabricates a protective sheet for a solar battery module by laminating at least two coated cyclic polyolefin sheets similar to the foregoing coated cyclic polyolefin sheet by an adhesive layer or the like, uses the protective sheet as the front surface protective sheet or the back surface protective sheet of a solar battery module; fabricates a solar battery module by, for example, superposing the protective sheet as a front surface protective sheet, a filler layer, a film provided with solar cells, i.e., photovoltaic cells, a filler layer and the protective sheet as a back surface protective sheet in that order in a superposed structure, bringing the component layers of the superposed structure into close contact by vacuum and bonding together those component layers by a lamination process using hot pressing; and the protective sheet transmits sunlight at a high transmittance, is excellent in strength, weather resistance, heat resistance, water resistance, light resistance, wind endurance, hailstorm resistance, chemical resistance, moisture resistance and soil resistance, has a high impermeability to moisture and oxygen, limits performance degradation due to aging to the least extent, very durable, has excellent protective ability, and can be used for the stable fabrication of a low-cost, safe solar battery module.

The materials mentioned in the description of the first to the fourth embodiment are applicable to the fifth embodiment. by a lamination process using hot pressing; and the protective sheet transmits sunlight at a high transmittance, is excellent in strength, weather resistance, heat resistance, water resistance, light resistance, wind endurance, hailstorm resistance, chemical resistance, moisture resistance and soil resistance, has a high impermeability to moisture and oxygen, limits performance degradation due to aging to the least extent, very durable, has excellent protective ability, and can be used for the stable fabrication of a low-cost, safe solar battery module.

The materials mentioned in the description of the first to the fourth embodiment are applicable to the fifth embodiment.

Sixth Embodiment

The present invention will be described hereinafter with reference to the accompanying drawings.

Figure 24:
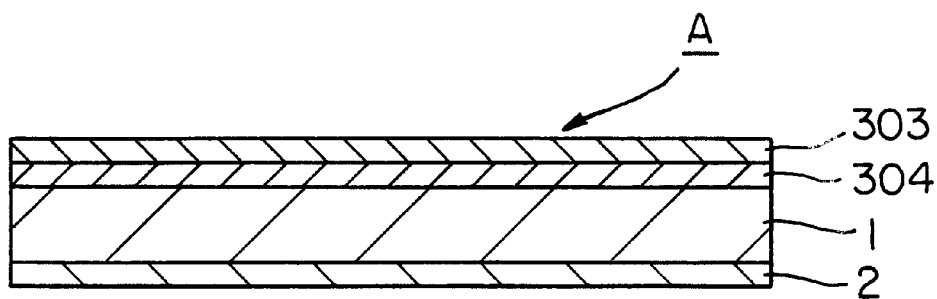
FIG. 24 is a typical sectional view of a protective sheet in a fifth embodiment according to the present invention for a solar battery module.

FIGS. 24 to 28 are typical sectional views of protective sheets in accordance with the present invention for solar battery modules, and FIG. 29 is a typical sectional view of a solar battery module employing a protective sheet shown in FIG. 24.

Referring to FIG. 24, a front surface protective sheet A in a first example of the sixth embodiment of the present invention for a solar battery module comprises a fluorocarbon resin sheet (weather-resistant sheet) 1 and deposited inorganic oxide film 2 deposited on one of the surfaces of the fluorocarbon resin sheet 1. A soil resistant layer 303 and/or an ultraviolet absorbing layer 304 is formed on one of the surfaces of the fluorocarbon resin sheet 1.

Figure 25:
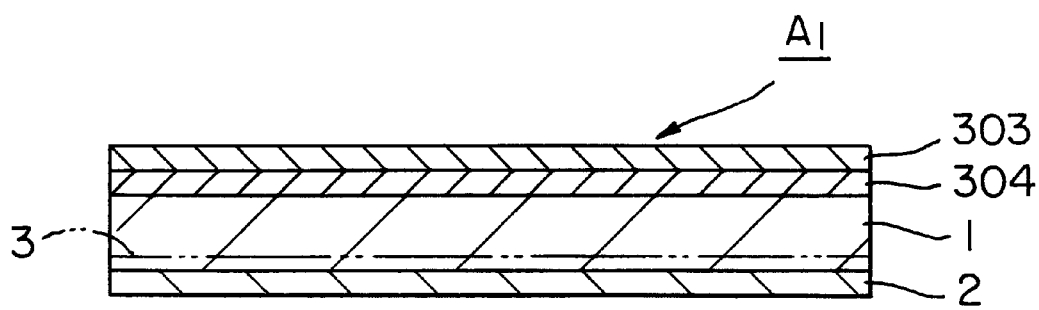
FIG. 25 is a typical sectional view of a protective sheet for a solar battery module.

Referring to FIG. 25, a front surface protective sheet A, in a second example of the sixth embodiment of the present invention for a solar battery module comprises a fluorocarbon resin sheet 1, a deposited inorganic oxide thin film 2 deposited on one of the surface of the fluorocarbon resin sheet 1, an ultraviolet absorbing layer 304 formed on the other surface of the fluorocarbon resin sheet 1, and a soil-resistant layer 303 formed on the ultraviolet absorbing layer 304. The soil-resistant layer 303 forms the outermost surface of the front surface protective sheet $A_1$.

Figure 26:
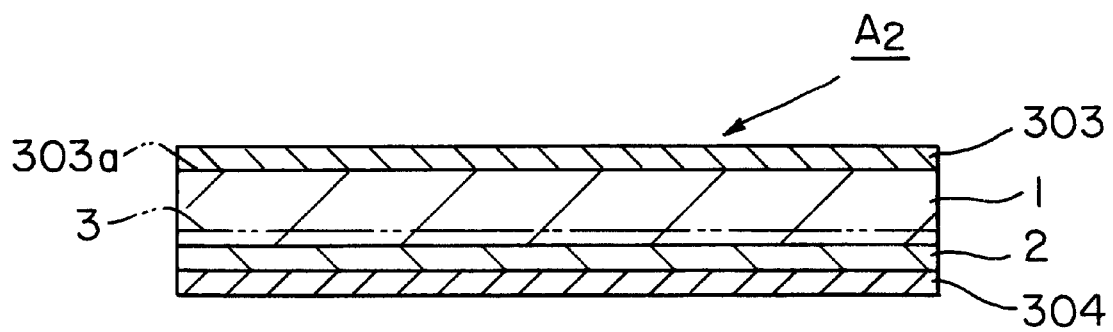
FIG. 26 is a typical sectional view of a protective sheet for a solar battery module.

Referring to FIG. 26, a front surface protective sheet $A_2$ in a third example of the sixth embodiment of the present invention for a solar battery module comprises a fluorocarbon resin sheet 1, a deposited inorganic oxide thin film 2 formed on one of the surfaces of the fluorocarbon resin sheet 1, a soil-resistant layer 303 formed on the surface of the fluorocarbon resin sheet 1, and an ultraviolet absorbing layer 304 formed on the deposited inorganic oxide thin film 2. The soil-resistant layer 303 forms the outermost surface of the front surface protective sheet $A_2$.

In the front surface protective sheets shown in FIGS. 25 and 26, the surface of the fluorocarbon resin sheet 1 may be processed to form a surface-treated layer 3 therein.

Referring to FIG. 27, a front surface protective sheet $A_3$ in a fourth example of the sixth embodiment of the present invention for a solar battery module comprises a fluorocarbon resin sheet 1, a multilayer film 4 consisting of at least two deposited inorganic oxide thin films 2 and formed on one of the surfaces of the fluorocarbon resin sheet 1, and a soil-resistant layer 303 and/or an ultraviolet asorbing layer 304 formed on one of or both the surfaces of the fluorocarbon resin sheet 1 provided with the multilayer film 4.

Referring to FIG. 28, a front surface protective sheet $A_4$ in a fifth example of the sixth embodiment of the present invention for a solar battery module comprises a fluorocarbon resin sheet 1, a multi layer film 5 consisting of at lest a deposited inorganic oxide thin film 2a formed by a chemical vapor deposition process and a deposited inorganic oxide film 2b formed on the deposited inorganic oxide thin film 2a by a physical vapor deposition process, and formed on one of the surfaces of the fluorocarbon resin film 1, a soil-resistant layer 303 and/or an ultraviolet absorber layer 304 formed on one of or both the surfaces of the fluorocarbon resin sheet 1.

Referring to FIG. 29, a solar battery module T employs the protective sheet A shown in FIG. 24 as its front surface protective sheet. The solar battery module T is fabricated by superposing the front surface protective sheet A, a filler layer 12, a photovoltaic layer 13 of solar cells, a filler layer 14 and a back surface protective sheet 15 in that order in a superposed structure with the deposited inorganic oxide thin film 2 of the front surface protective sheet A facing inside, and subjecting the superposed structure to a generally known forming process, such as a lamination process, in which those component layers of the superposed structure are brought into close contact by vacuum and are bonded together by hot pressing.

The foregoing protective sheets in accordance with the present invention and the foregoing solar battery module employing those protective sheets are examples intended to illustrate the invention and not to be construed to limit the scope of the invention.

For example, the foregoing solar battery modules may comprise additional layers for sunlight absorption, reinforcement or the like.

The soil-resistant layer 303 included in the front surface protective sheet in accordance with the present invention and the solar battery module is a coating film of a composite material containing photocatalytic powder containing titanium oxide as a principal component or a sol containing fine particles.

A solvent, aqueous or emulsion composite material containing a photocatalytic powder for forming the coating film is prepared by preparing a mixture of one or some kinds of photocatalytic powder, one or some kinds of bonding agents as a vehicle, when necessary, additives for the improvement or modification of the workability, heat resistance, light resistance, water resistance, weather resistance, mechanical or chemical properties, dimensional stability, oxidation resistance, slipperiness, releasability, flame retardancy, anti-fungal property, electric properties and the like, such as a lubricant, a crosslinking agent, an oxidation inhibitor, an ultraviolet absorber, a light stabilizer, a filler, a reinforcing material, a stiffener, an antistatic agent, a flame retarder, a flame-resistant agent, a foaming agent, an antifungus agent, a pigment and the like, a solvent, and a diluent, and kneading the mixture. The concentration of each of the ingredients is determined so that the ingredients may not affect sunlight transmittance. The coating film is formed by spreading the composite material by, for example, any one of coating processes including a floating-knife coating process, a knife-over-roll coating process, an inverted knife coating process, a squeeze roll coating process, a reverse roll coating process, a roll coating process, a gravure roll coating process, a kiss-roll coating process, an air blade coating process, an extrusion coating process, a curtain-flow coating process and the like, or any one of printing processes including a gravure printing process, an offset printing process, a silk-screen printing process, a transfer printing process and the like.

The desirable thickness of the coating film as dried is in the range of 0.1 to 10 $g/m^2$, more preferably, in the range of 0.5 to 1 $g/m^2$.

The photocatalytic powder may be a chemical substance having functions to promote the degradation, destruction, decomposition or reduction in molecular weight of a resin due to oxidation or the like caused by the operation of light, such as sunlight, and to facilitate keeping the surface of the soil-resistant layer clean by destroying the adhesion of dust to the surface of the soil-resistant layer and enabling wind and rain to remove dust from the surface of the soil-resistant layer.

The photocatalytic powder may be powder of any one of, for example, $TiO_2$, $ZnO$, $SrTiO_3$, $CdS$, $CaP$, $InP$, $GaAs$, $BaTiO_2$, $K_2TiO_3$, $K_2NbO_3$, $Fe_2)_3$, $Ta_2O_3$, $WO_3$, $SnO_2$, $Bi_2O_5$, $NiO$, $Cu_2O$, $SiC$, $SiO_2$, $InPb$, $RuO_2$, $CeO_2$ and the like, any one of metals including Pt, Rh, $RuO_2$, Nb, Cu, Sn, Ni and Fe, or any one of composite material prepared by mixing one or some of those metals and/or one or some of those metal oxides.

The photocatalytic powder content of the composite material is dependent on the shape and density of particles and a preferable photocatalytic powder content is in the range of about 0.1 to about 30% by weight.

A bonding agent capable of forming a film, excellent in light resistance, heat resistance, water resistance and the like, capable of increasing the hardness of the coating film, excellent in scratch resistance and abrasion resistance and immune to the effect of the photoactivity of the photocatalytic powder may be used as the vehicle. Possible materials for use as the bonding agent are, for example, polyethylene resins, polypropylene resins, ethylene-vinyl acetate copolymers, ionomers, ethylene-ethyl acrylate copolymers, ethylene-acrylate or methacrylate copolymers, methyl pentene polymers, polybutene resins, polyvinyl chloride resins, polyvinyl acetate resins, vinyl chloride-vinylidene chloride copolymers, poly(meta)acrylic resins, polyacrylonitrile resins, polystyrene resins, acrylonitrile-styrene copolymers (As resins), Acrylonitrile-butadiene-styrene copolymers (ABS resins), polyester resins, polyamide resins, polycarbonate resins, polyvinyl alcohol resins, saponified ethylene vinyl acetate copolymers, fluorocarbon resins, diene resins, polyacetal resins, polyurethane resins, epoxy resins, phenolic resins, amino resins, silicone resins, nitrocellulose, inorganic polymers and the like, modified resins, and a mixture of some of those resins.

It is particularly preferable to use one or some of low-melting glass, alkali metal silicates, phosphates, colloidal silica and inorganic polymers among those bonding agents immune to the influence of the photocatalytic powder.

According to the present invention, an activity blocking layer 303a (FIG. 26) may be interposed between the soil-resistant layer 303 and the ultraviolet absorbing layer or the fluorocarbon resin sheet underlying the soil-resistant sheet 303 to prevent the degradation, decomposition or destruction of the ultraviolet absorbing layer or the fluorocarbon resin sheet due to the influence of the photoactivity of the photocatalytic powder contained in the soil-resistant layer 303. Generally, the activity blocking layer 303a is formed under the soil-resistant layer.

A transparent, deposited inorganic oxide thin film, such as a deposited silicon oxide thin film or a deposited aluminum oxide thin film, may be used as the activity blocking layer 303a.

The deposited inorganic oxide thin film that serves as the activity blocking layer can be formed by the foregoing film forming process. The thickness of the deposited inorganic oxide thin film is in the range of about 100 to about 3000 Å, preferably, in the range of 100 to 1500 Å.

When necessary, a bonding primer layer or the like may be used for forming the coating film of a composite material containing photocatalytic powder and serving as the soil-resistant layer 303 to enhance the adhesion of the soil-resistant layer 303 to the underlying layer.

The bonding primer layer may be formed of, for example, a material capable of forming an inorganic primer layer that will not be decomposed by the photoactivity of the photocatalytic powder contained in the soil-resistant layer. Representative materials suitable for forming the primer layer are alkyl titanates including tetraisopropyl titanate, tetrabutyl titanate and tetrastearyl titanate, a product obtained through the hydrolysis of titanium chelate, and inorganic polysilazane (perhydropolysilazane).

In the present invention, tetraisopropyl titanate tetrabutyl titanate are particularly preferable because they are hydrolyzed very quickly and can be decomposed after forming a coating.

Description will be given of the ultraviolet absorbing layer 304 of the front surface protective sheet in accordance with the present invention for a solar battery module, and the solar battery module. A solvent, aqueous or emulsion composite material for forming the ultraviolet absorbing layer 304 is prepared by preparing a mixture of one or some kinds of ultraviolet absorbers, one or some kinds of bonding agents as a vehicle photocatalytic powder, one or some kinds of bonding agents as a vehicle and, when necessary, additives for the improvement or modification of the workability, heat resistance, light resistance, water resistance, weather resistance, mechanical or chemical properties, dimensional stability, oxidation resistance, slipperiness, releasability, flame retardancy, antifungal property, electric properties and the like, such as one or some of a lubricant, a crosslinking agent, an oxidation inhibitor, a stabilizer, a filler, a reinforcing material, a stiffener, an antistatic agent, a flame retarder, a flame-resistant agent, a foaming agent, an antifungus agent, a pigment and the like, a solvent, and a diluent, and kneading the mixture. The concentration of each of the ingredients is determined so that the ingredients may not affect sunlight transmittance. The coating film is formed by spreading the composite material by, for example, any one of coating processes including a floating-knife coating process, a knife-over-roll coating process, an inverted knife coating process, a squeeze roll coating process, a reverse roll coating process, a roll coating process, a gravure roll coating process, a kiss-roll coating process, an air blade coating process, an extrusion coating process, a curtain-flow coating process and the like, or any one of printing processes including a gravure printing process, an offset printing process, a silk-screen printing process, a transfer printing process and the like.

The desirable thickness of the coating film as dried is in the range of 0.1 to 10 $g/m^2$, more preferably, in the range of 0.5 to 1 $g/m^2$.

The ultraviolet absorber absorbs detrimental ultraviolet rays contained in sunlight, converts the energy of ultraviolet rays into harmless thermal energy in its molecules to prevent active species that starts the photodeterioration of polymers from being excited. One or some of ultraviolet absorbers, such as those of a benzophenone group, a benzotriazole group, a salicylate group, an acrylonitrile group, metallic complex salts, a hindered amine group and an inorganic ultraviolet absorber, such as ultrafine titanium oxide powder (particle size: 0.01 to 0.06 $\mu$m) or ultrafine zinc oxide powder (particle size: 0.01 to 0.04 $\mu$m), may be used.

The ultraviolet absorber content of the composite material is dependent on the shape and density of the particles and a preferable ultraviolet absorber content is in the range of about 0.1 to about 20% by weight.

The bonding agent used for preparing the composite material for forming the coating film serving as the dust-resistant layer and containing the photocatalytic powder may be used as the bonding agent serving as a vehicle.

EXAMPLES

Examples of the sixth embodiment will be described hereinafter.

Example 1

(1) A roll of a 50 $\mu$m thick polyvinyl fluoride sheet (PVF sheet), i.e., base sheet, was mounted on a feed roll of a continuous vacuum evaporation system. The polyvinyl fluoride sheet was unwound and wound around a coating drum and a 300 Å thick deposited aluminum oxide thin film was deposited on a treated surface of the polyvinyl fluoride sheet treated for adhesion improvement by a reactive vacuum evaporation process of an electron beam (EB) heating system to form a coated polyvinyl fluoride sheet. Aluminum was used as an evaporation source and oxygen gas was supplied to the continuous vacuum evaporation system.

Deposition conditions:

Evaporation source: Aluminum

Vacuum in vacuum chamber: $7.5 \times 10^{-6}$ mbar

Vacuum in deposition chamber: $2.1 \times 10^{-6}$ mbar

EB power: 40 kW

Sheet moving speed: 600 m/min (2) The 300 Å thick deposited aluminum oxide thin film of the coated polyvinyl fluoride sheet was subjected to a glow-discharge plasma process to form a plasma-processed surface. The glow-discharge plasma process was carried out by a glow-discharge plasma producing apparatus of 1500 W in plasma output immediately after the deposition of the 300 Å thick deposited aluminum oxide thin film. In the glow-discharge plasma process, an oxygen/argon mixed gas of 19/1 in $O_2$/Ar ratio was supplied so that the pressure of the oxygen/argon mixed gas is maintained at $6\times10^{-5}$ torr and the processing speed was 420 m/min.

An ultraviolet absorbing layer was formed in the plasma-processed surface of the deposited aluminum oxide thin film to complete a front surface protective sheet in accordance with the present invention. The ultraviolet absorbing layer was formed by coating the plasma-processed surface of the deposited aluminum oxide thin film with an ultraviolet absorber composite material containing 5 parts by weight of ultrafine titanium oxide powder of 0.03 at n in particle size and 95 parts by weight of an ethylene-vinyl alcohol copolymer solution (30% solid content) in a coating rate of 0.5 g/m$^2$ (dry state) by a gravure coating process.

(3) A solar battery module in accordance with the present invention was fabricated by using the front surface protective sheet thus fabricated. The front surface protective sheet and a 38 μm thick biaxially oriented polyethylene terephthalate film provided with an array of amorphous silicon solar cells were superposed with the plasma-processed deposited aluminum oxide thin film facing inside and with the surface of the 38 μm thick biaxially oriented polyethylene terephthalate film provided with the array of amorphous silicon solar cells facing the front surface protective sheet. Those component layers were laminated by using an adhesive layer of an acrylic resin to complete a solar battery module.

(4) Another protective sheet in accordance with the present invention and another solar battery module of the same components were fabricated by the same processes, except that a 50 μm thick fluorocarbon resin sheet of an ethylene-tetrafluoroethylene copolymer (ETFE) was used instead of the 50 μm thick polyvinyl fluoride sheet (PVF sheet).

Example 2

(1) A roll of a 50 μm thick polyvinyl fluoride film (PVF film), i.e., base sheet, was mounted on a feed roll of a plasma chemical vapor deposition system. A 300 Å thick deposited silicon oxide thin film was deposited on a treated surface of the polyvinyl fluoride film treated for adhesion improvement under the following conditions to form a coated polyvinyl fluoride sheet.

Deposition conditions:
Reaction gas mixing ratio: Hexamethyldisiloxane/oxygen/helium=1/10/10 (Unit: slm)
Vacuum in vacuum chamber: $5.0\times10^{-6}$ mbar
Vacuum in deposition chamber: $6.0\times10^{-6}$ mbar
Power supplied to cooling electrode drum: 20 kW
Film moving speed: 80 m/min
Surface for vapor deposition: Corona-processed surface (2) The 300 Å thick deposited silicon oxide thin film of the coated polyvinyl fluoride film was subjected to a corona discharge process to form a corona-processed surface and to increase the surface tension of the deposited silicon oxide thin film from 35 dyne to 60 dyne. Corona discharge power was 10 kW and the sheet was moved at a moving speed of 100 m/min.

An ultraviolet absorbing layer was formed on the corona-processed surface of the deposited silicon oxide thin film to complete a front surface protective sheet in accordance with the present invention. The ultraviolet absorbing layer was formed by coating the corona-processed surface of the deposited silicon oxide thin film with an ultraviolet absorber composite material containing 1 part by weight of a benzophenone ultraviolet absorber and 99 parts by weight of a thermosetting acrylic resin solution (30% solid content) in a coating rate of 2 g/m$^2$ (dry state) by a gravure coating process.

(3) A solar battery module was fabricated by using the front surface protective sheet thus fabricated. The front surface protective sheet and a 38 μm thick biaxially oriented polyethylene terephthalate film provided with an array of amorphous silicon solar cells were superposed with the corona-processed deposited silicon oxide thin film facing inside and with the surface of the 38 μm thick biaxially oriented polyethylene terephthalate film provided with the array of amorphous silicon solar cells facing the front surface protective sheet. Those component layers were laminated by using adhesive layers of an acrylic resin to complete a solar battery module.

(4) Another protective sheet in accordance with the present invention and another solar battery module of the same components were fabricated by the same processes, except that a 50 μm thick fluorocarbon resin sheet of an ethylene-tetrafluoroethylene copolymer (ETFE) was used instead of the 50 μm thick polyvinyl fluoride sheet (PVF sheet).

Example 3

(1) A front surface protecting sheet in accordance with the present invention was fabricated by the same processes as those in (2) of Example 1, except that, after forming the ultraviolet absorber layer on the plasma-processed surface of the deposited aluminum oxide thin film in (2) of Example 1, a soil-resistant layer of 1 g/m$^2$ (dry state) in coating rate was formed on the outer surface of the 50 μm a thick polyvinyl fluoride film as a base sheet by spreading a photocatalytic composite material containing 10 parts by weight of ultrafine titanium oxide powder of 0.03 μm in particle size and 90 parts by weight of a tetraethoxysilane solution (20% solid content) by a gravure roll coating process.

A solar battery module provided with the front surface protective sheet thus fabricated was fabricated by the same process as that in Example 1.

Example 4

(1) A front surface protecting sheet in accordance with the present invention was fabricated by the same processes as those in (2) of Example 2, except that, after forming the ultraviolet absorber layer on the corona-processed surface of the deposited silicon oxide thin film in (2) of Example 2, a soil-resistant layer of 1 g/m$^2$ (dry state) in coating rate was formed on the outer surface of the 50 μm thick polyvinyl fluoride film as a base sheet by spreading a photocatalytic composite material containing 10 parts by weight of ultrafine titanium oxide powder of 0.03 μm in particle size and 90 parts by weight of a tetraethoxysilane solution (20% solid content) by a gravure roll coating process.

A solar battery module provided with the front surface protective sheet thus fabricated was fabricated by the same process as that in Example 1.

Example 5

A front surface protecting sheet in accordance with the present invention was fabricated by the same processes as those in (2) of Example 1, except that, an ultraviolet absorber layer was formed on a surface of the 50 μm thick polyvinyl fluoride film as a base sheet opposite the surface of the same on which the deposited aluminum oxide thin film was formed by the same process as that in Example 1 in (2) of Example 1 instead of forming the same on the plasma-processed surface of the deposited aluminum oxide thin film, and a soil-resistant layer of 1 g/m$^2$ (dry state) in coating rate was formed on the outer surface of the 50 μm thick polyvinyl fluoride film by spreading a photocatalytic composite material containing 10 parts by weight of ultrafine titanium oxide powder of 0.03 μm in particle size and 90 parts by weight of a tetraethoxysilane solution (20% solid content) by a gravure roll coating process.

A solar battery module provided with the front surface protective sheet thus fabricated was fabricated by the same process as that in Example 1.

Comparative Example 1

(1) A solar battery module was fabricated by superposing a 50 μm thick polyvinyl fluoride film (PVF film) as a base sheet and a 38 μm thick biaxially oriented polyethylene terephthalate film provided with an array of amorphous silicon solar cells with the surface of the 38 μm a thick polyethylene terephthalate film provided with the array of amorphous silicon solar cells facing the front surface protective sheet, and laminating those component layers by using adhesive layers of an acrylic resin.

Comparative Example 2

A solar battery module was fabricated by superposing a 50 μm thick fluorocarbon resin sheet of anethylene-polytetrafluoroethylene copolymer film (ETFE film) as a base sheet, as a front surface protective sheet and a 38 μm thick biaxially oriented polyethylene terephthalate film provided with an array of amorphous silicon solar cells with the surface of the 38 μm a thick polyethylene terephthalate film provided with the array of amorphous silicon solar cells facing the front surface protective sheet, and laminating those component layers by using adhesive layers of an acrylic resin.

Experiments

The protective sheets in Examples 1 to 5 of the present invention and those in Comparative examples 1 and 2 were subjected to total transmittance measurement. The solar battery modules in Examples 1 to 5 and Comparative examples 1 and 2 were subjected to solar battery module evaluation tests.

(1) Total Transmittance Measurement

Total transmittance (%) of each of the protective sheets in Examples 1 to 5 and Comparative examples 1 and 2 against the total transmittance of the base sheet as a reference total transmittance was measured by a color computer.

(2) Solar Battery Module Evaluation Tests

The solar battery modules were subjected to environmental tests in conformity to conditions specified in JIS C8917-1989. Photovoltaic output of the solar battery modules was measured before and after environmental tests.

(3) Moisture Permeability and Oxygen Permeability

The moisture permeabilities of the protective sheets in Examples 1 to 5 and Comparative examples 1 and 2 were measured in an atmosphere of 40° C. and 90% RH by a moisture permeability measuring apparatus (PERMATRAN, MOCON, USA). The oxygen permeabilities of the protective sheets in Examples 1 to 5 and Comparative examples 1 and 2 were measured in an atmosphere of 23° C. and 90% RH by an oxygen permeability measuring apparatus (OXTRAN, MOCON, USA).

Measured data is tabulated in Table 6-1.

TABLE 6-1

|  | Total transmittance (%) | Moisture permeability (g/m$^2$/24 hr) | Oxygen permeability (cc/m$^2$/24 hr/atm) | Output reduction ratio (%) |
| --- | --- | --- | --- | --- |
| Example 1 | 92 | 0.8 | 1.4 | 4 |
| Example 2 | 93 | 0.5 | 1.0 | 2 |
| Example 3 | 90 | 0.8 | 1.4 | 3 |
| Example 4 | 91 | 0.5 | 1.0 | 2 |
| Example 5 | 92 | 0.8 | 1.4 | 4 |
| Comparative Example 1 | 93 | 26.3 | 27.7 | 15 |
| Comparative Example 2 | 95 | 11.2 | ≧500 | 14 |

In table 6-1, moisture permeability is expressed in a unit of g/m$^2$/day·40° C.·100% RH, and oxygen permeability is expressed in a unit of cc/m$^2$/day·23° C.·90% RH.

As obvious from Table 6-1, the protective sheets in Examples 1 to 5 have high total transmittances, respectively, and are excellent in moisture impermeability and oxygen impermeability.

The output reduction ratios of the solar battery modules employing the protective sheets in Examples 1 to 55 were low.

The protective sheets in Comparative examples 1 and 2 had high total transmittances, respectively. However, the moisture impermeabilities and the oxygen impermeabilities of the protective sheets in Comparative examples 1 and 2 were low. Consequently, the output reduction ratios of the solar battery modules employing the protective sheets in Comparative examples 1 and 2 were high.

As apparent from the foregoing description, the present invention takes into consideration the characteristics of a glass sheet that is used as the front surface protective sheet of a solar battery module, photocatalytic powder and an ultraviolet absorber, uses a fluorocarbon resin sheet as a base sheet, fabricates a coated fluorocarbon resin sheet by forming a transparent, vitreous deposited inorganic oxide thin film, such as a silicon oxide thin film or an aluminum oxide thin film, on one of the surfaces of the fluorocarbon resin sheet, and fabricates a protective sheet for a solar battery module by forming a soil-resistant layer of a composite material containing a photocatalytic powder and/or an ultraviolet absorbing layer of a composite material containing an ultraviolet absorber on one of or both the surfaces of the fluorocarbon resin sheet, and forms a solar battery module by using the protective sheet as a front surface protective sheet by superposing the protective sheet as a front surface protective sheet, a filler layer, a film provided with solar cells, i.e., photovoltaic cells, a filler layer and a back surface protective sheet in that order in a superposed structure with the deposited inorganic oxide thin film facing inside, bringing the component layers of the superposed structure into close contact by vacuum and bonding together those component layers by a lamination process using hot pressing. The protective sheet has greatly improved moisture resistance to prevent the permeation of moisture and oxygen through the protective sheet, is excellent in light resistance, heat resistance and water resistance, limits performance degradation due to aging to the least extent, is excellent in protective ability, prevents soiling of its surface by accumulated dust, can be fabricated at a low cost and can be used for the fabrication of a low-cost, safe solar battery module.

The materials mentioned in the description of the first, the second, the third, the fourth and the fifth embodiment are applicable to the sixth embodiment.

Seventh Embodiment

A protective sheet (cover film) in a seventh embodiment according to the present invention is used as the front or the back surface protective sheet of a solar battery module and comprises at least a base film (weather-resistant sheet), an ultraviolet intercepting layer, an infrared intercepting layer or a highly reflective layer formed on the base film.

The protective sheet in the seventh embodiment of the foregoing construction has the following effects.

(1) The protective sheet is a laminated film comprising at least a base film and one or some of an ultraviolet intercepting layer, an infrared intercepting layer and a highly reflective layer. The protective sheet is capable of intercepting some types of light radiation with wavelengths that do not contribute to power generation, such as ultraviolet radiation and infrared radiation to prevent the degradation of solar cells attributable to the effect of those types of light radiation. The use of a laminated film formed by laminating a base film and a highly reflective layer as a back surface protective sheet disposed on the back side of solar cells improves power generating efficiency.

(2) The protective sheet (cover film) for a solar battery module can be produced at a high productivity by forming an ultraviolet intercepting layer, an infrared intercepting layer and a highly reflective layer on a long, wide base film by a continuous coating means or evaporation means.

(3) A glass sheet serving as the front surface protective sheet of a solar battery module can be replaced with the protective sheet (cover film) of the present invention. The protective sheet of the present invention is easy to handle, improves the productivity of a production line for producing solar battery modules, enables the formation of a solar battery module in lightweight construction at a reduced cost.

The ultraviolet intercepting layer is a coating resin film containing dispersed metal oxide particles of a mean particle size in the range of 1 to 1000 nm.

Since the coating resin film containing disperse metal oxide particles is capable of satisfactorily intercepting ultraviolet radiation, the protective sheet (cover film) has a satisfactory ultraviolet intercepting ability.

Accordingly, the ultraviolet degradation of the solar battery can be prevented by covering the solar cells with the protective sheet.

The metal oxide particles are those of $TiO_2$, $ZnO$, $\alpha\text{-}Fe_2O_3$ or $CeO_2$.

Since the coating resin film containing the dispersed metal oxide particles is excellent in ultraviolet intercepting ability and stability, the protective sheet has an excellent ultraviolet intercepting ability.

The ultraviolet degradation of a solar battery can be suppressed for a long period of use by covering the solar cells of the solar battery with the protective sheet.

The infrared intercepting layer is a deposited metal film or a coating resin film containing dispersed metal oxide particles.

Since the deposited metal film or the coating resin film containing the disperse metal oxide particles has a satisfactory infrared intercepting ability, the protective sheet for a solar battery module has a satisfactory infrared intercepting ability.

Accordingly, the infrared degradation (heat degradation) of a solar battery can be prevented by covering the solar cells of the solar battery with the protective sheet (cover film).

The deposited metal film is a deposited film of Al or Ag.

Since the deposited film of Al or Ag is excellent in infrared intercepting ability and long-term stability, the protective sheet has an excellent infrared intercepting ability.

Accordingly, the infrared degradation of a solar battery can be prevented for a long period of use by covering the solar cells of the solar battery with the protective sheet (cover film).

The deposited metal film intercepts visible radiation if the same is excessively thick. Therefore, it is preferable to incorporate the deposited metal film into a protective sheet for use as a back surface protective sheet.

The metal oxide particles are those of $SnO_2$ capable of efficiently absorbing infrared radiation.

Since the coating resin film containing dispersed $SnO_2$ particles is capable of efficiently intercepting infrared radiation and excellent in long-term stability, the protective sheet including the coating resin film containing dispersed $Sno_2$ particles has an excellent infrared intercepting ability.

Accordingly, the infrared degradation of a solar battery can be prevented for a long period of use by covering the solar cells of the solar battery with the protective sheet (cover film).

The highly reflective layer is a deposited Ag or Al film or a resin film containing a dispersed white pigment.

The resin film containing the dispersed white pigment may be a white film formed by spreading a mixture of a weather-resistant resin, such as a fluorocarbon resin or a highly weather-resistant polyethylene terephthalate resin, and a white pigment or a weather-resistant film formed by coating a weather-resistant film, such as a fluorocarbon resin film or a highly weather-resistant biaxially oriented polyethylene terephthalate film (hereinafter referred to as "PET film"), with a white resin film formed by applying a liquid resin containing a dispersed white pigment in a film to the weather-resistant film and drying the film.

Since the deposited Ag or Al film or the resin film containing the dispersed white pigment is highly reflective, the protective sheet has a high light reflecting ability.

Accordingly, a solar battery module provided with the protective sheet bonded to the back surface of a photovoltaic layer provided with solar cells reflects part of incident light fallen on the front surface of the solar battery module and penetrated the solar cells toward the solar cells, which improves the power generating efficiency of the solar battery module.

A protective sheet fabricating method in accordance with the present invention fabricates a protective sheet for a solar battery module. The protective sheet comprises a laminated film at least comprising a weather-resistant sheet (base film) and an ultraviolet intercepting layer formed on the base film. The ultraviolet intercepting layer is formed by applying a liquid resin containing dispersed $TiO_2$ or $CeO_2$ particles having a mean particle size in the range of 1 to 1000 nm in a film to the base film and drying the film.

The protective sheet (cover film) for a solar battery module provided with an ultraviolet intercepting layer can be produced at a high productivity and low cost by forming an ultraviolet intercepting layer on a long, wide base film moving at a high moving speed on a continuous coating means.

A protective sheet fabricating method in accordance with the present invention may form a coating primer layer on a surface of the base film on which the liquid resin containing dispersed $TiO_2$ or $CeO_2$ particles is to be applied.

Thus, the base film of the protective sheet and the coating resin film containing dispersed $TiO_2$ or $CeO_2$ particles can firmly bonded together.

Even if a solar battery module provided with the protective sheet in accordance with the present invention is used under severe outdoor conditions, the ultraviolet intercepting layer will not come off the base film and solar battery module has improved stability.

A protective sheet fabricating method in accordance with the present invention fabricates a protective sheet for a solar battery module. The protective sheet comprises a laminated film at least comprising a weather-resistant sheet (base film) and an infrared intercepting layer formed on the base film. The infrared intercepting layer is a deposited metal film deposited on the base film or a coating resin film formed by applying a liquid resin containing dispersed metal oxide particles in a film to the base film and drying the film.

The protective sheet (cover film) for a solar battery module provided with an infrared intercepting layer can be produced at a high productivity and low cost by forming an infrared intercepting layer on a long, wide base film moving at a high moving speed on a continuous deposition or coating means.

A solar battery module in accordance with the present invention is provided with the protective sheet bonded to the front surface of a layer provided with solar cells by a heat-adhesive filler layer.

The heat-adhesive filer layer may be formed of a heat-adhesive resin containing as a principal component, for example, an ethylene-vinyl acetate copolymer, a polyolefin resin, a polyvinyl butyral resin or a silicone resin.

The solar cells can be embedded in the heat-adhesive filler layer in a stable state, and can be sandwiched between the protective sheet excellent in ultraviolet intercepting ability, infrared intercepting ability and light reflecting ability. Consequently, ultraviolet and infrared radiation which does not contribute to power generation can be intercepted, the highly reflective layer disposed behind the solar cells improves power generating efficiency, and the solar battery module is excellent in durability and generates power at a high power generating efficiency.

Protective sheets (cover films) in the seventh embodiment for a solar battery module and solar battery modules employing the protective sheets will be described with reference to the accompanying drawings.

The present invention is not limited in its practical application to those shown in the drawings.

FIGS. 30 to 33 are typical sectional views of examples of protective sheets in the seventh embodiment for solar battery modules.

Figure 30:
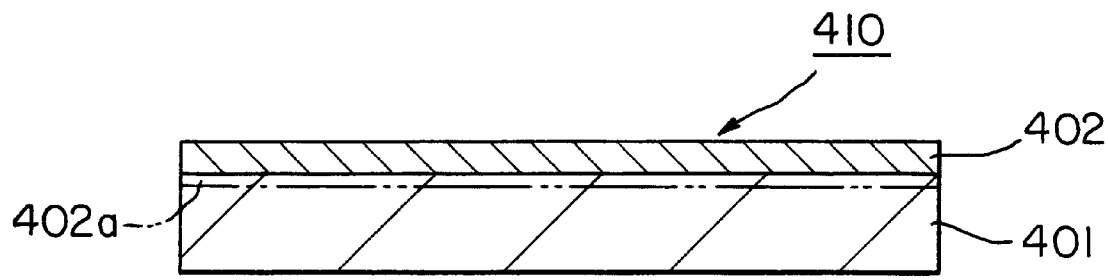
FIG. 30 is a typical sectional view of a protective sheet in Example 1 in a seventh embodiment according to the present invention for a solar battery module.

Referring to FIG. 30, a protective sheet 410 in a first example of the seventh embodiment of the present invention for a solar battery module comprises at least a base film 401 (weather-resistant sheet) 401 and an ultraviolet intercepting layer 402 formed on one of the surfaces of the base film 401.

Preferably, the base film 401 is a durable film excellent in weather resistance, strength and resistances to detrimental effects, such as a polyvinyl fluoride film (hereinafter referred to as "PVF film"), a fluorocarbon resin film, such as an ethylene-tetrafluoroethylene copolymer film (hereinafter referred to as "ETFE film"), a highly weather-resistant biaxially oriented polyethylene terephthalate film (hereinafter referred to as "weather-resistant PET film"), a polycarbonate film or a polyacrylate film.

The ultraviolet intercepting layer 402 may be a coating resin film containing dispersed metal oxide particles having a mean particle size in the range of 1 to 1000 n m. Preferable metal oxide particles are particles of $TiO_2$, ZnO, $\alpha$-$Fe_2O_3$ or $CeO_2$. $TiO_2$ or $CeO_2$ particles are particularly preferable.

Particles of one of those metal oxides or a mixture of some of those metal oxides may be used.

An acrylic resin or a silicone resin may be used as a binder for holding the particles together. An additive, such as a crosslinking agent or a silane coupling agent may be added to the resin to enhance the weather resistance of the resin.

A primer layer 402a of a polyisocyanate primer or a polyacryamine primer may be formed on a surface of the base film 401 on which the ultraviolet intercepting layer 402 is to be formed to enhance adhesion between the base film 401 and the ultraviolet intercepting layer 402 before forming the ultraviolet intercepting layer 402 on the base film by a coating process.

The protective film 401 intercepts ultraviolet radiation and transmits visible radiation. In most cases, the protective sheet is used as a front surface protective sheet to be disposed on the light receiving side of a solar battery module.

Figure 31:
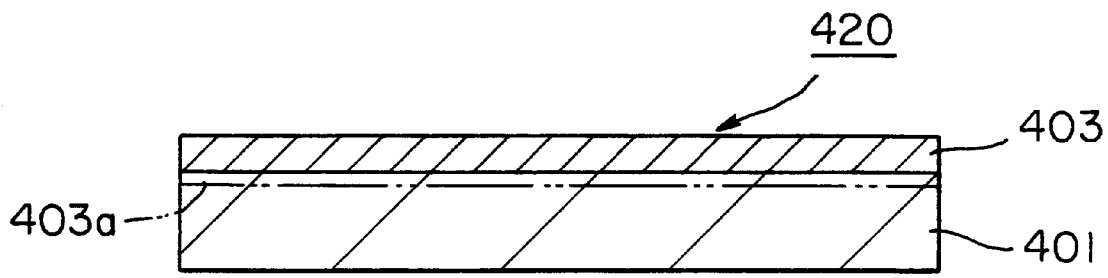
FIG. 31 is a typical sectional view of a protective sheet in Example 2 in a seventh embodiment according to the present invention for a solar battery module.

Referring to FIG. 31, a protective sheet 420 in a second example of the seventh embodiment of the present invention for a solar battery module comprises at least a base film 401 and an infrared intercepting layer 403 formed on a surface of the base film 401.

When necessary, a primer layer 403a may be sandwiched between the base film 401 and the infrared intercepting layer 403 to enhance adhesion between the base film 401 and the infrared intercepting layer 403.

The base film 401 may be formed of the same material as the base film 401 of the example shown in FIG. 30. The infrared intercepting layer 403 may be a coating resin layer containing dispersed metal oxide particles, such as $SnO_2$ particles.

The same resin as that used for forming the ultraviolet intercepting layer may be used as a binder for holding the metal oxide particles.

It is preferable that the infrared intercepting layer 403 contains metal oxide particles, such as $SnO_2$ particles when the protective sheet 420 is used as the front surface protective sheet of a solar battery module. It is preferable that the infrared intercepting layer 403 is a deposited Al or Ag film when the protective sheet 420 is used as the back surface protective sheet of a solar battery module.

Figure 32:
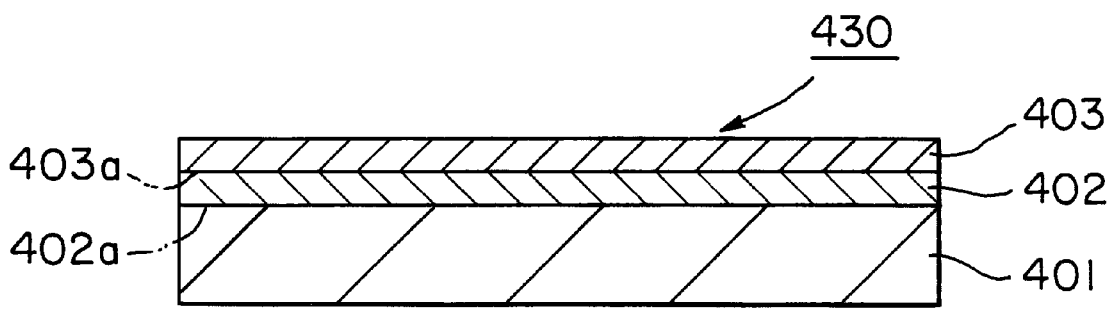
FIG. 32 is a typical sectional view of a protective sheet in Example 3 in a seventh embodiment according to the present invention for a solar battery module.

Referring to FIG. 32, a protective sheet 430 in a third example of the seventh embodiment of the present invention for a solar battery module comprises at least a base film 401, an ultraviolet intercepting layer 402 formed on the base film 401, and an infrared intercepting layer 403 formed on the ultraviolet intercepting layer 402.

When necessary, a primer layer 402a may be sandwiched between the base film 401 and the ultraviolet intercepting layer 402, and a primer layer 403a may be sandwiched between the ultraviolet intercepting layer 402 and the infrared intercepting layer 403 to enhance adhesion between the contiguous layers. When the infrared intercepting layer 403 is a deposited metal film, a primer for deposited metal film may be used.

Materials forming the base film 401, the ultraviolet intercepting layer 402 and the infrared intercepting layer 403 may be those of the examples shown in FIGS. 30 and 31 and hence the further description thereof will be omitted.

When the infrared intercepting layer 403 is a coating resin layer containing dispersed metal oxide particles, such as $SnO_2$ particles, the protective sheet 430 intercepts ultraviolet radiation and infrared radiation and transmits visible radiation. Therefore, the protective sheet 430 is suitable for use as a front surface protective sheet. The protective sheet 430 intercepts visible radiation as well as ultraviolet radiation and infrared radiation when the infrared intercepting layer 403 is a deposited metal film. Therefore, the protective sheet is suitable for use as a back surface protective sheet.

Figure 33:
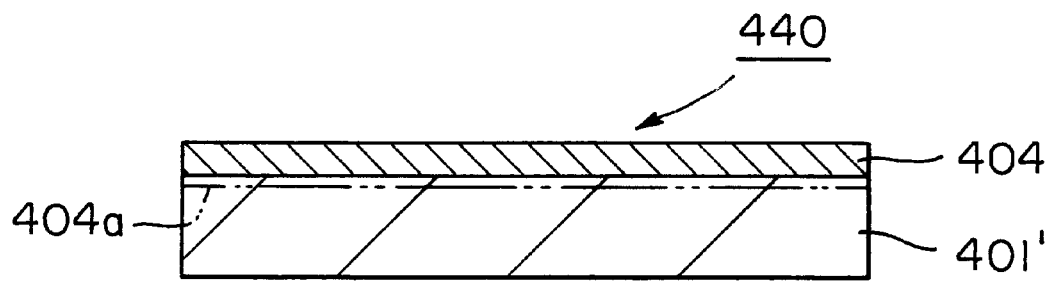
FIG. 33 is a typical sectional view of a protective sheet in Example 4 in a seventh embodiment according to the present invention for a solar battery module.

Referring to FIG. 33, a protective sheet 440 in a fourth example of the seventh embodiment of the present invention for a solar battery module comprises at least a base film 401' and a highly reflective layer 404 formed on the base film 401'.

When necessary, a primer layer may be sandwiched between the base film 401' and the highly reflective layer 404 to enhance adhesion between the base film 401' and the highly reflective layer 404.

The base film 401' may be the same as the base films 401 of the protective sheet shown in FIGS. 30 to 32. A highly reflective deposited Ag or Al film or a resin film containing dispersed white pigment is particularly suitable for use as the highly reflective layer 404.

The protective sheet 440 thus constructed is used as the back surface protective sheet of a solar battery module. Part of incident light fallen on the front surface of the solar battery module and penetrated the solar cells is reflected toward the solar cells, which improves the power generating efficiency of the solar battery module.

When necessary, each of the protective sheets shown in FIGS. 30 to 34 for solar battery modules may additionally be provided with, for example, a deposited inorganic oxide film, such as an aluminum oxide film or a silicon oxide film (SiOx film), or each of the layers formed on the base films may be coated with a protective layer.

Generally, a filler layer is interposed between the front surface of a photovoltaic layer provided with solar cells and the protective sheet when bonding the protective sheet to the photovoltaic layer. If adhesion between the protective sheet and the filler layer is not high enough, an adhesive layer may be formed on a surface of the protective sheet to be bonded to the photovoltaic layer.

Figure 34:
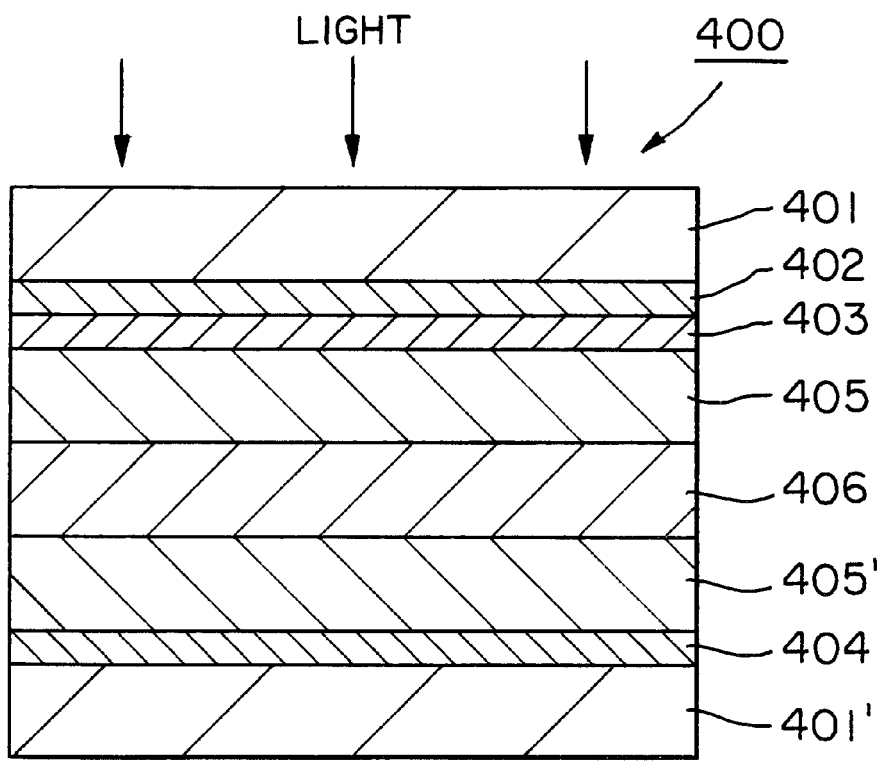
FIG. 34 is a typical sectional view of a solar battery module embodying the present invention.

Referring to FIG. 34 showing a solar battery module in a typical sectional view, protective sheets in accordance with the present invention are bonded to the front and the back surface of a photovoltaic layer provided with solar cells.

A solar battery module 400 shown in FIG. 34 is formed by superposing, from the front side toward the back side, a base film 401, an ultraviolet intercepting layer 402, an infrared intercepting layer 403, a filler layer 405, a photovoltaic layer 406 provided with solar cells, a filler layer 405', a highly reflective layer 404 and a base film 401', and laminating those component layers.

The photovoltaic layer 406 is sandwiched between the filler layers 405 and 405', a protective sheet comprising the base film 401, the ultraviolet intercepting layer 402 and the infrared intercepting layer 403 is bonded to the front surface of the photovoltaic layer 406, and a protective sheet comprising the base film 401' and the highly reflective sheet 404 is bonded to the back surface of the photovoltaic layer 406.

Therefore, ultraviolet radiation and infrared radiation that do not contribute to power generation and promotes the degradation of solar cells are intercepted by the protective sheet and, consequently, the degradation of the solar cells is prevented and the durability of the solar battery module is improved.

Visible radiation that contributes to power generation travels through the front protective sheet and falls on the solar cells to cause the solar cells to generate power. Part of visible radiation penetrated the photovoltaic layer 406 is reflected by the highly reflective layer 404 so as to fall again on the solar cells, so that visible radiation is used effectively for power generation and the efficiency of photoelectric conversion is improved.

EXAMPLES

Examples of the seventh embodiment will be described hereinafter.

Example 1

A front surface protective sheet for a solar battery module comprises a 70 μm thick highly weather-resistant PET film, and an infrared intercepting layer of an acrylic resin containing dispersed $SnO_2$ particles formed on one surface of the PET film. A back surface protective sheet is a laminated film formed by superposing a 38 μm thick PVF film, a 50 μm thick aluminum foil and a 38 μm thick PVF film in that order and laminating those component layers by a dry lamination process. A solar battery module in Example 1 was fabricated by bonding the front surface protective sheet and the back surface protective sheet to the front and the back surface, respectively, of a photovoltaic layer provided with an array of crystal silicon solar cells with 500 μm thick ethylene-vinyl acetate copolymer films, i.e., heat-adhesive filler layers, by a vacuum lamination process.

Example 2

A solar battery module in Example 2 was fabricated by using the same components as those of the solar battery module in Example 1 by the same processes as in Example 1, except that a front surface protective sheet comprising a 70 μm thick highly weather-resistant PET film, an ultraviolet intercepting layer of an acrylic resin containing dispersed $TiO_2$ particles having a mean particle size of 10 nm formed on the PET film, and an infrared intercepting layer of an acrylic resin containing dispersed $SnO_2$ particles was used instead of the front surface protective sheet of Example 1.

Example 3

A solar battery module in Example 3 was fabricated by using the same components as those of the solar battery module in Example 1 by the same processes as in Example 1, except that a front surface protective sheet comprising a 70 μm thick highly weather-resistant PET film and an ultraviolet intercepting layer of an acrylic resin containing dispersed $TiO_2$ particles having a mean particle size of 10 nm formed on the PET film was used instead of the front surface protective sheet of Example 1.

Example 4

A solar battery module in Example 4 was fabricated by using the same components as those of the solar battery module in Example 1 by the same processes as in Example 1, except that a front surface protective sheet similar to that in Example 2 and comprising a 70 μm thick highly weather-resistant PET film, an ultraviolet intercepting layer of an acrylic resin containing dispersed $TiO_2$ particles having a mean particle size of 10 nm. formed on the PET film, and an infrared intercepting layer of an acrylic resin containing dispersed $SnO_2$ particles formed on the ultraviolet intercepting layer was used instead of the front surface protective sheet of Example 1, and a back surface protective sheet comprising a 70 μm thick highly weather-resistant PET film, and a back surface protective sheet comprising a 70 μm thick highly weather-resistant PET film and an 800 Å thick deposited Al film formed as a highly reflective layer on the PET film was used instead of the back surface protective sheet of Example 1.

Comparative Example 1

A solar battery module in Comparative example 1 was fabricated by using the same components as those of the solar battery module in Example 1 by the same processes as in Example 1, except that a 70 μm thick highly weather-resistant PET film not provided with any infrared intercepting layer was used as a front surface protective sheet.

Evaluation of Solar Battery Modules in Examples 1 to 4 and Comparative Example 1

The solar battery modules in Examples 1 to 4 and Comparative example 1 were subjected to tests to evaluate their performance and long-term reliability, in which photoelectric conversion efficiency η (%) and fill factor (FF) were measured in an initial state and in a state after irradiation with 1 sun, for 2000 hr. Measured data is tabulated in Table 7-1.

TABLE 7-1

| | Characteristic of solar battery | | | |
|---|---|---|---|---|
| | Initial state | | State after exposure to 1 sun, 2000 hr | |
| | Conversion efficiency η (%) | FF | Conversion efficiency η (%) | FF |
| Example 1 | 10.5 | 0.65 | 10.2 | 0.60 |
| Example 2 | 10.4 | 0.63 | 10.1 | 0.59 |
| Example 3 | 10.5 | 0.66 | 10.3 | 0.60 |
| Example 4 | 11.5 | 0.70 | 10.8 | 0.65 |
| Comparative Example 4 | 10.4 | 0.62 | 9.5 | 0.58 |

As obvious from the measured data shown in Tables 7-1, the solar battery modules in Examples 1 to 4 have conversion efficiencies not smaller than 10% in an initial state and in a state after exposure to sunlight for 2000 hr, and the initial conversion efficiencies of the solar battery modules in Examples 1 to 4 were not reduced significantly by sunlight irradiation. The conversion efficiency of the solar battery module in Comparative example 1 was reduced to 9.5% by sunlight irradiation, and the conversion efficiency reduction ratio was large.

As is apparent from the foregoing description, the solar battery modules of the present invention are excellent in performance and long-term reliability. The protective sheet of the present invention and the solar battery module provided with the same protective sheet can be fabricated easily at a high productivity and are economically advantageous.

The materials mentioned in the description of the first to the sixth embodiment are applicable to the seventh embodiment.

Eighth Embodiment

Basic Construction

A protective sheet (film) in an eighth embodiment according to the present invention is intended for use as a front surface protective sheet of a solar battery module for covering the front surface of a photovoltaic layer provided with solar cells. The protective sheet is a single weather-resistant sheet (base film) or is a laminated sheet comprising a plurality of layers including a base film and at least one light confining layer.

The protective sheet (protective film) for a solar battery module can effectively be used as a substrate for the photovoltaic layer. The material and thickness of the base film are determined properly according to the use of the protective sheet. A film meeting requirements for strength, heat resistance, weather resistance, transparency and the like is used as the base film.

The protective sheet in accordance with the present invention for a solar battery module has a function to confine light and hence light fallen on the solar cells can repeatedly be used, which enhances power generating efficiency.

A protective sheet (film) in accordance with the present invention is intended for use as a front surface protective sheet of a solar battery module for covering the front surface of a photovoltaic layer provided with solar cells. The protective sheet is a single weather-resistant sheet (base film) or is a laminated sheet comprising a plurality of layers including a base film, at least one light confining layer, and an adhesive layer for bonding the protective sheet to a photovoltaic layer provided with solar cells.

A protective sheet of such laminated construction having a base film, a light confining layer and the adhesive layer for bonding the protective sheet to a surface of a photovoltaic layer is suitable particularly for use as a protective sheet for a solar battery module.

When the protective sheet for a solar battery module is thus constructed, it is not necessary to sandwich an adhesive film provided with a soft, sticky adhesive layer and difficult to handle between the protective sheet and the photovoltaic layer provided with solar cells. The adhesive layer need not be formed in a great thickness to facilitate handling the protective sheet and may be formed in the least necessary thickness. The protective sheet simplifies laminating process and improves productivity.

When the light confining layer is formed on the adhesive layer, i.e., when the light confining layer is the innermost layer of the protective sheet to be brought into contact with the photovoltaic layer, a peripheral portion of the light confining layer is removed so that a peripheral portion of the adhesive layer is exposed, and the protective sheet can be bonded to the photovoltaic layer with the exposed peripheral portion of the adhesive layer.

According to the present invention, the light confining layer has an irregular surface comprising regularly arranged projections. The height of the projections or depth of recesses between the projections is in the range of 0.1 nm to 500 μm.

Preferably, the irregular surface of the light confining layer is formed by arranging ridges or furrows of a triangular, trapezoidal or semicircular cross section having inclined surfaces, projections or recesses having the shape of a pyramid, a frustum, a hemisphere, a round projection or the like. An irregular surface formed by arranging pyramidal projections or recesses having intersecting surfaces forming an angle (apex angle) of 90° is particularly preferable.

Preferably, the height or depth of the irregularities is in the range of 0.1 nm to 500 µm. When the height or depth of the irregularities is less than 0.1 nm or greater than 500 µm, the effect of the light confining layer to confine light thereto by refracting and reflecting light is not high enough.

The appropriate range of the height or depth of the irregularities is dependent on the type of the solar battery module. For example, a suitable range of the height or depth of the irregularities is 0. 1 nm to 500 nm when thin-film solar cells, such as amorphous silicon solar cells, are employed, and is 1 to 500 µm when thick solar cells, such as single-crystal silicon solar cells, are employed.

A light confining layer meeting such conditions has a further effective light confining function.

According to the present invention, a light confining layer may have an irregular surface having large irregularities of a height or depth in the range of 1 to 500 µm, and small irregularities of a height or depth in the range of 0.1 to 500 nm formed on the large irregularities.

This light confining layer is capable of further effectively confining light fallen on the solar cells by effectively refracting and reflecting the incident light.

At least the base film of the protective sheet for a solar battery module is a weather-resistant film.

Thus, the protective sheet has an improved weather resistance. When the protective sheet is bonded to the front surface of the photovoltaic layer provided with the solar cells, the power generating performance of the solar cells is improved, the solar cells can safely be protected for a long period of use, and the solar battery module has excellent long-term reliability.

The component layers of the protective sheet for a solar battery module may include a gas-barrier layer.

The protective sheet of the present invention is used, in most cases, as a front surface protective sheet for covering the light receifing surface of a photovoltaic layer provided with solar cells. Therefore, it is preferable that the gas-barrier layer has a high transmittance particularly to visible radiation. Preferable layers for use as the gas-barrier layer are deposited layers of, for example, silicon oxide ($SiO_x$), silicon nitride ($SiN_x$), aluminum oxide ($Al_xO_y$) and the like, or inorganic-organic hybrid layers.

The gas-barrier layer improves the gas impermeability, i.e., impermeability to moisture, oxygen and the like, of the protective sheet.

Those gas-barrier layers may be used individually or in combination in a composite layer.

The gas-barrier layer improves the impermeability to moisture, oxygen and the like of the protective sheet, and the protective sheet is suitable for use in combination with polycrystalline or microcrystalline silicon thin-film solar cells subject to degradation by moisture or oxygen or tandem solar cells comprising, in combination, polycrystalline or microcrystalline silicon thin-film solar cells, and amorphous silicon, amorphous silicon-germanium or copper-selenium solar cells.

According to the present invention, the protective sheet for a solar battery module is placed on at least one of the surfaces of a photovoltaic layer provided with solar cells.

Since the protective sheet in accordance with the present invention is excellent, as mentioned above, in strength, heat resistance, weather resistance, transparency and gas impermeability and has a light confining function, the incident light can effectively used for power generation, and the solar battery module employing the protective sheet of the present invention is excellent in long-term reliability and is capable of efficiently generating power.

The use of the protective sheet provided with the adhesive layer simplifies the solar battery module fabricating process, and enables the fabrication of a solar battery module excellent in long-term reliability, performance and productivity.

Materials for fabricating protective sheet (protective film) in accordance with the present invention for solar battery modules and protective sheet fabricating methods will be described hereinafter.

Preferably, a weather-resistant sheet (base film) for a protective sheet in accordance with the present invention for a solar battery module is excellent in strength, heat resistance and transparency (transmittance to visible radiation) as well as in weather resistance. Possible films as the base film are, for example, fluorocarbon resins films, such as polyvinyl fluoride films (PVF films) and ethylene-tetrafluoroethylene copolymer films (ETFE films), polycarbonate films, polyethersulfone films, polysulfone films, polyacrylonitrile films, acrylic resin films, cellulose acetate films, glass-fiber-reinforced polycarbonate films, weather-resistant polyethylene terephthalate films and weather-resistant polypropylene films.

Those films may be used either individually or in combination in composite films.

Preferably, the gas-barrier layer formed of a gas-barrier material is transparent, heat-resistant and weather-resistant as well as excellent in impermeability. From this point of view, suitable gas-barrier layers are deposited films of one of silicon oxide ($SiO_x$), silicon nitride ($SiN_x$), tin oxide ($SnO_x$) and aluminum oxide ($Al_xO_y$), deposited films each of a mixture of some of those metal oxides, or composite films each of some of those metal oxides.

The deposited silicon oxide films ($SiO_x$ films), silicon nitride films ($SiN_x$ films), tin oxide films ($SnO_x$ films and aluminum oxide films ($Al_xO_y$ films can easily be formed by a CVD process, a PE-CVD (plasma-enhanced CVD) process, a PVD process and a sputtering process, respectively, on a base film. The PE-CVD process is particularly preferable because the same is capable of depositing a dense, transparent deposited film at a low temperature.

A suitable thickness of the deposited film is in the range of 50 to 5000 Å, preferably, in the range of 300 to 1500 Å.

The inorganic-organic hybrid coating layer may be formed of, for example, tetraethoxysilane and an ethylene-vinyl alcohol copolymer. Coating liquids of those materials are prepared, and the coating liquids are applied to the base film in films by a gravure roll coating process or the like and hot-drying the films.

Preferably, the inorganic-organic hybrid coating layer is formed in a coating rate (dry state) in the range of 0.5 to 8 g/m², more preferably, in the range of 1 to 5 g/m².

The inorganic-organic hybrid coating layer is excellent in gas impermeability and may be used individually. The inorganic-organic hybrid coating layer may be formed on a deposited inorganic oxide film to enhance the gas impermeability of the deposited inorganic oxide film.

An adhesive layer to be formed beforehand on a protective sheet to bond the protective sheet to a photovoltaic layer provided with solar cells may be formed of any one of ethylene copolymers including ethylene-vinyl acetate copolymers, ethylene-acrylate copolymers and ethylene-α-olefin copolymers, linear low-density polyethylene resins (L.LDPE), ionomers, polyvinyl butyral resins, silicone resins, and elastomers including polystyrene resins, polyolefine resins, polydiene resins, polyester resins, polyurethane resins, fluorocarbon resins and polyamide resins.

The ethylene copolymers may be modified ethylene copolymers produced through the modification of ethylene copolymers by graft copolymerization.

There is not particular restrictions on the thickness of the adhesive layer. The adhesive layer maybe formed in a suitable thickness according to the type and shape of the photovoltaic layer provided with solar cells to which the protective sheet is to be bonded.

The material for forming the adhesive layer may be prepared in, for example, a solution or a dispersion according to the material and the thickness of the adhesive layer to be formed, and the adhesive layer may be formed on a surface of the base film by a suitable means, such as a coating process, an extrusion coating process, a calender coating process, a hot lamination process or a dry lamination process.

Figure 37:
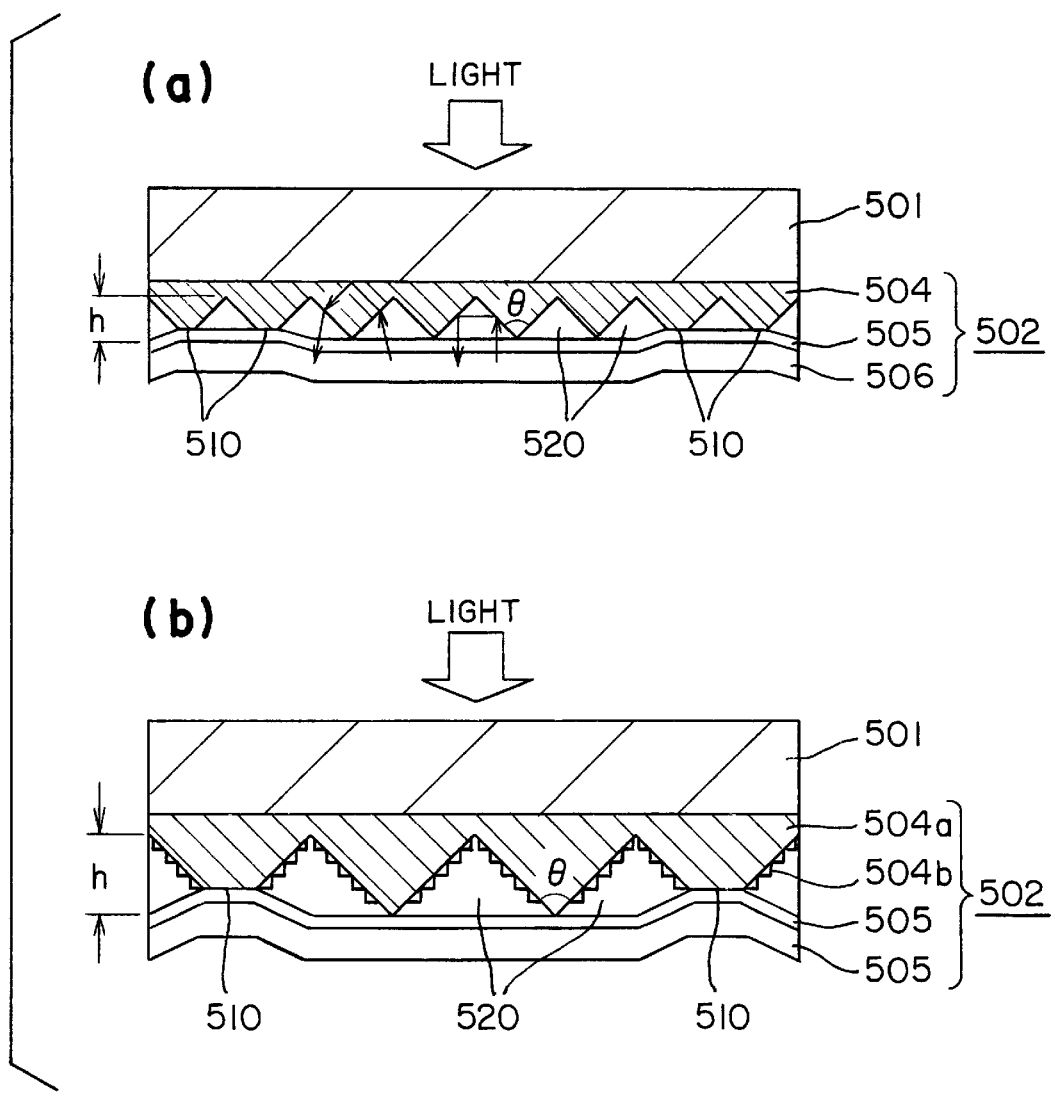
FIGS. 37(a) and 37(b) are typical sectional views of a light confining layer included in a protective sheet for a solar battery module.

The light confining layer may be formed, for example, in a shape as shown in FIG. 37(a) or 37(b).

FIGS. 37(a) and 37(b) are typical sectional views of light confining layers for protective sheets in accordance with the present invention for solar battery modules. As shown in FIG. 37(a), a light confining layer 502 comprises a transparent irregular structure 504 formed on one surface (lower surface as viewed in FIG. 37(a)) of a base film 501, and a support film 506 provided with an adhesive layer 505, superposed on the irregular structure 504 with adhesive layer 505 facing the irregular structure 504 and bonded to the irregular structure 504 at bonding spots 510 arranged at predetermined intervals.

Light scattered outward as indicated by the arrows is reflected and refracted so as to fall again on solar cells.

The base film may be provided with a single light confining layer similar to the light confining layer 502 as shown in FIG. 37(a), two light confining layers may be formed on the opposite surface, respectively, of the base film or two light confining layers may be formed on one of surfaces of the base film for satisfactory light confining effect.

FIG. 37(b) shows a light confining layer 502 similar to that shown in FIG. 37(a), except that the light confining layer 502 shown in FIG. 37(b) has a transparent, composite irregular structure 504 consisting of a large irregular structure 504 a and a small irregular structure 504 b formed on the surface of the large irregular structure 504 a instead of the irregular structure 504 shown in FIG. 37(a).

As mentioned above, it is preferable that each of the irregular structures 504, 504a and 504b is formed by arranging ridges or furrows of a triangular, trapezoidal or semicircular cross section, projections or recesses having the shape of a pyramid, a frustum, a hemisphere, a round projection or the like. An irregular structure formed by arranging pyramidal projections or recesses having intersecting surfaces forming an angle (apex angle) of 90° is particularly preferable.

Preferably, the height or depth of the irregularities is in the range of 0.1 nm to 500 µm.

When the irregularities of the irregular structure has a relatively great height or depth in the range of 0.1 µm to 500 µm, the irregular structure can be formed, for example, by heating and softening a thermoplastic resin layer formed on the base film, pressing an embossing die against the softened thermoplastic resin layer and cooling the embossed thermoplastic resin layer. Such an irregular structure can be formed also by applying an ionizing radiation curable resin, such as an ultraviolet curable resin, in a resin film to the base film pressing a separable die or a separable embossing sheet against the film of the ionizing radiation curable resin, curing the resin film and separating the separable die or the separable embossing sheet from the resin film.

When the irregularities of the irregular structure has a relatively small height or depth in the range of 0.1 nm to 0.1 µm, the irregular structure can be formed, for example, by forming a transparent ZnO ore $SnO_2$ thin film by a CVD process with etching action or by forming a specular thin film by a CVD process and forming minute irregularities in the specular thin film by sputtering.

A transparent SiOx thin film formed by a CVD or a PE-CVD process has an irregular structure having minute projections. The transparent $SiO_x$ thin film serves also as a gas-barrier layer.

The irregular structure of each of the light confining layers 502 shown in FIGS. 37(a) and 37(b) has an air layer to enhance light reflecting and refracting effect. A transparent material, such as a transparent resin, having a refractive index different from that of the material forming the irregular structure or a resin containing dispersed particles of a transparent material, such as $TiO_2$ or $SiO_x$, having a refractive index different from that of the material forming the irregular structure may be filled in furrows or recesses in the irregular structure to enhance the light reflecting and refracting effect of the light confining layer.

When the irregular structure is formed of a resin, a material having a large refractive index in the range of 1.8 to 2.2 or a material having a small refractive index in the range of 1.1 to 1.3 is suitable as the transparent material having a refractive index different from that of the material forming the irregular structure.

When the irregular structure is formed of a resin, a transparent thin film having a refractive index different from that of the material forming the irregular structure, such as a film of $SiO_x$, ZnS, $TiO_2$ or $Sb_2O_3$, may be formed on the surfaces defining the irregularities of the irregular structure by a deposition means. The transparent thin film improves the reflection efficiency of the surface of the irregularities to ensure satisfactory light confining effect.

EXAMPLES

Examples of the eighth embodiment will be explained with reference to the accompanying drawings. The present invention is not limited in its practical application to examples shown in the drawings.

A protective sheet (film) in accordance with the present invention for a solar battery module is intended to be used as a front protective sheet to be bonded to the front surface of a photovoltaic layer 507 provided with solar cells. The protective sheet is a single weather-resistant sheet (base film) provided with a light confining layer or a laminated sheet comprising a plurality of layers including a base film and a light confining layer. FIGS. 35(a) to 35(e) show protective sheets in accordance with the present invention by way of example.

FIGS. 35(a) to 35(e) are typical sectional views of protective sheets (protective films) in accordance with the present invention for solar battery modules. The protective sheet shown in FIG. 35(a) comprises a base film (weather-resistant sheet) 501 and a light confining layer 502a formed on the outer surface of the base film 501, i.e. a surface on the light receiving side of the base film 501. The protective sheet shown in FIG. 35(b) comprises a base film (weather-resistant sheet) 501 and a light confining layer 502a formed on the inner surface of the base film 501, i.e., a surface to be laminated to a photovoltaic layer 507 provided with solar cells.

Figure 35:
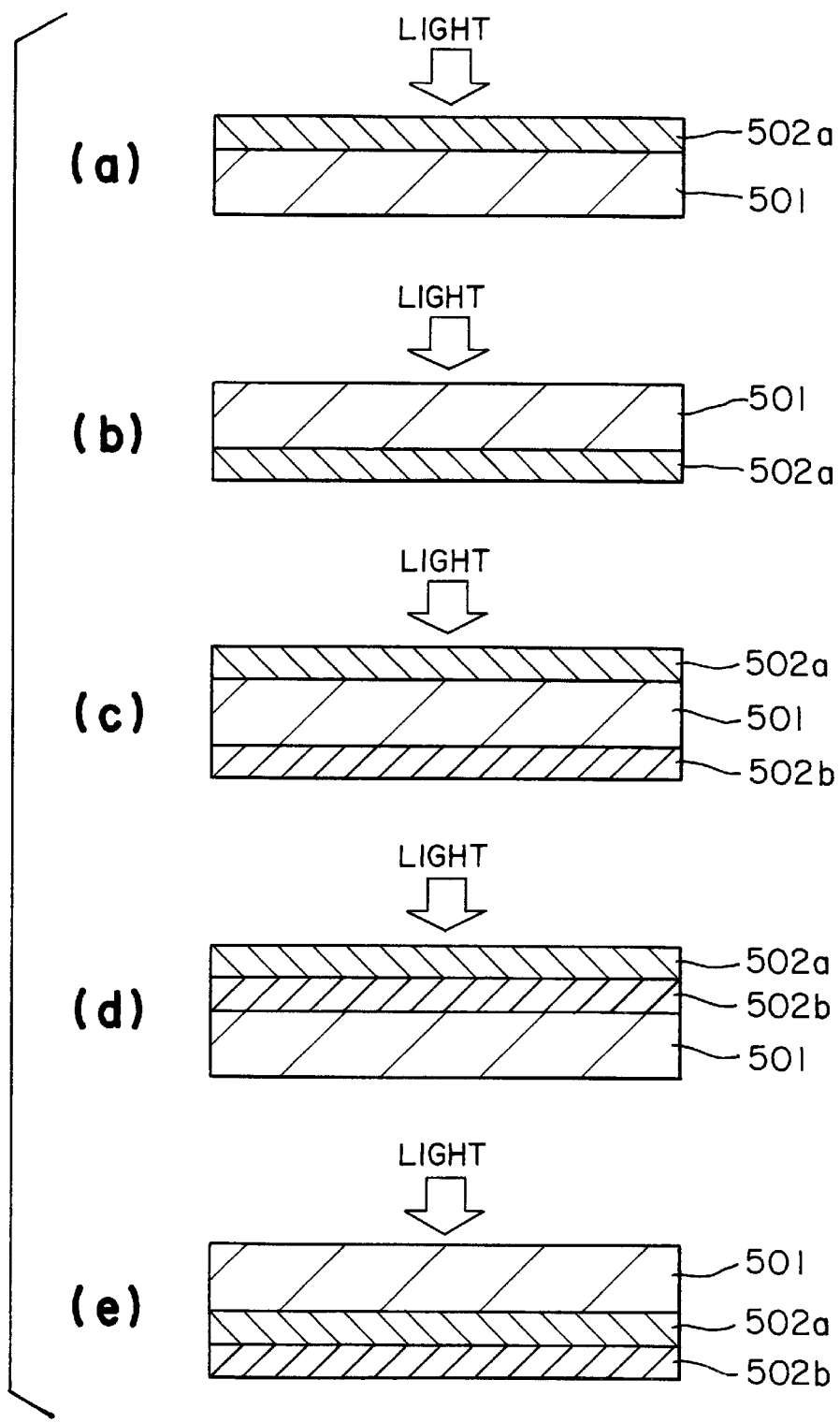
FIGS. 35(a) to 35(e) are typical sectional views of assistance in explaining a process of fabricating a protective sheet in an eighth embodiment according to the present invention for a solar battery module.

The protective sheet shown in FIG. 35(c) comprises a base film (weather-resistant sheet) 501, a light confining layer 502a formed on the outer surface of the base film 501, and a light confining layer 502b formed on the inner surface of the base film 501.

The protective sheets shown in FIG. 35(d) comprises a base film 501, a light confining layer 502b formed on the outer surface of the base film 501, and a light confining layer 502a formed on the outer surface of the light confining layer 502b. The protective sheets shown in FIG. 35(e) comprises a base film 501, a light confining layer 502a formed on the inner surface of the base film 501, and a light confining layer 502b formed on the surface of the light confining layer 502a.

When necessary, a gas-barrier layer may be formed on any one of the component layers of the protective sheet, preferably, an inner layer. When a layer other than the base film, such as the light confining layer, is the outermost layer, a protective layer may be formed on the surface of the outermost layer by a film lamination process or resin coating process.

As mentioned above, the protective sheet thus formed is excellent in strength, heat resistance, weather resistance, transparency and gas impermeability, and is capable of making incident light fall repeatedly on the solar cells and of improving power generating efficiency.

The protective sheet and a photovoltaic layer provided with solar cells can be laminated by sandwiching a resin film for forming an adhesive layer between the protective sheet and the front surface of the photovoltaic layer and laminating those component layers by a lamination process, in which those component layers are bonded together by hot pressing.

A protective sheet in accordance with the present invention for a solar battery module is intended to be used as a front protective sheet to be bonded to the front surface of a photovoltaic layer 507 provided with solar cells. The protective sheet is a laminated film comprising a base film, an adhesive layer for bonding the protective sheet to a photovoltaic layer provided with solar cells, and a light confining layer or the protective sheet is a laminated film comprising a plurality of layers including a base film, an adhesive layer for bonding the protective sheet to a photovoltaic layer provided with solar cells, and a light confining layer. FIGS. 36(a) to 36(e) show protective sheets in accordance with the present invention by way of example.

FIGS. 36(a) to 36(e) are typical sectional views of protective sheets (protective films) in accordance with the present invention for solar battery modules. The protective sheet (protective film) shown in FIG. 36(a) comprises a base film (weather-resistant sheet) 501, a light confining layer 502a formed on the outer surface of the base film 501, i.e. a surface on the light receiving side of the base film 501, and an adhesive layer 503 for bonding the protective sheet to a photovoltaic layer 507 provided with solar cells formed on the inner surface of the base film 501, i.e., a surface to be bonded to the photovoltaic layer 507.

The protective sheet shown in FIG. 36(b) comprises a base film (weather-resistant sheet) 501, a light confining layer 502a formed on the inner surface of the base film 501, i.e., a surface to be bonded to a photovoltaic layer 507 provided with solar cells, and an adhesive layer 503 formed on the light confining layer 502a.

The protective sheet shown in FIG. 36(c) comprises a base film 501 as an outermost layer, an adhesive layer 503 formed on the inner surface of the base film 501, and a light confining layer 502a formed on the adhesive layer 503. The light confining layer 502a must be formed so that the periphery thereof lies inside the periphery of the adhesive layer 503 and a peripheral portion of the adhesive layer 503 is exposed to enable the adhesive layer 503 to exercise its bonding function.

The protective sheets shown in FIG. 36(d) comprises a base film 501, a light confining layer 502a formed on the outer surface of the base film 501, a light confining layer 502b formed on the inner surface of the base film 501, and an adhesive layer 503 formed on the light confining layer 502b.

The protective sheets shown in FIG. 36(e) comprises a base film 501, a light confining layer 502a formed on the inner surface of the base film 501, a light confining layer 502b formed on the surface of the light confining layer 502a, and an adhesive layer 503 formed on the light confining layer 502b.

When necessary, a gas-barrier layer may be formed on any one of the component layers of the protective sheet, preferably, an inner layer. When a layer other than the base film, such as the light confining layer, is the outermost layer, a protective layer may be formed on the surface of the outermost layer by a film lamination process or resin coating process.

As mentioned above, the protective sheet thus formed is excellent in strength, heat resistance, weather resistance, transparency and gas impermeability. Since the protective sheet is provided beforehand with the adhesive layer for bonding the protective sheet to a photovoltaic layer provided with solar cells, the adhesive layer can be formed in the lest necessary thickness, and the process for fabricating a solar battery module is simplified. The protective sheet is capable of making light incident on the solar battery module fall repeatedly on the solar cells and of improving power generating efficiency.

FIGS. 37(a) and 37(b) are typical sectional views of light confining layers for protective sheets in accordance with the present invention for solar battery modules. These light confining layers are the same as those previously described with reference to FIGS. 37(a) and 37(b) and hence the description thereof will be omitted to avoid duplication.

FIG. 38(a) is a plan view of an irregular structure of assistance in explaining the irregular structures of the light confining layers shown in FIGS. 37(a) and 37(b), FIG. 38(b) is a sectional view taken online A—A in FIG. 38(a) and FIG. 38(c) is a perspective view of the irregular structure shown in FIG. 38(a).

As shown in FIG. 38(c), the light confining layer 502 has a corrugated irregular structure formed by arranging ridges having a triangular cross section. Preferably, the apex angle θ of the triangular cross section of the ridges is about 90°. An optimum apex angle of the triangular cross section is 90° and a preferable height of the triangular cross section is in the range of 0.1 nm to 500 μm.

FIG. 39(a) is a plan view of another light confining layer 502, FIG. 39(b) is a sectional view taken on line A—A in FIG. 39(a), and FIG. 39(c) is a perspective view of the light confining layer 502.

As obvious from FIG. 39(c), the light confining layer 502 shown in FIGS. 39(a) to 39(c) has an irregular structure formed regularly arranging pyramidal projections. Preferably, the apex angle θ of the triangular cross section of the pyramidal projections is about 90°. An optimum apex angle θ of the triangular cross section of the pyramidal projection is 90° and a preferable height of the pyramidal projections is in the range of 0.1 nm to 500 μm.

Figure 40:
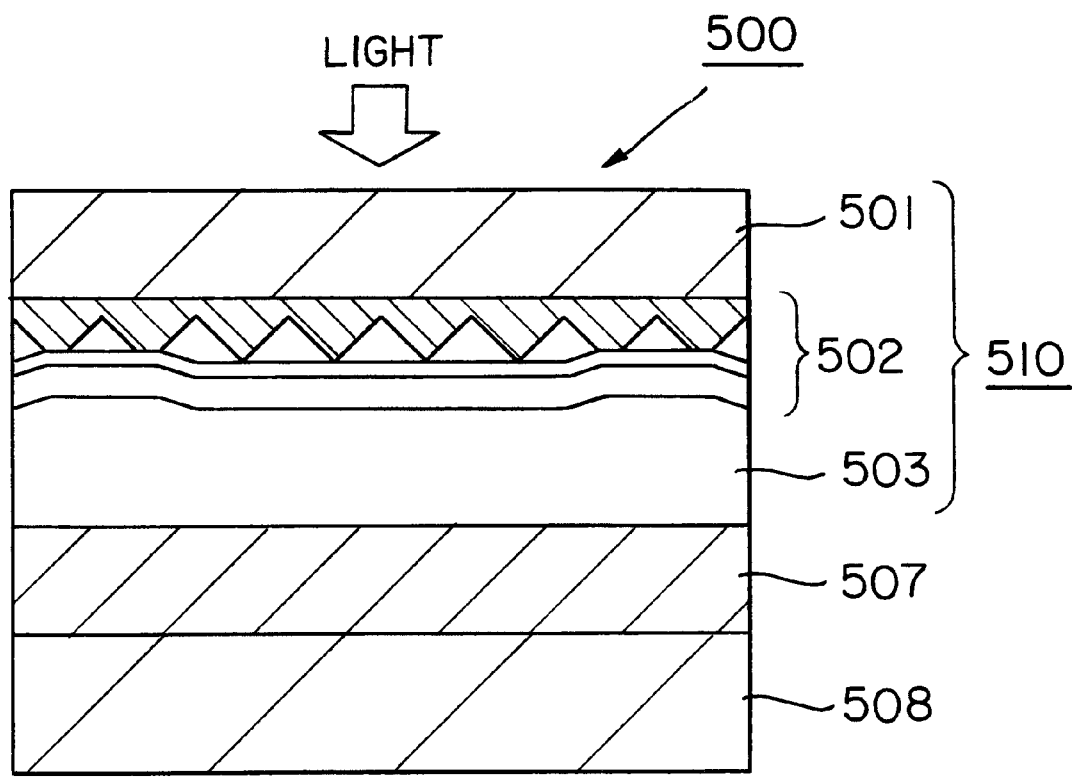
FIG. 40 is a typical sectional view of a solar battery module embodying the present invention provided with a protective sheet.

FIG. 40 is a typical sectional view of a solar battery module 500 provided with a protective film in accordance with the present invention.

As shown in FIG. 40, the solar battery module 500 is a laminated structure comprising a base film 501 as a front surface protective sheet, a light confining layer 502, an adhesive layer 503, a photovoltaic layer 507 provided with solar cells, and a substrate 508 superposed in that order. The solar battery module may be fabricated, for example, by forming the photovoltaic layer 507 provided with solar cells on the substrate 508, superposing a protective sheet 510 formed by superposing and laminating the base film 501, the light confining layer 502 and the adhesive layer 503 in that order on the substrate 508 provided with the photovoltaic layer 507, and bonding together the protective sheet 510 and the substrate 508 provided with the photovoltaic layer 507 by hot pressing.

When necessary, a gas-barrier layer may be formed on any one of the component layers of the protective sheet 510. When necessary, a back surface protective sheet similar to the protective sheet 510 may be bonded to the back surface, i.e., the outer surface, of the substrate 508.

Since the front surface of the photovoltaic layer provided with solar cells is covered with the protective sheet excellent in strength, heat resistance, weather resistance, transparency and gas impermeability and capable of making light incident on the solar battery module fall repeatedly on the solar cells, the solar battery module is excellent in long-term reliability, is capable of effectively using incident light fallen on the solar cells and has excellent power generating ability.

EXAMPLES

Examples and a comparative example will be described below.

Example 1

Figure 38:
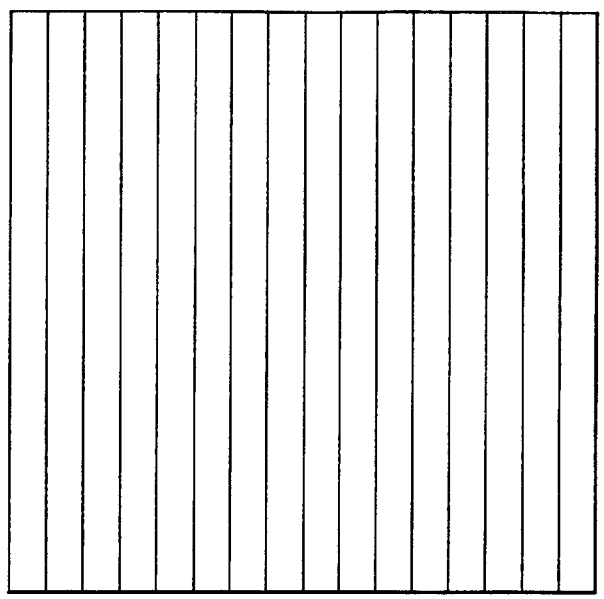
FIGS. 38(a), 38(b) and 38(c) are a typical plan view, a typical sectional view and a typical perspective view, respectively, of an example of a reflecting structure included in the light confining layer shown in FIGS. 37(a) and 37(b)
Figure 38:
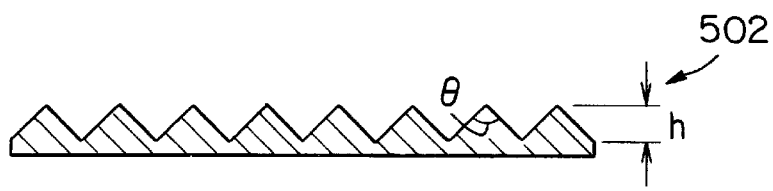
Figure 38:
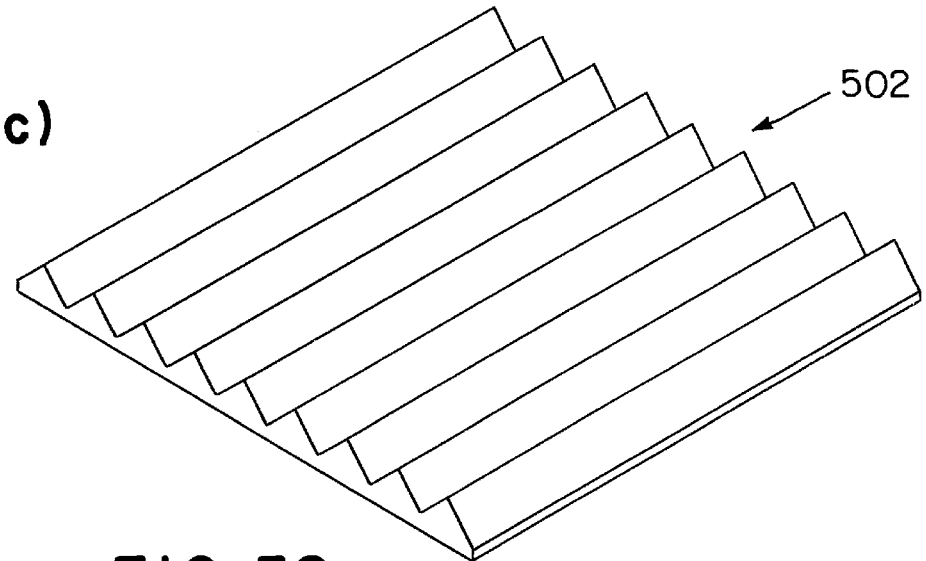

A 75 μm thick ETFE film was used as a base film. A light confining layer having a corrugated irregular structure comprising ridges having a triangular cross section as shown in FIG. 38 was formed of an ultraviolet curable acrylic resin on one of the surfaces of the 75 μm thick ETFE film. The triangular cross section was 8 μm in height and 60° in apex angle. A 80 nm thick textured layer of ZnO was deposited on the light confining layer by a CVD process. A 70 nm thick deposited $SiO_x$ film as a gas-barrier layer was formed on the textured layer by a CVD process to complete a protective sheet in Example 1 for a solar battery module.

Example 2

A protective sheet in Example 2 for a solar battery module of the same components as those of Example 1 was fabricated by the same processes as in Example 1, except that the protective sheet in Example 2 was provided with a light confining layer having a corrugated irregular structure comprising ridges of a triangular cross section of 8 μm in height and 90° in apex angle.

Example 3

A protective sheet in Example 3 for a solar battery module of the same components as those of Example 1 was fabricated by the same processes as in Example 1, except that the protective sheet in Example 3 was provided with a light confining layer having a corrugated irregular structure comprising ridges of a triangular cross section of 8 μm in height and 120° in apex angle.

Example 4

Figure 39:
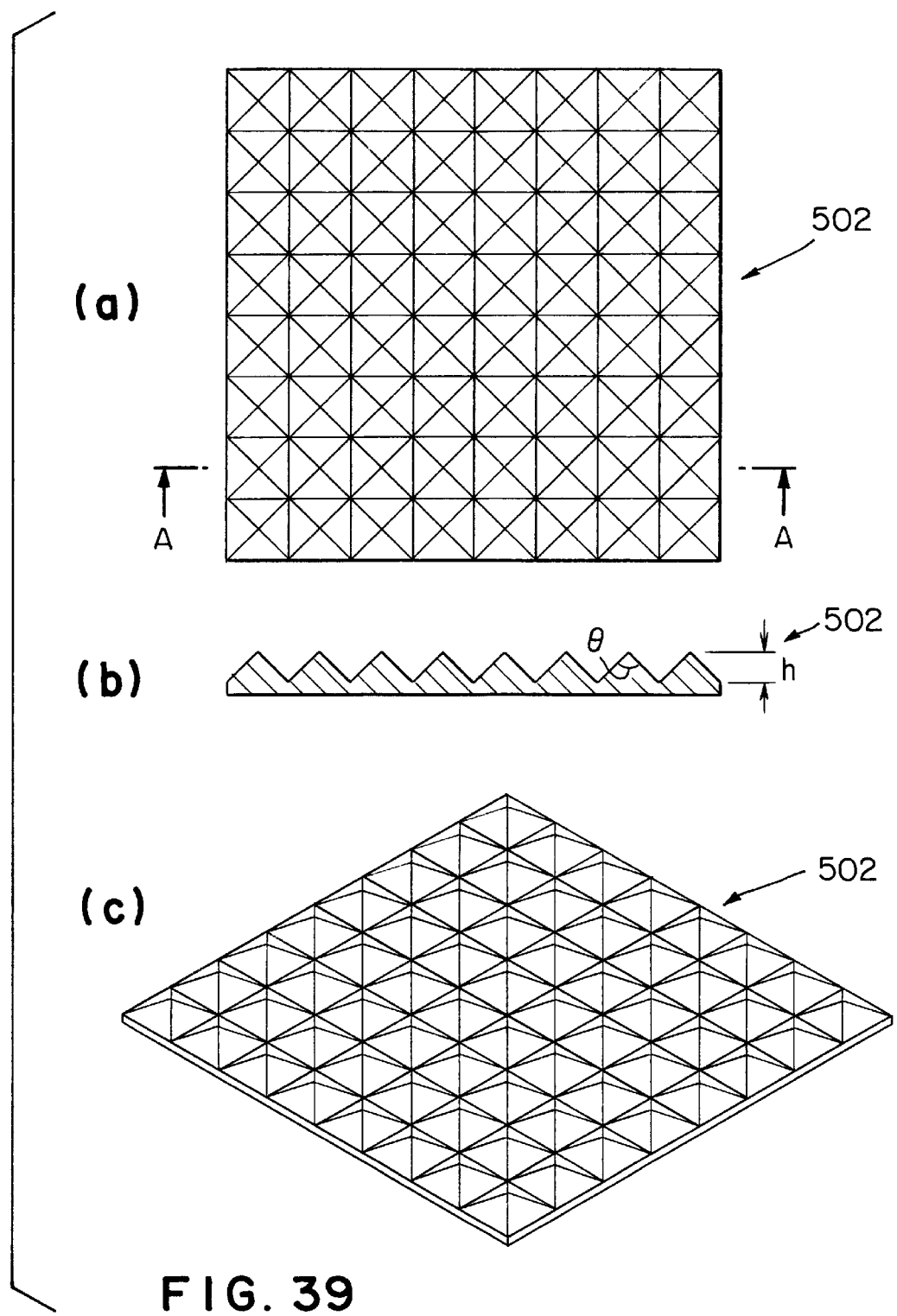
FIGS. 39(a), 39(b) and 39(c) are a typical plan view, a typical sectional view and a typical perspective view, respectively, of another example of a reflecting structure included in the light confining structure.

A protective sheet in Example 2 for a solar battery module of the same components as those of Example 1 was fabricated by the same processes as in Example 1, except that the protective sheet in Example 4 was provided with a light confining layer having an irregular structure comprising pyramidal projections of a triangular cross section of 8 μm in height and 60° in apex angle as shown in FIG. 39.

Example 5

A protective sheet in Example 5 for a solar battery module of the same components as those of Example 4 was fabricated by the same processes as in Example 4, except that the protective sheet in Example 5 was provided with a light confining layer having an irregular structure comprising pyramidal projections of a triangular cross section of 8 μm in height and 90° in apex angle.

Example 6

A protective sheet in Example 6 for a solar battery module of the same components as those of Example 4 was fabricated by the same processes as in Example 4, except that the protective sheet in Example 6 was provided with a light confining layer having an irregular structure comprising pyramidal projections of a triangular cross section of 8 μm in height and 120° in apex angle.

Comparative Example 1

A protective sheet in Comparative example 1 for a solar battery module of the same components as those of Example 1 was fabricated, except that the protective sheet in Comparative example 1 was provided with a 8 μm thick flat ultraviolet curable acrylic resin film instead of the light confining layer.

Tests and Test Results

Solar battery modules in Examples 1 to 6 and Comparative example 1 were fabricated by bonding the protective sheets in Examples 1 to 6 and Comparative example 1 by hot pressing to photovoltaic layers, respectively. Each photovoltaic layer was provided with amorphous silicon solar cells formed on a glass substrate provided with a deposited Ag film as a reflecting layer.

Short-circuit currents $J_{SC}$ (mA/cm$^2$) in the solar battery modules in Examples 1 to 6 and Comparative example 1 were measured. Percent short-circuit current increase based on the short-circuit current in the solar battery moducle in Comparative example 1 was calculated. Measured and calculated data are shown in Table 8-1.

TABLE 8-1

| | Test Result | | | |
|---|---|---|---|---|
| | Irregular structure | Apex angle | Short-circuit Current ($J_{sc}$ (mA/cm$^2$)) | Short-circuit current improvement ratio (%) |
| Example 1 | Corrugated | 60° | 30.5 | 4.8 |
| Example 2 | Corrugated | 90° | 31.1 | 6.9 |
| Example 3 | Corrugated | 120° | 29.6 | 1.7 |
| Example 4 | Pyramidal | 60° | 30.8 | 5.8 |
| Example 5 | Pyramidal | 90° | 31.2 | 7.2 |

TABLE 8-1-continued

| | | Test Result | | |
|---|---|---|---|---|
| | Irregular structure | Apex angle | Short-circuit Current ($J_{sc}$ (mA/cm$^2$)) | Short-circuit current improvement ratio (%) |
| Example 6 | Pyramidal | 120° | 29.3 | 0.7 |
| Comparative Example 1 | Flat | — | 29.1 | 0 |

As obvious from Table 8-1, the short-circuit currents in the solar battery modules in Examples 1 to 6 employing the protective films in Examples 1 to 6 as their front surface protective sheets, respectively, are higher than that in the solar battery module in Comparative example 1 employing the protective sheets in Comparative example 1, which proves the effect of the light confining layer in increasing short-circuit current.

The short-circuit current in the solar battery module in Example 5 employing the protective sheet provided with the light confining layer having the irregular structure formed of the ultraviolet curable resin and comprising the pyramidal projections of a triangular cross section of 8 μm in height and 90° in apex angle is the highest and best among those in the solar battery modules in Examples 1 to 6.

As apparent from the foregoing description, the protective sheet according to the present invention for a solar battery module is excellent in strength, heat resistance, weather resistance, transparency and gas impermeability, and is capable of making light incident on the solar battery module fall repeatedly on the solar cells to increase short-circuit current and power generating efficiency.

The adhesive layer for bonding the protective sheet to the photovoltaic layer provided with solar cells can be formed beforehand on the inner surface of the protective sheet. Therefore, the adhesive layer can be formed in the least necessary thickness and the process for fabricating the solar battery module by bonding together the protective sheet and the photovoltaic layer provided with solar cells can be simplified. The protective sheet makes light incident on the solar battery module fall repeatedly on the solar cells and thereby increases power generating efficiency.

The solar battery module employing the protective sheet as its front surface protective sheet or its back surface protective sheet is excellent in long-term reliability and is capable of generating power at a high power generating efficiency and of being produced at high productivity.

The materials mentioned in the description of the first to the seventh embodiment are applicable to the eighth embodiment.

What is claimed is:

1. A protective sheet for a solar battery module, comprising:
   a weather-resistant sheet; and
   a deposited inorganic oxide thin film formed on one of the surfaces of the weather-resistant sheet, wherein an ultraviolet absorbing layer and a soil-resistant layer are formed on one of or both of the surfaces of the weather-resistant sheet and the deposited inorganic oxide thin film, and the soil-resistant layer serves as an outermost layer.

2. The protective sheet for a solar battery module, according to claim 1, wherein the weather-resistant sheet is a fluorocarbon resin sheet.

3. The protective sheet for a solar battery module, according to claim 2, wherein the fluorocarbon resin sheet has a visible radiation transmittance of 90% or above.

4. The protective sheet for a solar battery module, according to claim 2, wherein the fluorocarbon resin sheet contains an ultraviolet absorber and/or an oxidation inhibitor.

5. The protective sheet for a solar battery module, according to claim 2, wherein a surface-treated layer is formed in one of the surfaces of the fluorocarbon resin sheet.

6. The protective sheet for a solar battery module, according to claim 5, wherein the surface-treated layer is a plasma-processed layer, a corona-processed layer, a layer of a primer for deposition, a layer of an anchoring agent or a layer of an adhesive.

7. The protective sheet for a solar battery module, according to claim 2, wherein the deposited inorganic oxide thin film is a single-layer inorganic oxide thin film, a multilayer film consisting of at least two inorganic oxide thin films or a composite film consisting of at least two deposited thin films of inorganic oxides different from each other.

8. The protective sheet for a solar battery module, according to claim 1, wherein the weather-resistant sheet is a cyclic polyolefin sheet.

9. The protective sheet for a solar battery module, according to claim 8, wherein the cyclic polyolefin sheet has a visible radiation transmittance of 90% or above.

10. The protective sheet for a solar battery module, according to claim 8, wherein the cyclic polyolefin sheet contains one or some of additives including an ultraviolet absorber, an oxidation inhibitor and reinforcing fibers.

11. The protective sheet for a solar battery module, according to claim 8, wherein a surface of the cyclic polyolefin sheet is processed in an embossed surface.

12. The protective sheet for a solar battery module, according to claim 8, wherein the deposited inorganic oxide thin film is a single-layer inorganic oxide thin film, a multilayer film consisting of at least two inorganic oxide thin films or a composite film consisting of at least two deposited thin films of inorganic oxides different from each other.

13. The protective sheet for a solar battery module, according to claim 1, wherein a coating film of a composite material comprising a condensation polymer produced through the hydrolysis of a silicon compound is formed on the deposited inorganic oxide thin film.

14. The protective sheet for a solar battery module, according to claim 13, wherein the weather-resistant sheet has a visible radiation transmittance of 90% or above.

15. The protective sheet for a solar battery module, according to claim 13, wherein the weather-resistant sheet contains an ultraviolet absorber and/or an oxidation inhibitor.

16. The protective sheet for a solar battery module, according to claim 13, wherein the weather-resistant sheet is a fluorocarbon resin sheet, a cyclic polyolefin sheet, a polycarbonate sheet, a poly(meta)acrylic sheet or a polyester sheet.

17. The protective sheet for a solar battery module, according to claim 13, wherein the deposited inorganic oxide thin film is a single-layer inorganic oxide thin film, a multilayer thin film consisting of at least two inorganic oxide thin films or a composite film consisting of at least two deposited thin films of inorganic oxides different from each other.

18. The protective sheet for a solar battery module, according to claim 13, wherein the deposited inorganic oxide thin film has a thickness in the range of 50 to 4000 Å.

19. The protective sheet for a solar battery module, according to claim 13, wherein the silicon compound is a substance expressed by the general formula R'SiR$_3$, where R' denotes a group stable to hydrolysis and capable of being polymerized by heat and/or ionizing radiation, and R denotes an OH group and/or a group subject to hydrolysis.

20. The protective sheet for a solar battery module, according to claim 19, wherein R' in the general formula R'SiR$_3$ is a group including an epoxy atomic group or a group including an atomic group having a C—C double bond.

21. The protective sheet for a solar battery module, according to claim 19, wherein R' in the general formula R'SiR$_3$ is a group including a (meta)acryl atomic group.

22. The protective sheet for a solar battery module, according to claim 13, wherein the composite material further contains a condensation polymer produced through the hydrolysis of a compound expressed by the general formula MR$_n$, where M denotes an element selected from silicon, aluminum, titanium, zirconium, vanadium, boron and tin, R denotes an OH group and/or a group subject to hydrolysis and n denotes the valence of the element.

23. The protective sheet for a solar battery module, according to claim 13, wherein the composite material contains a resin having hydrogen bond forming groups.

24. The protective sheet for a solar battery module, according to claim 13, wherein the protective sheet has an oxygen permeability of 2.0 cc/m$^2$·day·atm or below in an atmosphere of 25° C. and 90% RH and a moisture permeability of 2.0 g/m$^2$·day or below in an atmosphere of 40° C. and 100% RH.

25. The protective sheet for a solar battery module, according to claim 1, wherein the soil-resistant layer is formed on the weather-resistant sheet, the ultraviolet absorbing layer is formed on the deposited inorganic oxide thin film, and the soil-resistant layer serves as an outermost layer.

26. The protective sheet for a solar battery module, according to claim 1, wherein the weather-resistant sheet is a transparent fluorocarbon resin sheet having a visible radiation transmittance of 90% or above.

27. The protective sheet for a solar battery module, according to claim 1, wherein the weather-resistant sheet is a transparent fluorocarbon resin sheet of a vinyl fluoride resin or an ethylene-tetrafluoroethylene copolymer.

28. The protective sheet for a solar battery module, according to claim 1, wherein the deposited inorganic oxide thin film is a single-layer inorganic oxide thin film or a multilayer film consisting of at least two inorganic oxide thin films deposited by physical vapor deposition processes.

29. The protective sheet for a solar battery module, according to claim 1, wherein the deposited inorganic oxide thin film is a single-layer inorganic oxide thin film or a multilayer film consisting of at least two inorganic oxide thin films deposited by chemical vapor deposition processes.

30. The protective sheet for a solar battery module, according to claim 1, wherein the deposited inorganic oxide thin film is a multilayer film consisting of at least two layers formed by a physical vapor deposition process and a chemical vapor deposition process.

31. The protective sheet for a solar battery module, according to claim 30, wherein the deposited inorganic oxide thin film is a multilayer film consisting of at least a deposited inorganic oxide thin film formed by a chemical vapor deposition process and a deposited inorganic oxide thin film formed by a physical vapor deposition process.

32. The protective sheet for a solar battery module, according to claim 1, wherein the soil-resistant layer is a coating film of a composite material containing photocatalytic powder containing titanium oxide as a principal component, or a sol containing fine particles.

33. The protective sheet for a solar battery module, according to claim 1, wherein the ultraviolet absorbing layer is a coating film of a composite material containing an ultraviolet absorber.

34. The protective sheet for a solar battery module, according to claim 1, wherein a deposition-resistant protective film is sandwiched between the weather-resistant sheet and the deposited inorganic oxide thin film.

35. The protective sheet for a solar battery module, according to claim 34, wherein the weather-resistant sheet has a visible radiation transmittance of 90% or above.

36. The protective sheet for a solar battery module, according to claim 34, wherein the weather-resistant sheet contains an ultraviolet absorber and/or an oxidation inhibitor.

37. The protective sheet for a solar battery module, according to claim 34, wherein the weather-resistant sheet is a fluorocarbon resin sheet, a cyclic polyolefin sheet, a polycarbonate sheet, a poly(meta)acrylic sheet or a polyester sheet.

38. The protective sheet for a solar battery module, according to claim 34, wherein the deposition-resistant protective film is a deposited inorganic oxide film formed by a chemical vapor deposition process or a physical vapor deposition process.

39. The protective sheet for a solar battery module, according to claim 34, wherein the deposition-resistant protective film is a deposited inorganic oxide film formed by a plasma chemical vapor deposition process.

40. The protective sheet for a solar battery module, according to claim 34, wherein the deposition-resistant protective film is a deposited silicon oxide film formed by a plasma chemical vapor deposition process.

41. The protective sheet for a solar battery module, according to claim 34, wherein the deposition-resistant protective film is formed of a silicon oxide compound having silicon and oxygen as component elements, and the silicon oxide compound contains at least carbon or hydrogen as a trace element or both carbon and hydrogen as trace elements.

42. The protective sheet for a solar battery module, according to claim 34, wherein the deposition-resistant protective film has a thickness of 10 Å to less than 150 Å.

43. The protective sheet for a solar battery module, according to claim 34, wherein the deposited inorganic oxide thin film is a single-layer inorganic oxide thin film, a multilayer film consisting of at least two inorganic oxide thin films or a composite film consisting of at least two deposited thin films respectively of different inorganic oxides different from each other.

44. The protective sheet for a solar battery module, according to claim 34, wherein the deposited inorganic oxide film has a thickness in the range of 150 Å to 4000 Å.

45. The protective sheet for a solar battery module, according to claim 1, wherein an additional weather-resistant sheet is disposed on the deposited inorganic oxide thin film.

46. The protective sheet for a solar battery module, according to claim 45, wherein the weather-resistant sheet has a visible radiation transmittance of 90% or above.

47. The protective sheet for a solar battery module, according to claim 45, wherein the weather-resistant sheet contains an ultraviolet absorber and/or an oxidation inhibitor.

48. The protective sheet for a solar battery module, according to claim 45, wherein the deposited inorganic oxide thin film is a single-layer inorganic oxide thin film, a multilayer film consisting of at least two inorganic oxide thin films or a composite film consisting of at least two deposited thin films of inorganic oxides different from each other.

49. The protective sheet for a solar battery module, according to claim 45, wherein the additional weather-resistant sheet is a cyclic polyolefin film of a polycyclopentadiene resin, a polydicyclopentadiene resin or a polynorbornadiene resin.

50. A solar battery module comprising:
a photovoltaic layer provided with solar cells;
a pair of filler layers contiguous respectively with opposite surfaces of the photovoltaic layer provided with solar cells; and
a pair of protective sheets contiguous respectively with the pair of filler layers;
wherein, at least one of the pair of protective sheets comprises a cyclic polyolefin weather-resistant sheet and a deposited inorganic oxide thin film.

51. The solar battery module according to claim 50, wherein the protective sheet comprising the weather-resistant sheet and the deposited inorganic oxide thin film, further comprises a coating film formed of a composite material comprising a condensed polymer produced through the hydrolysis of a silicon compound on the deposited inorganic oxide thin film.

52. The solar battery module according to claim 50, wherein the protective sheet comprising the weather-resistant sheet and the deposited inorganic oxide thin film, further comprises a soil-resistant layer and/or an ultraviolet absorbing layer formed on one of or both the surfaces of the weather-resistant sheet and the deposited inorganic oxide thin film.

53. The solar battery module according to claim 50, wherein the protective sheet comprising the weather-resistant sheet and the deposited inorganic oxide thin film, further comprises a deposition-resistant protective film sandwiched between the weather-resistant sheet and the deposited inorganic oxide thin film.

54. The solar battery module according to claim 50, wherein the protective sheet comprising the weather-resistant sheet and the deposited inorganic oxide thin film, further comprises an additional weather-resistant sheet disposed on the deposited inorganic oxide thin film.

55. A solar battery module comprising:
a photovoltaic layer provided with solar cells;
a pair of filler layers contiguous respectively with opposite surfaces of the photovoltaic layer provided with solar cells; and
a pair of protective sheets contiguous respectively with the pair of filler layers;
wherein, at least one of the pair of protective sheets comprises a weather-resistant sheet and a deposited inorganic oxide thin film, and
wherein an ultraviolet absorbing layer and a soil-resistant layer are formed on one of or both of the surfaces of the weather-resistant sheet and the deposited inorganic oxide thin film, and the soil-resistant layer serves as an outermost layer.

56. The solar battery module according to claim 55, wherein the weather-resistant sheet is a fluorocarbon resin sheet.

57. The solar battery module according to claim 55, wherein the weather-resistant sheet is a cyclic polyolefin sheet.

58. The solar battery module according to claim 55, wherein the protective sheet comprising the weather-resistant sheet and the deposited inorganic oxide thin film, further comprises a coating film formed of a composite material comprising a condensed polymer produced through the hydrolysis of a silicon compound on the deposited inorganic oxide thin film.

59. The solar battery module according to claim 55, wherein the protective sheet comprising the weather-resistant sheet and the deposited inorganic oxide thin film, further comprises a deposition-resistant protective film sandwiched between the weather-resistant sheet and the deposited inorganic oxide thin film.

60. The solar battery module according to claim 55, wherein the protective sheet comprising the weather-resistant sheet and the deposited inorganic oxide thin film, further comprises an additional weather-resistant sheet disposed on the deposited inorganic oxide thin film.

* * * * *